United States Patent [19]
Olson

[11] Patent Number: 6,133,754
[45] Date of Patent: Oct. 17, 2000

[54] MULTIPLE-VALUED LOGIC CIRCUIT ARCHITECTURE; SUPPLEMENTARY SYMMETRICAL LOGIC CIRCUIT STRUCTURE (SUS-LOC)

[75] Inventor: Edgar Danny Olson, Moorpark, Calif.

[73] Assignee: EDO, LLC, Pasadena, Calif.

[21] Appl. No.: 09/086,869

[22] Filed: May 29, 1998

[51] Int. Cl.$^7$ .......................... H03K 19/00; H03K 19/094
[52] U.S. Cl. ................................. 326/59; 326/59; 326/60; 326/112; 326/119; 326/121
[58] Field of Search ................................. 326/59, 60, 112, 326/119, 121

[56] References Cited

U.S. PATENT DOCUMENTS

| | | | |
|---|---|---|---|
| 3,129,340 | 4/1964 | Baskin | 307/88.5 |
| 3,283,256 | 11/1966 | Hurowitz | 328/147 |
| 3,492,496 | 1/1970 | Callan | 307/209 |
| 3,508,033 | 4/1970 | Turecki | 235/92 |
| 3,663,837 | 5/1972 | Epstein et al. | 307/289 |
| 3,671,764 | 6/1972 | Maley et al. | 307/209 |
| 3,969,633 | 7/1976 | Paluck et al. | 307/205 |
| 4,107,549 | 8/1978 | Moufah | 307/205 |
| 4,109,101 | 8/1978 | Mitani | 178/67 |
| 4,217,502 | 8/1980 | Suzuki et al. | 307/205 |
| 4,302,690 | 11/1981 | Gollinger et al. | 307/451 |
| 4,704,544 | 11/1987 | Horwitz | 307/270 |
| 4,716,471 | 12/1987 | Yokomizo | 358/296 |
| 4,737,663 | 4/1988 | Varadarajan | 307/455 |
| 4,808,854 | 2/1989 | Reinagel | 307/473 |
| 4,990,796 | 2/1991 | Olson | 307/279 |
| 5,017,817 | 5/1991 | Yamakawa | 307/571 |
| 5,128,894 | 7/1992 | Lin | 365/168 |
| 5,200,653 | 4/1993 | Moloney et al. | 307/473 |
| 5,398,327 | 3/1995 | Yoshida | 395/500 |
| 5,457,411 | 10/1995 | Hastings | 326/59 |
| 5,463,341 | 10/1995 | Karasawa | 327/219 |
| 5,469,163 | 11/1995 | Taddiken | 341/83 |
| 5,512,764 | 4/1996 | Seabaugh et al. | 257/25 |
| 5,519,393 | 5/1996 | Brandestini | 341/10 |
| 5,548,549 | 8/1996 | Ong | 365/185 |
| 5,559,734 | 9/1996 | Saito | 365/168 |
| 5,563,530 | 10/1996 | Frazier et al. | 326/132 |
| 5,572,629 | 11/1996 | Choi | 395/61 |

OTHER PUBLICATIONS

Proceedings, The Twenty–Sixth International Symposium on Multiple–Valued Logic, May 29–31, 1996, Santiago de Compostela, Spain.

Wu, X. W. et al, "CMOS Ternary Logic Circuits," IEE Proceedings, vol. 137, Pt. G, No. 1, Feb. 1, 1990, pp. 21–27.

Ueno, Fumio et al, "Design Method of CMOS Quaternary Threshold Logic Circuits Realized by Multiple Ion Implants," IEEE Proceedings of the Seventeenth International Symposium on Multiple–Valued Logic, Boston, May 26–28, 1987, pp. 268–274.

*Primary Examiner*—Michael Tokar
*Assistant Examiner*—Vibol Tan
*Attorney, Agent, or Firm*—Andrew S. Jordan; Cislo & Thomas, LLP

[57] ABSTRACT

Circuit structure and resulting circuitry for multiple-valued logic. The circuit structure allows the design and fabrication of any r-valued logic function of n-places where r is an integer greater than 1 and n is an integer greater than 0. This structure is called SUpplementary Symmetrical LOgic Circuit structure (SUS-LOC). In circuits incorporating SUS-LOC, circuit branches are realized that uniquely deliver circuit response and output. For some circuits, and due to the operating characteristics of the switch elements, additional circuit elements, or stages, must be incorporated to prevent "back biasing." SUS-LOC is fully active. Only active elements perform logic synthesis and those components not directly related to logic synthesis, such as resistors and/or other passive loads, are relegated the task of circuit protection. The fabrication of r-valued, multi-valued, or multiple-valued logic circuits, designed using the definitions of the SUS-LOC structure can be accomplished with known techniques, materials, and equipment.

26 Claims, 112 Drawing Sheets

Fig. 7a:
Legend
▨ = Conducting, (ON)    ☐ = Non-conducting, (OFF)
Fig. 7b:
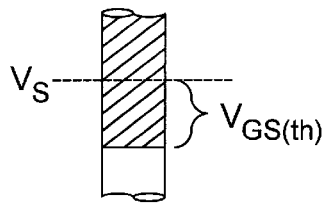
Fig. 7c:
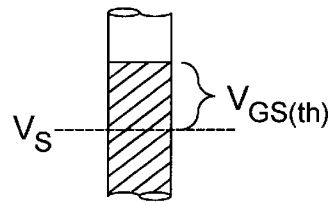
Fig. 7d:
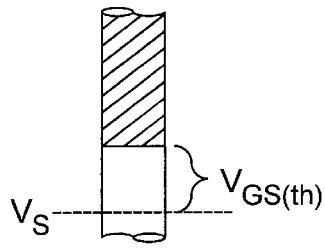
Fig. 7e:
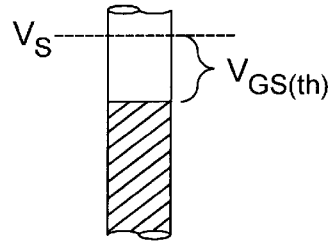
Fig. 7f:
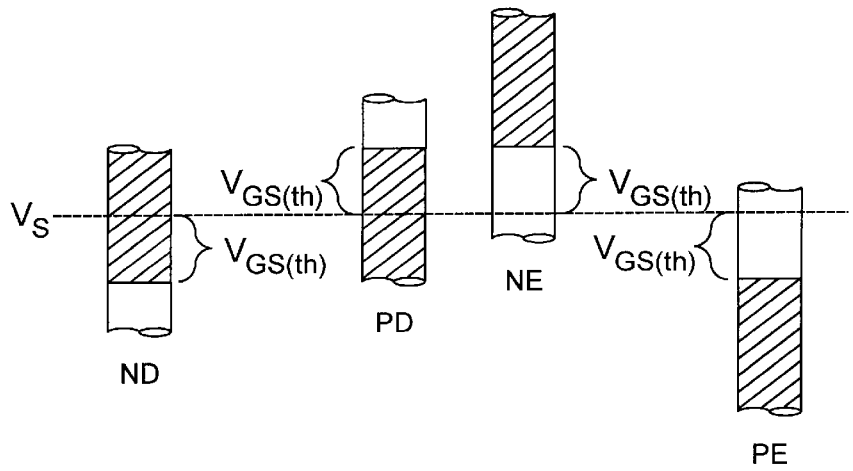

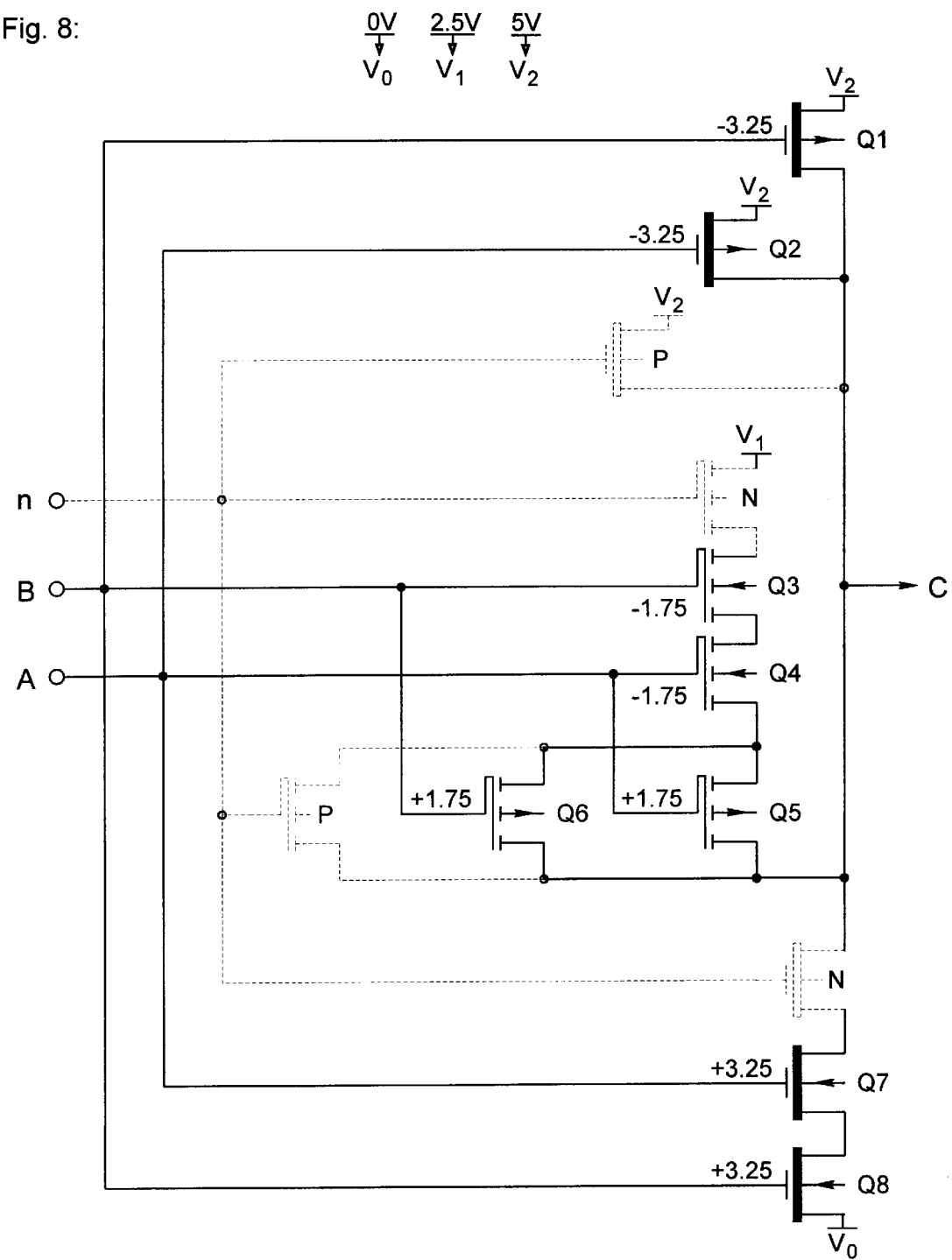

Fig. 18:

| CGOR₃ | A | | |
|---|---|---|---|
| B | 0 | 1 | 2 |
| 0 | 2 | 1 | 0 |
| 1 | 1 | 1 | 0 |
| 2 | 0 | 0 | 0 |

Fig. 19:

| CGOR₃ | A | | |
|---|---|---|---|
| B | 0 | 1 | 2 |
| 0 | 2 | 1 | 0 |
| 1 | 1 | 1 | 0 |
| 2 | 0 | 0 | 0 |

Fig. 20:

| CGOR₃ | A | | |
|---|---|---|---|
| B | 0 | 1 | 2 |
| 0 | 2 | 1 | 0 |
| 1 | 1 | 1 | 0 |
| 2 | 0 | 0 | 0 |

Fig. 21:

| CGAND₃ | A | | |
|---|---|---|---|
| B | 0 | 1 | 2 |
| 0 | 2 | 2 | 2 |
| 1 | 2 | 1 | 1 |
| 2 | 2 | 1 | 0 |

Fig. 22:

| CGAND₃ | A | | |
|---|---|---|---|
| B | 0 | 1 | 2 |
| 0 | 2 | 2 | 2 |
| 1 | 2 | 1 | 1 |
| 2 | 2 | 1 | 0 |

Fig. 23:

| CGAND₃ | A | | |
|---|---|---|---|
| B | 0 | 1 | 2 |
| 0 | 2 | 2 | 2 |
| 1 | 2 | 1 | 1 |
| 2 | 2 | 1 | 0 |

Fig. 24:

| LAMBDA 01₃ | A | | |
|---|---|---|---|
| B | 0 | 1 | 2 |
| 0 | 1 | 0 | 0 |
| 1 | 0 | 0 | 0 |
| 2 | 0 | 0 | 0 |

Fig. 25:

| LAMBDA 01₃ | A | | |
|---|---|---|---|
| B | 0 | 1 | 2 |
| 0 | 1 | 0 | 0 |
| 1 | 0 | 0 | 0 |
| 2 | 0 | 0 | 0 |

Fig. 26:

| CEQ₃ | A | | |
|---|---|---|---|
| B | 0 | 1 | 2 |
| 0 | 2 | 2 | 2 |
| 1 | 2 | 1 | 2 |
| 2 | 2 | 2 | 0 |

Fig. 27:

| CEQ₃ | A | | |
|---|---|---|---|
| B | 0 | 1 | 2 |
| 0 | 2 | 2 | 2 |
| 1 | 2 | 1 | 2 |
| 2 | 2 | 2 | 0 |

Fig. 28:

| CEQ₃ | A | | |
|---|---|---|---|
| B | 0 | 1 | 2 |
| 0 | 2 | 2 | 2 |
| 1 | 2 | 1 | 2 |
| 2 | 2 | 2 | 0 |

Fig. 29:

| CEQ₃ | A | | |
|---|---|---|---|
| B | 0 | 1 | 2 |
| 0 | 2 | 2 | 2 |
| 1 | 2 | 1 | 2 |
| 2 | 2 | 2 | 0 |

Fig. 30:

| CEQ₃ | A | | |
|---|---|---|---|
| B | 0 | 1 | 2 |
| 0 | 2 | 2 | 2 |
| 1 | 2 | 1 | 2 |
| 2 | 2 | 2 | 0 |

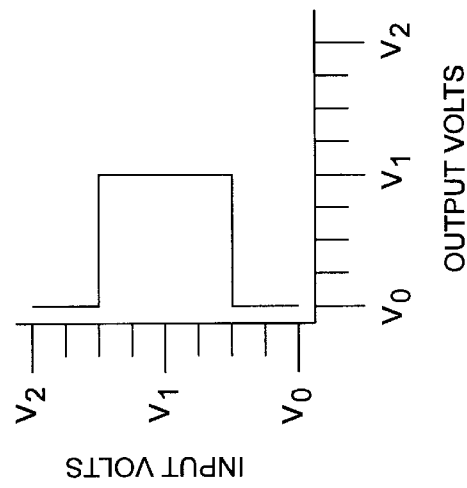
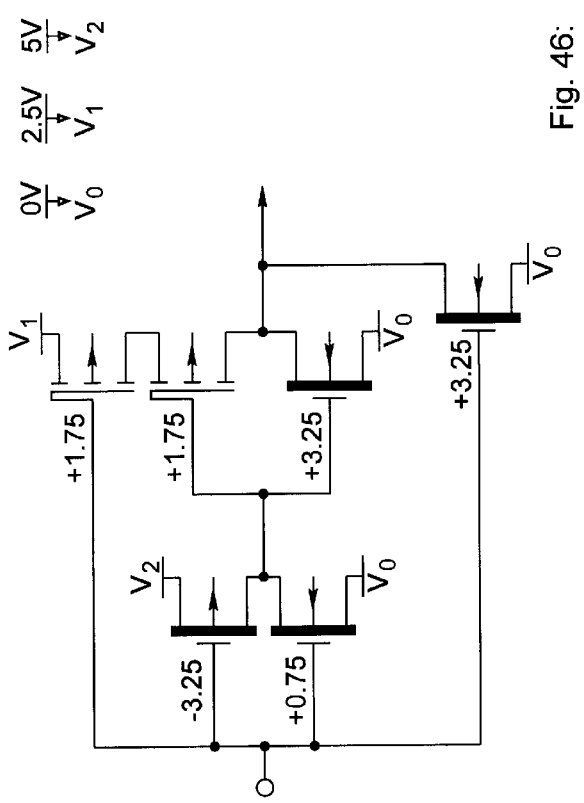
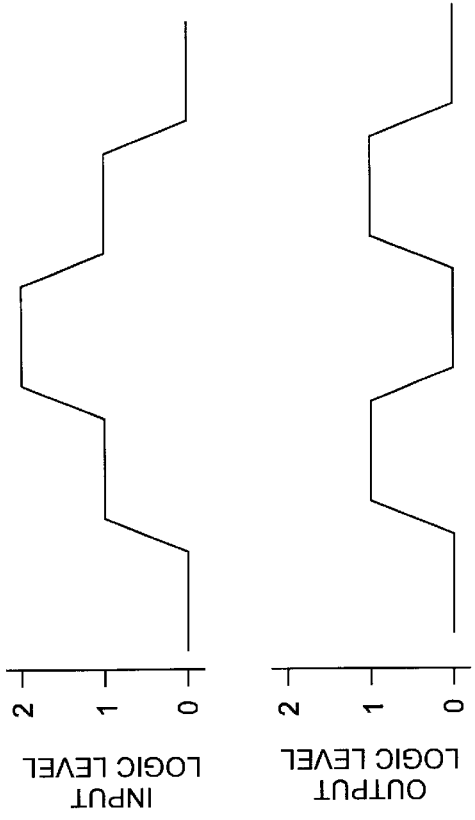
Fig. 44:
Fig. 45:
Fig. 46:

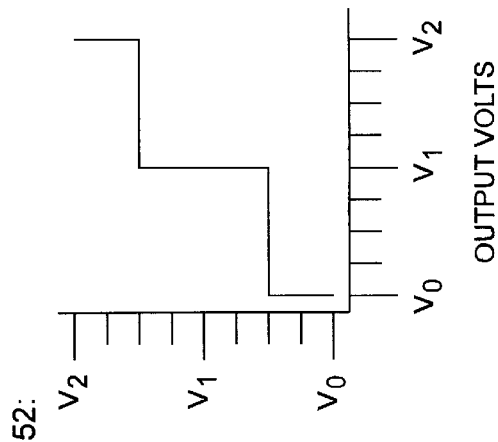
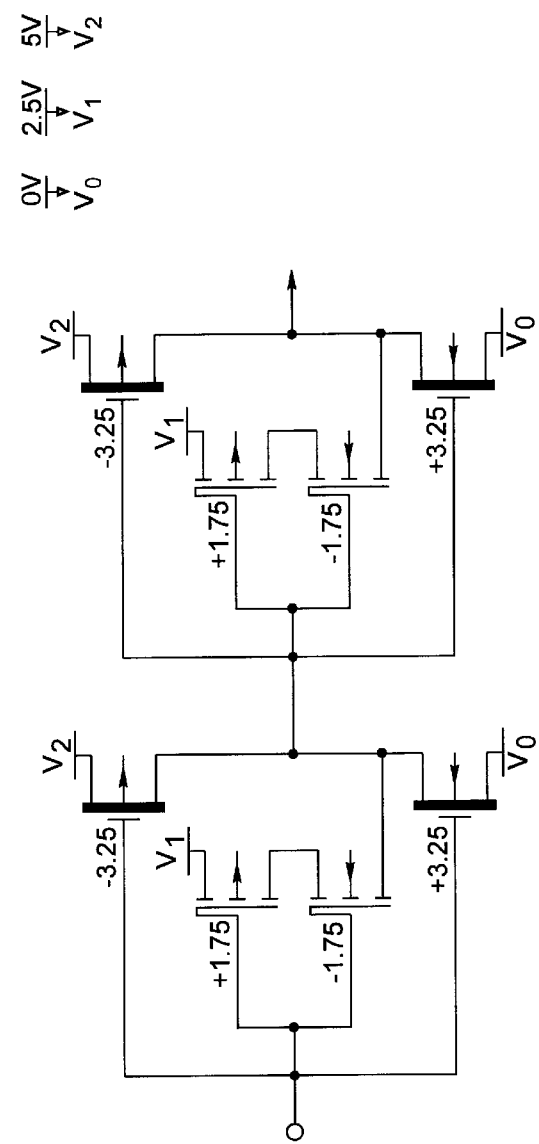
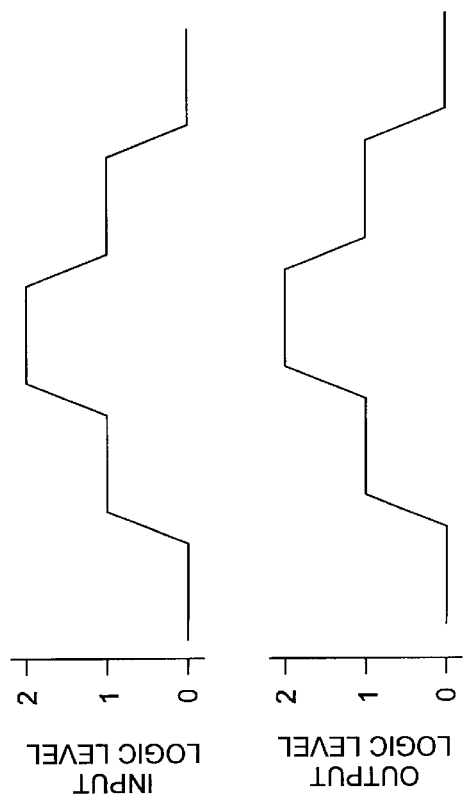
Fig. 50:
Fig. 51:
Fig. 52:

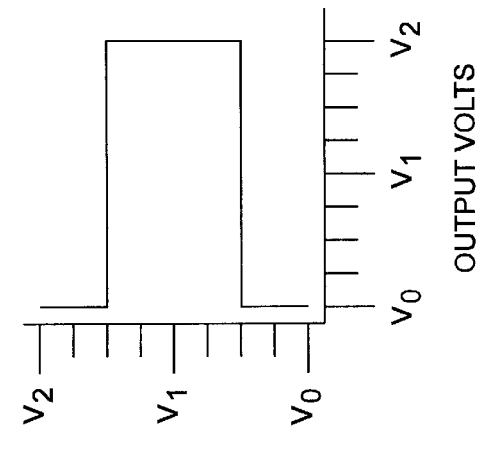
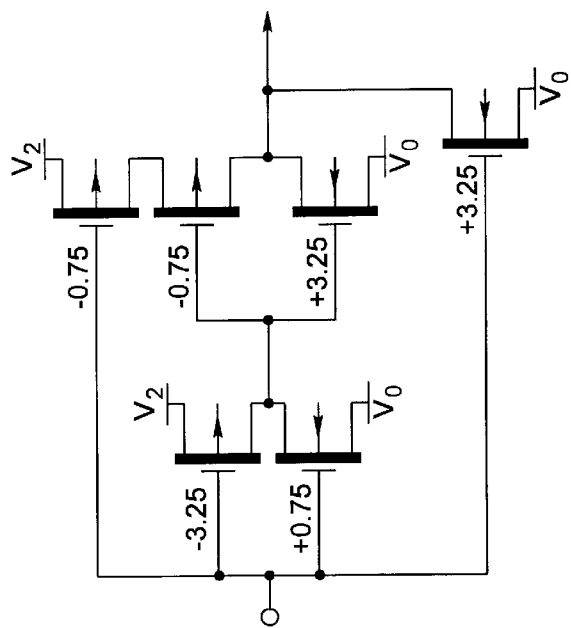
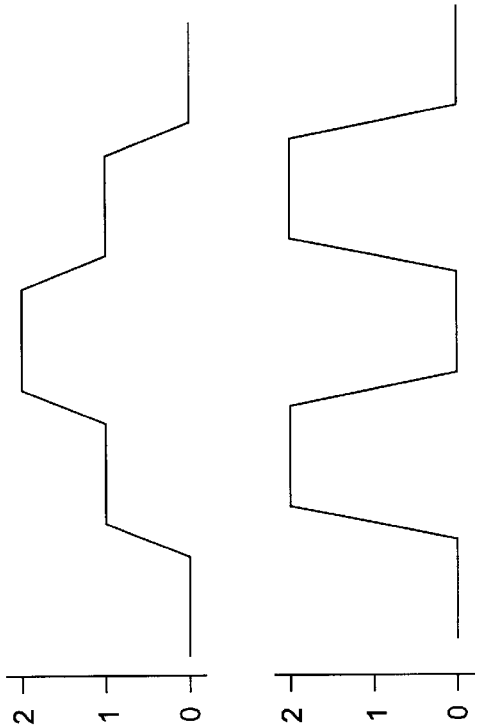
Fig. 53:
Fig. 54:
Fig. 55:

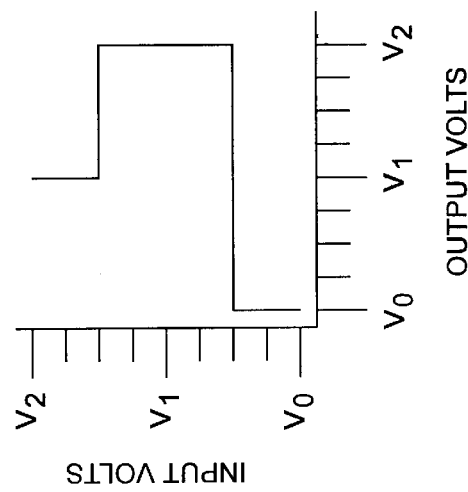
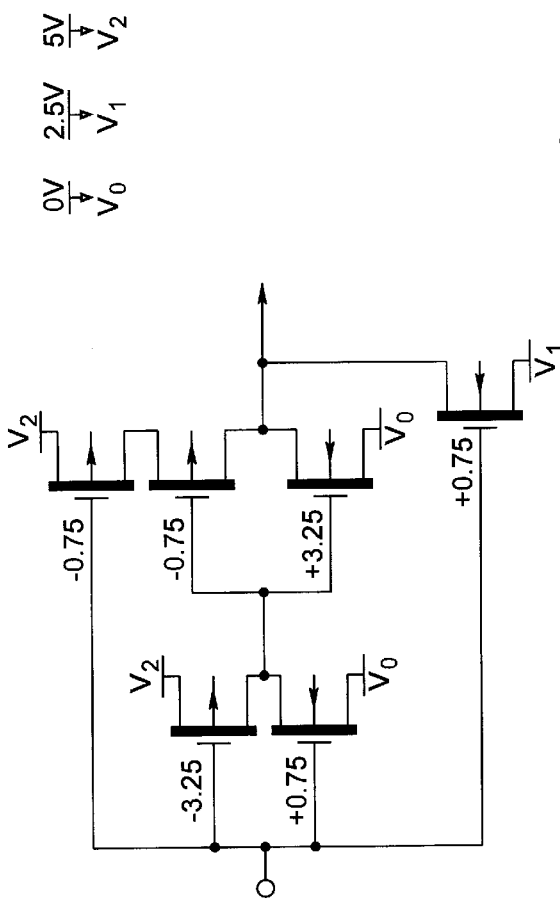
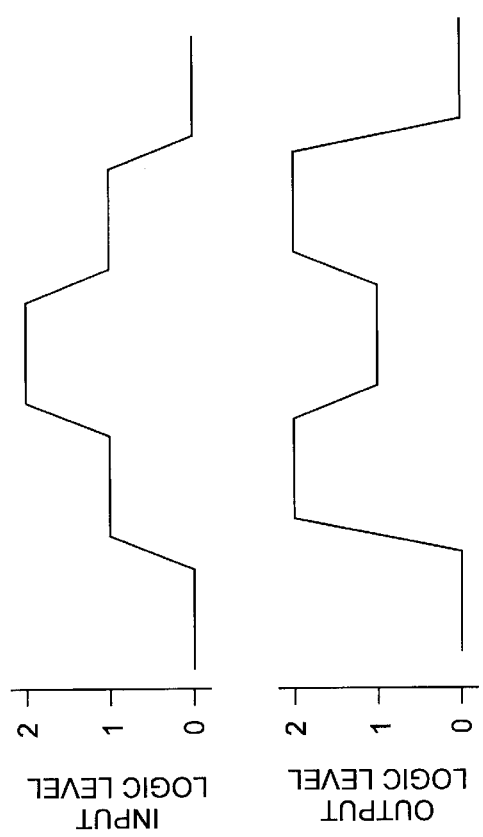
Fig. 56:
Fig. 57:
Fig. 58:

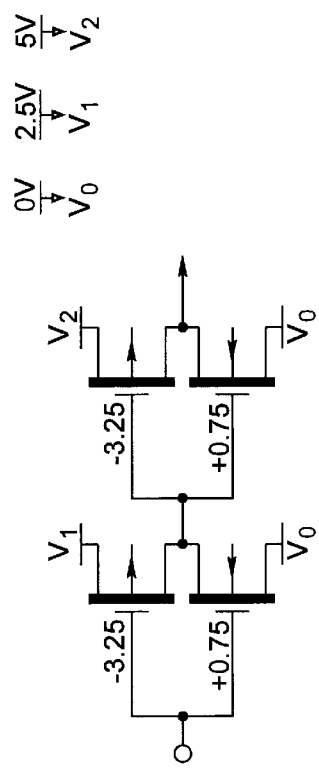
Fig. 59:
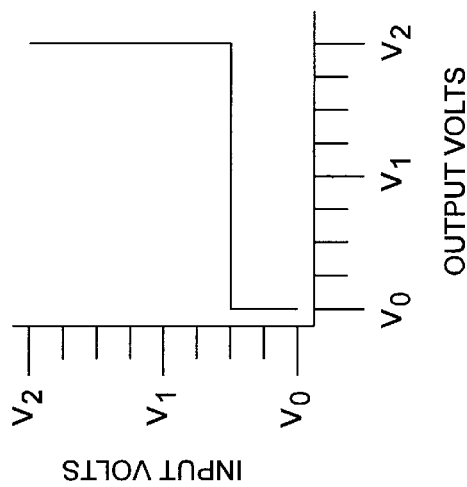
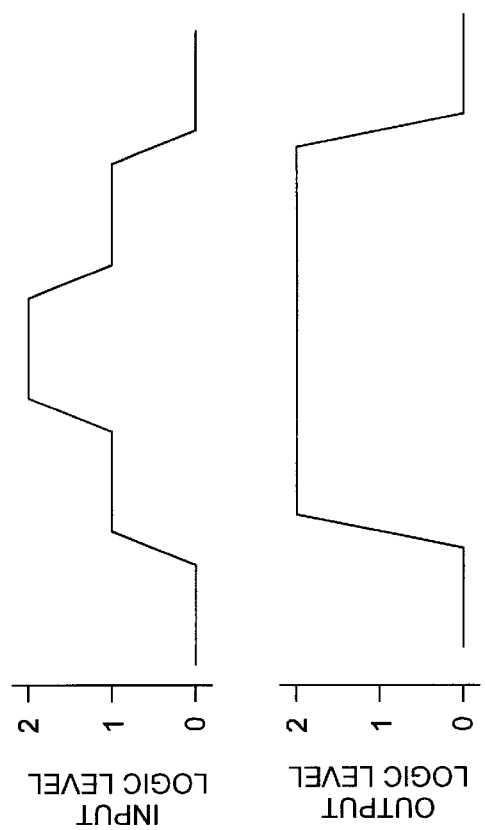
Fig. 60:
Fig. 61:

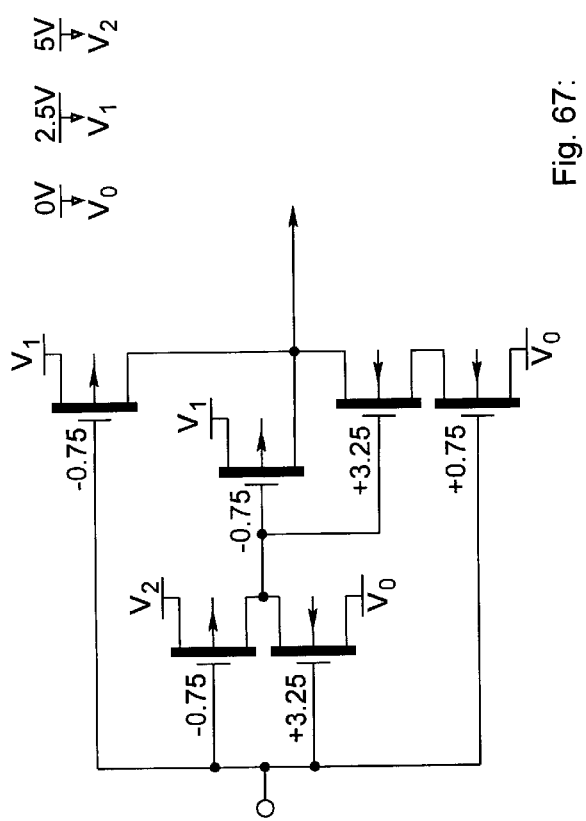
Fig. 65:
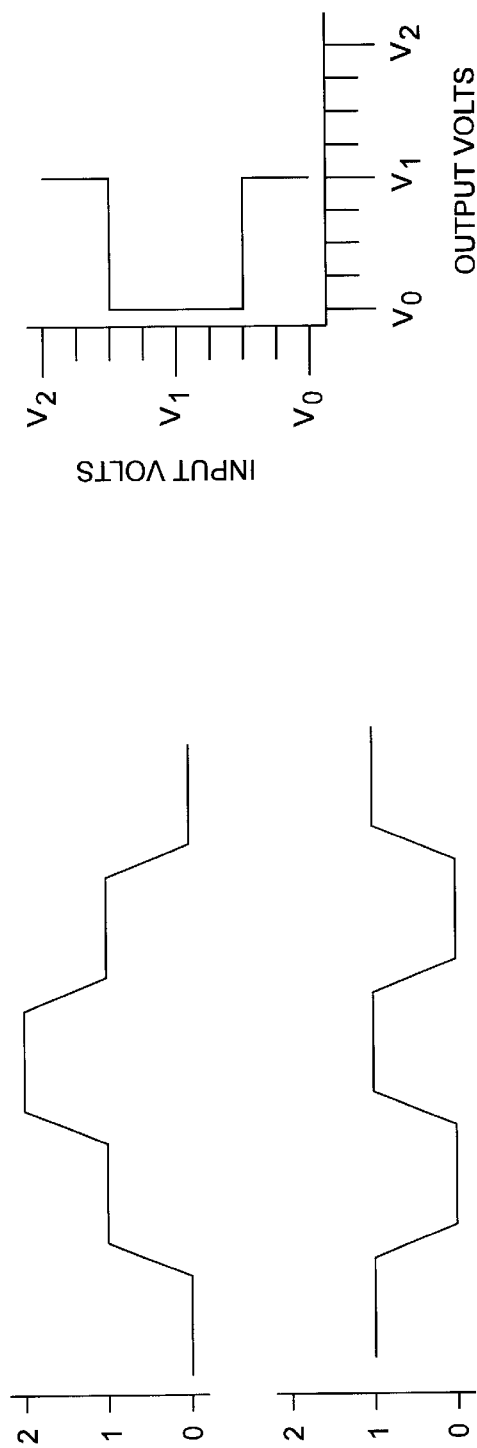
Fig. 67:
Fig. 66:

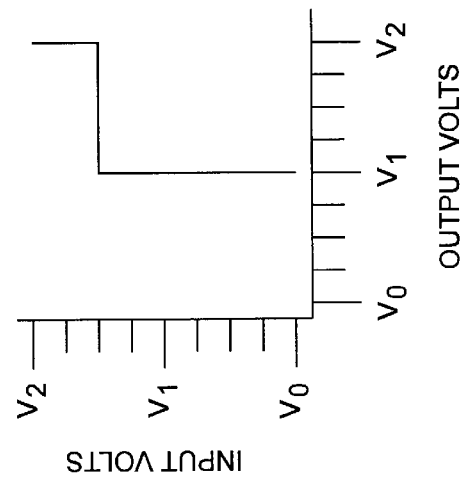
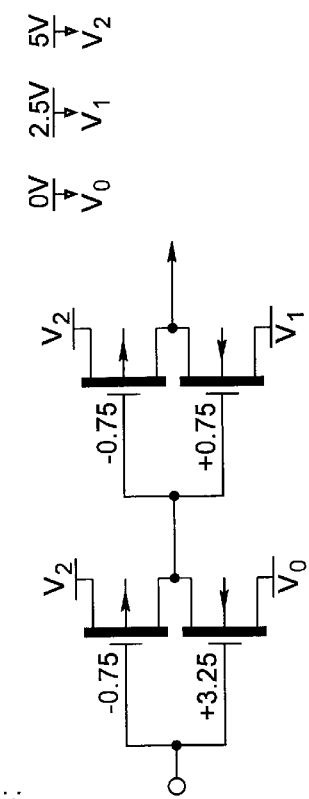
Fig. 74:
Fig. 75:
Fig. 76:

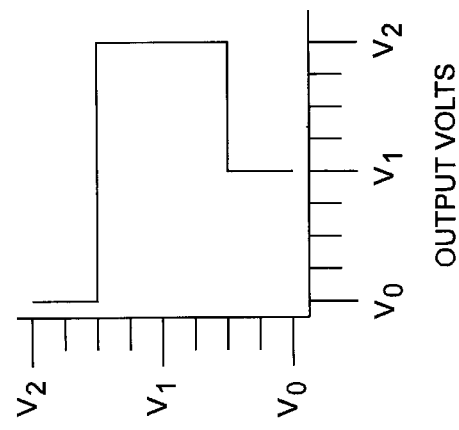
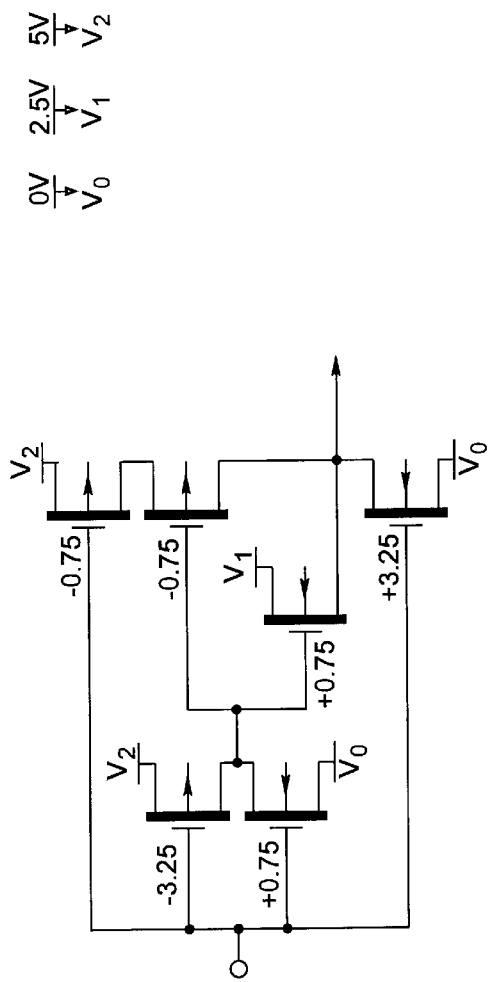
Fig. 77:
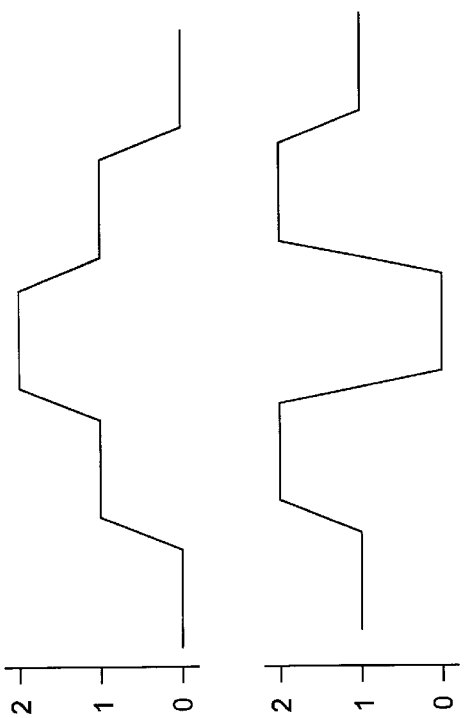
Fig. 79:
Fig. 78:

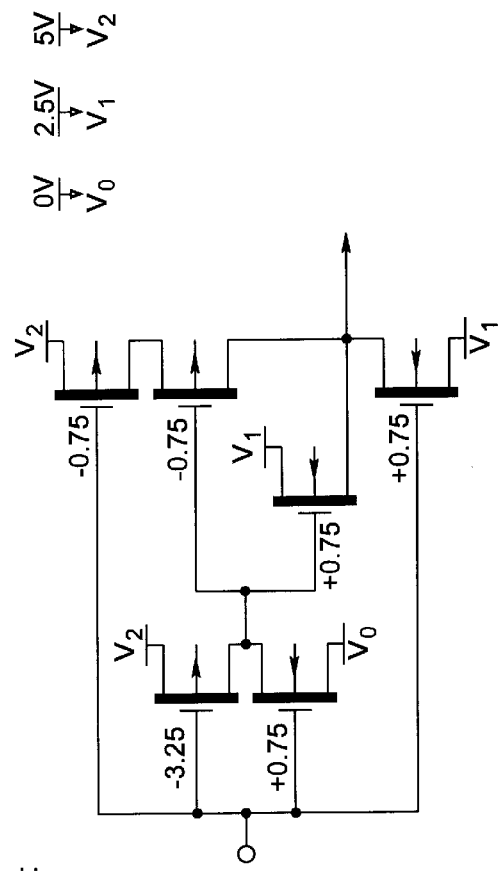
Fig. 80:
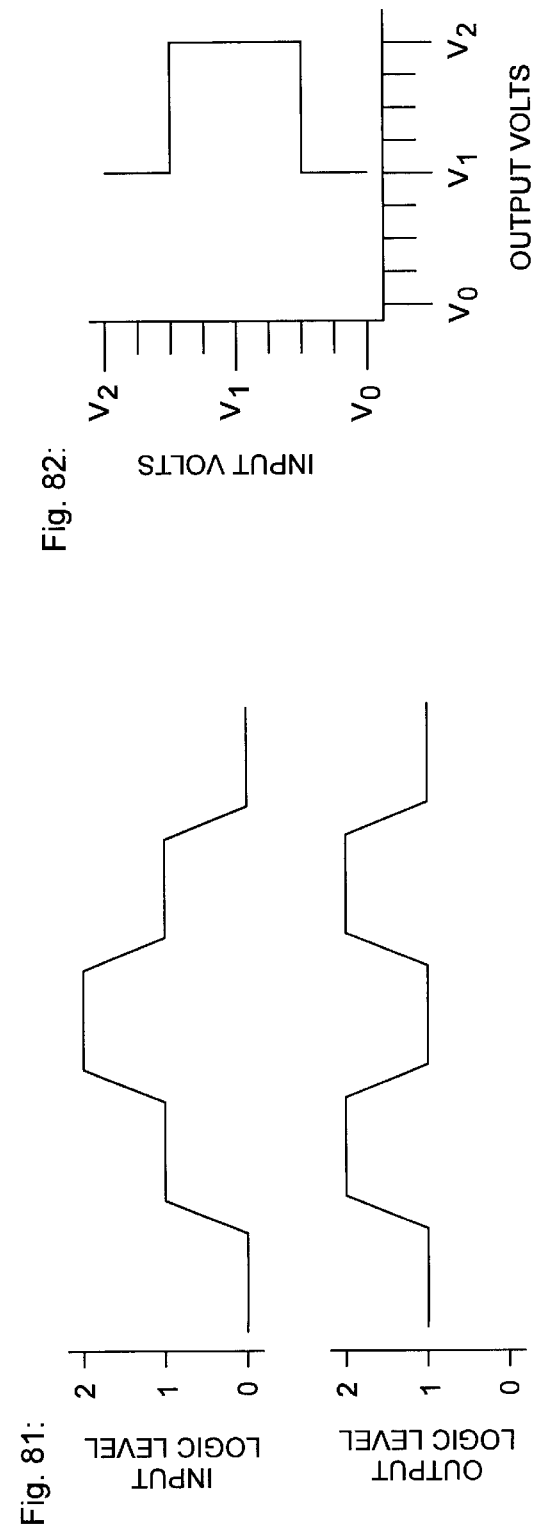
Fig. 82:
Fig. 81:

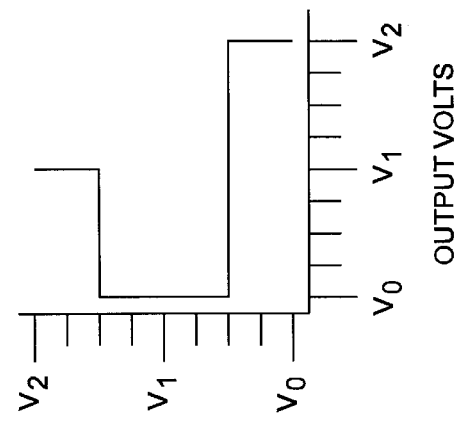
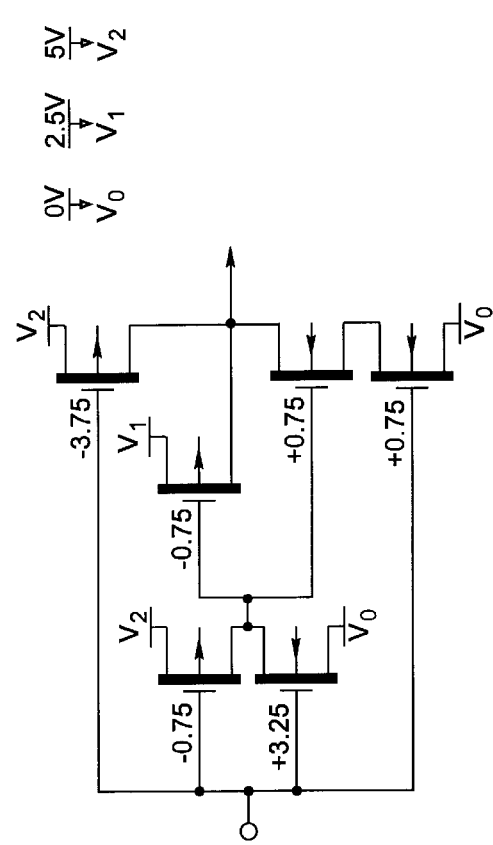
Fig. 89:
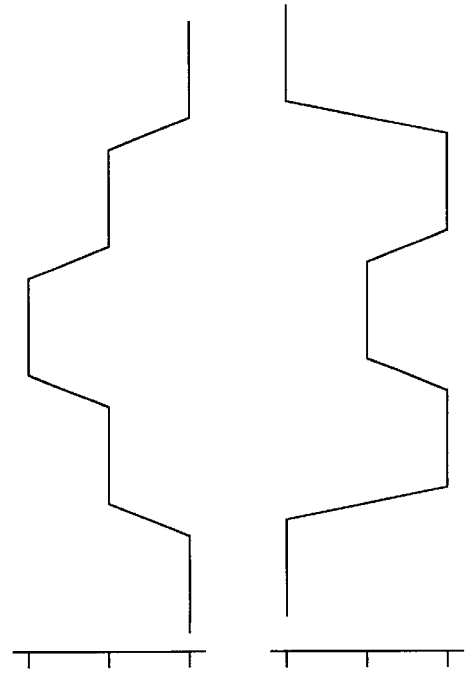
Fig. 91:
Fig. 90:

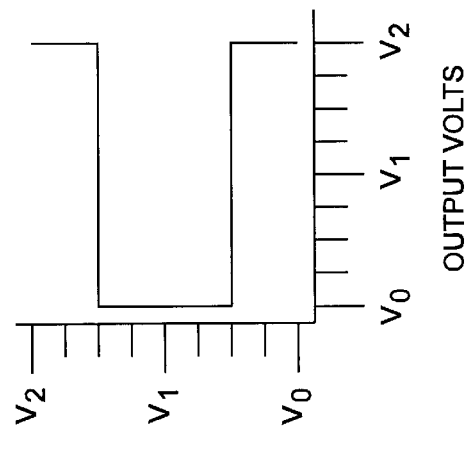
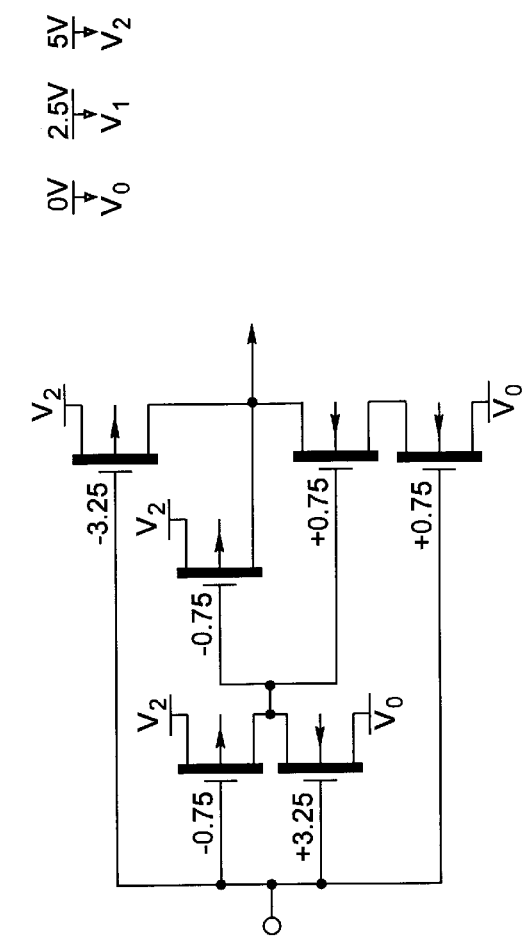
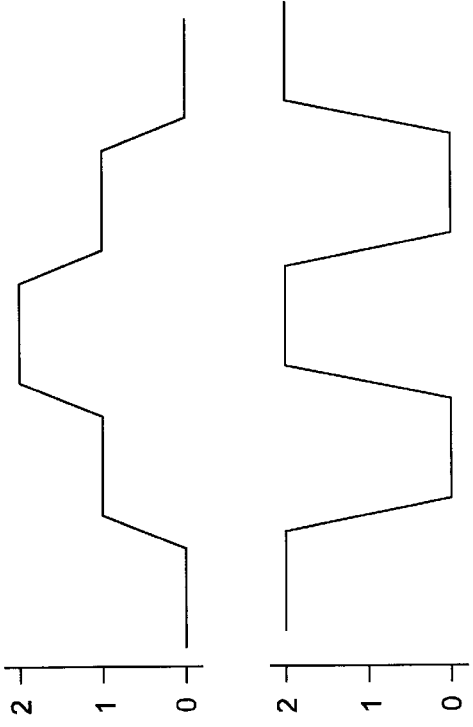
Fig. 92:
Fig. 93:
Fig. 94:

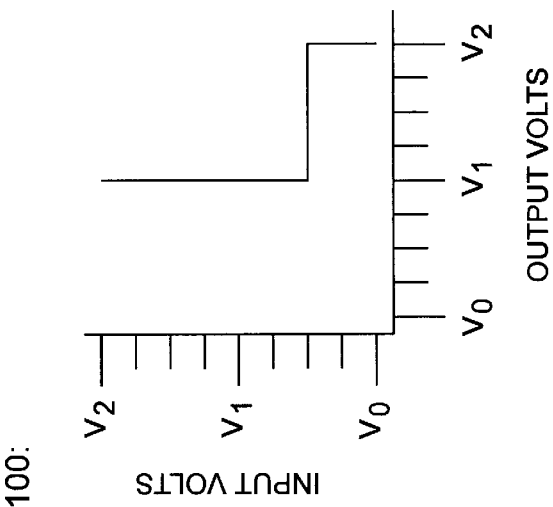
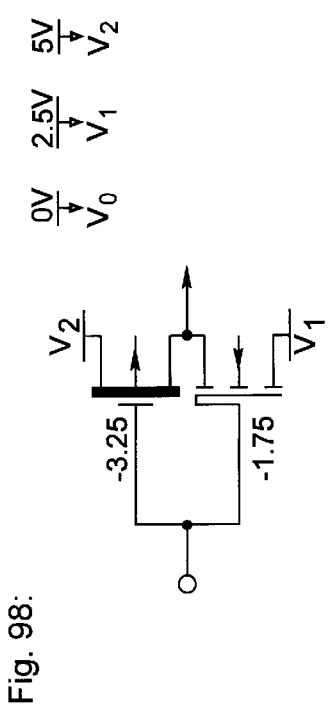
Fig. 98:
Fig. 99:
Fig. 100:

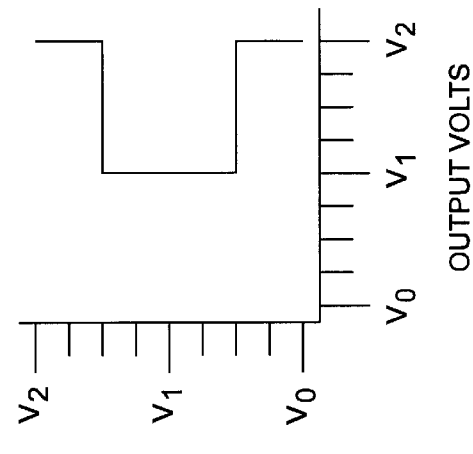
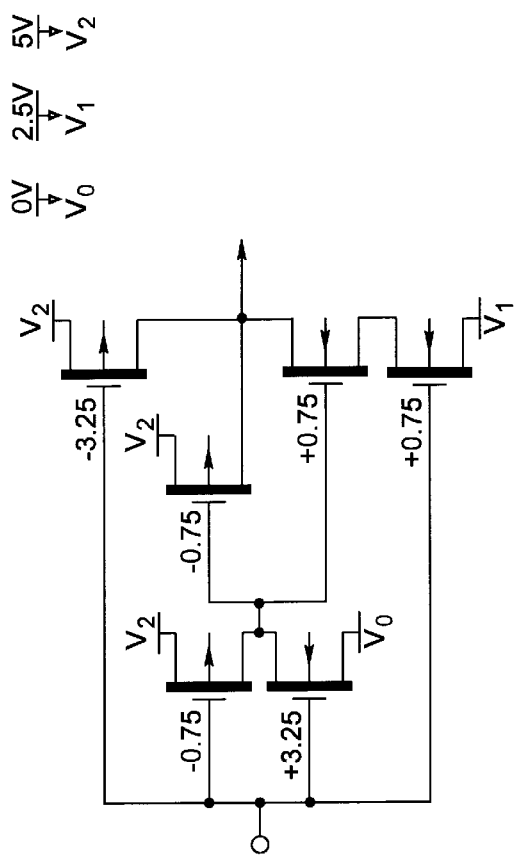
Fig. 101:
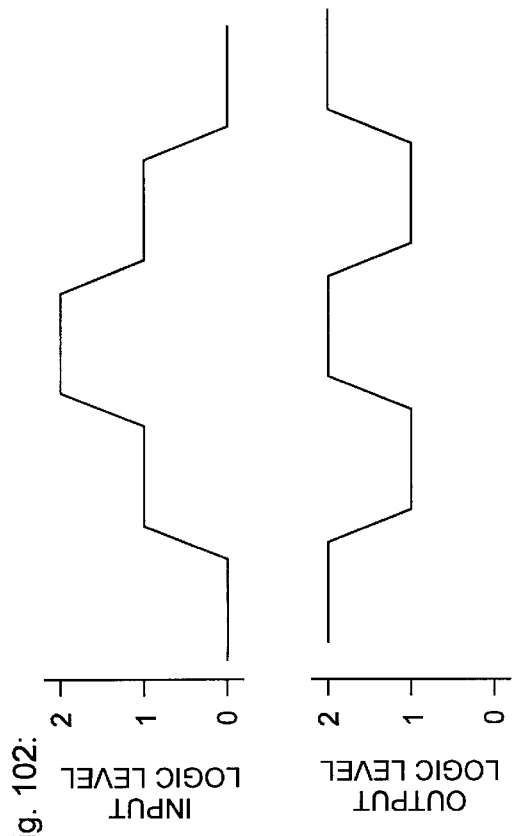
Fig. 102:
Fig. 103:

Fig. 115:
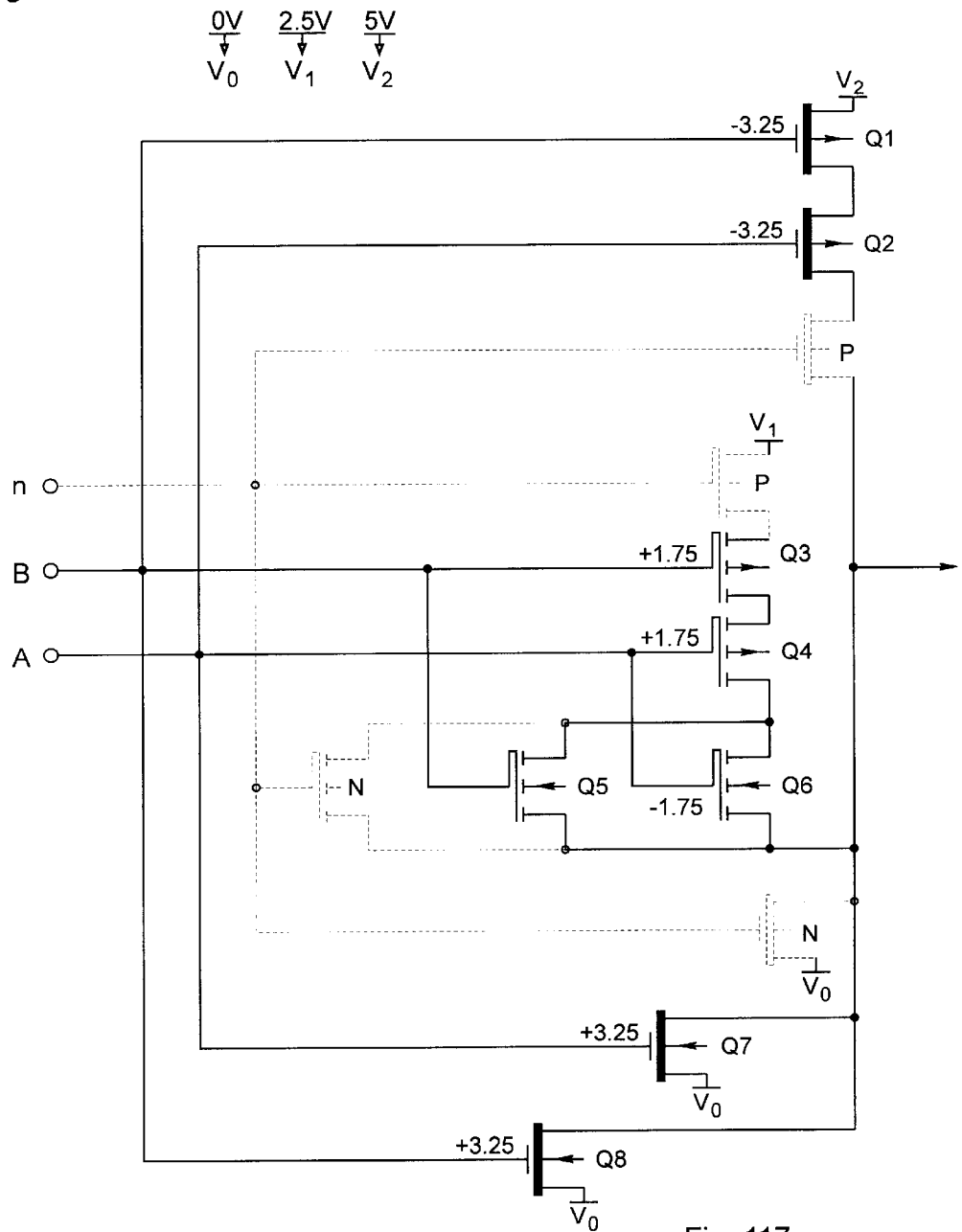
Fig. 116:
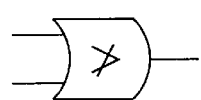
Fig. 117:
|   | A |   |   |
|---|---|---|---|
|   | 0 | 1 | 2 |
| B 0 | 2 | 1 | 0 |
| 1 | 1 | 1 | 0 |
| 2 | 0 | 0 | 0 |

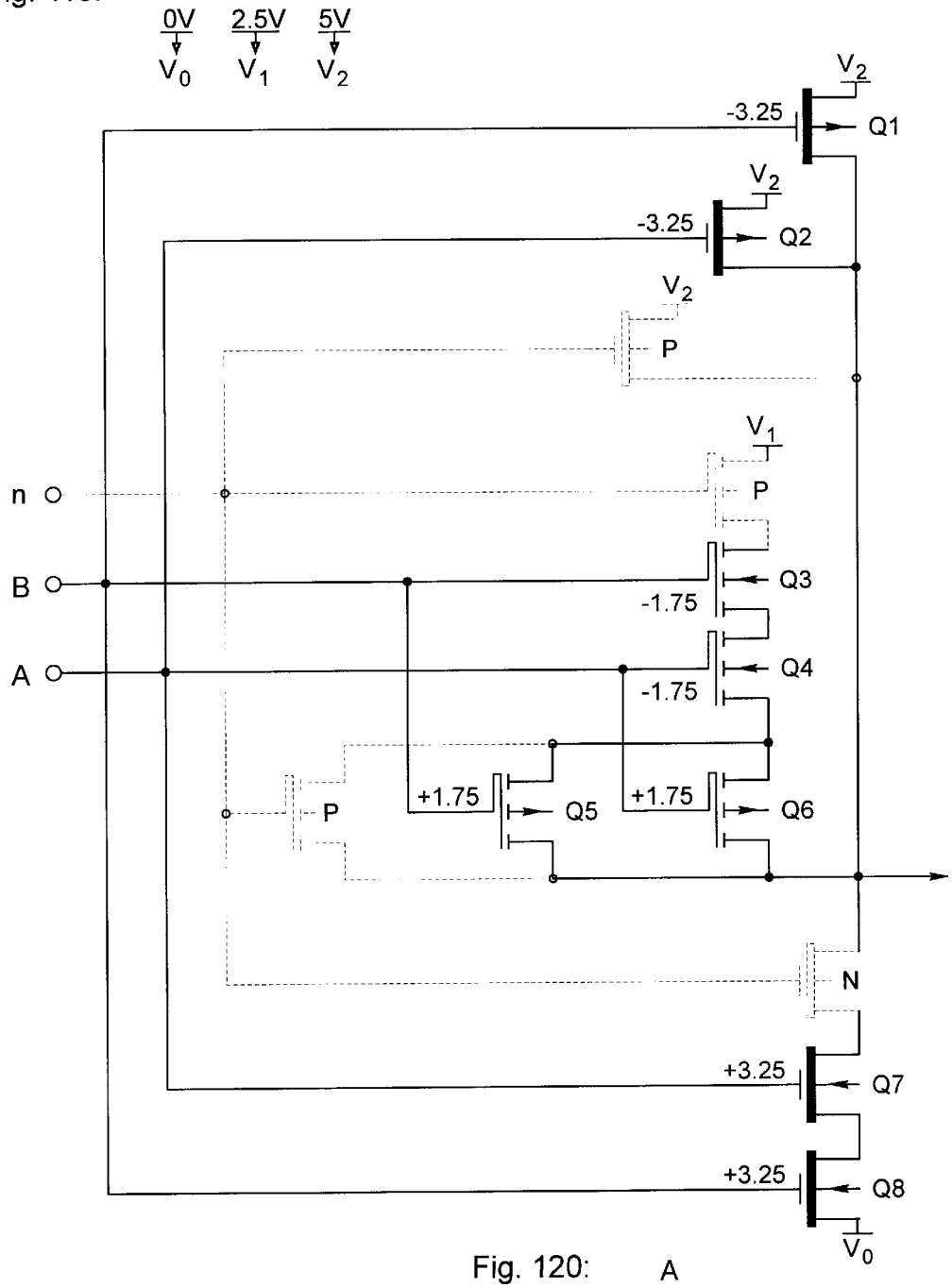
Fig. 118:
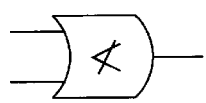
Fig. 119:
Fig. 120:

0V 2V 4V 6V 8V
↓ ↓ ↓ ↓ ↓
$V_0$ $V_1$ $V_2$ $V_3$ $V_4$

Fig. 124:
$0V \quad 2V \quad 4V \quad 6V \quad 8V$
$V_0 \quad V_1 \quad V_2 \quad V_3 \quad V_4$
Fig. 125:
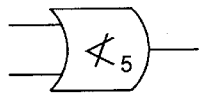
Fig. 126:
|   |   | A |   |   |   |   |
|---|---|---|---|---|---|---|
|   |   | 0 | 1 | 2 | 3 | 4 |
|   | 0 | 4 | 4 | 4 | 4 | 4 |
|   | 1 | 4 | 3 | 3 | 3 | 3 |
| B | 2 | 4 | 3 | 2 | 2 | 2 |
|   | 3 | 4 | 3 | 2 | 1 | 1 |
|   | 4 | 4 | 3 | 2 | 1 | 0 |
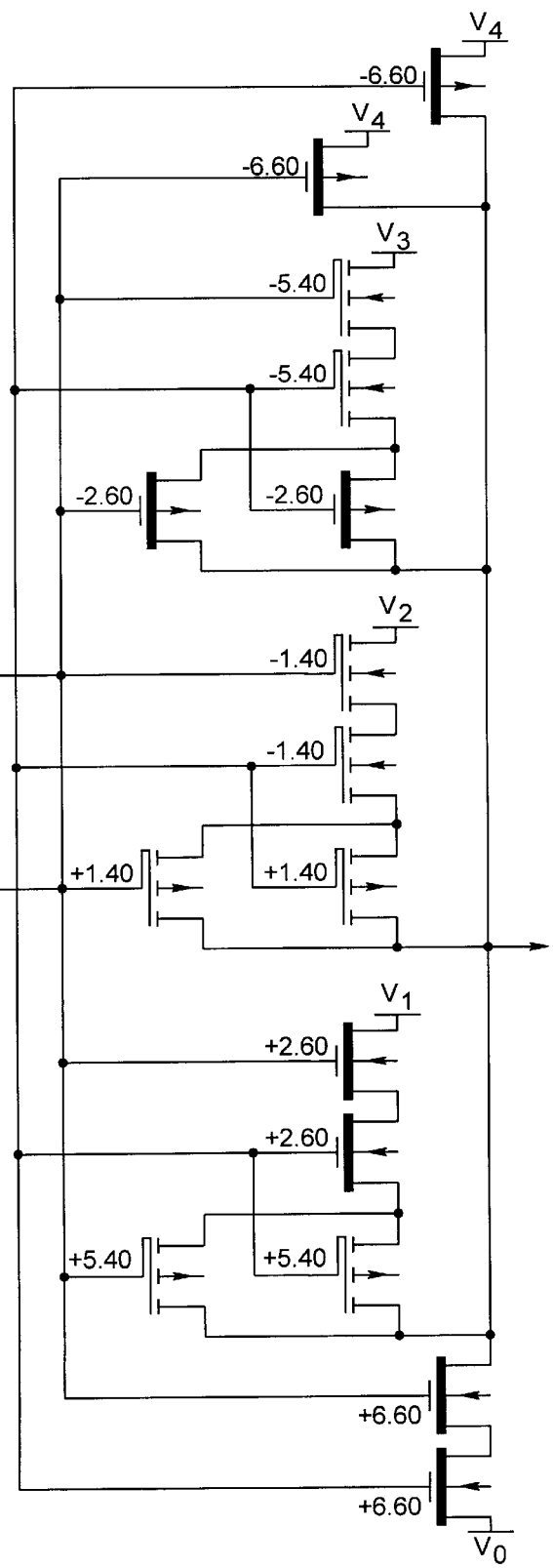

Fig. 129:
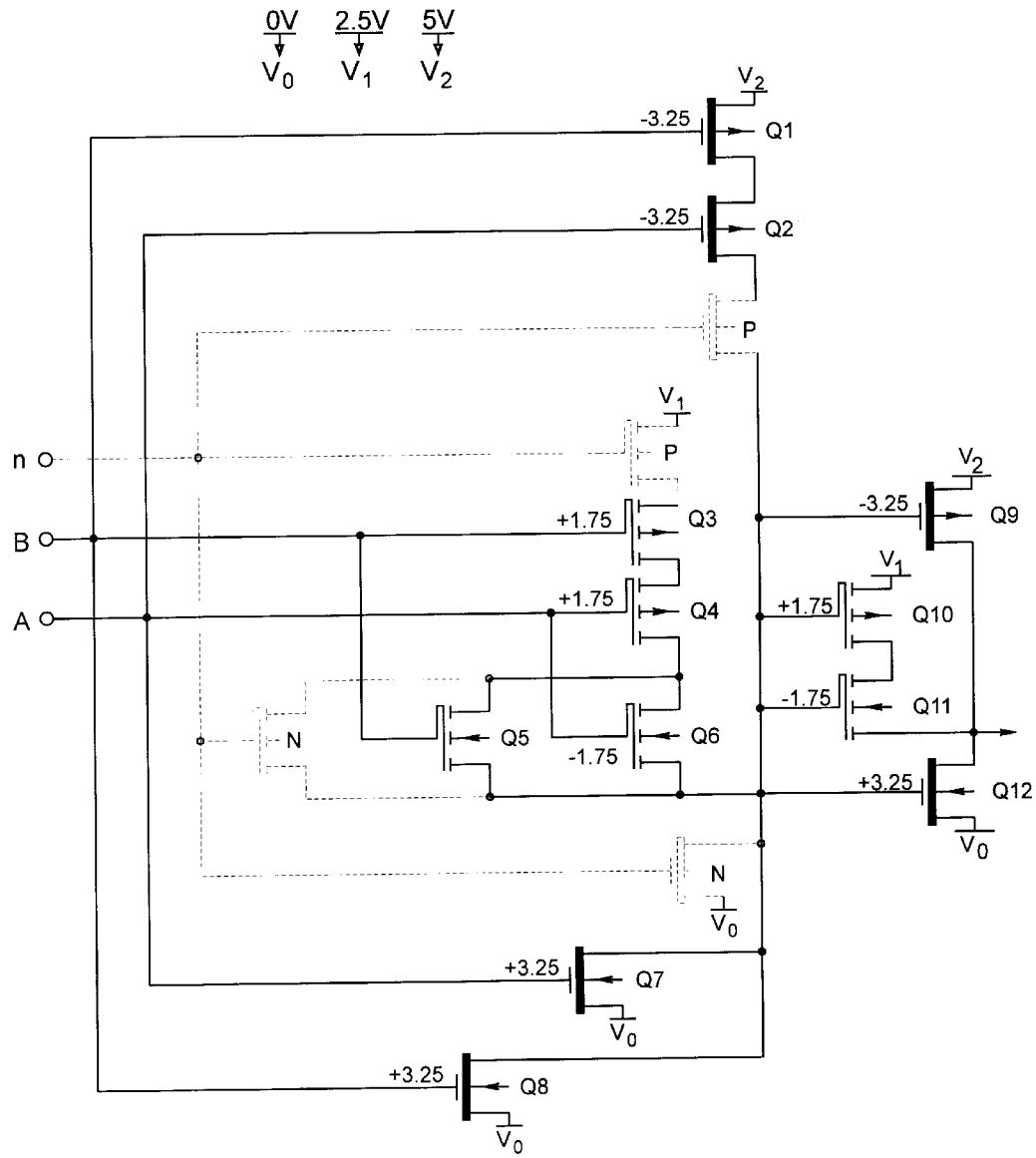
Fig. 130:
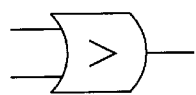
Fig. 131:
|   | A |   |   |
|---|---|---|---|
|   | 0 | 1 | 2 |
| B 0 | 0 | 1 | 2 |
| B 1 | 1 | 1 | 2 |
| B 2 | 2 | 2 | 2 |

Fig. 132:
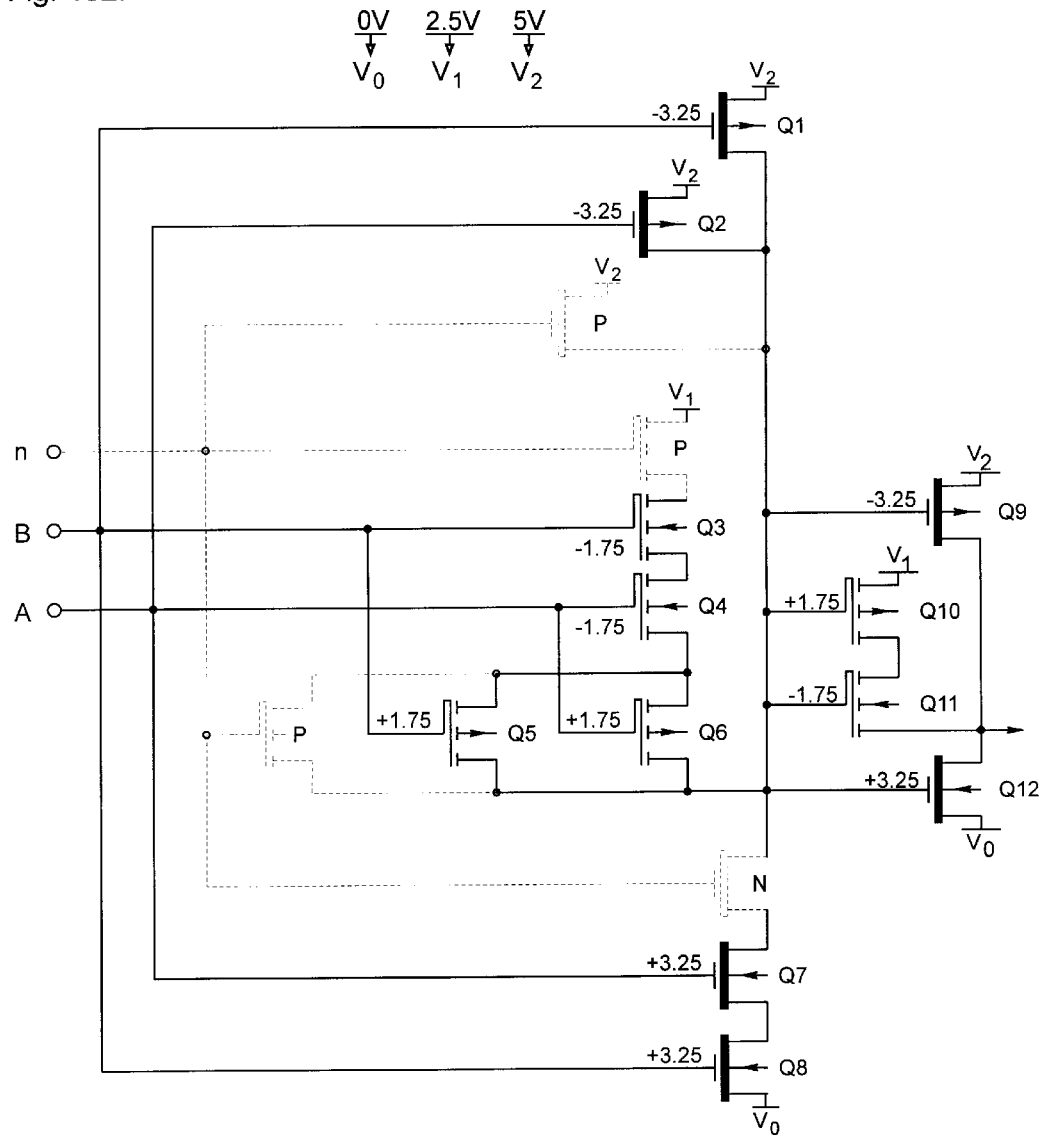
Fig. 133:
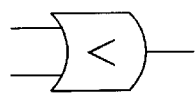
Fig. 134:
|   | A |   |   |
|---|---|---|---|
|   | 0 | 1 | 2 |
| B 0 | 0 | 0 | 0 |
| 1 | 0 | 1 | 1 |
| 2 | 0 | 1 | 2 |

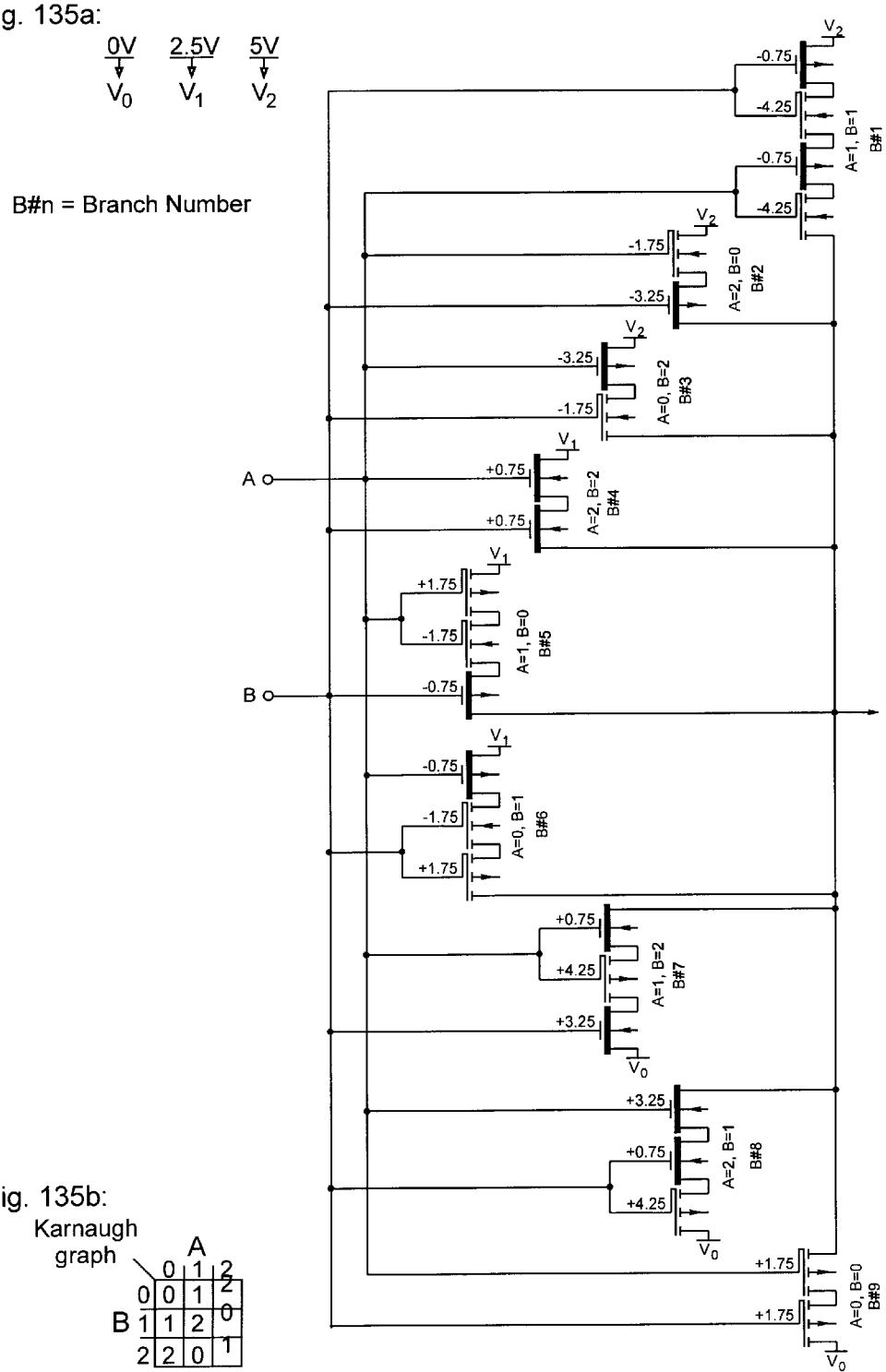

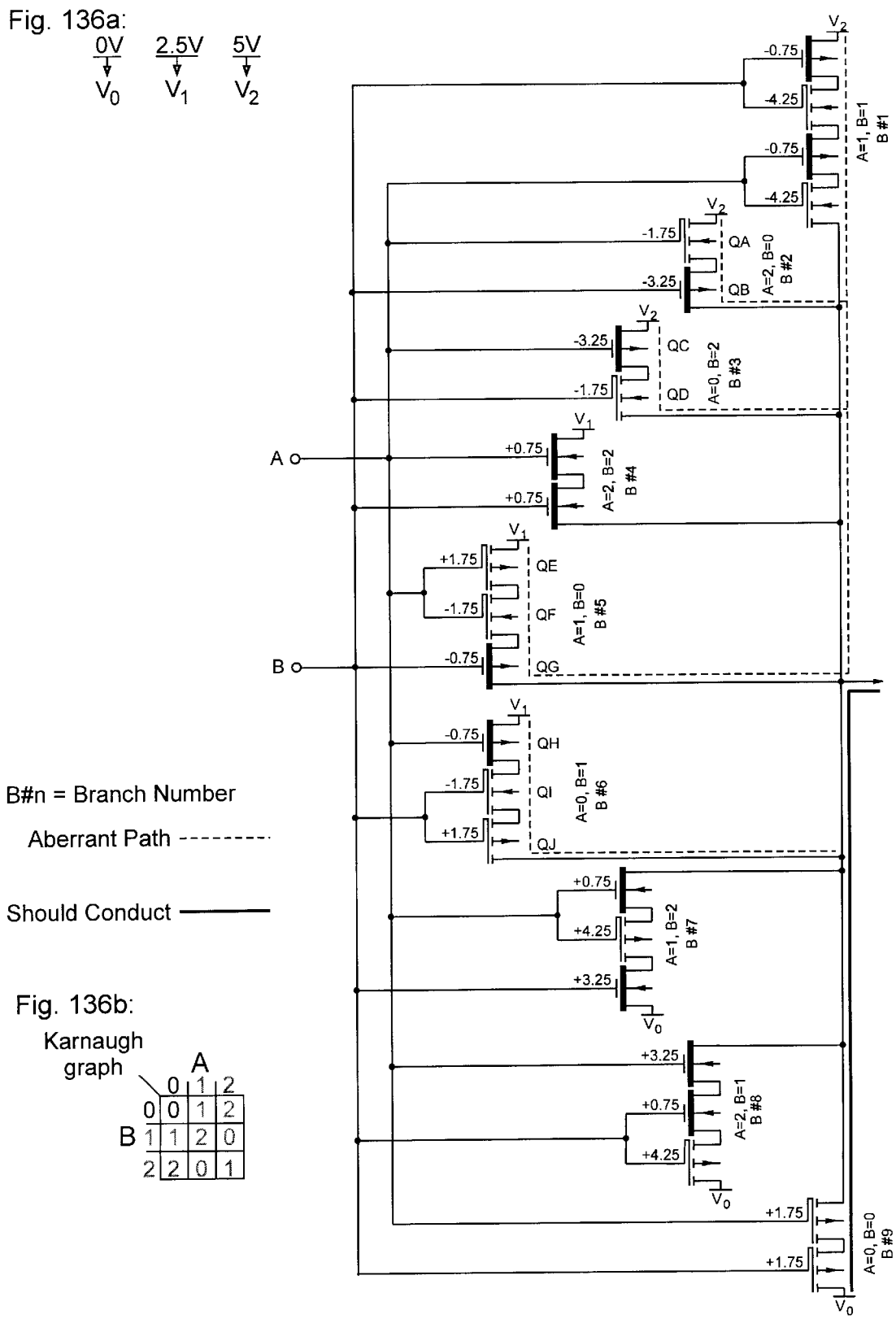

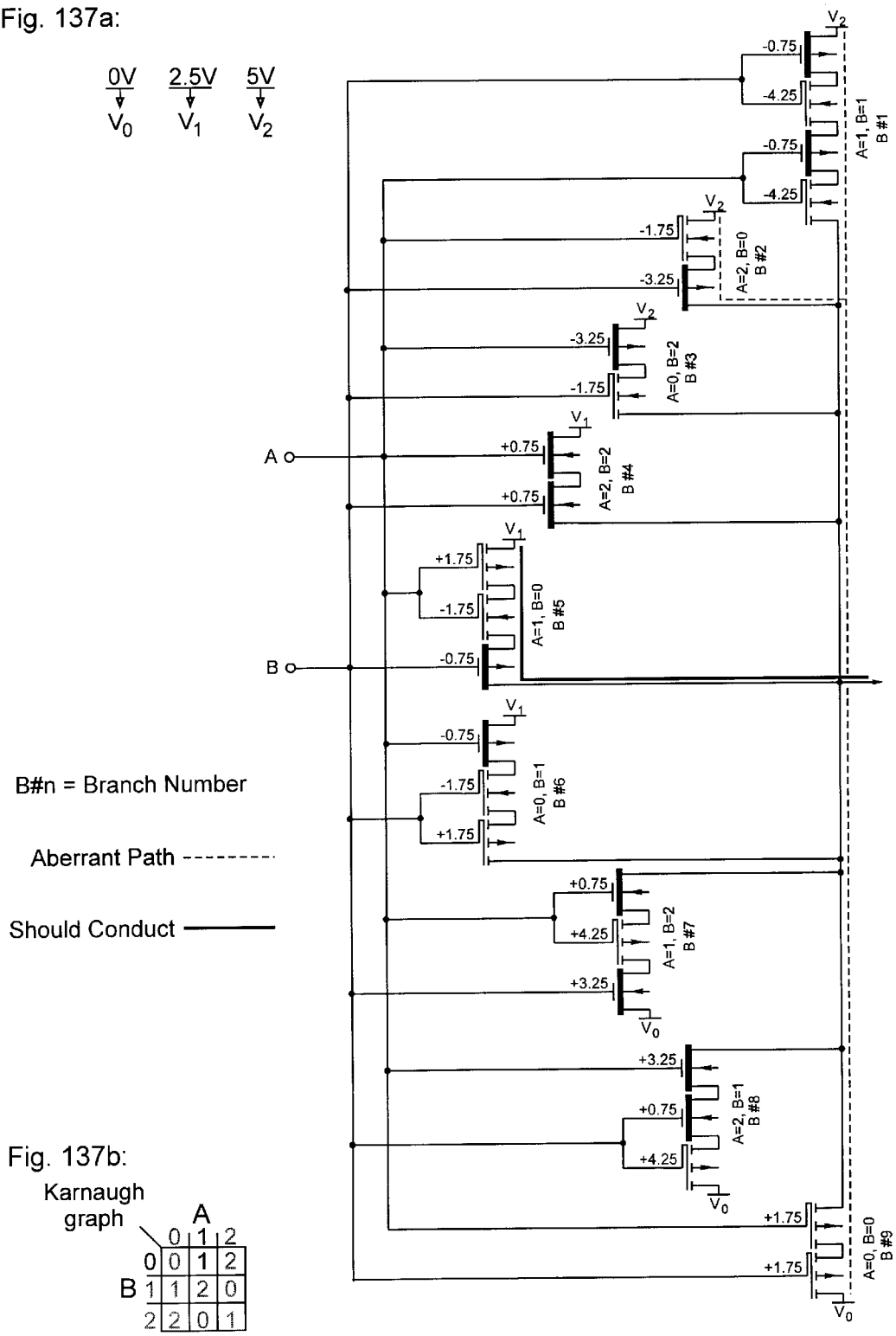

Karnaugh graph

B#n = Branch Number

Aberrant Path - - - - - - - -

Should Conduct ―――

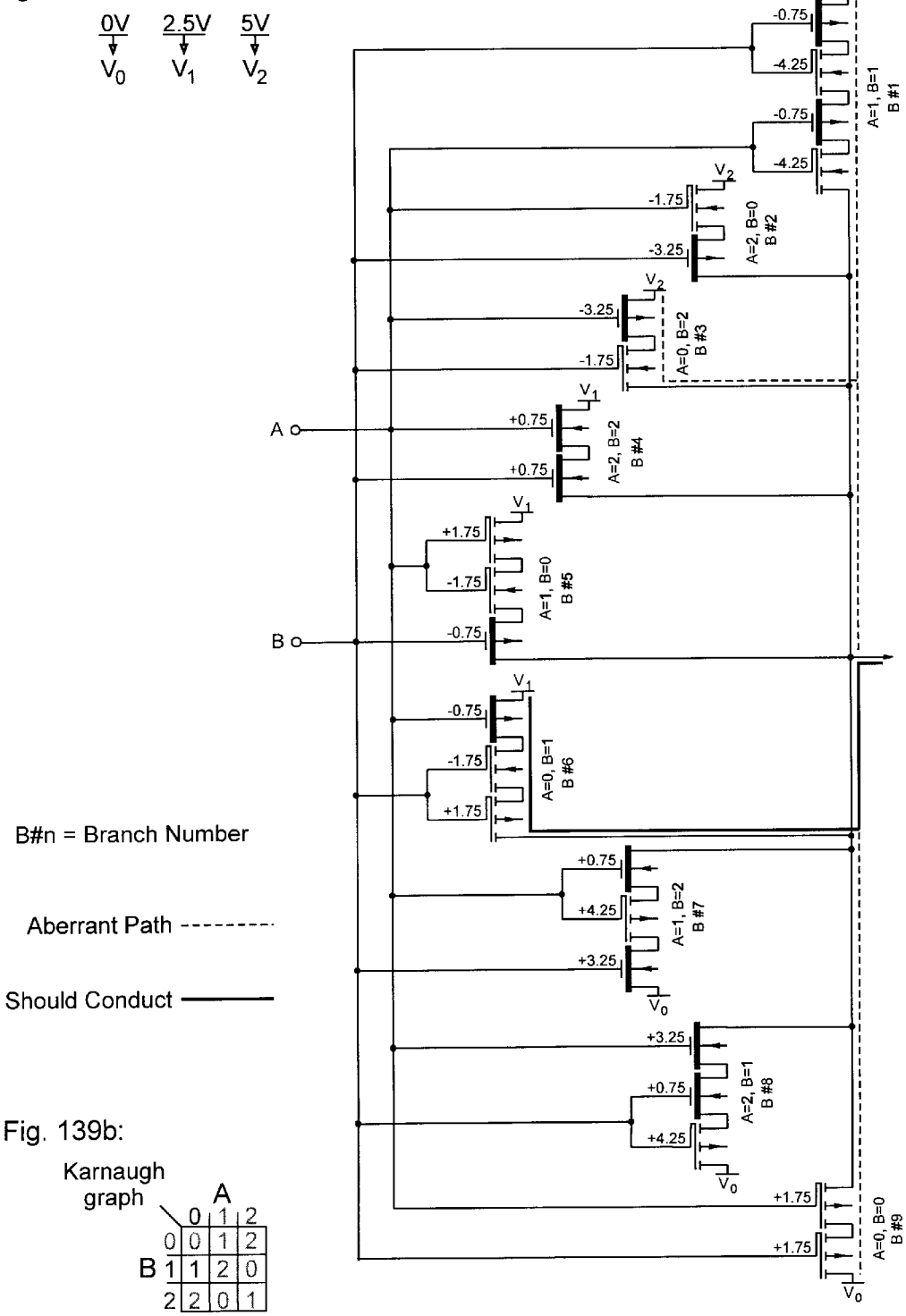

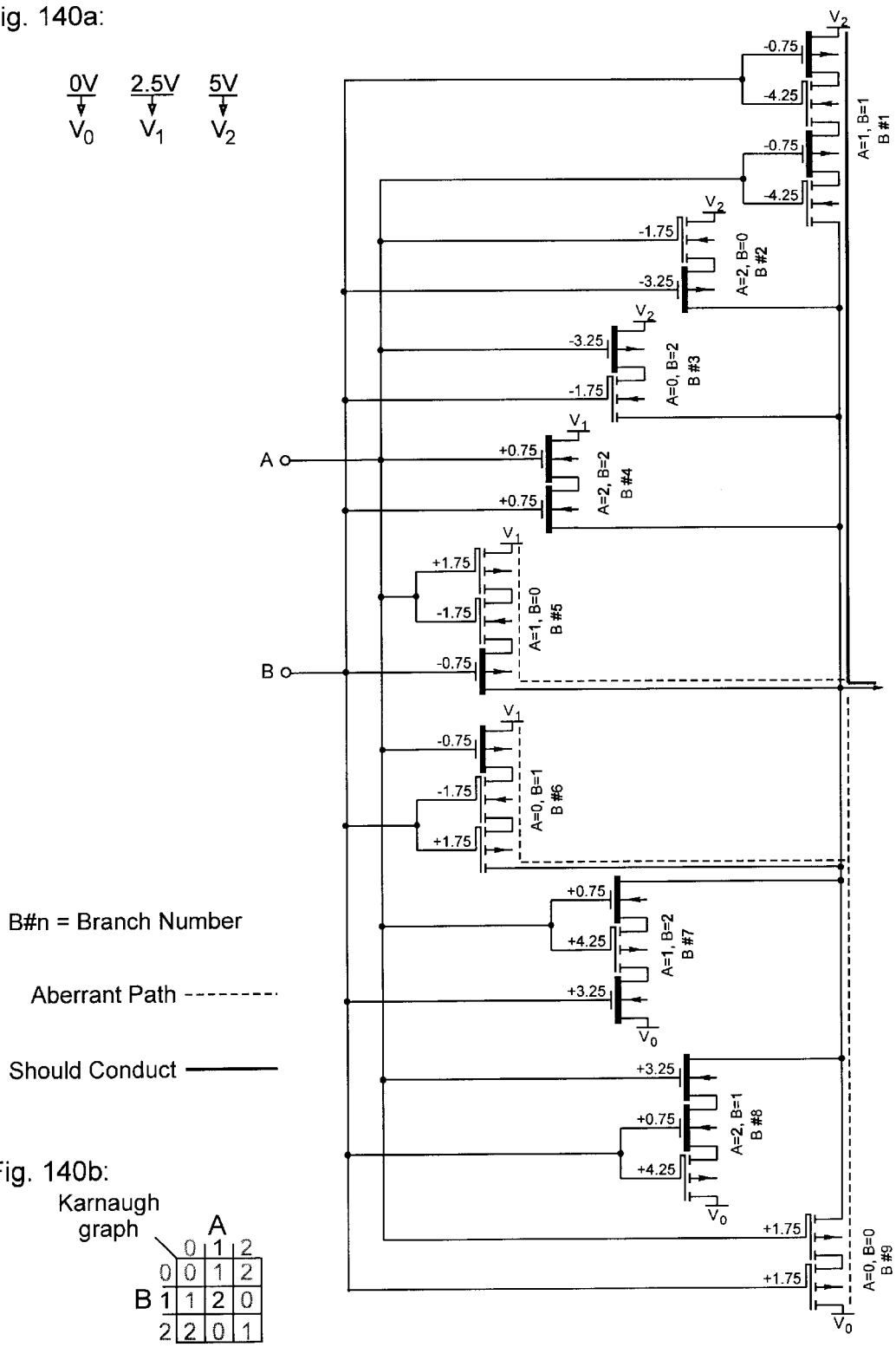

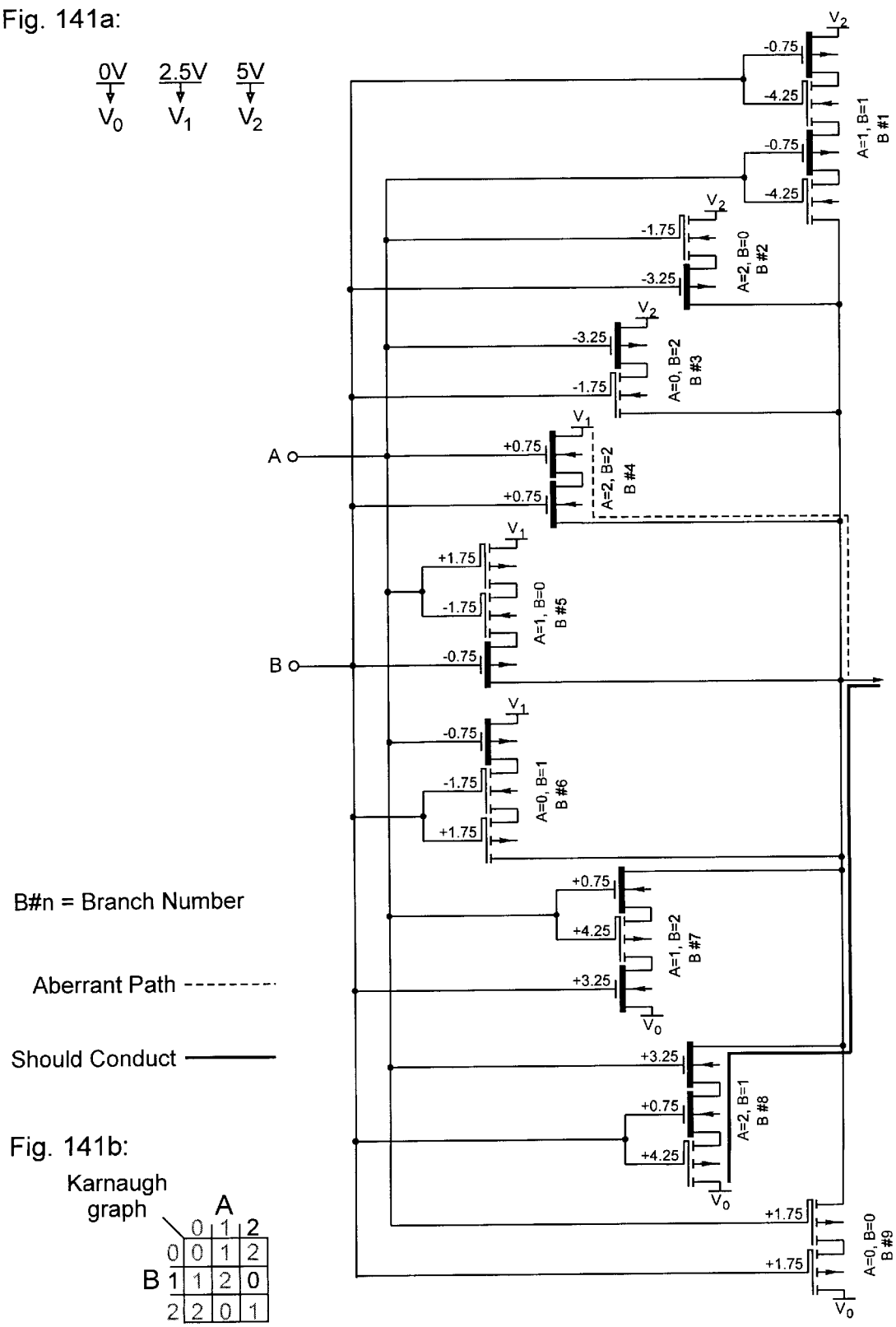

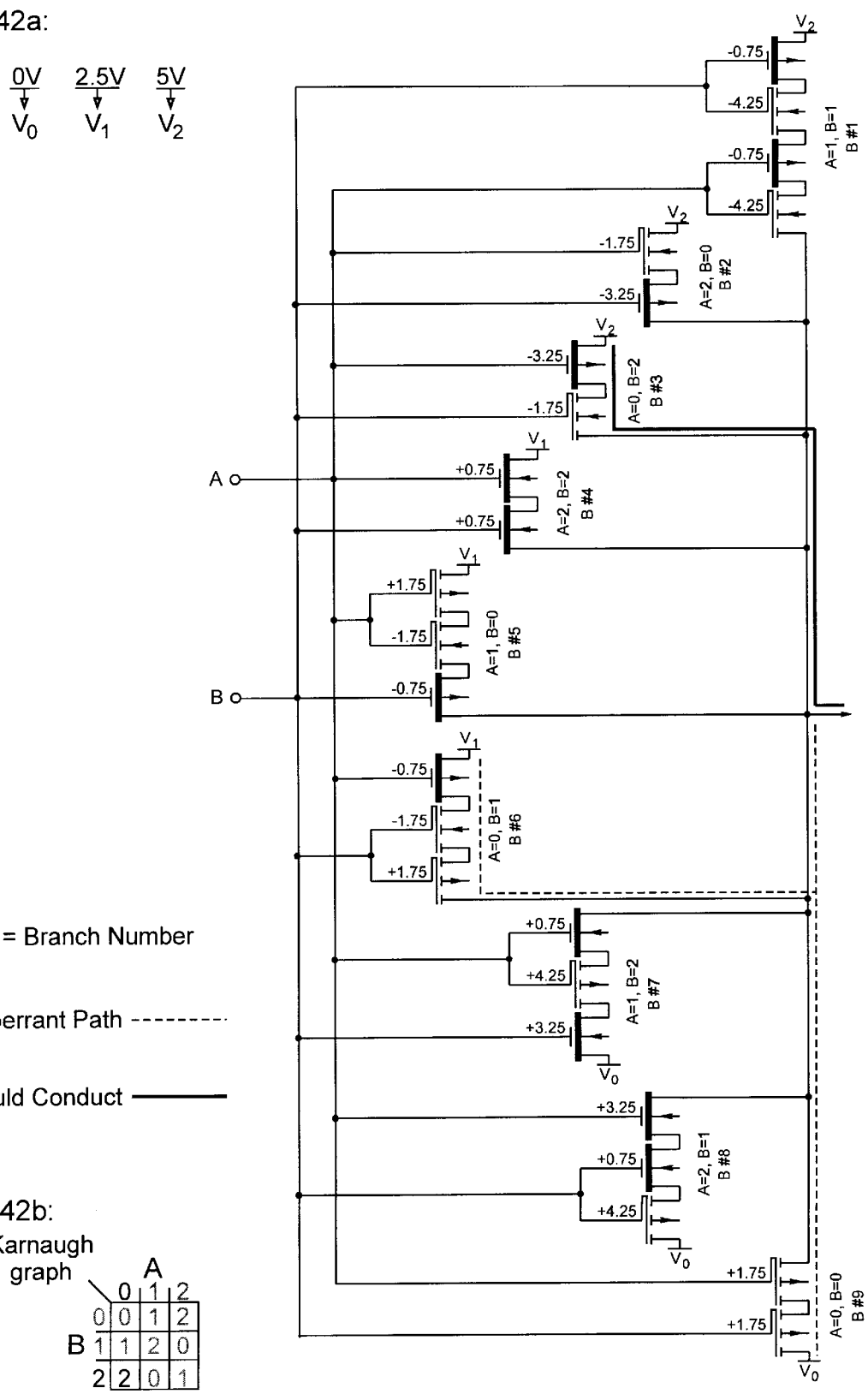

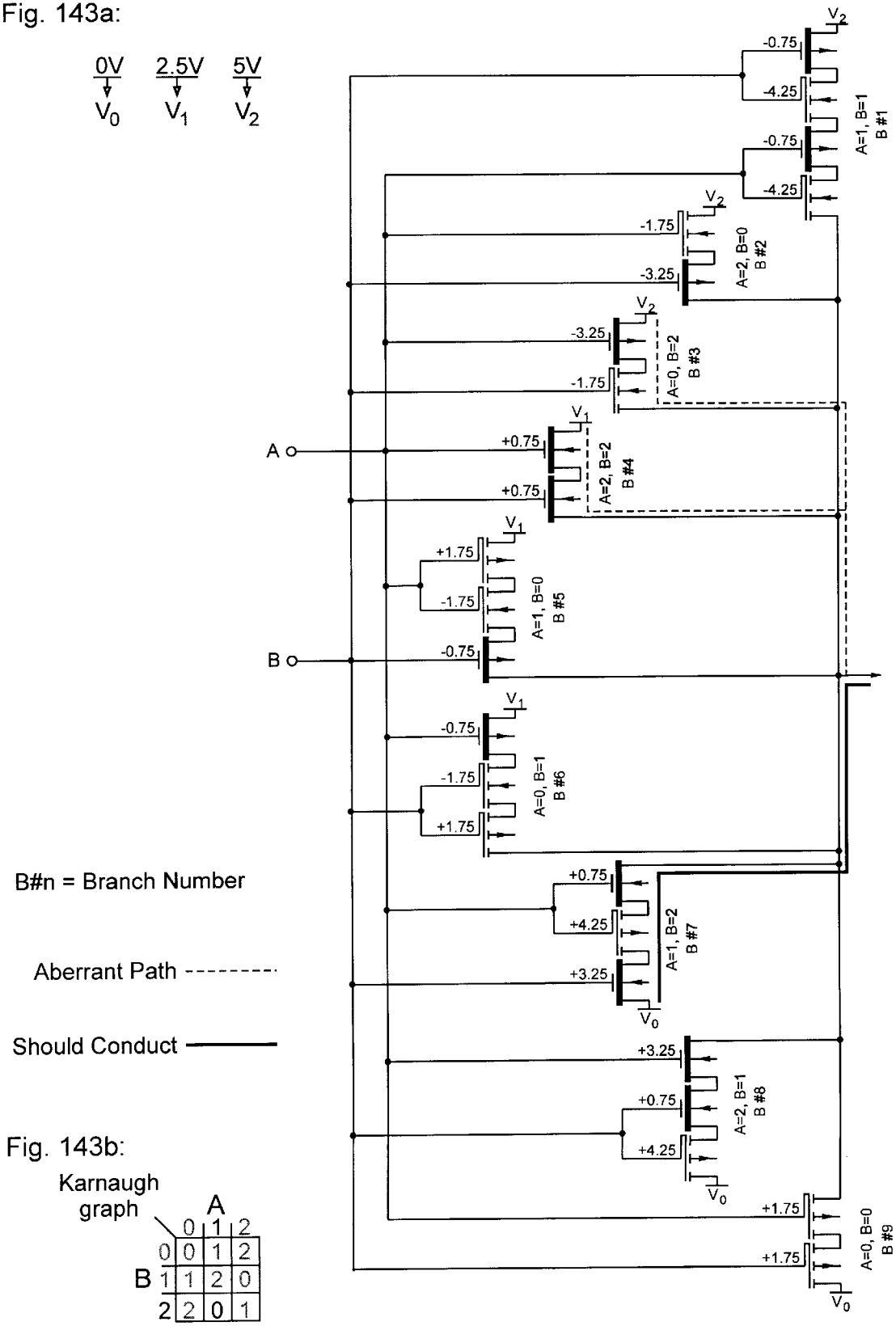

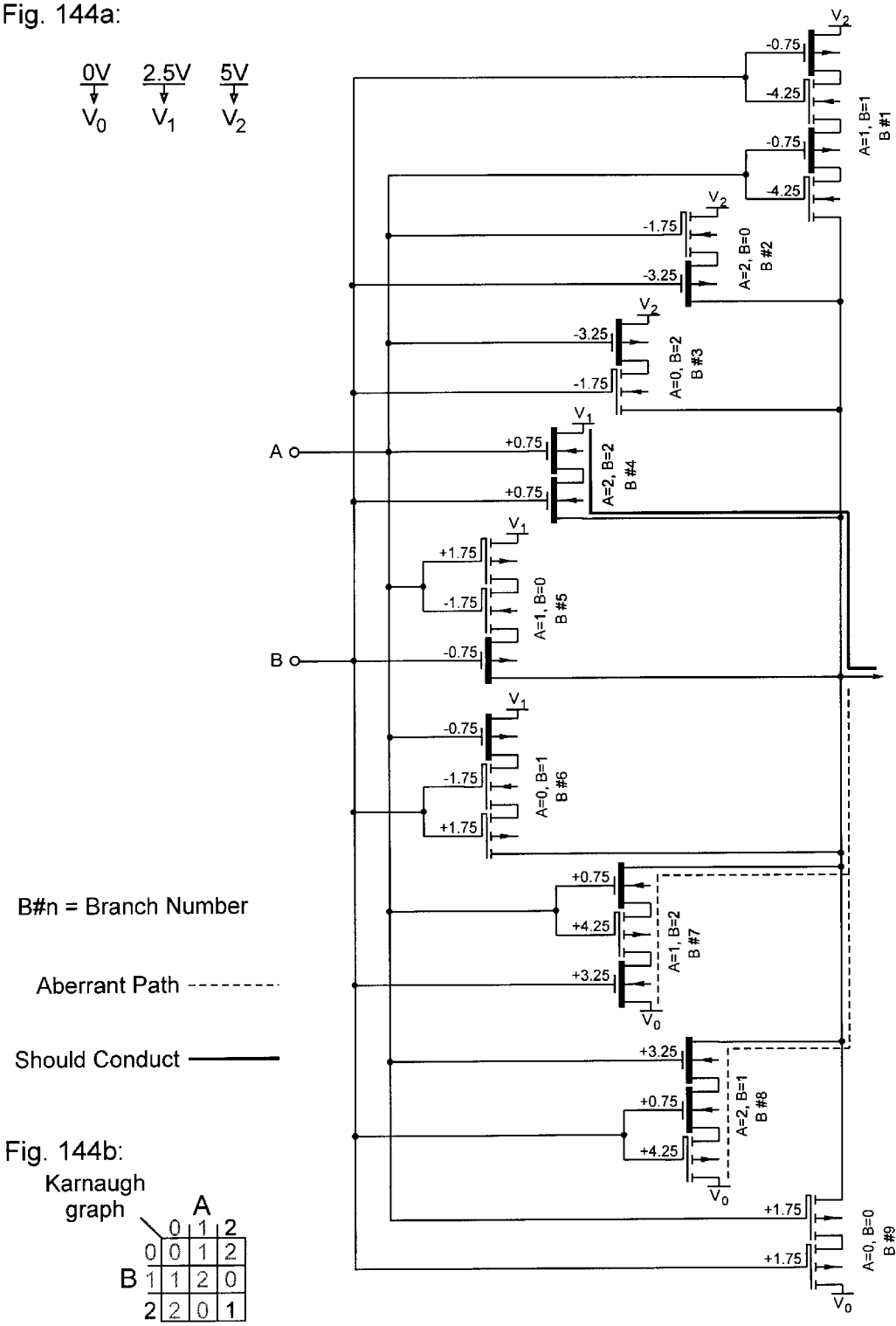

0V → $V_0$
2.5V → $V_1$
5V → $V_2$

B#n = Branch Number

Aberrant Path --------

Should Conduct ———

Karnaugh graph

B#n = Branch Number
* = Not Replaced

From Fig. 155a

|   | A |   |   |
|---|---|---|---|
|   | 0 | 1 | 2 |
| B 0 | 0 | 0 | 0 |
| 1 | 0 | 1 | 0 |
| 2 | 0 | 0 | 2 |

Fig. 165:
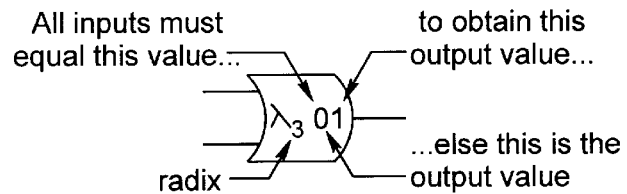
Fig. 166:
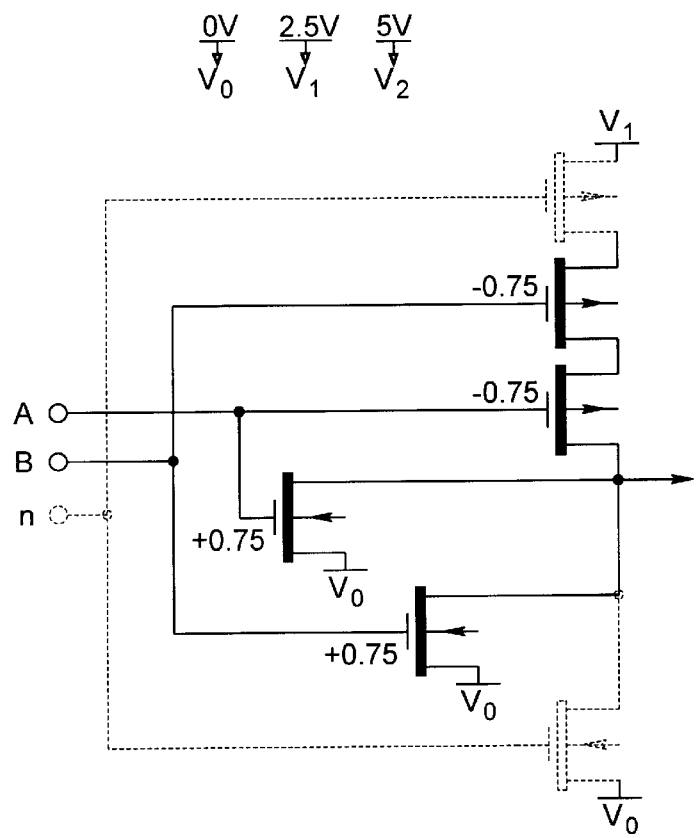
Fig. 167:
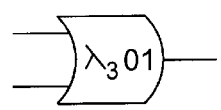
Fig. 168:
|   | A |   |   |
|---|---|---|---|
|   | 0 | 1 | 2 |
| B 0 | 0 | 1 | 1 |
| 1 | 1 | 1 | 1 |
| 2 | 1 | 1 | 1 |

Fig. 169:
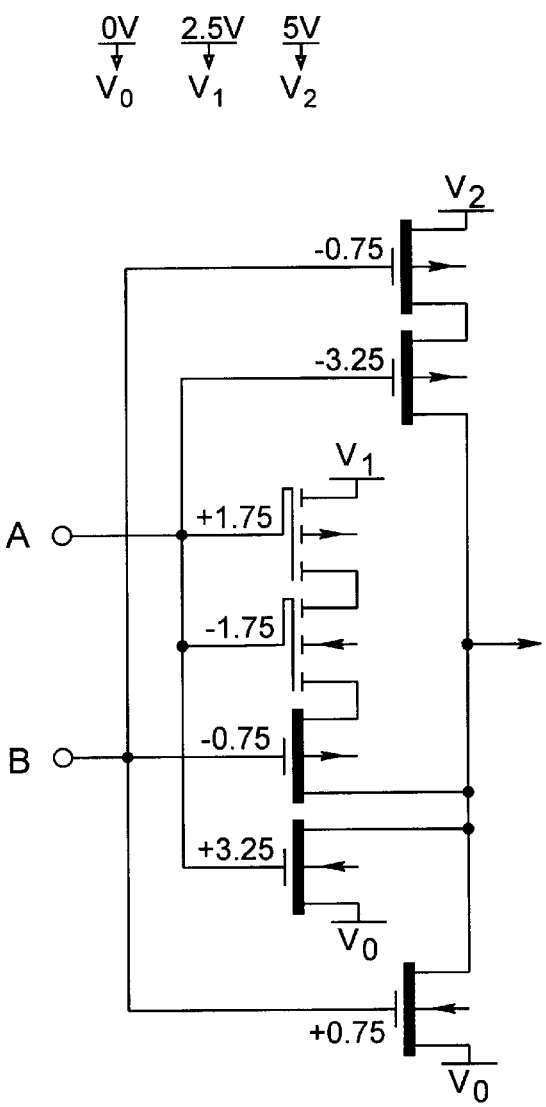
Fig. 170:
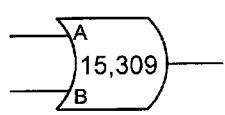
Fig. 171:
|   | A |   |   |
|---|---|---|---|
|   | 0 | 1 | 2 |
| B 0 | 2 | 1 | 0 |
| 1 | 0 | 0 | 0 |
| 2 | 0 | 0 | 0 |

Fig. 172:
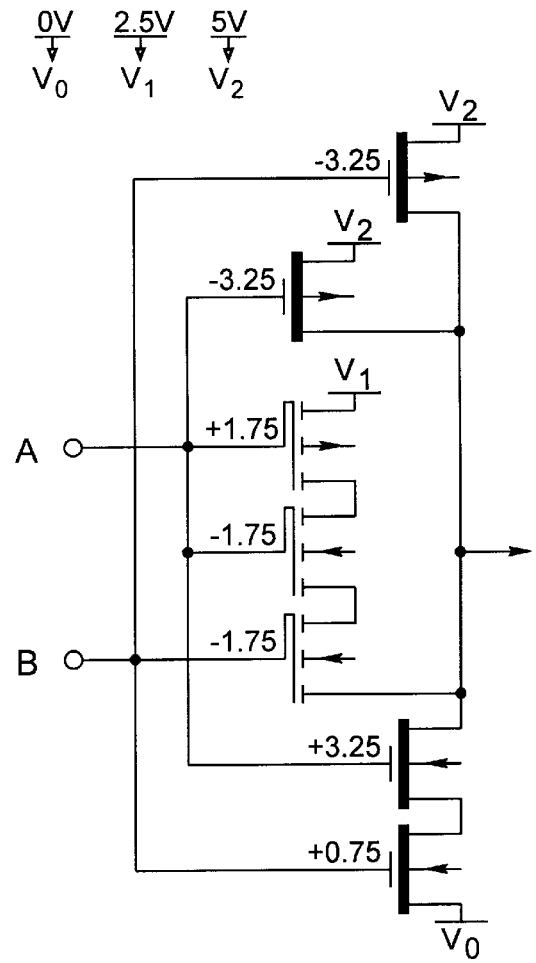
Fig. 173:
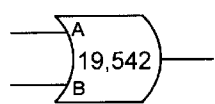
Fig. 174:
|   | A |   |   |
|---|---|---|---|
|   | 0 | 1 | 2 |
| B 0 | 2 | 2 | 2 |
| 1 | 2 | 1 | 0 |
| 2 | 2 | 1 | 0 |

Fig. 175:
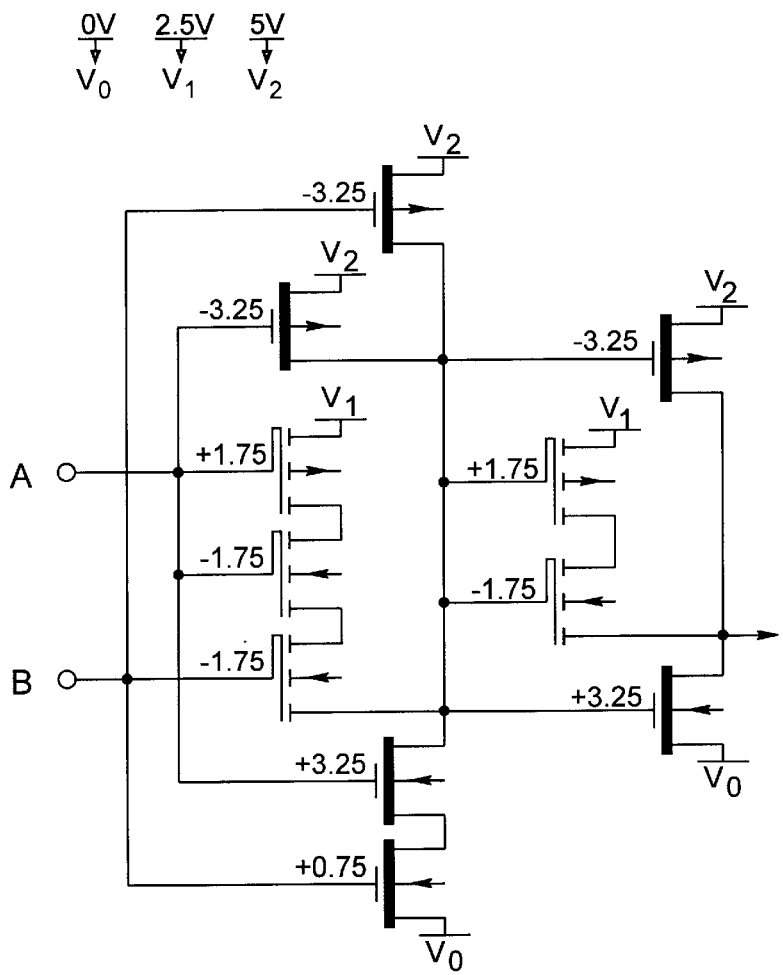
Fig. 176:
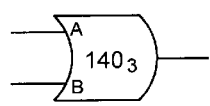
Fig. 177:
|   | A |   |   |
|---|---|---|---|
|   | 0 | 1 | 2 |
| B 0 | 0 | 0 | 0 |
| 1 | 0 | 1 | 2 |
| 2 | 0 | 1 | 2 |

Fig. 178:
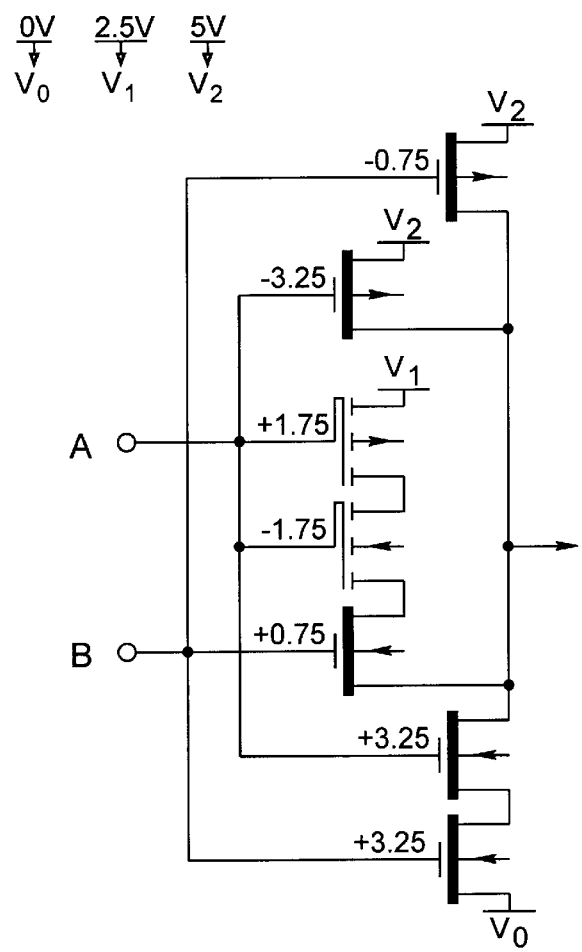
Fig. 179:
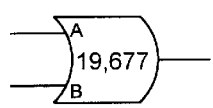
Fig. 180:
|   | A |   |   |
|---|---|---|---|
|   | 0 | 1 | 2 |
| B 0 | 2 | 2 | 2 |
| 1 | 2 | 2 | 2 |
| 2 | 2 | 1 | 0 |

Fig. 183:
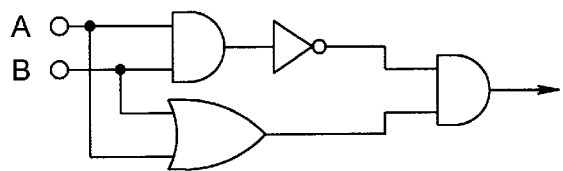
Fig. 184:
|   | A | |
|---|---|---|
| | 0 | 1 |
| B 0 | 0 | 1 |
| 1 | 1 | 0 |
Fig. 185:
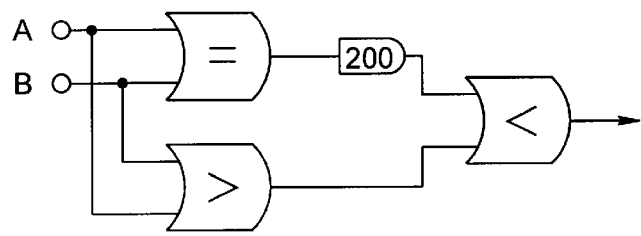

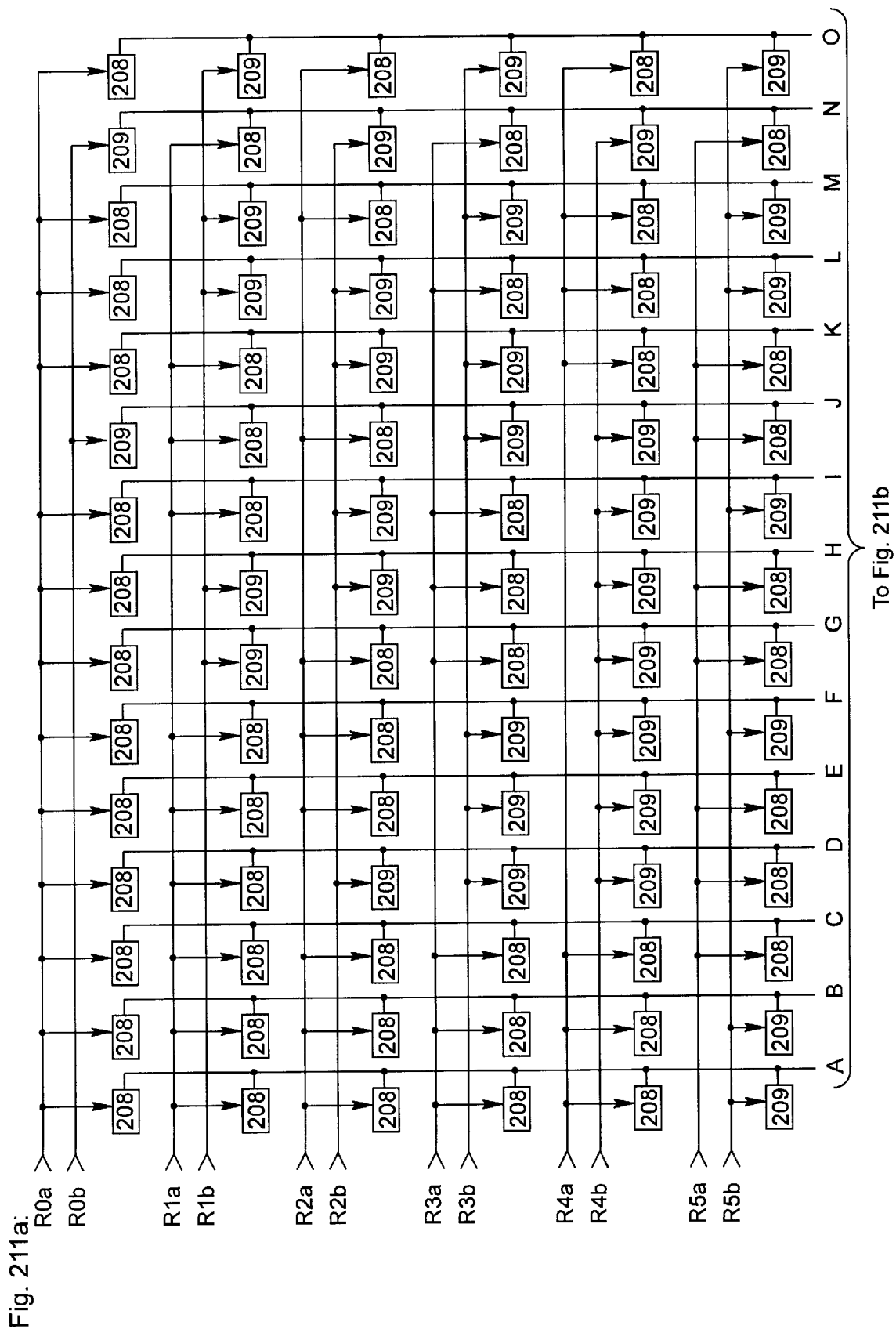

Fig. 212:
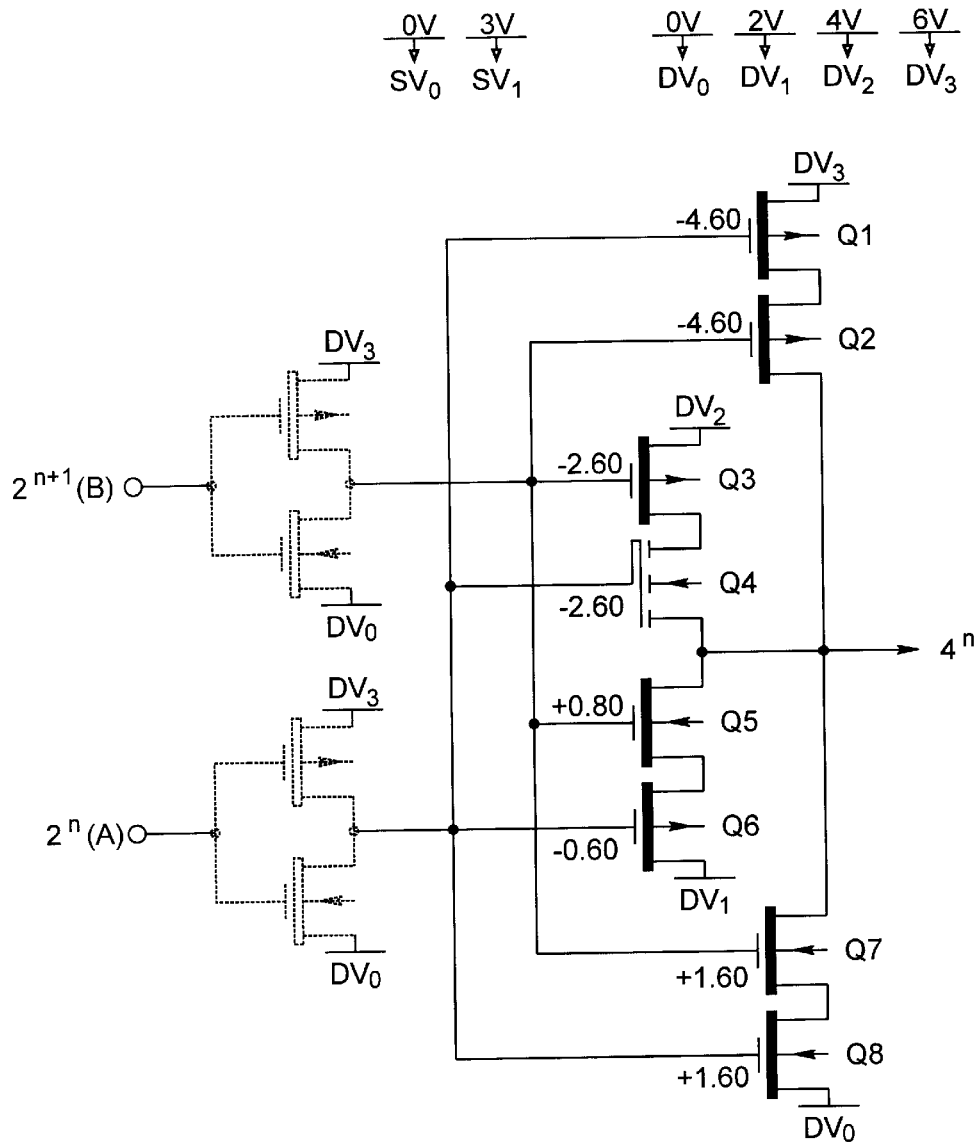
Fig. 213:
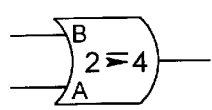
Fig. 214:
|   | A | |
|---|---|---|
|   | 0 | 1 |
| B 0 | 3 | 2 |
| 1 | 1 | 0 |

Fig. 215:
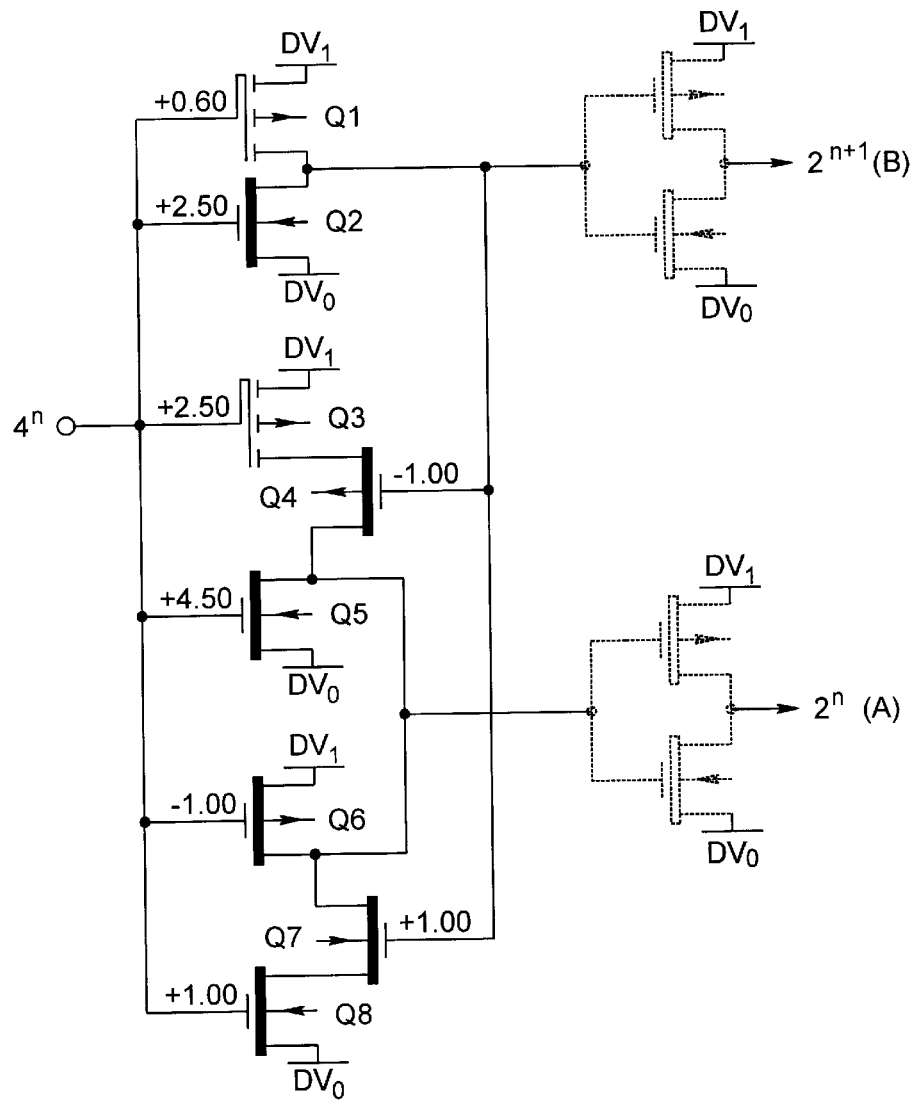
Fig. 216:
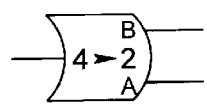
Fig. 217:
| OUTPUTS \ INPUT | 0 | 1 | 2 | 3 |
|---|---|---|---|---|
| A | 1 | 0 | 1 | 0 |
| B | 1 | 1 | 0 | 0 |

(* = altered threshold voltages)

To Fig. 239b

Fig. 240a:
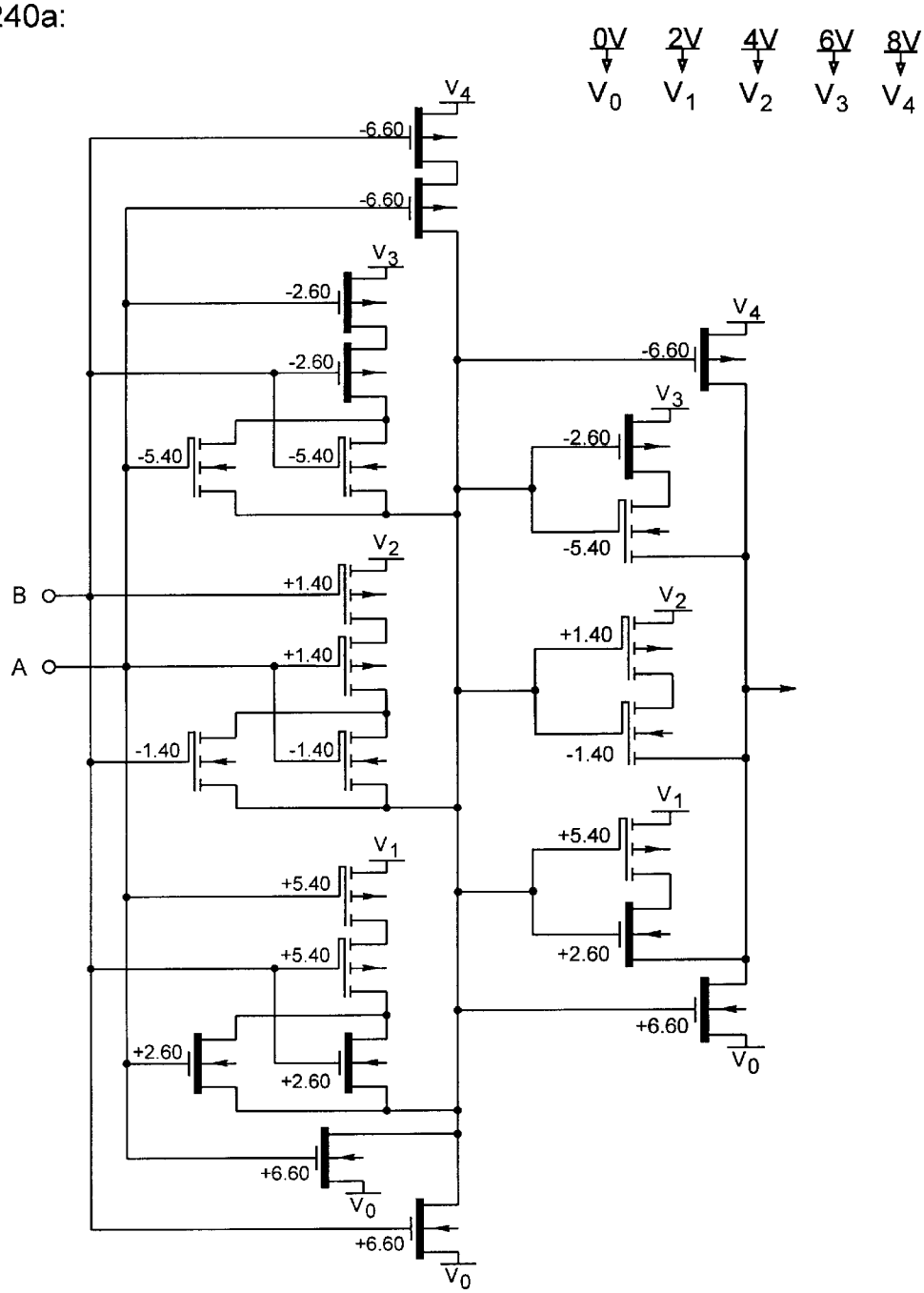
Fig. 240b:
Karnaugh graph
Fig. 240c:
Symbol
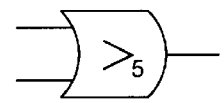

To Fig. 242b

Fig. 243a:
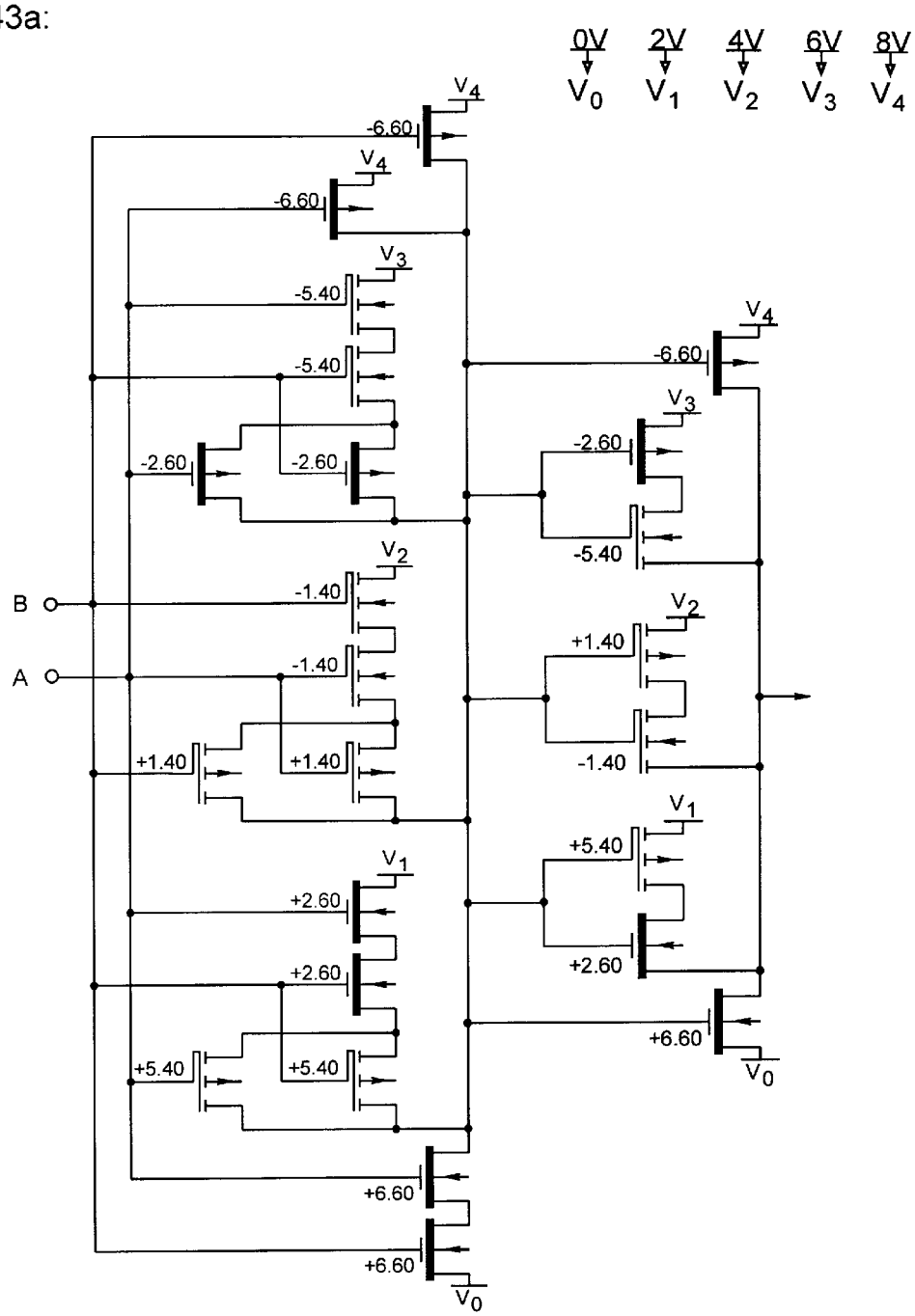
Fig. 243b:
Karnaugh graph
Fig. 243c:
Symbol
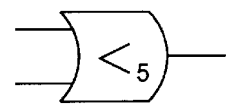

Fig. 244a:
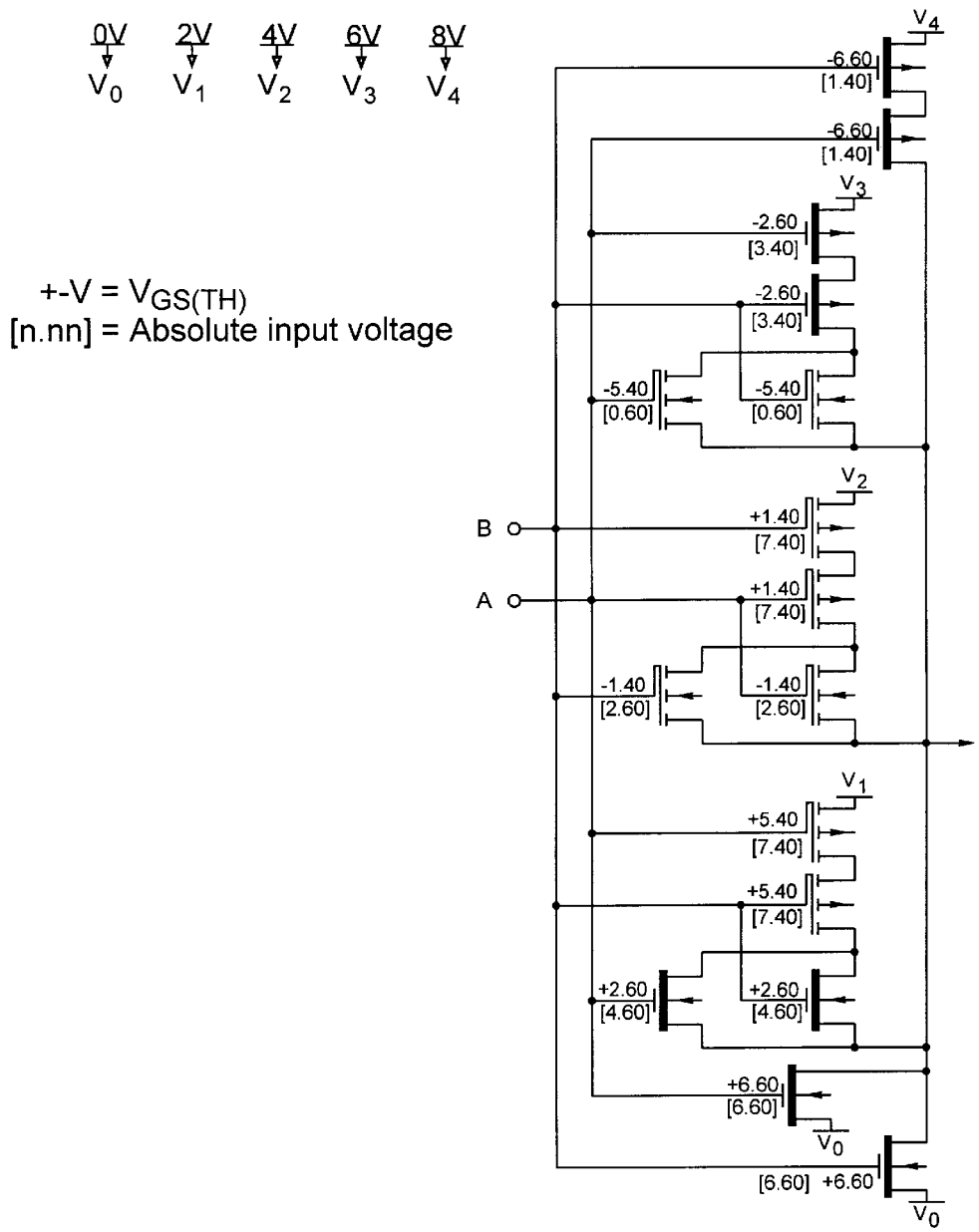
$+\text{-}V = V_{GS(TH)}$
[n.nn] = Absolute input voltage
Fig. 244b:
Karnaugh graph
|   | A |   |   |   |   |
|---|---|---|---|---|---|
|   | 0 | 1 | 2 | 3 | 4 |
| 0 | 4 | 3 | 2 | 1 | 0 |
| 1 | 3 | 3 | 2 | 1 | 0 |
| B 2 | 2 | 2 | 2 | 1 | 0 |
| 3 | 1 | 1 | 1 | 1 | 0 |
| 4 | 0 | 0 | 0 | 0 | 0 |
Fig. 244c:
Symbol
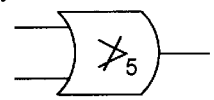

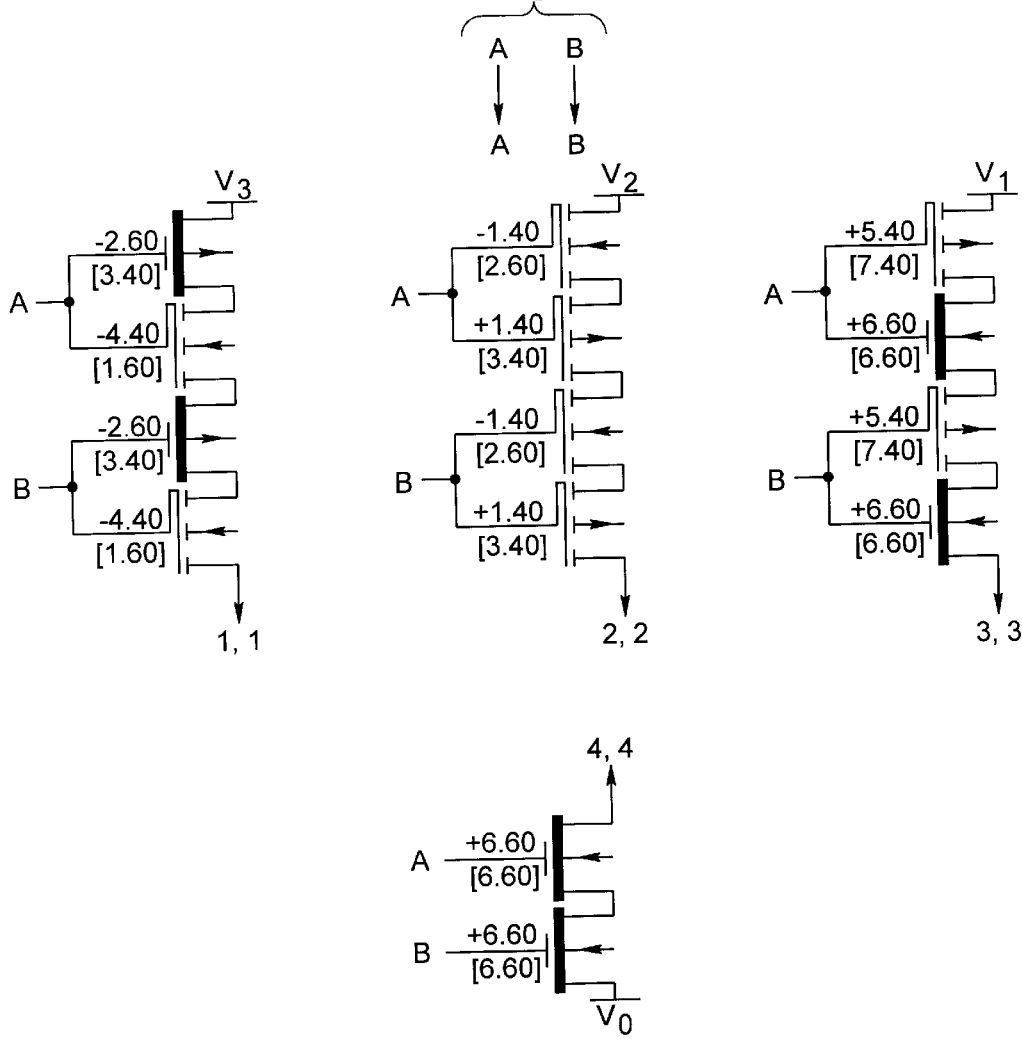
Fig. 246b:
Fig. 246c: Karnaugh graph
Fig. 246d: Symbol
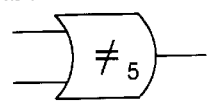

Fig. 248a:
Threshold Voltages:
± n.nn = $V_{GS(TH)}$
[n.nn] = Absolute
Logical Expressions: A, B
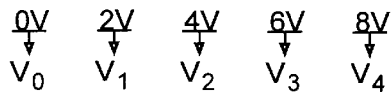
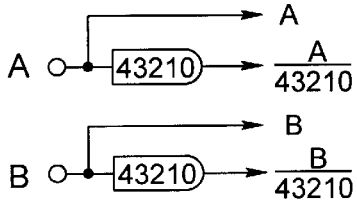
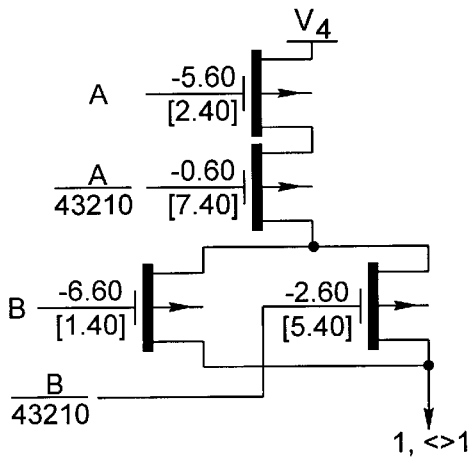
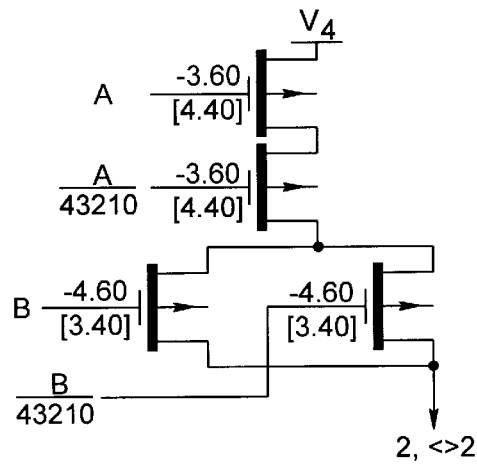
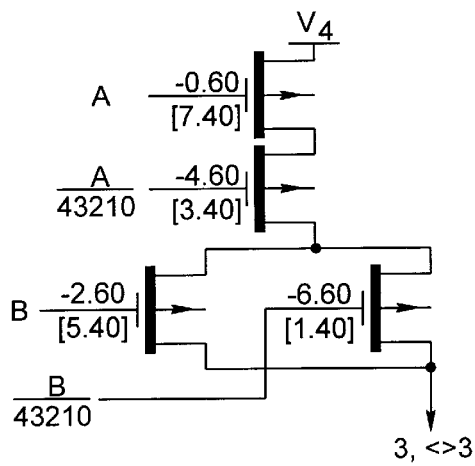
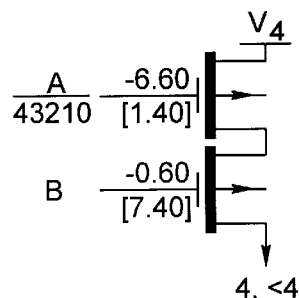

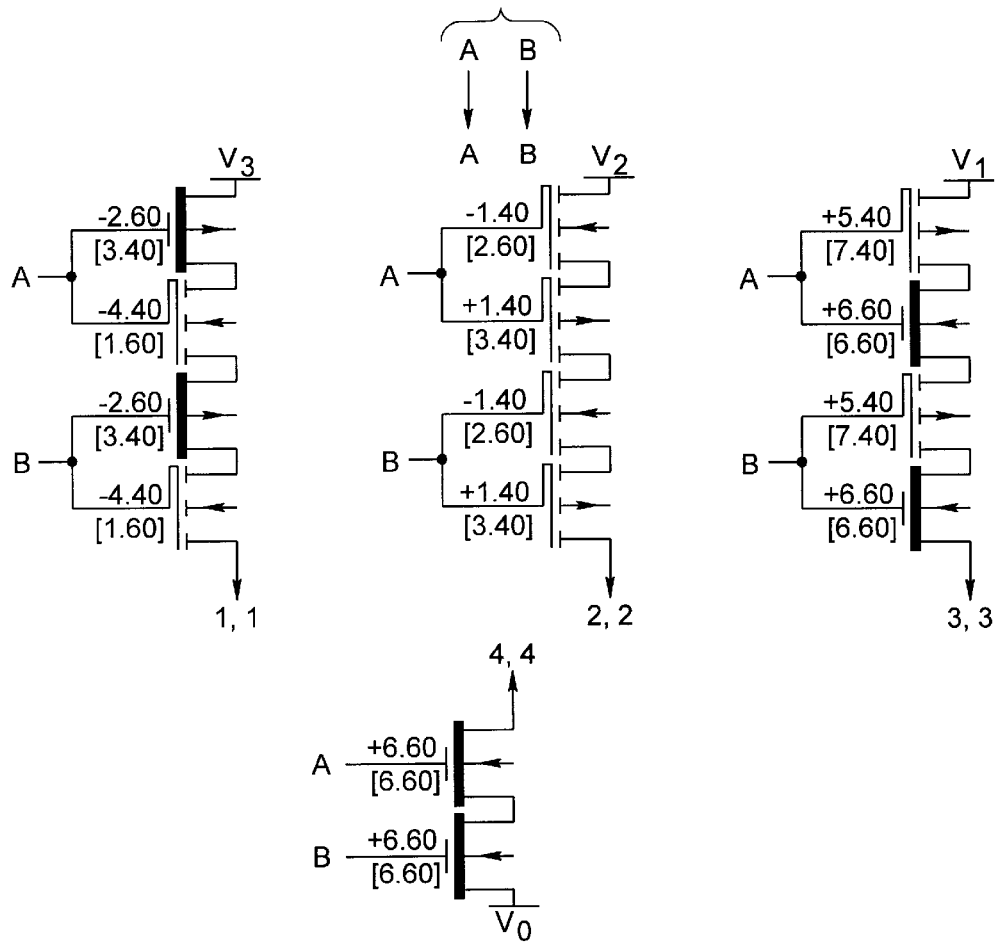
Fig. 248b:
Fig. 248c:
Karnaugh graph
Fig. 248d:
Symbol
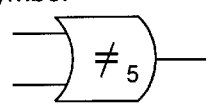

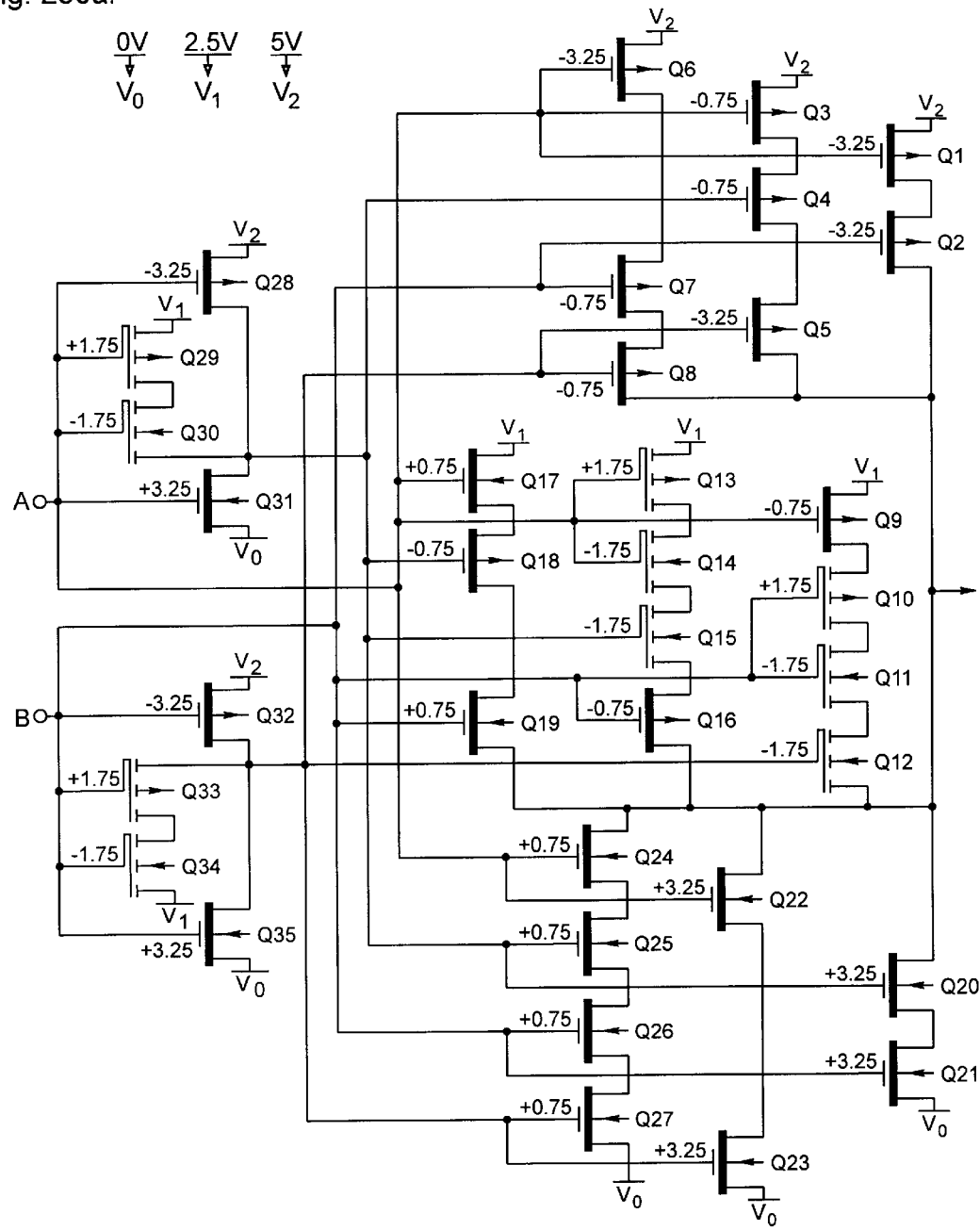
Fig. 250a:
Fig. 250b:
Karnaugh graph
Fig. 250c:
Symbol
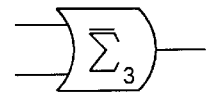

Fig. 251a:
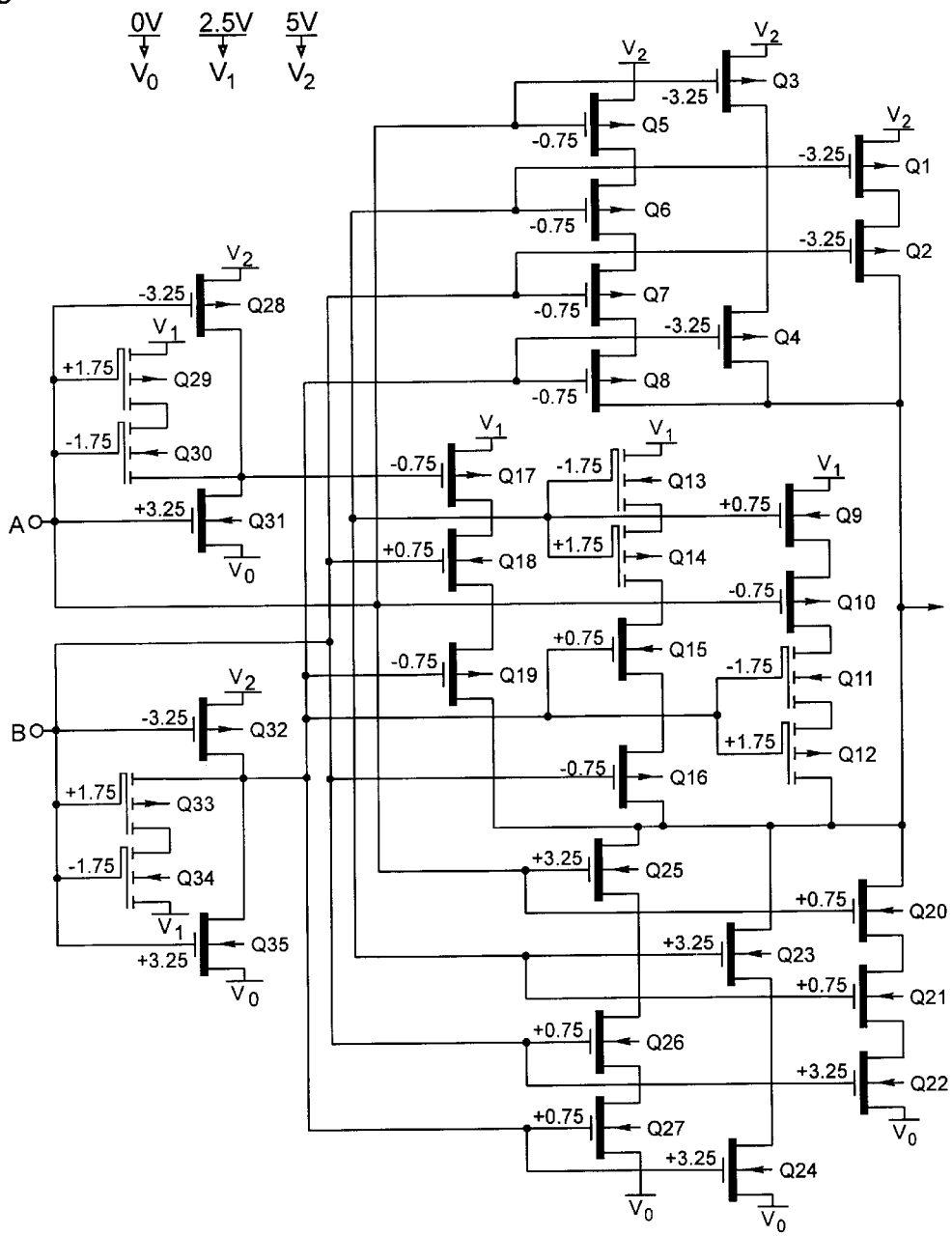
Fig. 251b:
Karnaugh graph
Fig. 251c:
Symbol
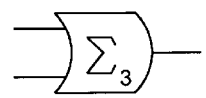

Karnaugh graph

MULTIPLE-VALUED LOGIC CIRCUIT ARCHITECTURE; SUPPLEMENTARY SYMMETRICAL LOGIC CIRCUIT STRUCTURE (SUS-LOC)

BACKGROUND OF THE INVENTION

1. Field of the Invention

This invention relates to electronic circuitry used to generate, store, and transmit information and more particularly to electronic circuitry that can do so by representing such information in any chosen digital number system, especially ternary (based on the number three) to provide multiple-valued logic.

2. Description of the Related Art

Computers, especially personal computers, are now quite common. The development history and construction of such computers is well documented and readily available through textbooks, treatises, and other written sources. A brief summary is given here as background for the invention set forth herein.

Since the arrival of the transistor and the chip-based microcircuit, information is increasingly represented in an electronic form. Electronic representation of information is very powerful as the information is no longer tied to the particular individual thing used to convey the information (although it may be tied to the particular medium). For example, books store information as printed words physically attached to the pages. The words in the book cannot easily be transferred or copied from one book to another book. In contrast, computers and other electronic data machines (referred to generally as "computers" herein) store their information as voltages that can be duplicated and/or transmitted very quickly and easily to other computers.

Furthermore, computers can operate on their stored data/information by instructions that are also stored electronically. Sequences of these instructions are "computer programs" that are created to perform a certain set of instructions. Such sequences may easily be repeated on the same or different sets of data/information. In the last fifteen years, the flexibility and power of computer programs has increased to the point where off-the-shelf programs are over several million bytes (several megabytes) long and to where the graphical representation of moving objects in an environment (as in virtual reality) is increasingly available.

One of the great advantages of today's computers is the speed at which they operate. Off-the-shelf microcomputers can operate at speeds of 200 megahertz (MHz) or more and can perform millions of instructions per second. Increasing operating speeds are becoming more readily available as time goes on and at lower prices. Modern day computers require such speed as the increased size of more powerful and flexible software requires greater performance from the hardware. Ultimately, the speed of a computer is determined by the response time of the individual circuits and the circuit density limit at which no additional circuits can fit into a unit space. The faster the circuit response time and the greater the circuit density, the better and faster the computer. However, there are limits to which circuit response and density can currently be increased. These limits foil attempts to increase the utility and speed of computers.

To use and manipulate voltages that store, convey, and operate upon information, computers use logic circuits in a predetermined fashion. Currently, most logic circuits are based on a binary number system in order to convey and manipulate information. The reason for this may be historical as early transistorized logic circuits were based on an "on-off" type of data storage. That is to say, an "on" state or a presence of voltage represented one value ("one") while an "off" state or absence of voltage represented another value ("zero"). Previous logical circuit structures addressing the fabrication of circuits that synthesize binary logic include: ECL, TTL, DTL, RTL, NMOS, PMOS, and COS-MOS or CMOS.

In committing to binary circuitry, the computer industry exploited the basic operating state of the transistor. Transistors operate in two basic states by either transmitting voltage and current through the transistor or by preventing such transmission. However, by committing to binary logic, the computer industry imposed an unnecessary limitation on computer speed and utility.

Binary logic limits computer speed as it is the least dense and most elaborate manner in which information can be digitally represented. Unlike the decimal number system of common use that can represent any one of ten numbers in any decimal place, the binary number system can represent only one of two numbers in any binary place. For example, the number one hundred requires only three digits in the decimal number system, namely "100". However, in the binary number system, the number one hundred is represented as "1100100" ($2^6+2^5+2^2=64+32+4$). In binary, the numeral "100" represents the number four. What takes three numeral places in decimal takes seven places in binary, an over-100% increase in numeral places.

While a number system based on the number ten is convenient for modern-day use, other number systems have been used in the past. The number sixty formed the basis of a number system used in ancient Sumeria and Babylon. The number twenty formed the basis of the Mayan number system. What may form a convenient basis for a number system for people may not necessarily form a convenient number system for computers. Mechanical and structural constraints dictate what number system is the most convenient. Unfortunately, with binary-based logic circuitry, modern-day computers cannot adapt to incorporate and use what number system(s) might be the most advantageous.

As such, binary logic circuits require more physical space and necessarily operate at less-than-optimum speeds. It would be very advantageous to provide computer logic circuits that operate in an optimum number system, e.g., based upon the number three, four, or five, etc. so that logic operations could proceed more quickly and efficiently. Such an optimum number system may depend upon the use to which the computer (or pertinent circuitry) is put.

Previously, there have been few circuits capable of directly synthesizing an information-representing logic system based on a number system other than two. What circuits there might be are primarily ternary (based on the number three (3)) and are passively loaded, inhibiting their ultimate utility for use in computers. Also, most of these circuits are mere translators that use two or more binary inputs to produce only one digit of n-valued output, or vice versa (n being any chosen number). Such translators do not use the power inherently present in representing information in a number system greater than two. Furthermore, such translators cannot be used in a systematic and efficient manner in order to construct a computer implementing a number-based logic system other than one based upon the number two.

While translating circuitry is functional, it is extremely limiting in both cost and size. Also, the detection and elimination of disallowed binary and/or n-valued states further increase such cost and size.

Recently, Intel Corporation announced the availability of flash memory with storage elements using more than two states, indicating the commercial viability of multiple-valued logic circuits in the marketplace.

The inventor of SUS-LOC previously patented a tristable multivibrator used to generate the three signal levels used in ternary data systems. That patent, U.S. Pat. No. 4,990,796 issued to Olson on Feb. 5, 1991 is incorporated herein by this reference. That tristable multivibrator only used enhancement mode Insulated Gate Field Effect Transistors (IGFETs) and resistive elements to accomplish its signal goals. No depletion mode IGFETs were used. Such depletion mode IGFETs have apparently been generally unavailable on the open market and are generally absent from most current circuit designs.

SUMMARY OF THE INVENTION

The present invention sets forth a circuit design that can represent information in any digital number system. Additionally, logic functions (including Boolean logic functions) can be performed upon two or more inputs in such number systems by means of the present invention. A self-sustaining and consistent circuit architecture is disclosed by which multiple-valued logic may be attained through currently-available technology. No other circuit design is believed to have achieved such breadth of utility.

Denominated SUS-LOC (for SUpplementary Symmetrical Logic Circuit structure), this circuit design uses currently-available circuit elements to construct logic circuits based on any number (radix, r) for any number of places (n). Consequently, logic circuits can be formed based on any number system and these logic circuits may take any number of inputs. Such multiple-valued logic circuits can form the basis for a digital computer that operates in the most advantageous number system for the specific application.

The preferred number system for general information processing purposes is currently seen as being ternary (based on the number three) as it appears to balance increased speed by using a higher number system with the burdens associated with using more transistors in logic circuits for higher number systems. While a ternary or radix 3 logic system is considered to be the optimal logic system for digital computers, such optimization is seen as also including an ideal computer with a logic system based on the transcendental number e (2.7182818 . . . ), the root of Napierian logarithms. As computers must currently operate in discrete numbers, ternary logic systems approach this optimal radix in discrete form.

Unlike binary circuits where only two different voltages are used, the present invention can use any number of voltages. P- and N-channel depletion mode transistors, as well as P- and N-channel enhancement mode transistors are combined to control the flow/propagation of signals through the circuits of the present invention. The gate thresholds ($V_{GS\ on}$, $V_{GS\ off}$ and/or $V_{GS(TH)}$) of the transistors are particularly chosen so that the transistor with such gate threshold voltage turns on and off only in response to the appropriate input voltage. As different transistors will have different gate thresholds, and as certain threshold voltages may turn some transistors on while turning other transistors off, signal control within the circuit can be particularly manipulated during manufacture in a manner previously unavailable in binary or otherwise. Binary logic uses transistors of only one or two threshold voltages with the threshold voltages only serving to turn the transistors on.

In SUS-LOC, transistor characteristics often require additional circuitry to ensure proper synthesis, especially the proper signal response and synthesis of a particular logic function. Such additional circuitry may include additional "stages" to prevent back biasing of transistors in certain situations.

Mainly, a FET's source and drain electrodes are determined by the magnitude of the voltages placed upon them. For N-channel FETs, the electrode that is more negative is defined as the source. For P-channel FETs, the source electrode is the more positive. As several FETs have their "drains" connected to an output terminal, "back biasing" can occur when the output voltage from a branch serves to alter the "source" of a FET in another branch. The additional stage of circuitry prevents "back biasing" from disrupting overall circuit response and preserves proper output values.

If transistors or similar circuit elements are achieved that do not respond to such back biasing, such additional circuitry is not necessary and leads to a more simplified design which is disclosed herein.

In its most elaborate form, one circuit branch in a SUS-LOC circuit could be provided for each combination of input signals. However, branches providing the same output signal can often be combined to reduce the number of discrete circuit elements required.

The SUS-LOC structure of the present invention is set forth in more detail below, showing the manner in which the transistors and their threshold voltages are selected.

OBJECTS OF THE INVENTION

It is an object of the present invention to provide basic circuitry allowing information to be represented in any available number system (radix r-valued number system).

It is another object of the present invention to provide circuitry based on an r-valued number system that can take any number of variables as input (n-variable input).

It is another object of the present invention to provide logic circuits based on any number system that are fully active with no passive components used for logic synthesis.

It is an object of the present invention to provide the basic circuitry required for logic circuitry based on any number system, or combination of number systems.

It is an object of the present invention to provide the logic circuitry required for a computer based on any number system.

It is an object of the present invention to provide the basic circuitry required for a computer based on an optimal number system, that optimal number system is currently seen as being the number three.

It is an object of the present invention to provide predictable and realizable circuitry for multiple-valued logic.

These and other objects and advantages of the present invention will be apparent from a review of the following specification and accompanying drawings.

BRIEF DESCRIPTION OF THE DRAWINGS

FIG. 7a shows the legend that is used in conjunction with FIGS. 7b through 7f.

FIG. 7b shows the conductance of an N-channel depletion mode FET with its $V_{GS(TH)}$ relative to $V_S$.

FIG. 7c shows the conductance of a P-channel depletion mode FET with its $V_{GS(TH)}$ relative to $V_S$.

FIG. 7d shows the conductance of an N-channel enhancement mode FET with its $V_{GS(TH)}$ relative to $V_S$.

FIG. 7e shows the conductance of an P-channel enhancement mode FET with its $V_{GS(TH)}$ relative to $V_S$.

FIG. 7f is a composite drawing of FIGS. 7b through 7f.

FIG. 8 is a schematic representation of a ternary CGOR circuit.

FIGS. 11–30 show Karnaugh graphs for circuits incorporating the present invention. FIGS. 11–16 show Karnaugh graphs with indicators marking non-reverse sequences that lead to back biasing.

FIG. 44 is a schematic representation of a one-place ternary function having the positional descriptor of $F010_3$.

FIG. 45 is a plot of the transfer characteristics of the $F010_3$ OPF shown in FIG. 44.

FIG. 46 is a plot of the input to output waveforms of the $F010_3$ shown in FIG. 44.

FIG. 50 is a schematic representation of a one-place ternary function having the positional descriptor of $F012_3$, otherwise known as a ternary buffer.

FIG. 51 is a plot of the transfer characteristics of the $F012_3$ OPF shown in FIG. 50.

FIG. 52 is a plot of the input to output waveforms of the $F012_3$ OPF shown in FIG. 50.

FIG. 53 is a schematic representation of a one-place ternary function having the positional descriptor of $F020_3$.

FIG. 54 is a plot of the transfer characteristics of the $F020_3$ OPF shown in FIG. 53.

FIG. 55 is a plot of the input to output waveforms of the $F020_3$ OPF shown in FIG. 53.

FIG. 56 is a schematic representation of a one-place ternary function having the positional descriptor of $F021_3$, otherwise known as a ternary next-state generator.

FIG. 57 is a plot of the transfer characteristics of the $F021_3$ OPF shown in FIG. 56.

FIG. 58 is a plot of the input to output waveforms of the $F021_3$ OPF shown in FIG. 56.

FIG. 59 is a schematic representation of a one-place ternary function having the positional descriptor of $F022_3$.

FIG. 60 is a plot of the transfer characteristics of the $F022_3$ OPF shown in FIG. 59.

FIG. 61 is a plot of the input to output waveforms of the $F022_3$ OPF shown in FIG. 59.

FIG. 65 is a schematic representation of a one-place ternary function having the positional descriptor of $F101_3$.

FIG. 66 is a plot of the transfer characteristics of the $F101_3$ OPF shown in FIG. 65.

FIG. 67 is a plot of the input to output waveforms of the $F101_3$ OPF shown in FIG. 65.

FIG. 74 is a schematic representation of a one-place ternary function having the positional descriptor of $F112_3$.

FIG. 75 is a plot of the transfer characteristics of the $F112_3$ OPF shown in FIG. 74.

FIG. 76 is a plot of the input to output waveforms of the $F112_3$ OPF shown in FIG. 74.

FIG. 77 is a schematic representation of a one-place ternary function having the positional descriptor of $F120_3$, otherwise known as a next state generator.

FIG. 78 is a plot of the transfer characteristics of the $F120_3$ OPF shown in FIG. 77.

FIG. 79 is a plot of the input to output waveforms of the $F120_3$ OPF shown in FIG. 77.

FIG. 80 is a schematic representation of a one-place ternary function having the positional descriptor of $F121_3$.

FIG. 81 is a plot of the transfer characteristics of the $F121_3$ OPF shown in FIG. 80.

FIG. 82 is a plot of the input to output waveforms of the $F121_3$ OPF shown in FIG. 80.

FIG. 89 is a schematic representation of a one-place ternary function having the positional descriptor of $F201_3$, otherwise known as a ternary previous state generator.

FIG. 90 is a plot of the transfer characteristics of the $F201_3$ OPF shown in FIG. 89.

FIG. 91 is a plot of the input to output waveforms of the $F201_3$ OPF shown in FIG. 89.

FIG. 92 is a schematic representation of a one-place ternary function having the positional descriptor of $F202_3$.

FIG. 93 is a plot of the transfer characteristics of the $F202_3$ OPF shown in FIG. 92.

FIG. 94 is a plot of the input to output waveforms of the $F202_3$ OPF shown in FIG. 92.

FIG. 98 is a schematic representation of a one-place ternary function having the positional descriptor of $F211_3$.

FIG. 99 is a plot of the transfer characteristics of the $F211_3$ OPF shown in FIG. 98.

FIG. 100 is a plot of the input to output waveforms of the $F211_3$ OPF shown in FIG. 98.

FIG. 101 is a schematic representation of a one-place ternary function having the positional descriptor of $F212_3$.

FIG. 102 is a plot of the transfer characteristics of the $F212_3$ OPF shown in FIG. 101.

FIG. 103 is a plot of the input to output waveforms of the $F212_3$ OPF shown in FIG. 101.

FIG. 115 is a schematic representation of the $CGOR_3$ circuit.

FIG. 116 is the symbol for the $CGOR_3$ circuit of FIG. 115.

FIG. 117 is the Karnaugh graph for the $CGOR_3$ circuit of FIG. 115.

FIG. 118 is a schematic representation of the $CGAND_3$ circuit.

FIG. 119 is the symbol for the $CGAND_3$ circuit of FIG. 118.

FIG. 120 is the Karnaugh graph for the $CGOR_3$ circuit of FIG. 118.

FIG. 124 is a schematic representation of the $CGAND_5$ circuit.

FIG. 125 is the symbol for the $CGAND_5$ circuit of FIG. 124.

FIG. 126 is the Karnaugh graph for the $CGAND_5$ circuit of FIG. 124.

FIG. 129 is a schematic representation of the $GOR_3$ circuit.

FIG. 130 is the symbol for the $GOR_3$ circuit of FIG. 129.

FIG. 131 is the Karnaugh graph for the $GOR_3$ circuit of FIG. 129.

FIG. 132 is a schematic representation of the $GAND_3$ circuit.

FIG. 133 is the symbol for the $GAND_3$ circuit of FIG. 132.

FIG. 134 is the Karnaugh graph for the $GAND_3$ circuit of FIG. 132

FIGS. 135–161 show the development of additional stages for SUS-LOC circuits that suffer from back biasing.

FIGS. 135–144 show schematics and Karnaugh graphs for the SUS-MOS SIGMA circuit, number 4,069. The solid line in these schematics indicate the "true" path for proper circuit/signal operation. The dashed lines indicate aberrant paths arising from back biasing.

FIGS. 145–152 show replacement circuitry for FETs in SUS-MOS that suffer back biasing.

FIGS. 153–161 are schematics and Karnaugh graphs for the SUS-MOS SIGMA circuit of FIGS. 133–144 where FETs suffering from aberrant paths are replaced by the appropriate circuit from FIGS. 145–152.

Figure 162:
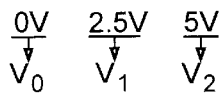

FIG. 162 is a schematic representation of the EQ$_3$ circuit.

Figure 163:
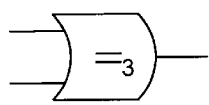

FIG. 163 is the symbol for the EQ$_3$ circuit of FIG. 162.

Figure 164:
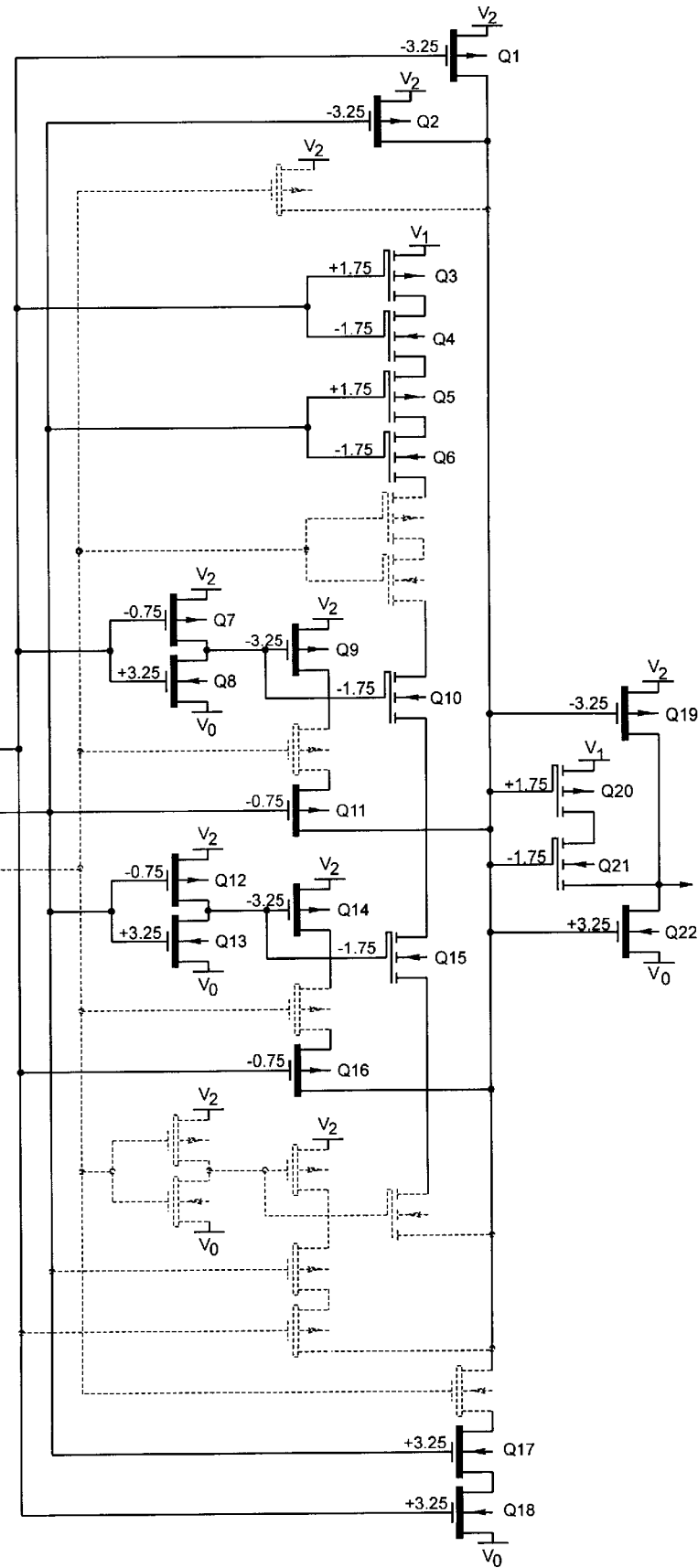

FIG. 164 is the Karnaugh graph for the EQ$_3$ circuit of FIG. 162.

FIG. 165 shows the basic symbol and explanation of the numbering method for a Lambda nn circuit.

FIG. 166 is a schematic representation of the Lambda 01 circuit.

FIG. 167 is the symbol for the Lambda 01 circuit of FIG. 166.

FIG. 168 is the Karnaugh graph for the Lambda 01 circuit of FIG. 166.

FIG. 169 is a schematic representation of the ternary function 15,309 circuit.

FIG. 170 is the symbol for the ternary function 15,309 circuit of FIG. 169.

FIG. 171 is the Karnaugh graph for the ternary function 15,309 circuit of FIG. 169.

FIG. 172 is a schematic representation of the ternary function 19,542 circuit.

FIG. 173 is the symbol for the ternary function 19,542 circuit of FIG. 172.

FIG. 174 is the Karnaugh graph for the ternary function 19,542 circuit of FIG. 172.

FIG. 175 is a schematic representation of the ternary function 141 circuit.

FIG. 176 is the symbol for the ternary function 141 circuit of FIG. 175.

FIG. 177 is the Karnaugh graph for the ternary function 141 circuit of FIG. 175.

FIG. 178 is a schematic representation of the ternary function 19,677 circuit.

FIG. 179 is the symbol for the ternary function 19,677 circuit of FIG. 178.

FIG. 180 is the Karnaugh graph for the ternary function 19,677 circuit of FIG. 178.

Figure 181:
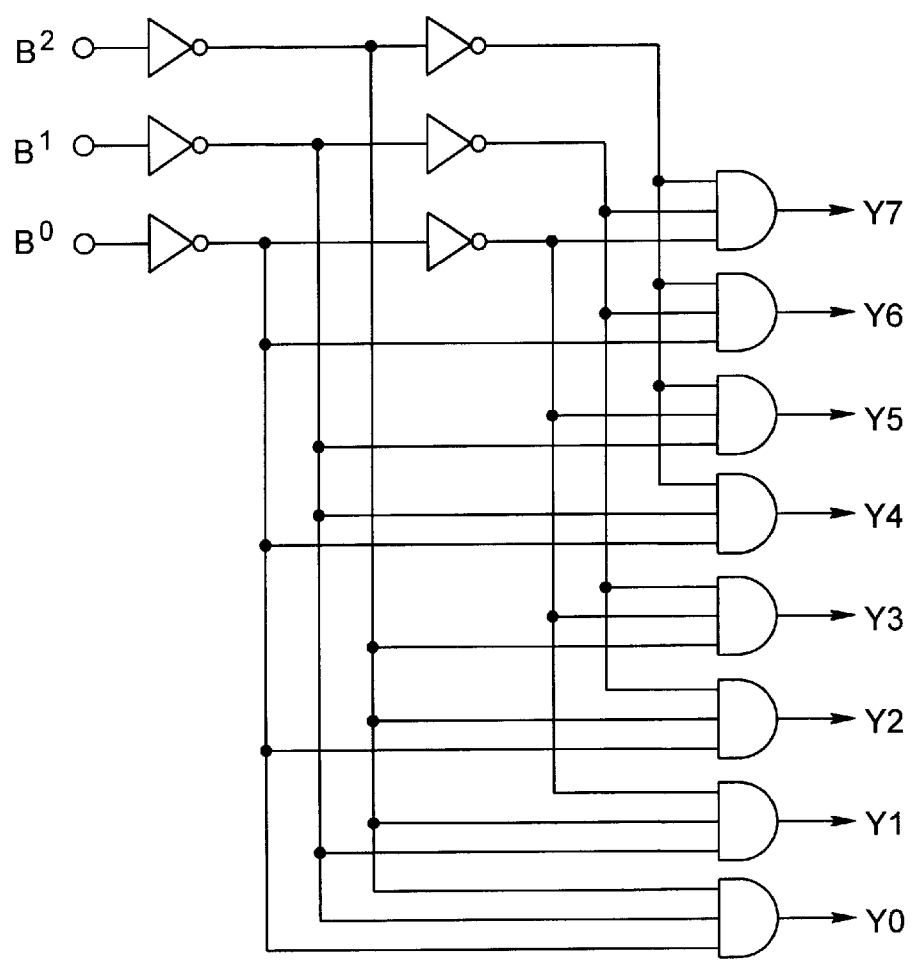

FIG. 181 is a schematic representation of a three place binary 1 of 8 selector.

Figure 182:
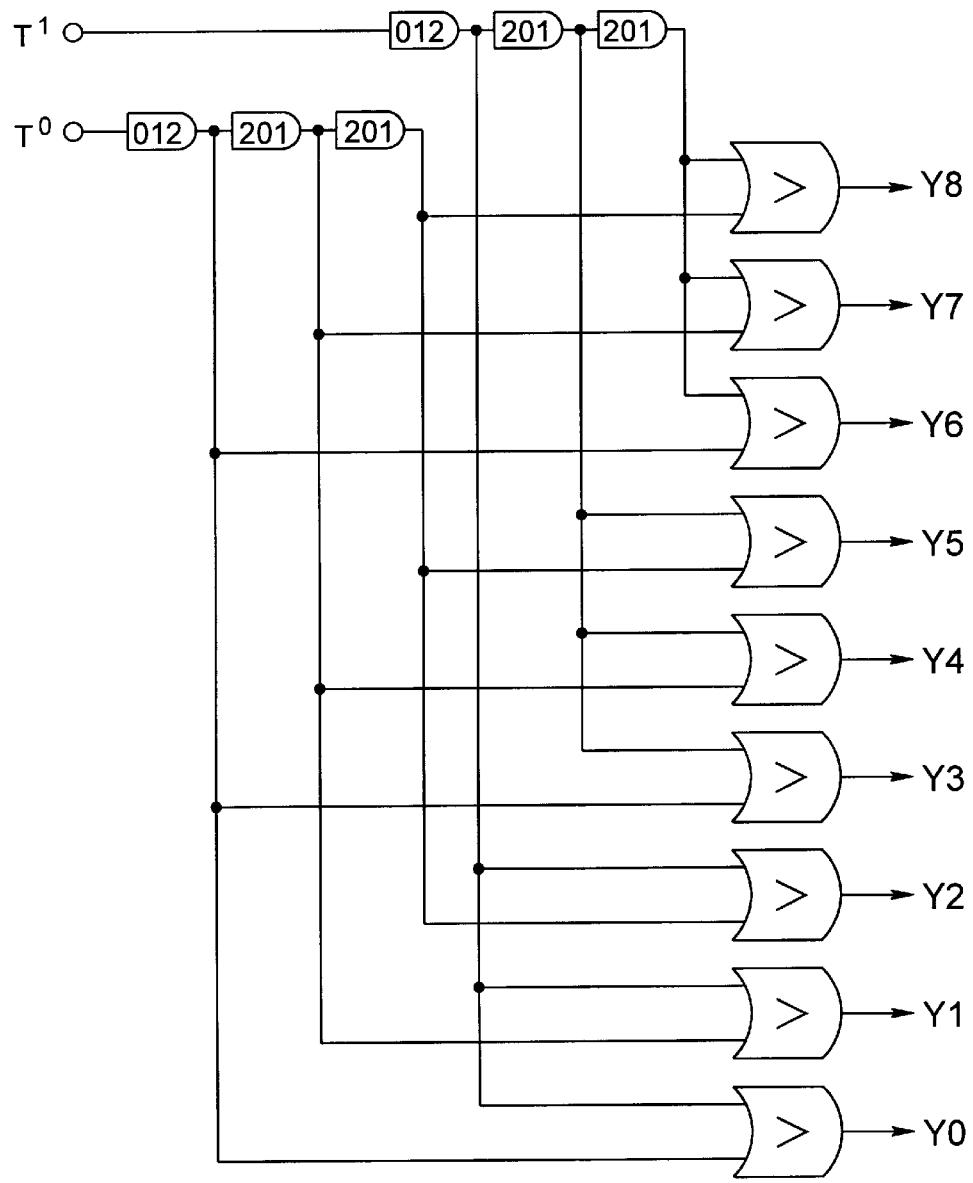

FIG. 182 is a schematic representation of a two place ternary address decoder or a 1 of 9 selector.

FIG. 183 is a schematic representation of a binary exclusive OR gate.

FIG. 184 is the Karnaugh graph for the circuit shown in FIG. 183.

FIG. 185 is a schematic representation of an XGOR$_3$ circuit assembled with a combinational architecture similar to the binary exclusive OR shown in FIG. 183.

Figure 186:

FIG. 186 is the symbol for XGOR$_3$ circuit shown in FIG. 185.

FIG. 187 is the Karnaugh graph for XGOR$_3$ circuit shown in FIG. 185.

Figure 188:
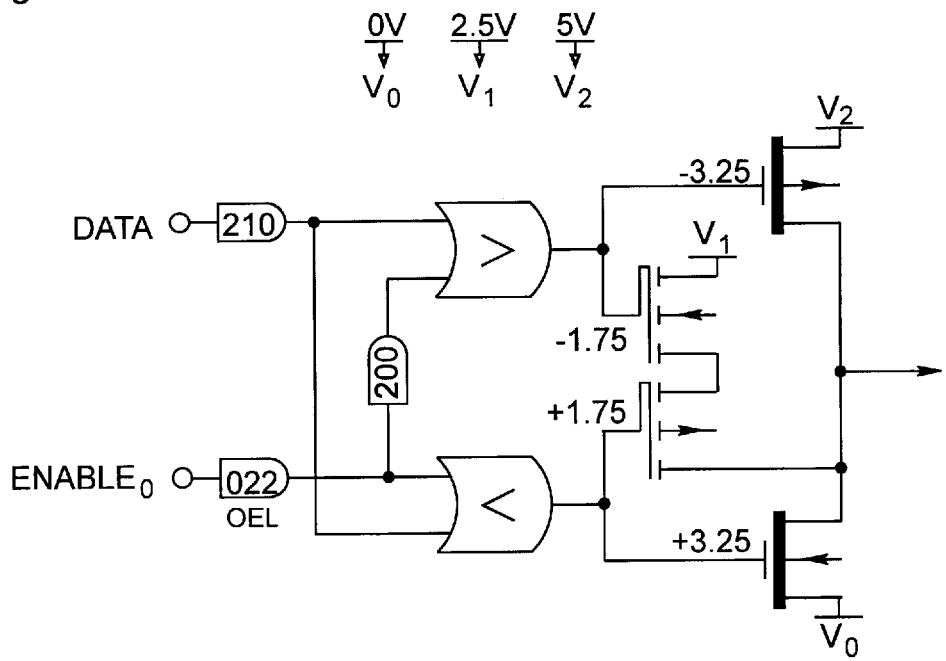

FIG. 188 is a schematic representation of the ternary r+1 state buffer.

Figure 189:
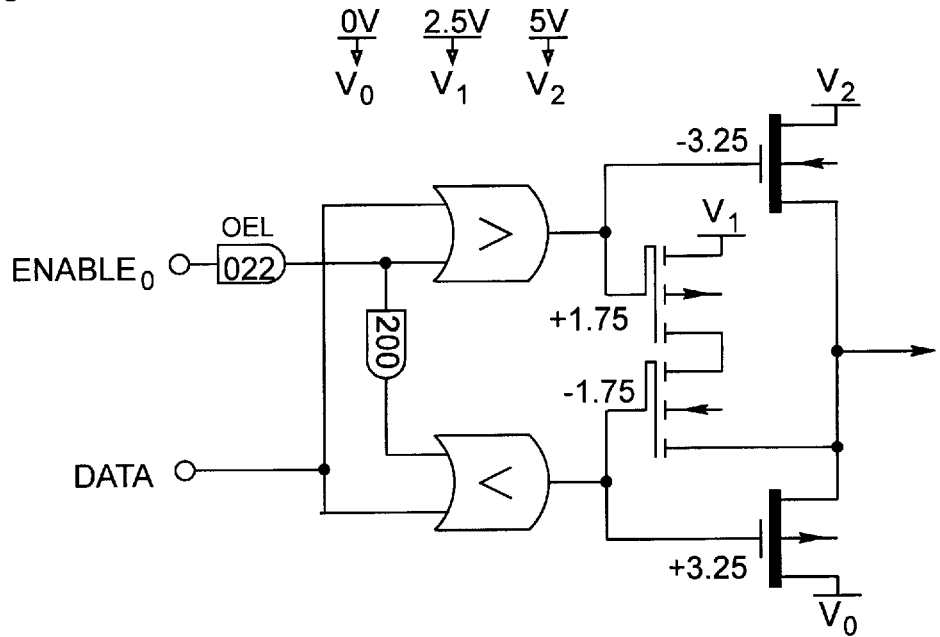

FIG. 189 is a schematic representation of the quad-state ternary base-1 complementer.

Figure 190:
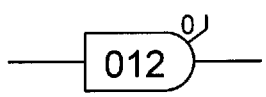

FIG. 190 is symbol for a ternary r+1 state buffer with an output enable level of zero.

Figure 191:
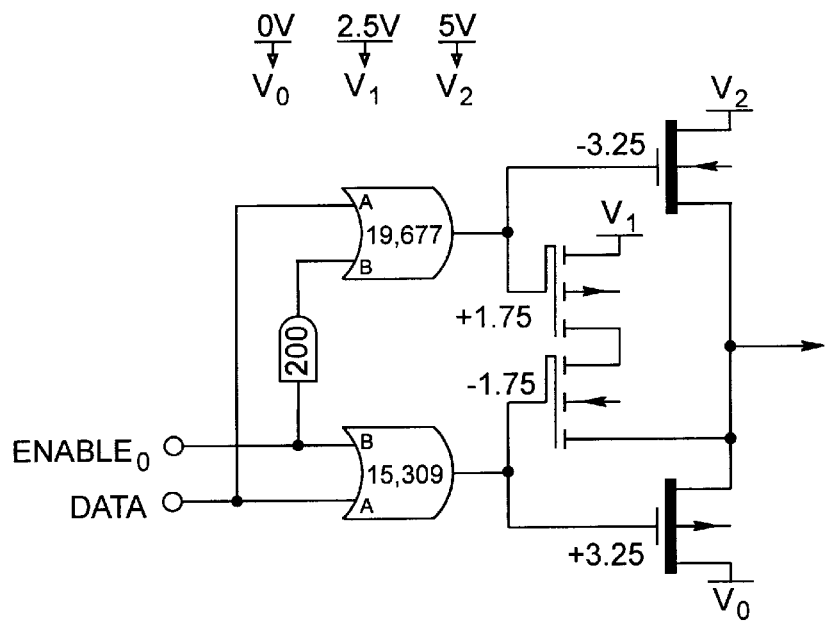

FIG. 191 is a schematic representation of a quad-state buffer using the ternary MPFs #15,309 and #19,677.

Figure 192:
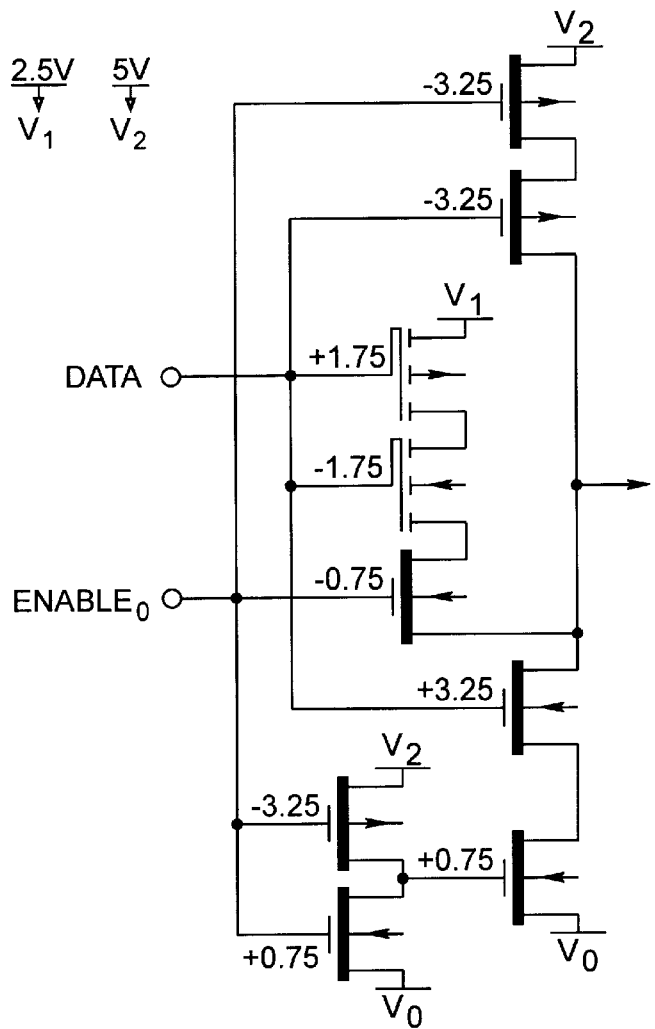

FIG. 192 is a schematic representation of a quad state base-1 complementer.

Figure 193:
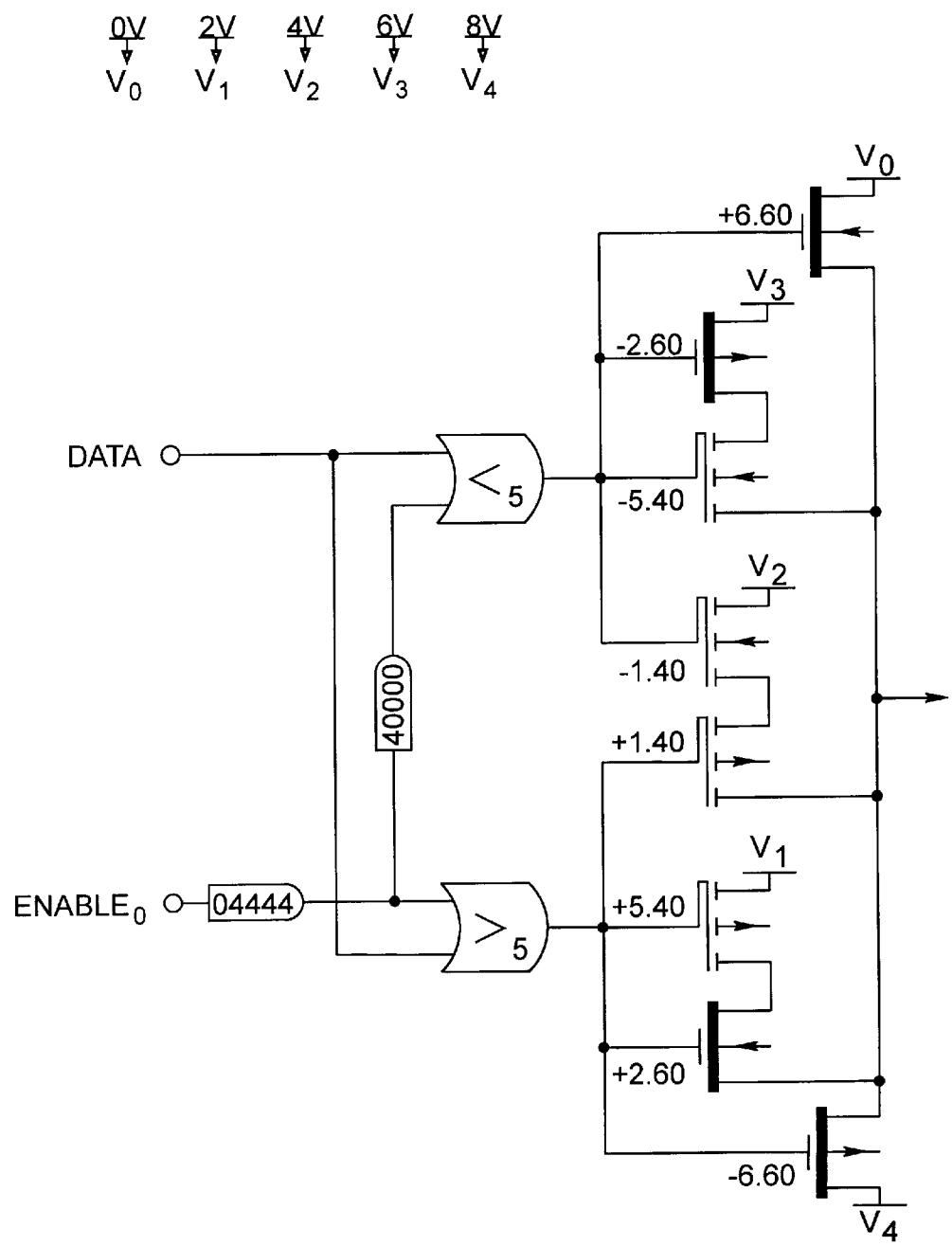

FIG. 193 is a schematic representation of a pentanary hex-state base-1 complementer.

Figure 194:
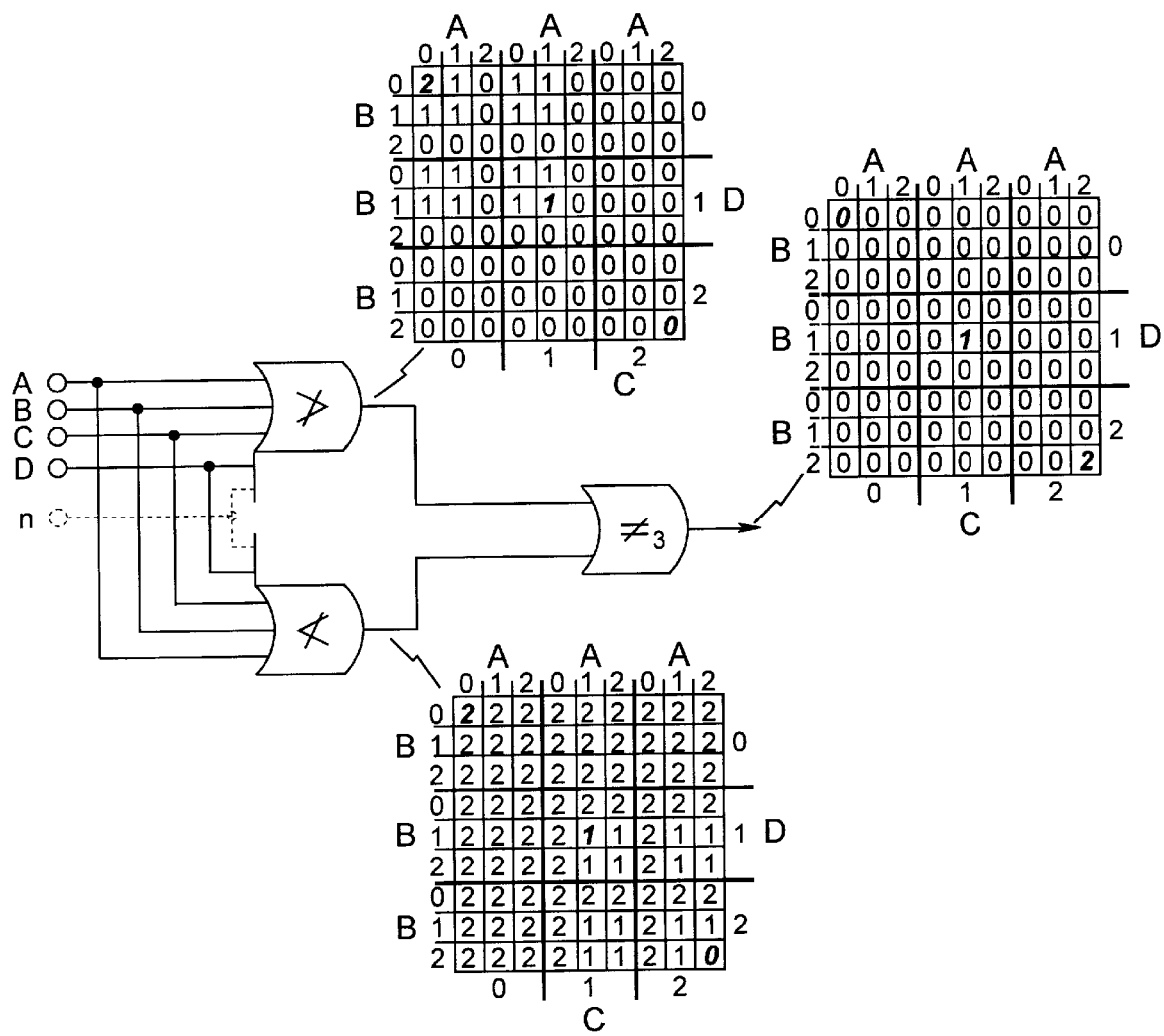

FIG. 194 is a schematic representation of a ternary EQ showing input expansion using CGOR and CGAND combinationally.

Figure 195:
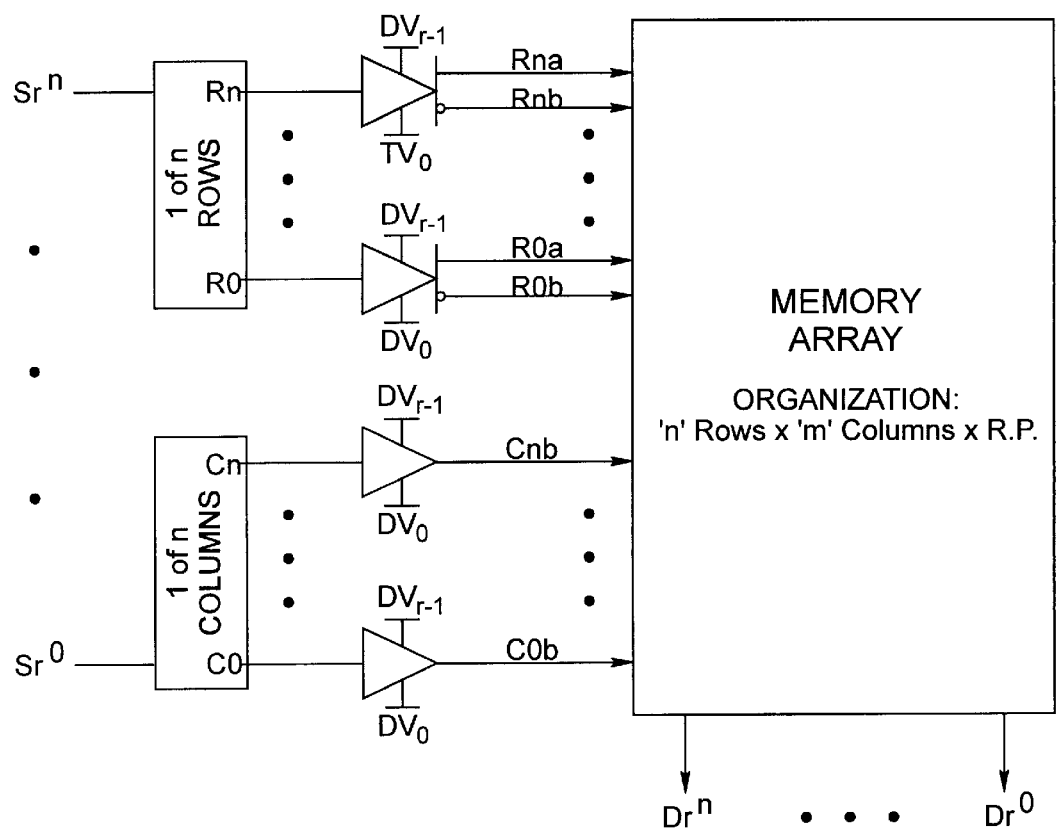

FIG. 195 is a block diagram of a Radix Converting Read Only Memory (RCROM).

Figure 196:
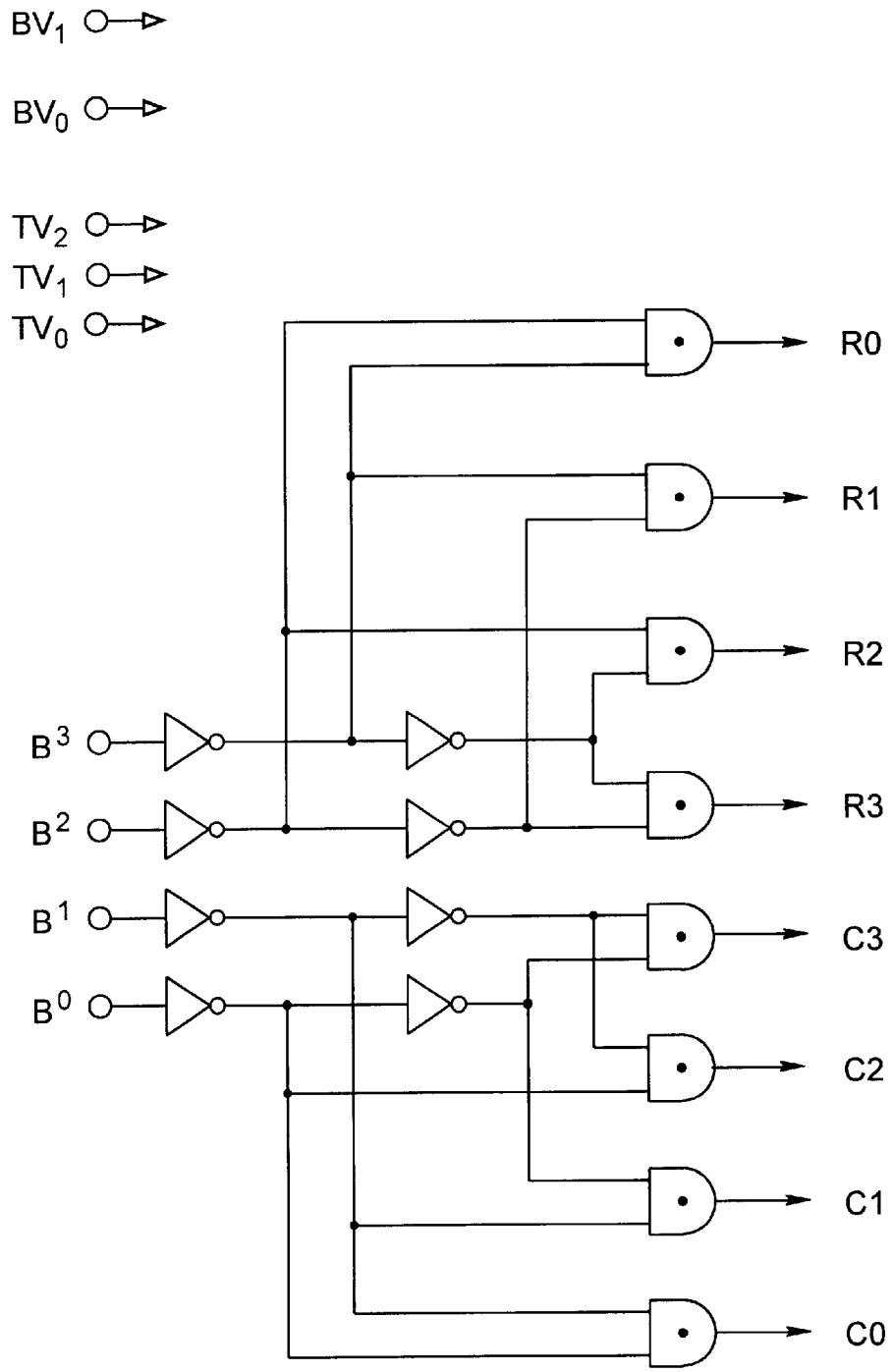

FIG. 196 is a schematic representation of a four bit binary address decoder.

Figure 197:
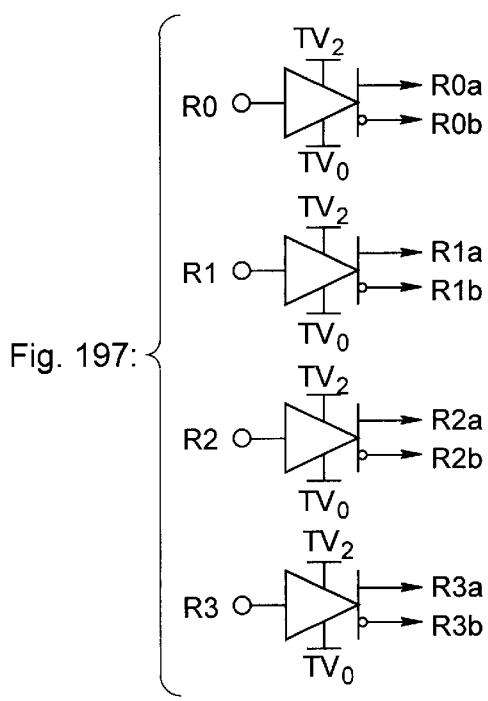

FIG. 197 is a schematic representation of the Row differential driver/level changers used in the address decoder of FIG. 194.

Figure 198:
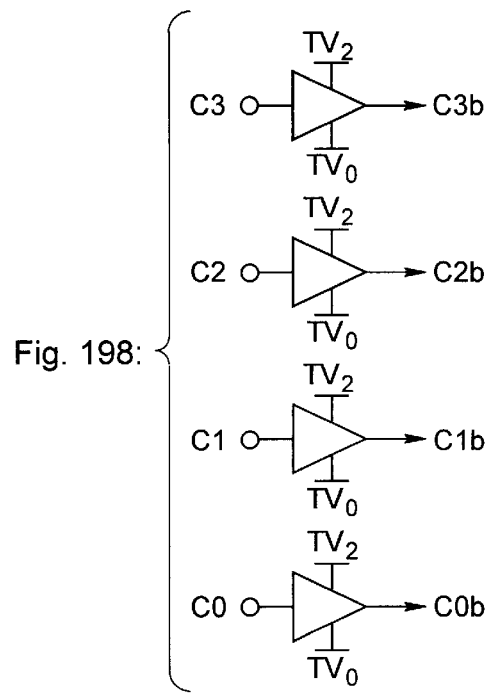
Figure 199:
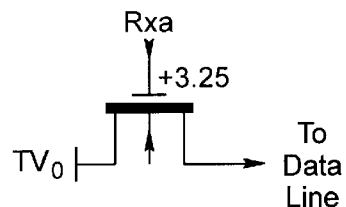
Figure 200:
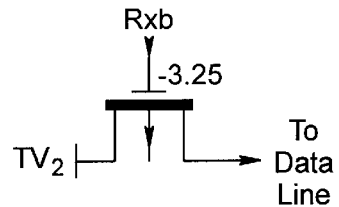
Figure 201:
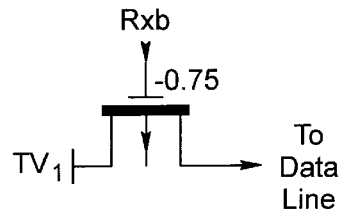
Figure 202:
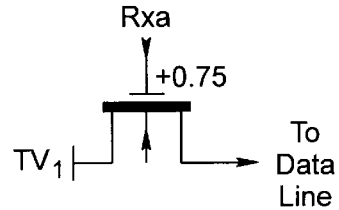

FIG. 198 is a schematic representation of Column driver/level changers used in the address decoder of FIG. 194.

FIGS. 199, 200, 201 and 202 are schematic representations of the FETs that are required to form the binary to ternary memory array. Next to the gate of each FET is its required threshold voltage.

FIG. 203 is a schematic representation of the symbol used for FETs in a memory array.

Figure 204:
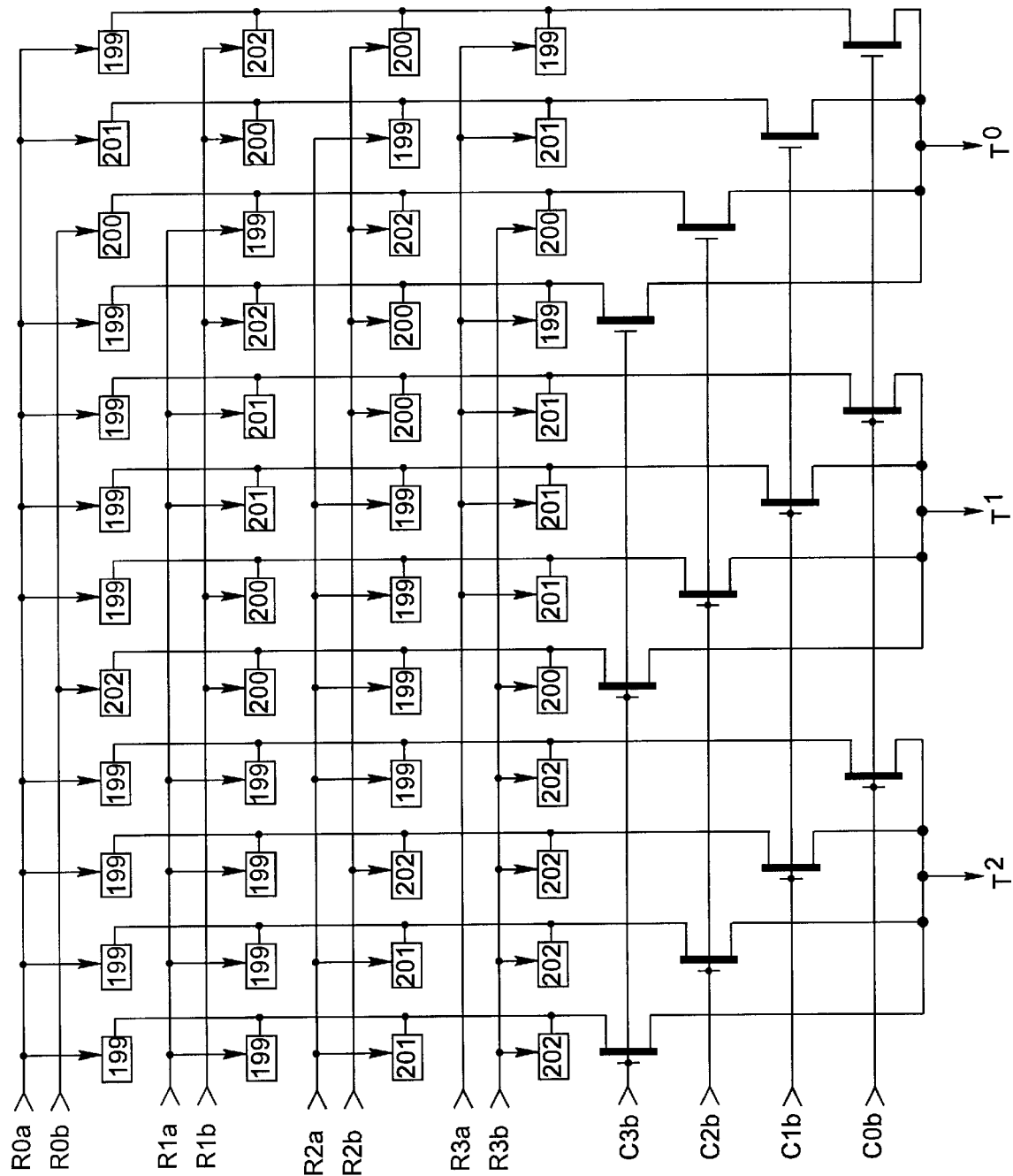

FIG. 204 is a schematic representation of a memory array is comprised of 48 FETs with a 4×4×3 organization.

Figure 205:
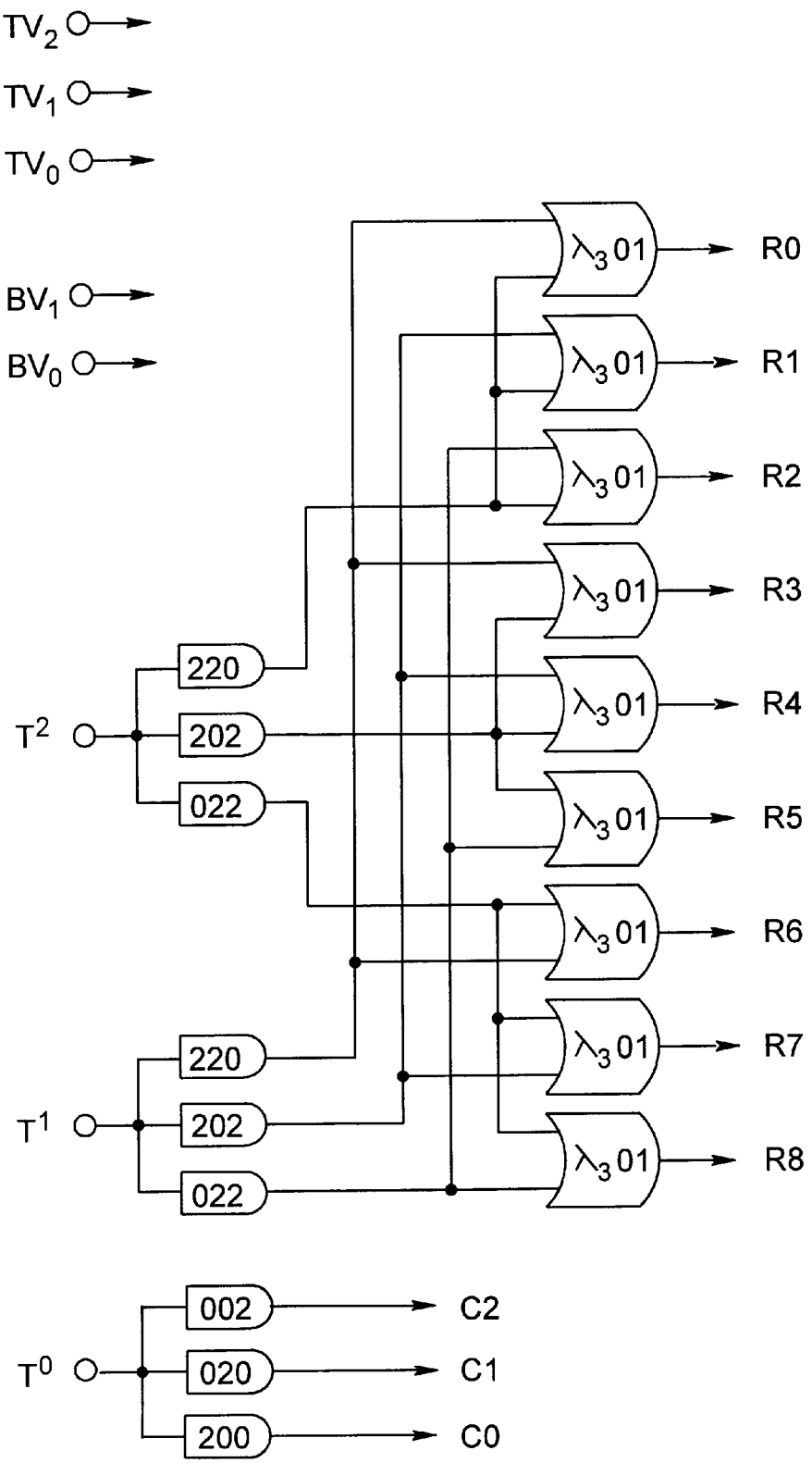

FIG. 205 is a schematic representation of a three tert ternary address decoder.

Figure 206:
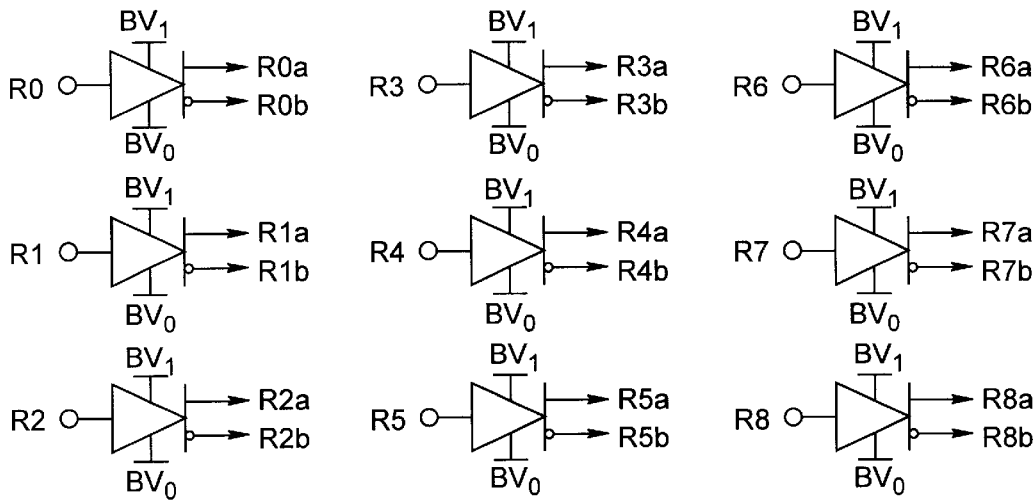

FIG. 206 is a schematic representation of the Row differential driver/level changers used in the address decoder of FIG. 203.

Figure 207:
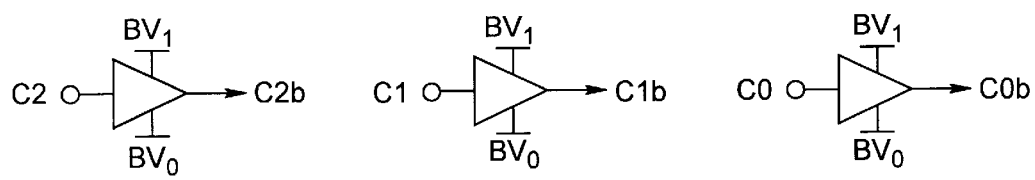

FIG. 207 is a schematic representation of the Column driver/level changers used in the address decoder of FIG. 203.

Figure 208:
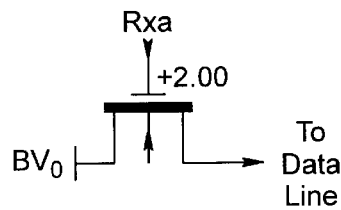
Figure 209:
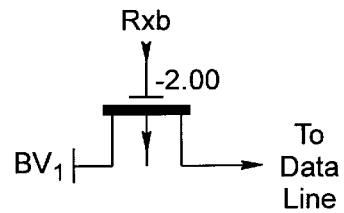

FIGS. 208 and 209 are schematic representations of FETs that are required to form the ternary to binary memory array.

Figure 210:

FIG. 210 is the symbol used for FETs in the memory array.

FIG. 211 is a schematic representation of a memory array comprised of 135 FETs with a 9×3×5 organization.

FIG. 212 is a schematic representation of a 2 duad 4 gate.

FIG. 213 is the symbol for the 2 duad 4 gate shown in FIG. 210.

FIG. 214 is the Karnaugh graph for the 2 duad 4 gate shown in FIG. 210.

FIG. 215 is a schematic representation of a 4 duad 2 gate.

FIG. 216 is the symbol for the 4 duad 2 gate shown in FIG. 213.

FIG. 217 is the Karnaugh graph for the 4 duad 2 gate shown in FIG. 213.

Figure 218:
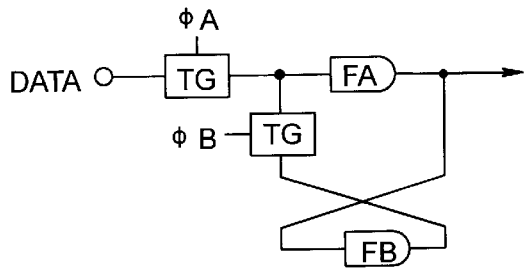

FIG. 218 is the schematic representation of a simple latch implemented with cross-coupled re-valued one-place functions.

Figure 219:
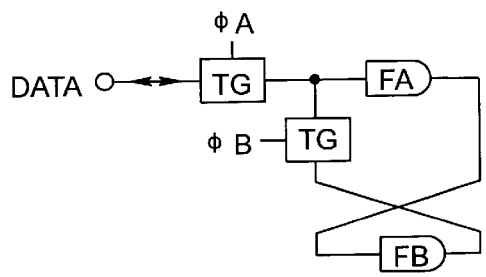

FIG. 219 is a schematic representation of an identity group latch with a bi-directional data input/output terminal.

Figure 220:
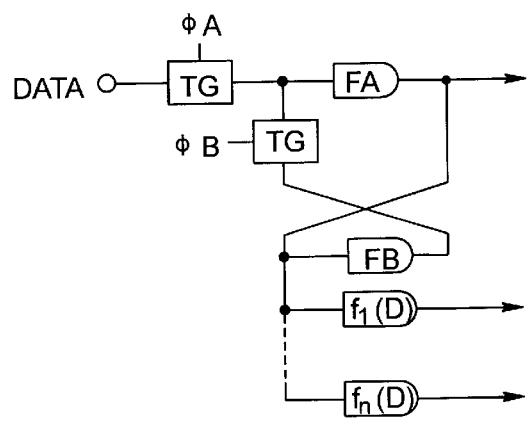

FIG. 220 is a schematic representation of a simple latch with multiple outputs.

Figure 221:
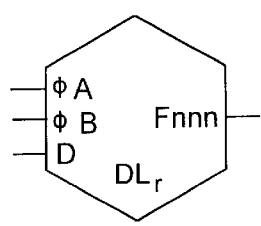

FIG. 221 is the basic symbol for the complimenting or converting latch of FIG. 218.

Figure 222:
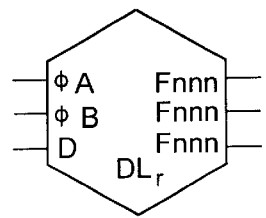

FIG. 222 is the symbol for the simple latch with multiple outputs of FIG. 220.

Figure 223:
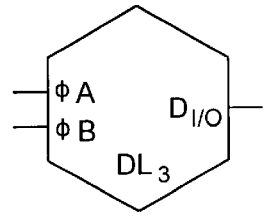

FIG. 223 is the symbol for the identity group latch of FIG. 219.

Figure 224:
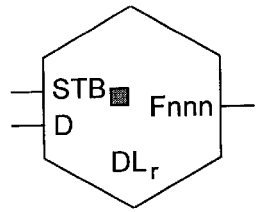

FIG. 224 is the symbol used to represent a simple latch with a dedicated strobe circuit.

Figure 225:
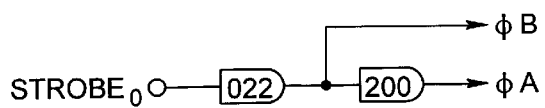

FIG. 225 is a schematic representation of a strobe circuit that may be used with ternary latches.

Figure 226:
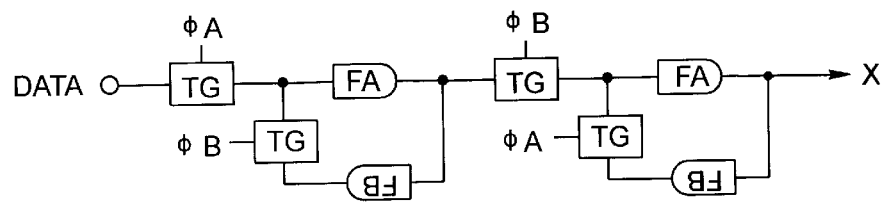

FIG. 226 is a schematic representation of a master-slave latch using simple latches.

Figure 227:
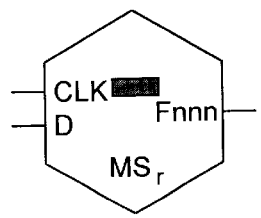

FIG. 227 is the symbol for the master-slave latch of FIG. 226.

Figure 228:
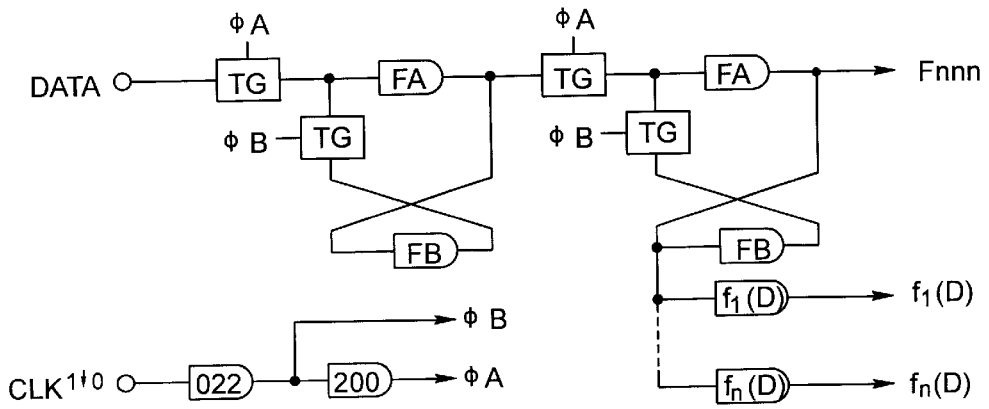

FIG. 228 is a schematic representation of a master-slave latch with multiple outputs and operates on the logic 1 to logic 0 edge of the Strobe$_0$ input.

Figure 229:
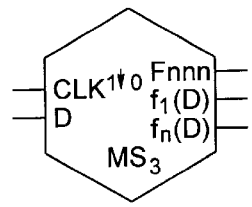

FIG. 229 is the symbol for the master-slave latch of FIG. 228.

Figure 230:
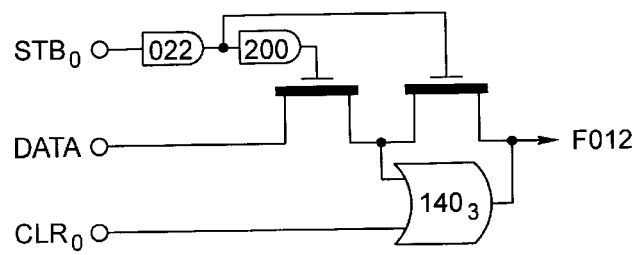

FIG. 230 is a schematic representation of a resettable simple latch.

Figure 231:
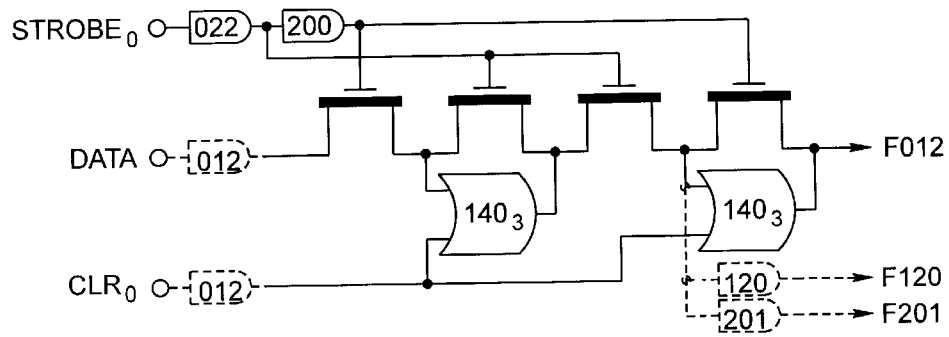

FIG. 231 is a schematic representation of a master-slave latch with an asynchronous clear capability.

Figure 232:
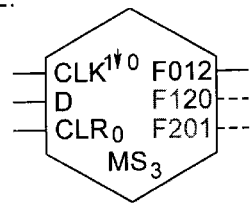

FIG. 232 is the symbol for the master-slave latch of FIG. 231.

Figure 233:
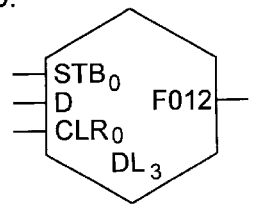
Figure 234:
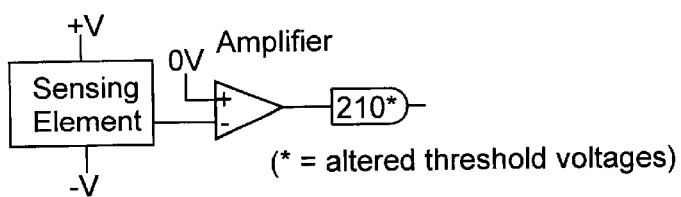

FIG. 233 is the symbol for the simple latch of FIG. 230. to FIG. 234 is a simple schematic of a digitizing linearizer using a ternary OPF.

Figure 235:
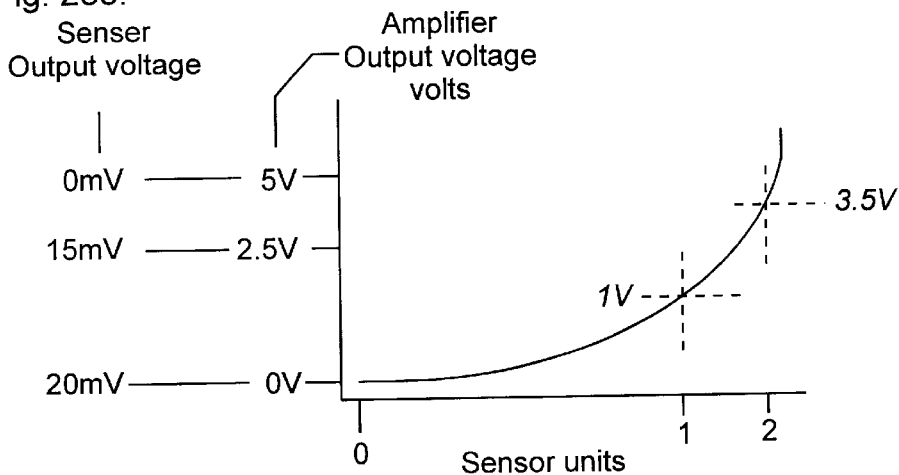

FIG. 235 is an output curve of the transducer or sensing element for the digitizing linearizer of FIG. 234.

Figure 236:
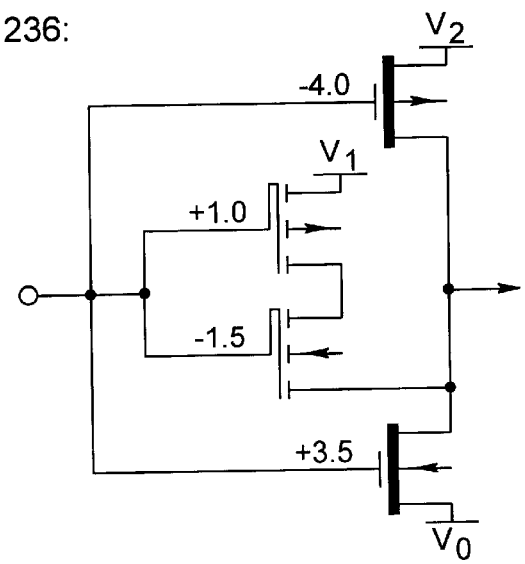

FIG. 236 is a schematic of the ternary OPF used in FIG. 234 with altered threshold voltages that match the sensor's amplified output curve.

Figure 237:
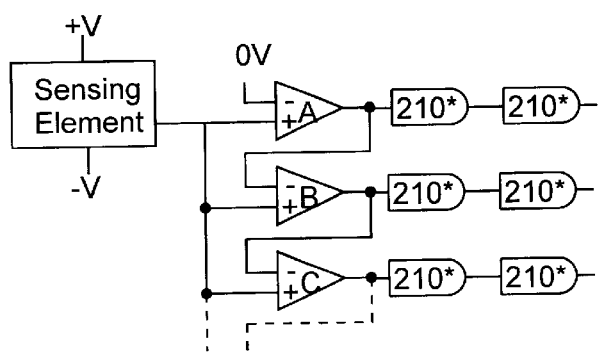

FIG. 237 is a simple schematic of a digitizing linearizer of FIG. 234 extended to several places of ternary, plus an additional OPF to serve as a buffer to ensure that metastability does not occur and to produce a non-complemented value.

Figure 238:
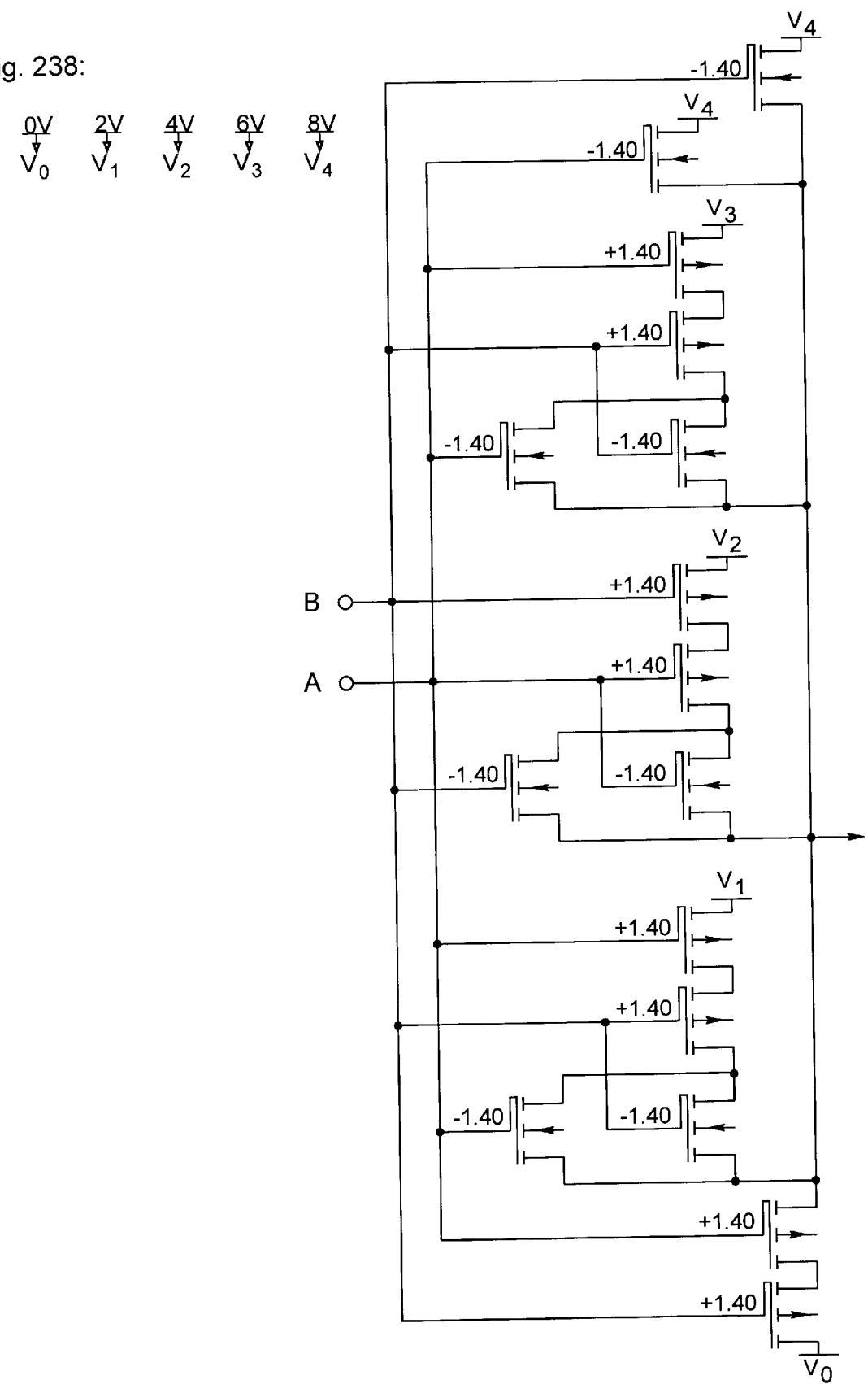
Figure 239A:
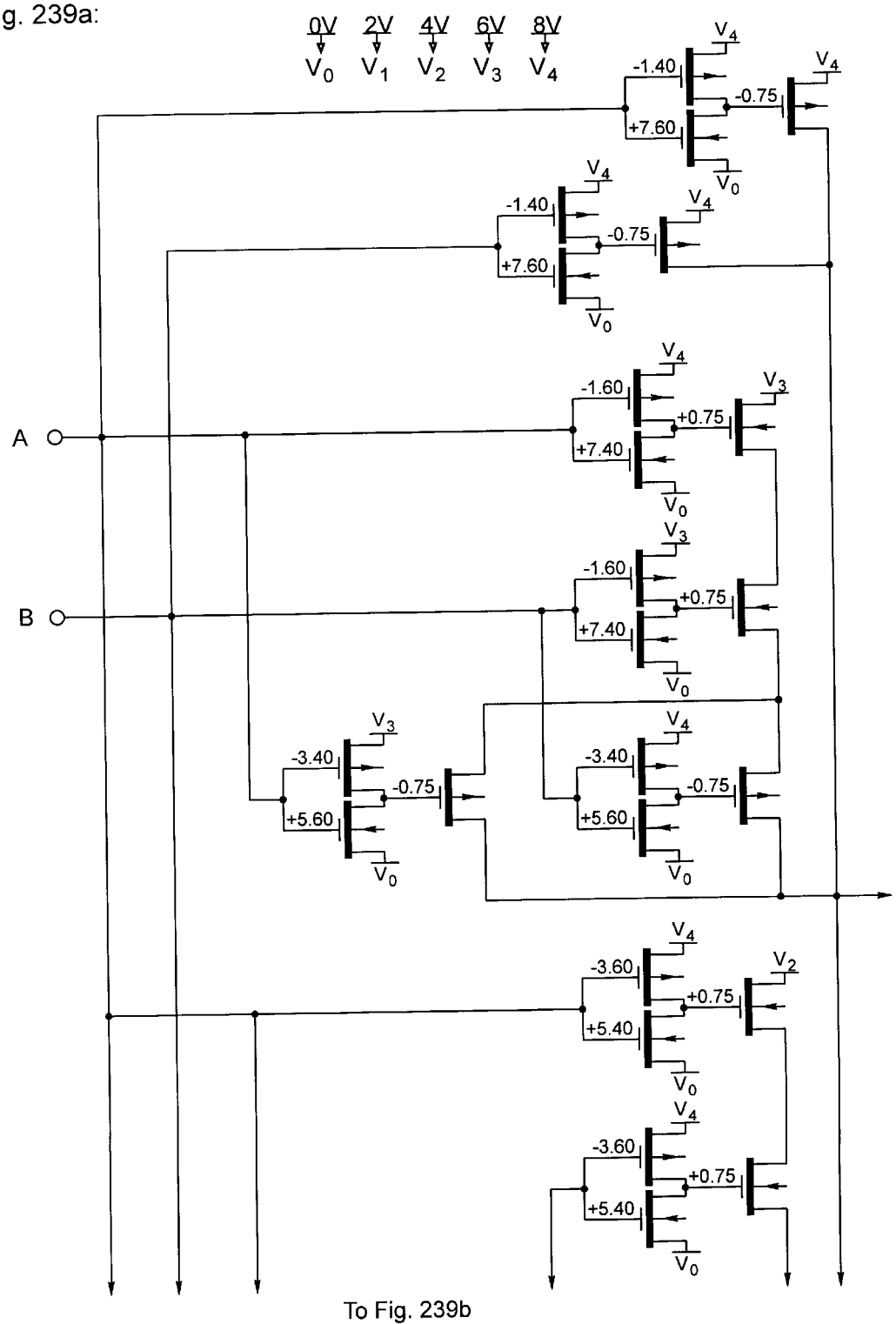
Figure 239B:
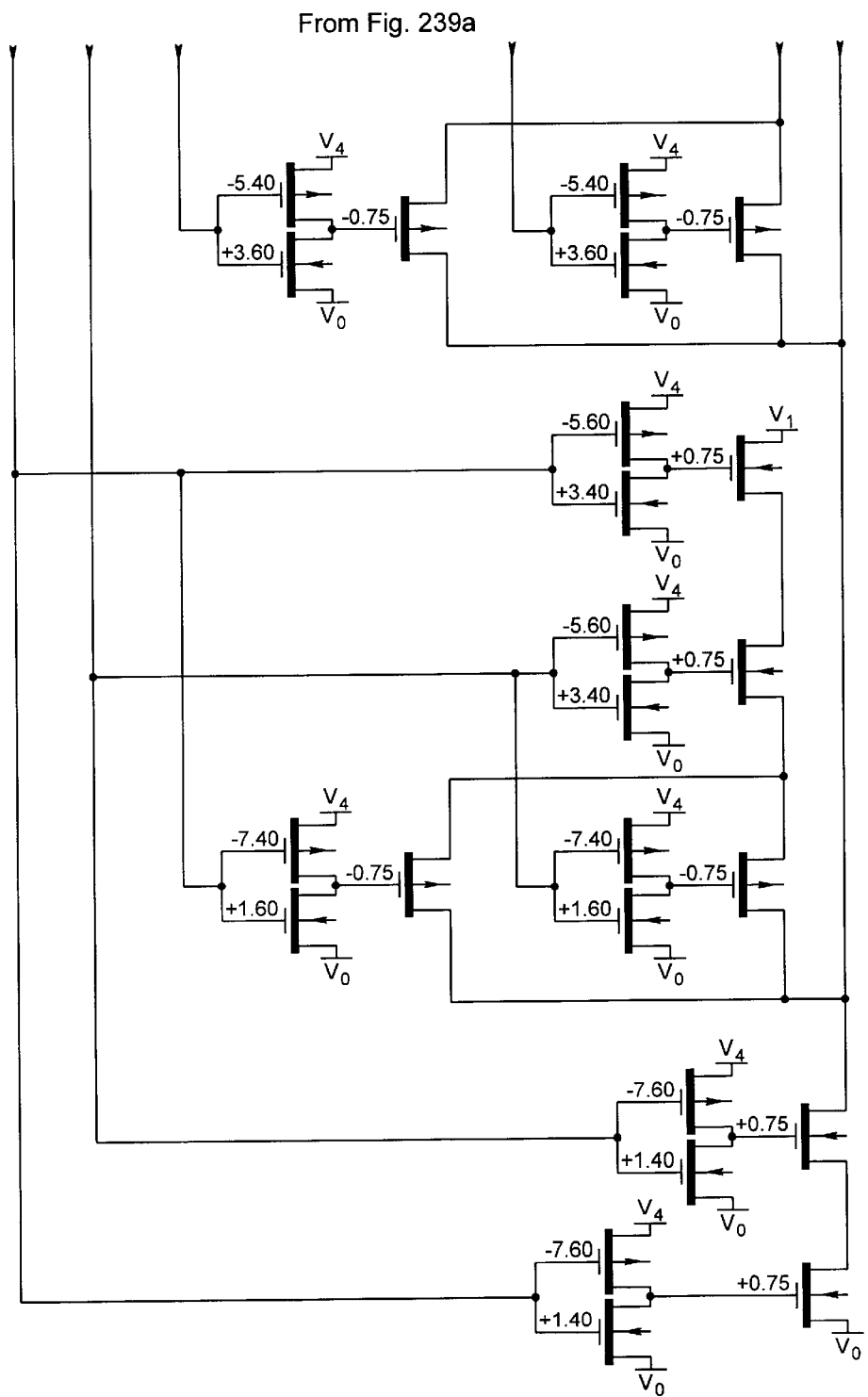

FIG. 238 is a pentanary GOR$_5$ circuit schematic as realized through the SUS-MOS embodiment of SUS-LOC along with its Karnaugh graph. FIGS. 239$a,b$ are the GOR$_5$ circuit schematic of FIG. 238 with additional stages to prevent back biasing. FIGS. 240$a$–240$c$ are a schematic (240$a$), Karnaugh graph (240$b$) and symbol (240$c$) for a complemented CGOR$_5$ circuit of FIG. 121 to provide a GOR$_5$ circuit such as those in FIGS. 238 and 239$a,b$.

Figure 241:
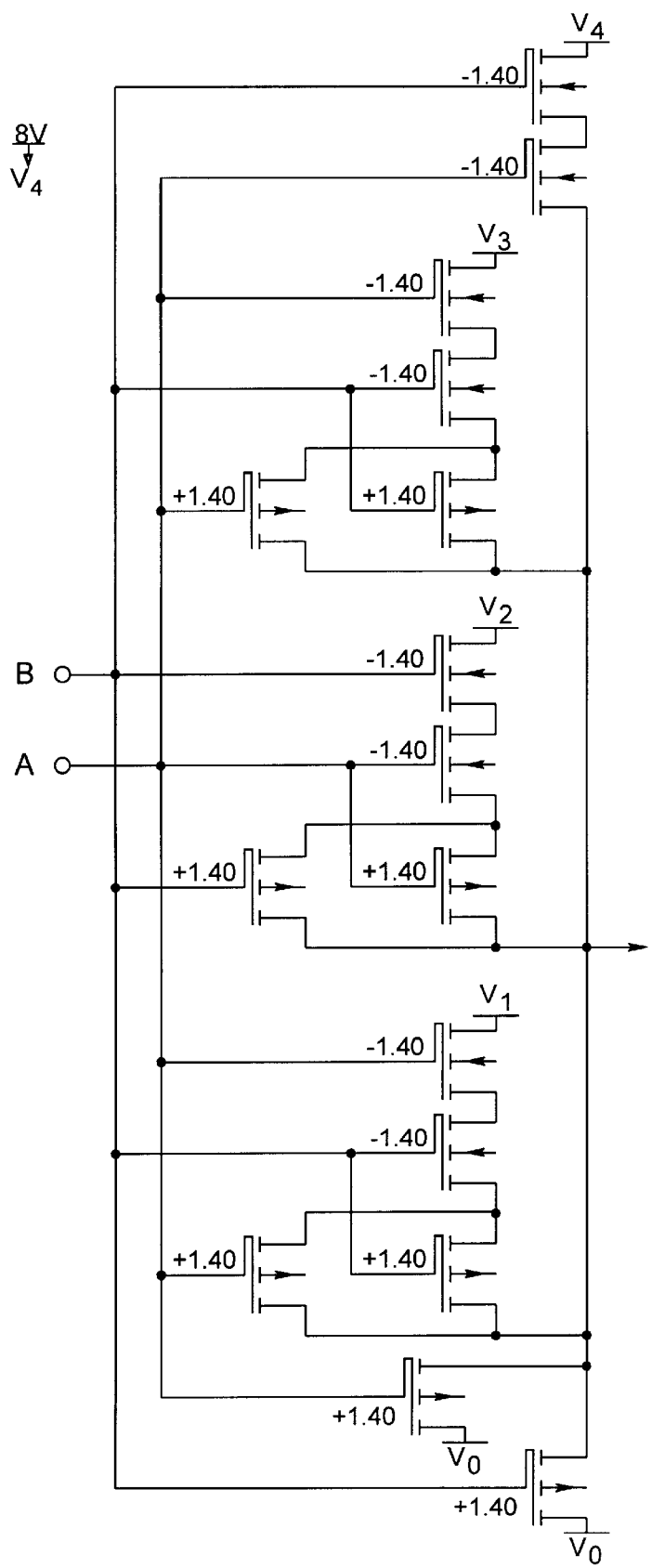

FIG. 241 is a pentanary GAND$_5$ circuit schematic as realized through the SUS-MOS embodiment of SUS-LOC along with its Karnaugh graph.

Figure 242A:
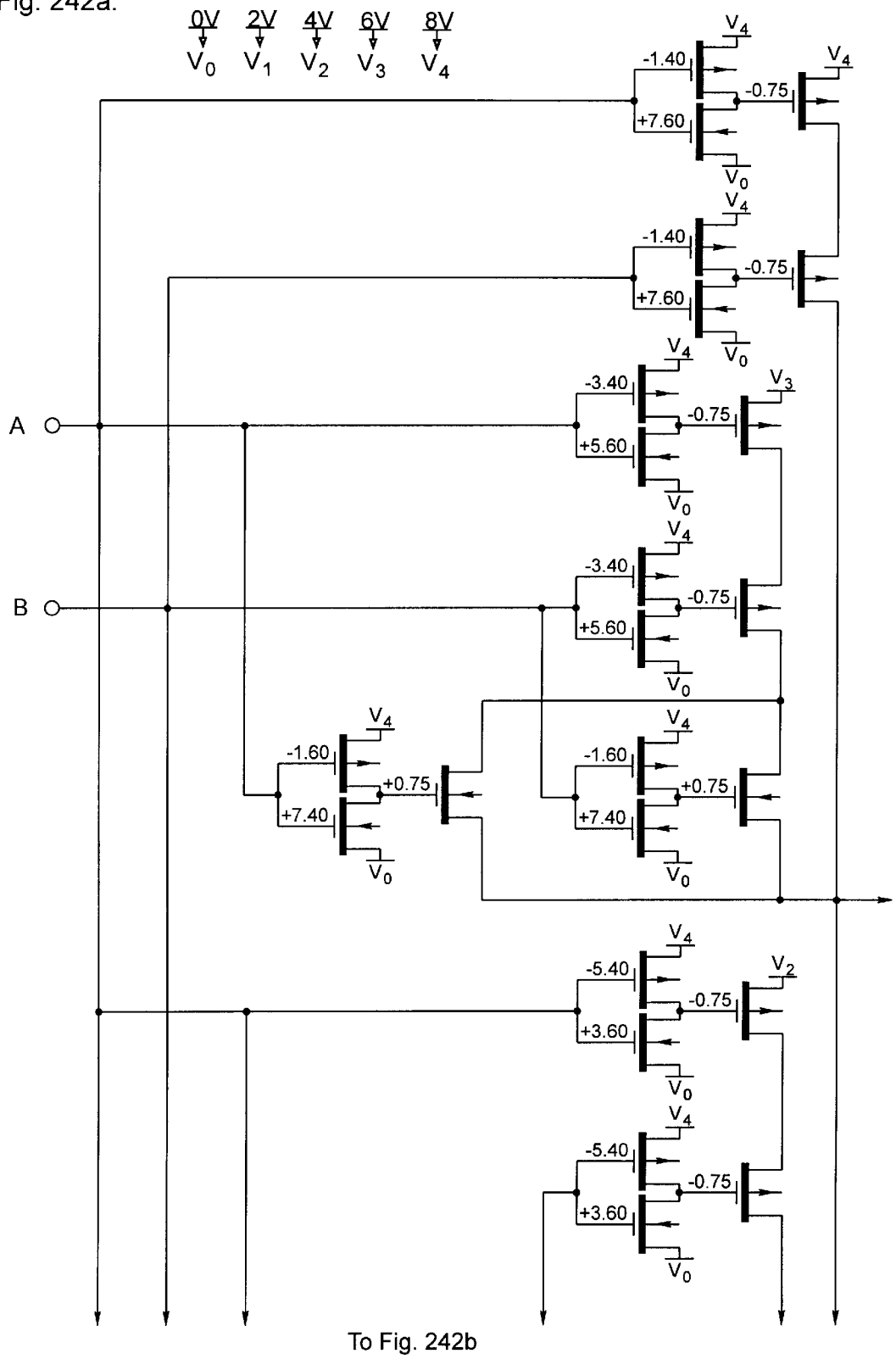
Figure 242B:
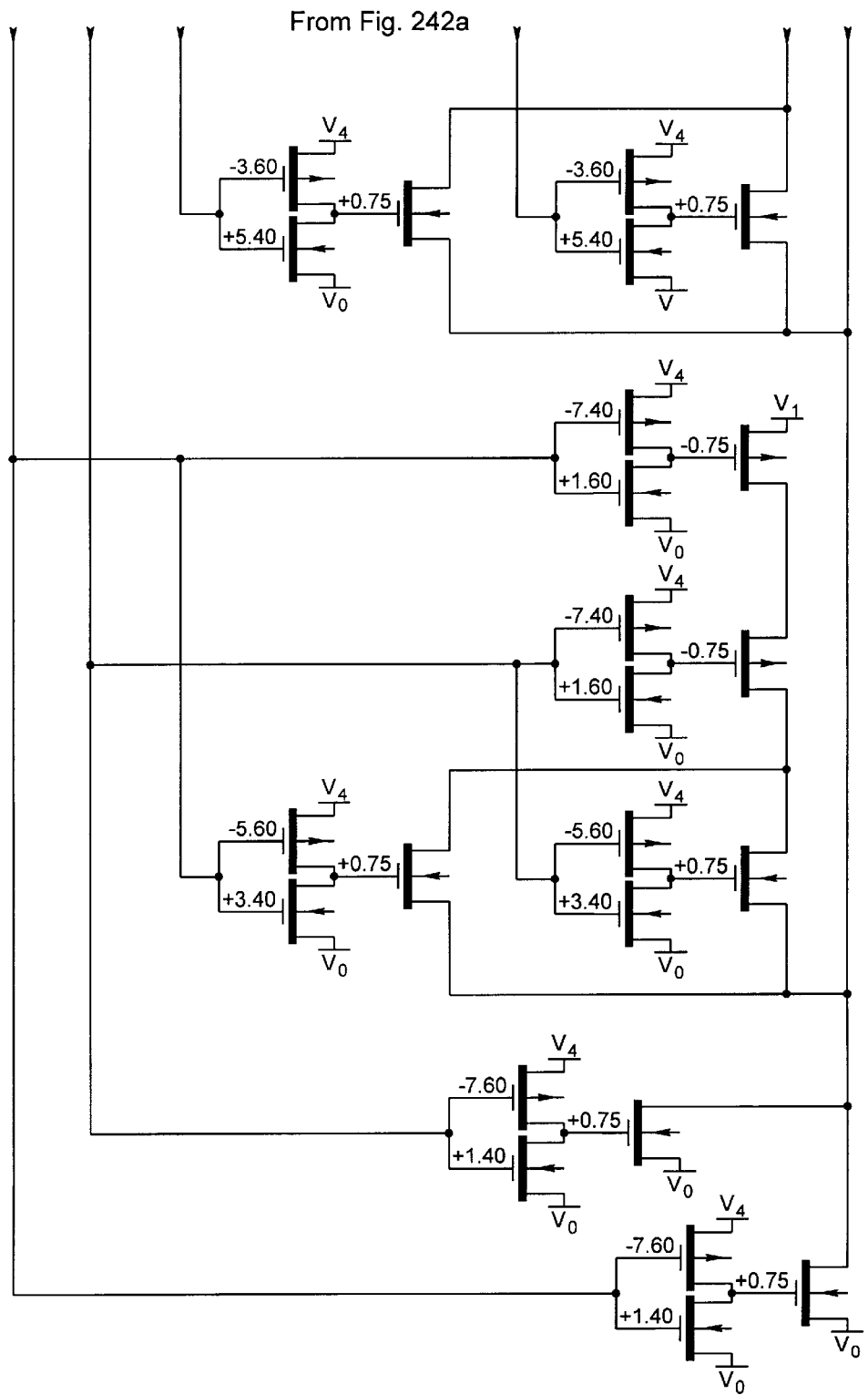

FIGS. 242$a,b$ are the GAND$_5$ circuit schematic of FIG. 241 with additional stages to prevent such back biasing.

FIGS. 252$a$ and 252$b$ show the schematic (252$a$) and Karnaugh graph (252$b$) for a tetranary embodiment of a CMORAGA circuit named after Dr. Claudio Moraga of the University of Dortmund, Germany.

FIGS. 243$a$–243$c$ are a schematic (243$a$), a Karnaugh graph (243$b$) and a symbol (243$c$) for a complemented CGAND$_5$ circuit of FIG. 124 to provide a GAND$_5$ circuit such as those in FIGS. 241 and 242$a,b$.

Figure 121:
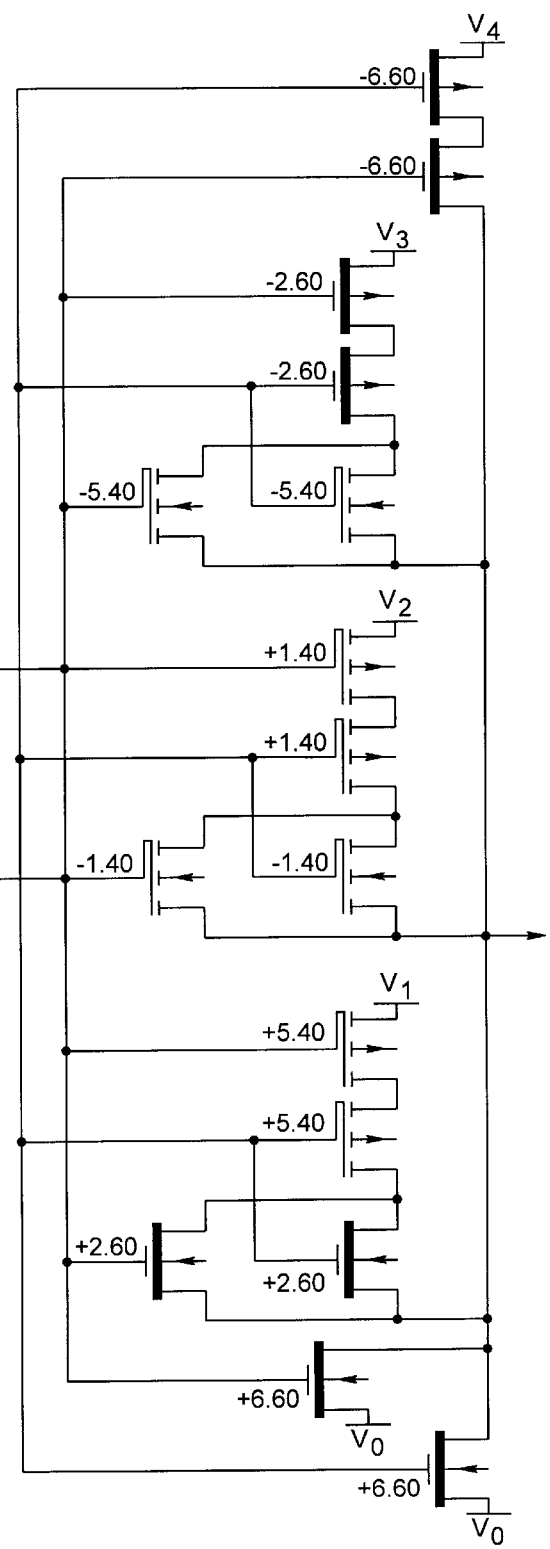
FIG. 121 is a schematic representation of the $CGOR_5$ circuit.
Figure 122:
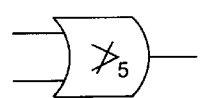
FIG. 122 is the symbol for the $CGOR_5$ circuit of FIG. 121.
Figure 123:
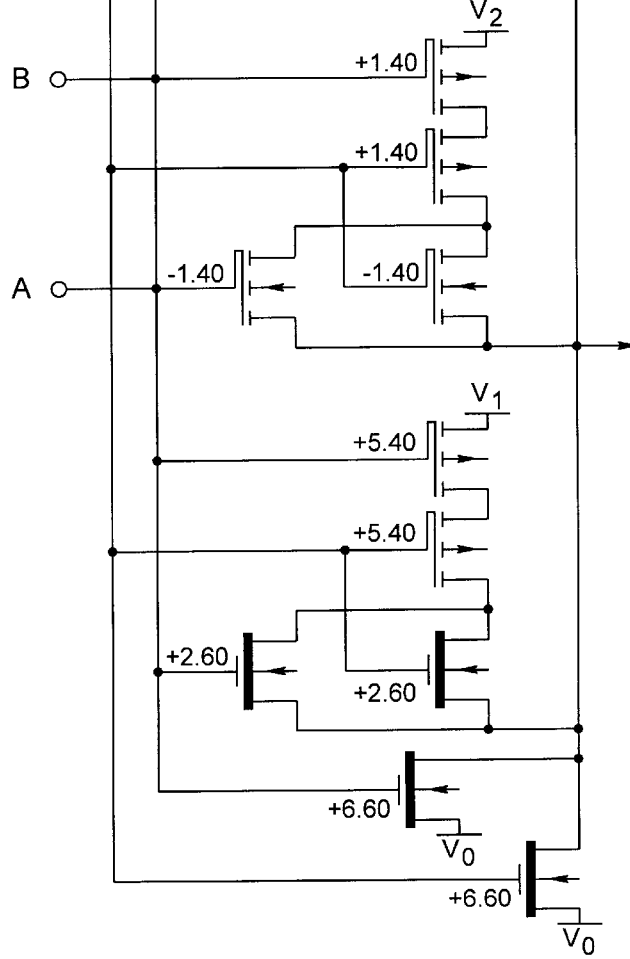
FIG. 123 is the Karnaugh graph for the $CGOR_5$ circuit of FIG. 121.

FIGS. 244$a$–244$c$ are the CGOR$_5$ circuit schematic of FIG. 121 with brackets about absolute threshold voltages calculated from the source voltage plus the relative gate threshold voltage (244$a$). The Karnaugh graph (244$b$) and CGOR$_5$ symbol (244$c$) are also shown in the FIG. 244 series.

FIGS. 245$a$–245$l$ are a complete set of Karnaugh graph groupings (set forth in heavy circumscribing) for the pentanary CEQ$_5$ circuit.

FIGS. 245 $a,b$ are the composite circuit branches schematics corresponding to the Karnaugh graph groupings of FIG. 245. FIG. 246$c$ shows the karnaugh graph for the entire circuit which is representable by the symbol shown in 246$d$.

FIGS. 247$a$–247$i$ show an alternative Karnaugh graph grouping scheme for the CEQ$_5$ circuit.

FIGS. 248$a,b$ are the composite circuit branches schematics corresponding to the Karnaugh graph groupings of FIG. 247 with the Karnaugh graph and symbol shown in FIGS. 248$c$ and 248$d$, respectively.

Figures 249A, 249B, 249C, 249D, 249E, 249F, 249G, 249H, 249I, 249J, 249K, 249L:
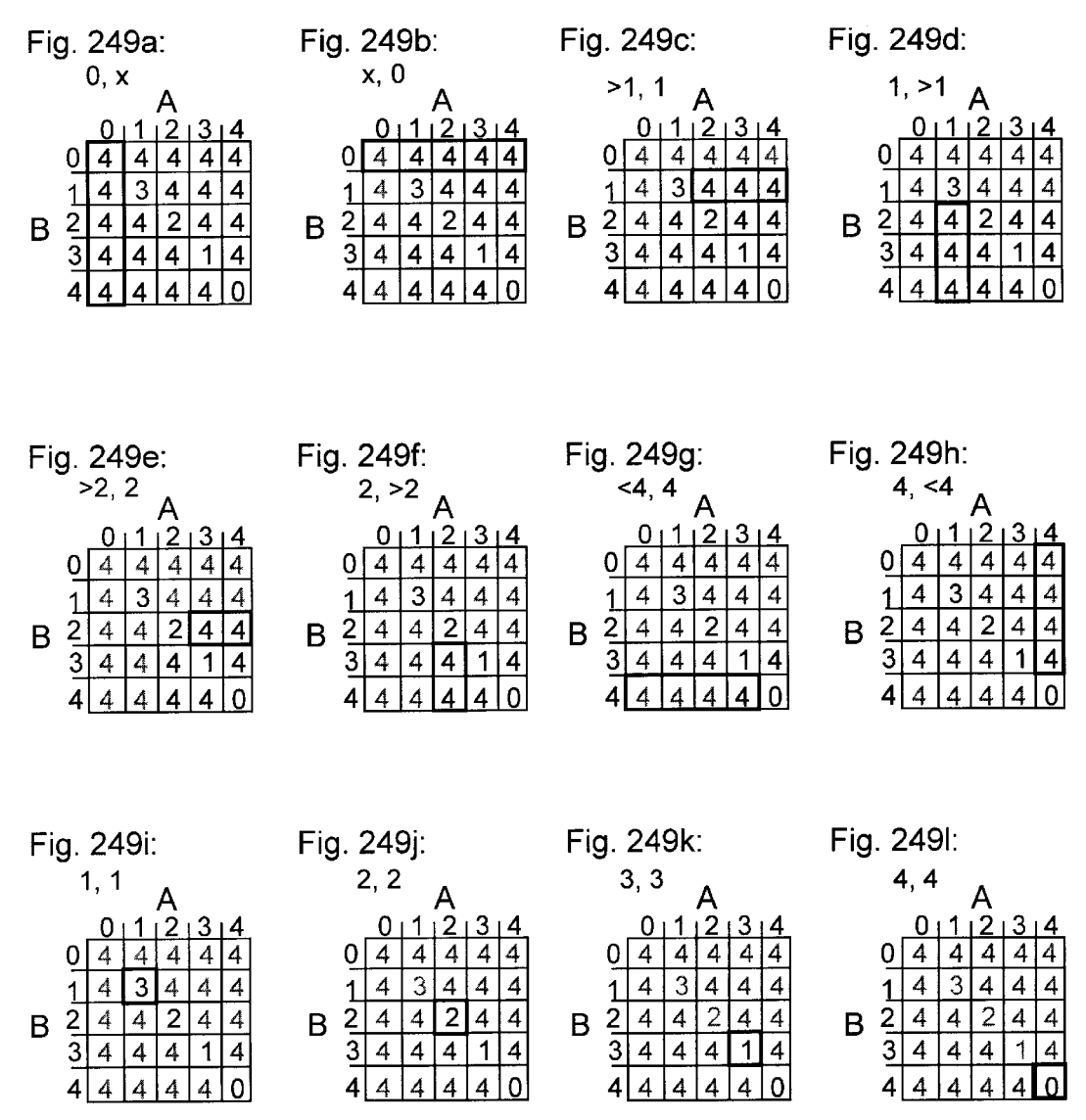

FIGS. 249$a$–249$l$ show a second alternative Karnaugh graph grouping for the CEQ$_5$ circuit.

FIGS. 250$a$–250$c$ show the schematic (250$a$), Karnaugh graph (250$b$), and symbol (250$c$) for the complemented ternary Sigma or CSIGMA$_3$ circuit.

FIGS 251$a$–250$c$ show the schematic (251$a$), Karnaugh graph (251$b$), and symbol (251$c$) for an alternative embodiment of the ternary Sigma or SIGMA$_3$ circuit.

DESCRIPTION OF THE PREFERRED EMBODIMENT(S)

Described herein is a multiple-valued logic circuit structure and method of obtaining same. The Supplementary Symmetrical Logic Circuit structure (SUS-LOC) disclosed herein is intended primarily for the design and fabrication of fully active logic circuits of a radix (r) greater than 2. The SUS-LOC structure can be used to implement any r-valued logic function of n-places, as well as the elements required for sequential and clocked sequential logic, where r, the radix, is an integer greater than 1, and n is an integer greater than 0.

Prior disclosures made under the U.S. Patent and Trademark Office Document Disclosure Program are explicitly incorporated herein by this reference thereto. The symbols and nomenclatures that are presented herein are subject to change as multiple valued logic and the SUS-LOC structure are further developed.

Previous logic structures developed over the past 50 years have been devoted almost exclusively to the synthesis of binary logic and include: Transistor-Transistor Logic, (TTL); P and N-channel Metallic Oxide Semiconductor, (PMOS & NMOS); and Complementary Symmetrical Metallic Oxide Semiconductor, (originally COS-MOS; currently CMOS).

The majority of the reasons why a logic structure capable of supporting the synthesis of logical functions other than binary has not previously been developed are speculative at best, but may include: a pre-occupation with binary logic; the assumption that implementation of a higher radix would be too complex or expensive; and the prior success of binary.

There are two reasons that are not speculative. The first is that a cost-effective method of producing and detecting intermediate logic levels has previously been unavailable. Secondly, before a circuit capable of synthesizing a logical function can be realized (especially a fully active one), three requirements must be met by the rules and definitions of the structure used to design and fabricate the circuit. These three requirements are:

1) there must be r different sources of power available with each source of power representing only one of r different logic levels;
2) there must be one controllable path, or branch, from a source of power to an output terminal of the circuit per output logic level; and
3) only one controllable path, or branch, conducts from a source of power to an output terminal per input logic level, contiguous group of input logic levels, or unique combination of input logic levels.

The design rules and definitions of the SUS-LOC structure, through "supplementation", meet all three requirements. This allows the design and economical fabrication of fully active circuits capable of synthesizing any revalued logic function circuit of n-places using only binary switches (e.g., transistors).

The characteristic output features of SUS-LOC based circuits are determined by the specifications of the switches used. Fabrication of SUS-LOC based circuits can be accomplished with the techniques, materials, and equipment of circa 1970. However, recent developments in circuit technology can be advantageously employed in conjunction with the present invention. Also, the predominance of ternary logic in this patent is not a limitation of the SUS-LOC structure, but rather the result of optimization for a general purpose computer and complies with a general philosophy having simpler elements giving stability to sophisticated and complex systems.

In the simplest case of "one-place functions" (below), "supplementation" is the technique used to achieve stable intermediate logic/voltage level(s). As an example, for the ternary complementer F210, one switch is used for each of two terminus logic levels. Two switches are connected to conduct in series and share a common control signal with the termini for each intermediate logic level "supplementing" the termini per input term, per output logic level in excess of two. The two switches of an intermediate logic level define the upper and lower input signals that generate the output response of the intermediate logic level.

A few advantages derived from increasing the radix of a logic synthesizing circuit include, but are not limited to: a decrease of quiescent and dynamic power requirements, an increase of data density, and increased computational ability.

The switches selected for this disclosure of the SUS-LOC structure, due to their low cost, high reliability, and ease of manufacture are Insulated Gate Field Effect Transistors, (IGFETs, FETs). However, any switch(es) of similar characteristics may be suitable substitutes such as, but not limited to, Insulated Gate Bipolar Transistors or analogous optical devices.

The channel type, mode, and threshold voltage ($V_{GS(TH)}$), of each FET is fabricated or selected such that when one branch is on, all other branches are off. That is, all the switches in one branch are on while at least one switch in all other branches are off. For a one-place function (OPF), when either terminus branch is on, the other terminus branch and at least one FET of each intermediate branch is OFF. Additionally, when an intermediate branch is on, both terminus branches and at least one FET of all other intermediate branches is OFF. Therefore, for any unique input only a unique output is delivered. This is true for any number of inputs.

Basic Circuit Elements: IGFETS

In the present invention, SUS-LOC circuits are constructed using insulated gate field effect transistors (IGFETs, FETs). IGFETs are known in the art and have a source S, a gate G, and a drain D. Very generally, IGFETs both allow and prevent the transmission of the source voltage to the drain according to the gate input control voltage impressed upon the IGFET. The transmission or non-transmission of the source voltage to drain depends upon the relative voltage between the source voltage and the gate, or input, voltage. Depending upon the specific IGFET and its chosen operating characteristics, gate input control voltages may be higher or lower than the source voltage.

With these operating characteristics, IGFETs are highly suited for application in SUS-LOC. Alternatively, other means by which control voltages (or inputs) can both allow and prevent the transmission of source voltages that are both lower and higher than the control voltage are possible substitutes for IGFETs. With the advancement of optical technology, optical analogues of IGFETs may become available and act as substitutes for IGFETs. Optical analogues, or quantum devices such as the "Super Pass" transistor, may solve the back biasing problem suffered by IGFETs in SUS-LOC. The "Super Pass" transistor was disclosed by X. Deng, T. Hanyu and M. Kameyama in their paper "Quantum Device Model Based Super Pass Gate for Multiple-Valued Digital Systems" made to the 25th International Symposium on Multiple-Valued Logic (ISMVL), 1995.

Figure 1:
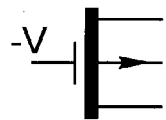
FIG. 1 is a schematic representation of a P-channel enhancement mode transistor with a $V_{GS\ on}/V_{GS(TH)}$ of −V.
Figure 2:
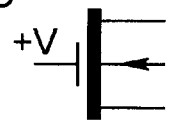
FIG. 2 is a schematic representation of an N-channel enhancement mode transistor with a $V_{GS\ on}/V_{GS(TH)}$ of +V.
Figure 3:
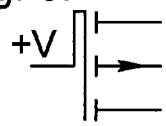
FIG. 3 is a schematic representation of a P-channel depletion mode transistor with a $V_{GS\ off}/V_{GS(TH)}$ of +V.
Figure 4:
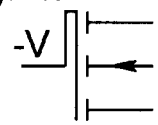
FIG. 4 is a schematic representation of an N-channel depletion mode transistor with a $V_{GS\ off}/V_{GS(TH)}$ of −V.
Figure 5:
FIG. 5 is a schematic representation of a FET with a near-zero threshold.

FIGS. 1 and 2 show enhancement mode FETs of the P and N-channel types, respectively. FIGS. 3 and 4 show depletion mode FETs of the P and N-channel types, respectively. FIG. 5 shows a near zero threshold FET. Next to the gate of each FET, other than a near zero threshold FET, is a "+V" or "−V" used to indicate the polarity and magnitude of the threshold voltage, $V_{GS(TH)}$, relative to the FET's source voltage. In this patent, $V_{GS(TH)}$ is also referred to as $V_{GS\ on}$ and as $V_{GS\ off}$ to indicate the switching effect for enhancement and depletion mode FETs, respectively.

For an enhancement mode transistor (FIGS. 1 and 2), when the gate input voltage traverses the gate threshold voltage ($V_{GS\ on}$) with respect to the source voltage, the transistor turns on. For a depletion mode transistor (FIGS. 3 and 4), when the gate input voltage traverses the gate threshold voltage ($V_{GS\ off}$) with respect to the source voltage, the transistor turns off. FIGS. 7a–7f show these response characteristics in graphical form.

One way to understand the operation of IGFETs is to consider the situation where the gate input voltage is initially at the same level as the source voltage. The gate threshold voltage will be ±V relative to the source voltage and is a constant according to how the FET has been made. Generally, enhancement mode IGFETs are off and depletion mode IGFETs are on when the input gate voltage equals the source voltage. As the gate input voltage increases or decreases to approach the absolute gate threshold voltage (either source voltage plus $V_{GS(TH)}$ or source voltage minus $V_{GS(TH)}$). Upon traversing the absolute gate threshold voltage, the IGFET will operate according to its preselected characteristics. For enhancement mode IGFETs, the IGFET turns on and conducts the source voltage to the drain. For depletion mode IGFETs, the IGFET turns off and does not conduct the source voltage to the drain.

FIG. 1 shows an P-channel enhancement mode transistor with a gate threshold voltage, $V_{GS\ on}$ of −V. The term $V_{GS\ on}$ indicates the relative gate threshold voltage at which the P-channel enhancement mode transistor turns on. The relative voltages are the gate input voltage and the source voltage. If the gate input voltage differs from the source voltage by at least the gate threshold voltage $V_{GS\ on}$ of −V, the P-channel enhancement mode transistor is on and the source voltage will be conducted to the drain. If the gate voltage differs from the source voltage by less than −V, the P-channel enhancement mode transistor is off and no conduction occurs between the source and the drain. The present invention uses P-channel enhancement mode transistors to transmit the source voltage to the drain when the gate input voltage is lower than the source voltage by the gate threshold voltage. The relative gate threshold voltage ($V_{GS\ on}$) between the gate and source voltages is controlled by altering the dopant level and other characteristics (such as the oxide thickness) of the transistor during fabrication. These operating characteristics of a P-channel enhancement mode IGFET are correspondingly similar for other IGFETs used in the present invention.

FIG. 2 shows an N-channel enhancement mode transistor having a relative gate threshold voltage $V_{GS\ on}$ of +V. If the gate input voltage differs from the source voltage by at least +V, the N-channel enhancement mode transistor is on and the source voltage will be conducted to the drain. Otherwise, the transistor is off. The present invention uses N-channel enhancement mode transistors to transmit the source voltage to the drain when the gate input voltage is higher than the source voltage by the relative gate threshold voltage.

FIG. 3 shows a P-channel depletion mode transistor having a relative gate threshold voltage, $V_{GS\ off}$, of +V. If the gate input voltage differs from the source voltage by at least +V, the P-channel depletion mode transistor is off and no conduction will occur between the source and the drain. Otherwise, the transistor is on and conducts the voltage at its source to its drain. The present invention uses P-channel depletion mode transistors to shut off the source voltage from the drain when the gate input voltage is higher than the source voltage by the relative gate threshold voltage.

FIG. 4 shows an N-channel depletion mode transistor with a gate threshold voltage, $V_{GS\ off}$, of −V. If the gate input voltage differs from the source voltage by at least the gate threshold voltage $V_{GS\ off}$ of −V, the N-channel depletion mode transistor is off and no conduction will occur between the source and the drain. If the gate voltage differs from the source voltage by less than −V, the N-channel depletion mode transistor is on and conduction will occur between the source and the drain. The present invention uses N-channel depletion mode transistors to shut off the source voltage from the drain when the gate input voltage is lower than the source voltage by the gate threshold voltage.

P-channel FETs are useful in defining the upper bounds of a SUS-LOC branch while N-channel FETs are useful in defining the lower bounds of a SUS-LOC branch. By selectably defining conduction bands having upper and lower bounds as defined by P-channel and N-channel FETs, logical circuit functions for any number system (radix r) can be designed having any number of inputs (n).

As circuit symbols generally disclose the circuit element involved, the drawing figures accompanying this patent generally serve as complete disclosures for the SUS-LOC circuits shown therein.

Figure 6:
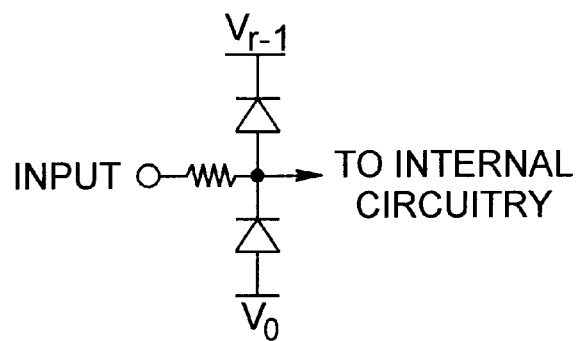
FIG. 6 is a schematic representation of circuitry designed to prevent component damage due to electrostatic discharge (ESD).

Because this disclosure of the SUS-LOC structure uses FETs, protecting the inputs against electrostatic discharge (ESD) is desirable. FIG. 6 shows one method of protecting inputs from ESD. Other methods may also be used.

The maximum and minimum power supply voltages (the output voltages) for SUS-LOC circuits are determined by the output requirements of the circuit and/or the specifications of the switches being employed. However, the suggested minimum power supply voltages for logic levels 0 and 1 are 0.0 volts and 1.5 volts, respectively. Each additional logic level may then be the previous logic level voltage plus the logic level 1 voltage to provide a logic step voltage (LSV) of 1.5 volts. It is important to maintain discrete logic levels in digital applications, 1.5 volts is seen as being easily achievable. Other LSV values may also be used to good effect.

The power supply designators used in schematic diagrams of SUS-LOC circuits, are simply the letter "V" subscripted with the logic level represented by that voltage, (e.g., $V_1$ represents logic level 1, $V_3$ represents logic level 3, etc.).

Due to the extremely high input impedance of FETs, and due to each output power supply voltage representing only one of r different logic levels, the logic levels of a SUS-LOC circuit are virtually equal to the supply voltages representing the logic levels. As set forth below, the voltage range, or domain, for each of the r different logic levels are established according to predictable relationships.

The threshold voltages, $V_{GS(TH)}$, of P-channel FETs are selected or fabricated to be a percentage of a logic level above the highest input logic level to which they are to conduct. The threshold voltages, $V_{GS(TH)}$, of N-channel FETs are selected or fabricated to be a percentage of a logic level below the lowest input logic level to which they are to conduct. The suggested percentage for each should be in the range of 55% to 75% of the logic step voltage (LSV) such that an overlap of on branches is obtained when the circuit is switching from one output logic level to another. This percentage is called the "overlap percentage" (OP) and should be the same for all switches used in digital applications. Analog applications may require that the $V_{GS(TH)}$ and/or OP and/or the LSV be variable.

When the OP is used as suggested, circuit symmetry is maintained as the logic level switch point voltage is the mid-point between the two adjacent logic level voltages. The output transfer characteristics are enhanced due to the continuous application of voltage to the output terminal during switching. A domain is created for each logic level, the boundaries of which are established by the upper and lower switch point voltages for an intermediate branch, and a switch point voltage and $V_0$ or $V_{r-1}$ for a terminus branch.

When developing a logic function, or logic synthesizing, circuit ("logic function"), it is necessary to calculate the appropriate or required threshold voltages for each of the FETs. In order to calculate the $V_{GS(TH)}$ for a particular FET, the appropriate equation is selected according to the FET's channel type from the following two equations:

P-channel: $V_{GS(TH)}=Vi-(VO-(OP\times LSV))$;

and

N-channel: $V_{GS(TH)}=Vi-(VO+(OP\times LSV))$.

Where:
Vi is the input logic level voltage limit (upper or lower, as appropriate) to which the branch responds;
VO is the output logic level voltage;
LSV is the logic step voltage; and
OP is the selected overlap percentage preferably in the range of 55% to 75%.

The noise immunity of a SUS-LOC circuit ranges from approximately 45 % of a logic level to several logic levels due to the logic level domains, tolerances of the switches and power supplies, the high impedance of FETs, and the overlap percentage. The output of some functions change one logic level with an input change of two or more logic levels, hence the noise immunity in SUS-LOC can range several logic levels.

Any circuit element(s) connecting/disconnecting an output terminal to/from a source of power in response to an input stimulus is denominated a branch to better describe and name specific elements in the present invention. The SUS-LOC structure contains two primary branch types designated "terminus" and "intermediate," and one secondary branch type designated "composite."

All one-place logic functions require a minimum of two terminus branches. The presence and numeration of intermediate branches is determined by the radix and the specific logic function being synthesized. Composite branches are formed by a combination of primary branches when a logic function requires two or more input terms. Such logic functions taking two or more input terms are also called multiple-place functions (MPFs). Each branch type is defined as follows.

A terminus branch consists of one FET, which connects an output terminal to a source of power representing a logic level and is responsive to one or a group of contiguous input logic level(s) when the input is cycled through the logic level sequence of 0, . . . r−1.

The FET used to form a terminus branch is dependent upon the input logic level(s) responded to (I) versus the output logic level (O) of the branch. The channel type (P or N) and mode, enhancement or depletion (E or D), are for I>O, use NE;

for I<O, use PE.

In other words, enhancement mode FETs are used when the responsive input (I) is never equal to the output (O). Again, the FET is not on or conducting to output when I equals O (I=O). This is consistent with enhancement mode FET characteristics. When I>O, an N-type enhancement mode FET is used. When I<O, a P-type enhancement mode FET is used. An example of an OPF with such termini is shown in FIG. 89, F201.

A depletion mode FET can be used in a terminus branch when the following conditions are all present:

1. The output logic level is not 0 or r−1 for that FET;
2. The output logic level is required for two or more contiguous input logic levels;
3. The output is an element of the input logic level sequence which includes 0 or r−1;
4. The magnitude of the input will exceed the output logic level either positively or negatively (+ or −);
5. The magnitude of the output logic level is not exceeded by another output logic level; and
6. The other terminus branch FET is an enhancement mode FET.

Figure 71:
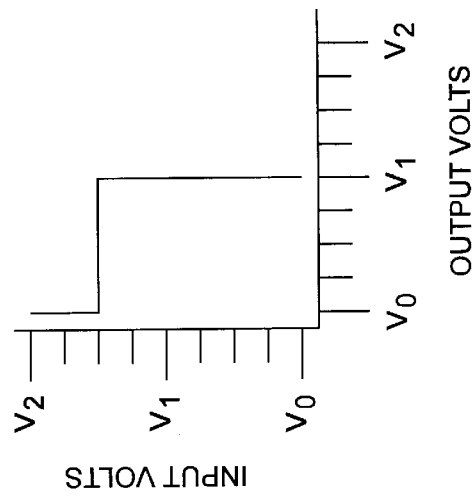
FIG. 71 is a schematic representation of a one-place ternary function having the positional descriptor of $F110_3$.
Figure 72:
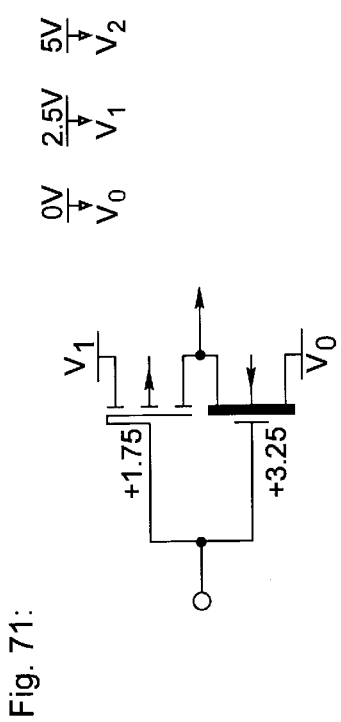
FIG. 72 is a plot of the transfer characteristics of the $F110_3$ OPF shown in FIG. 71.
Figure 73:
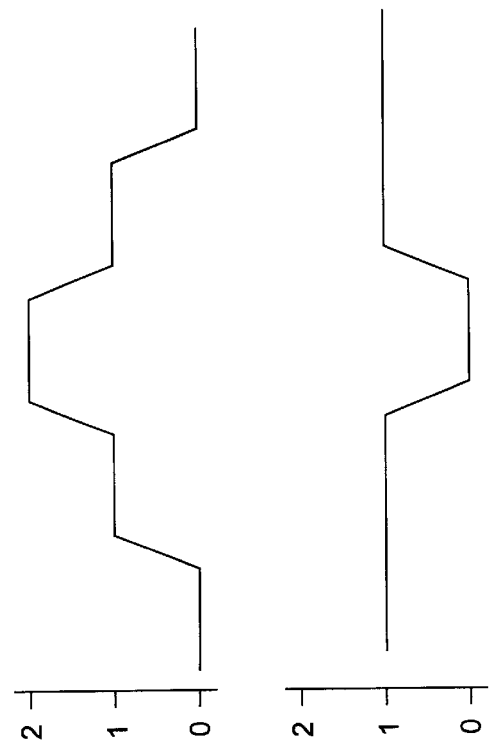
FIG. 73 is a plot of the input to output waveforms of the $F110_3$ OPF shown in FIG. 71.
Figure 83:
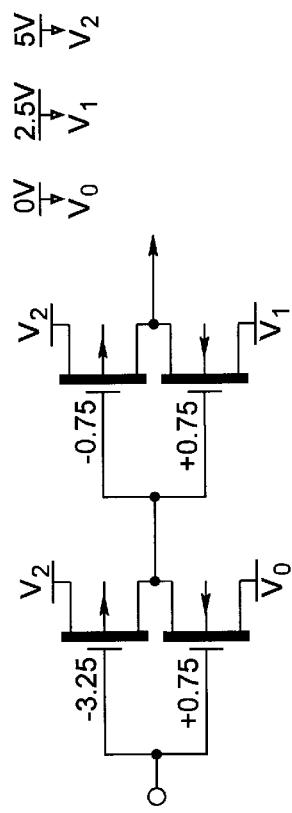
FIG. 83 is a schematic representation of a one-place ternary function having the positional descriptor of $F122_3$.
Figure 85:
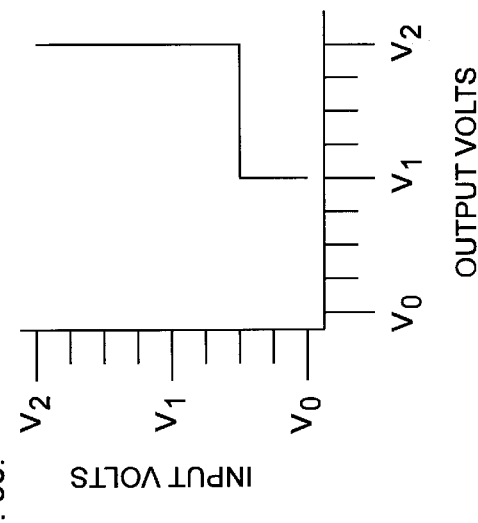
FIG. 85 is a plot of the input to output waveforms of the $F122_3$ OPF shown in FIG. 83.
Figure 84:
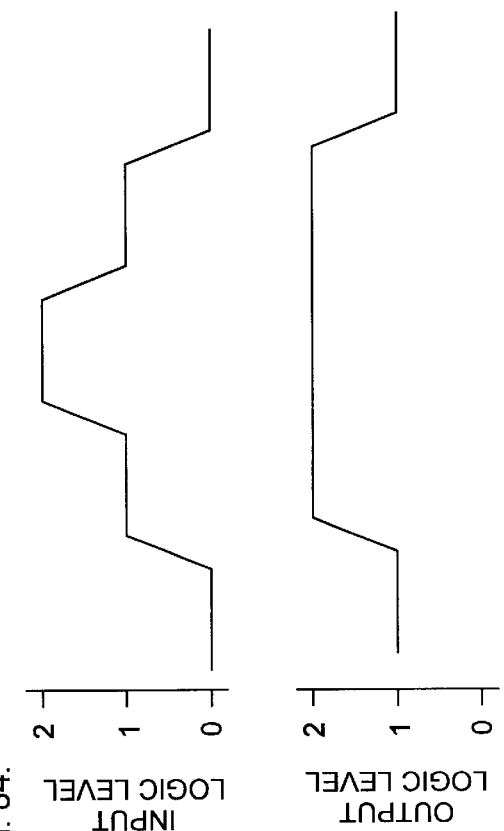
FIG. 84 is a plot of the transfer characteristics of the $F122_3$ OPF shown in FIG. 83.
Figure 86:
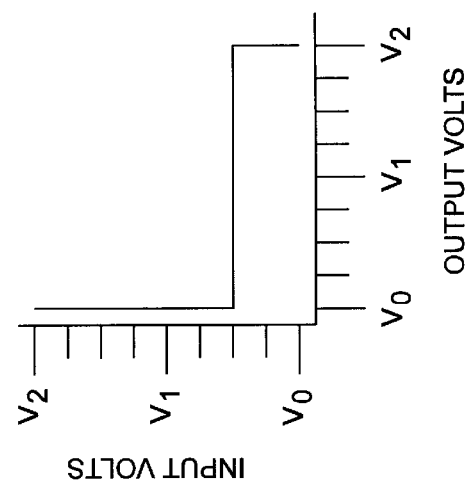
FIG. 86 is a schematic representation of a one-place ternary function having the positional descriptor of $F200_3$.
Figure 87:
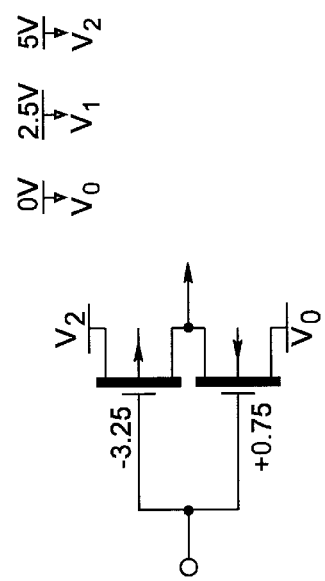
FIG. 87 is a plot of the transfer characteristics of the $F200_3$ OPF shown in FIG. 86.
Figure 88:
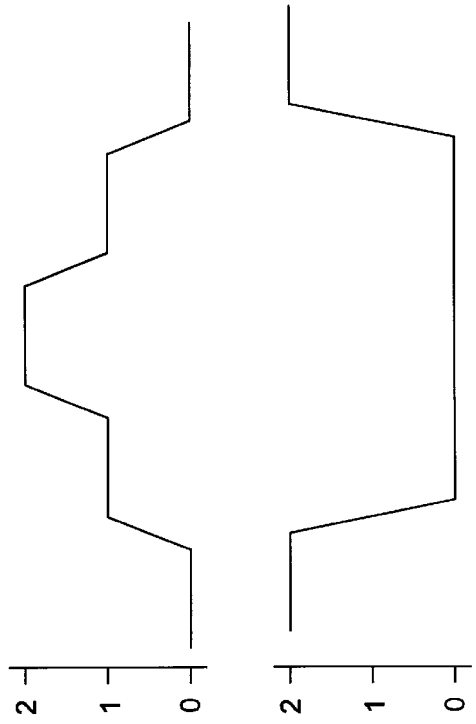
FIG. 88 is a plot of the input to output waveforms of the $F200_3$ OPF shown in FIG. 86.

When the above six conditions are present, the channel type used is as follows:

When the depletion mode FET is to conduct in response to input logic levels 0 and 1, (or 0 and >0, radix dependent), and no other output logic level is greater than the one conducted by the depletion mode FET, then a P-channel depletion mode FET is used. An example of this is F$110_3$ shown in FIG. 71.

When the depletion mode FET is to conduct in response to input logic levels r−1 and r−2, (or r−1 and <r−1, radix dependent), and no other output logic level is less than the one conducted by the depletion mode FET then an N-channel depletion mode FET is used. An example of this is F$211_3$ shown in FIG. 98.

An intermediate branch consists of two FETs, connected to conduct in series, which connect an output terminal to a source of power representative of a logic level between the Is logic levels conducted by the terminus branches, and is responsive to one, or a group of contiguous, input logic level(s) when the input is cycled through the logic level sequence of 0, . . . r−1.

Three possible FET combinations can be used to form an intermediate branch. The specific FET combination is dependent upon the input logic level(s) responded to (I), versus the output logic level (O) of the branch. The combinations of channel type P or N and mode, enhancement or depletion (E or D), are:

for O>I, use PE & ND;

for O ∈ I, use PD & ND;

and for O<I, use PD & NE.

Where:
PE stands for P-channel enhancement mode;
NE stands for N-channel enhancement mode;
PD stands for P-channel depletion mode; and
ND stands for N-channel depletion mode FETs As an example, the pentanary (radix 5) base-1 complementer shown in FIG. 110 contains all three combinations.

Each of these three FET combinations define a window or band gap for which both FETs conduct. Where the conduction band is to occur for responsive inputs I below the output logic level O, PE and ND are used. For a conduction band about O, PD and ND are used. For a conduction band above O, PD and NE are used.

A composite branch is a combination of terminus and/or intermediate branches connected to conduct in series, parallel, or series-parallel as required by the multiple-place logic function in which they occur. Such composite branches arise in multiple-place functions and are absent in one-place functions. For example, the CGOR$_3$ circuit of FIG. 8 and the CGAND$_3$ circuit of FIG. 9 each have three composite branches while the CEQ$_3$ circuit of FIG. 10 has five composite branches.

The relationship of a branch's conducting and non-conducting input logic level(s) to the output logic level(s) determines the mode and channel type of the FET(s) that form that branch.

FETs allow bi-directional current flow between the source and drain electrode. For P-channel FETs, the more positive electrode will act as the source. For N-channel FETs, the more negative electrode will act as the source. Due to the source and drain electrodes being determined by the polarity and/or magnitude of the voltages placed upon them, both one place functions and multiple place functions often require additional circuitry to prevent "back biasing." For one place functions, additional circuit "stages" are used to achieve proper circuit output. For multiple place functions, additional one place functions (OPFs) may be used for one or more of the inputs to ensure proper input logic level(s) to output logic level(s) response of a branch during both its on and OFF states.

When the output logic level changes in the opposite direction of the input logic level(s), the additional stage(s) or OPF(s) is/are not required. For example, if the output decreases for increasing input (as for a complementer), no additional circuitry is needed. However, when the output logic level changes in either the same direction, not in the opposite direction, or randomly, relative to the input logic level(s), then additional stage(s) or OPF(s) is/are required. As more than one branch or circuit element may require the same additional stage, the output(s) and/or input(s) of such stages or OPF(s) may be fed forward as needed.

Because those of ordinary skill in binary logic are primarily concerned with the binary inverter, NOR, NAND, and XOR logic functions, the analogous ternary logic functions are of particular interest and are set forth, below. However, construction and implementation of other r-valued functions may also be achieved and put to good use. Certain ones of these circuits provide advantages and signal-processing capacities not available in binary. Generally any number of radices ($r_1, r_2, \ldots r_n$) in any combinations can be accommodated by SUS-LOC. Additionally, multi-radix circuits having two or more inputs is also within the scope of the present invention. Basic function circuits may use a single radix, r, in a circuit having one or more inputs.

Development of an r-valued SUS-LOC circuit is a four step procedure. These four steps are:

Step 1

Define the parameters of the circuit by:

A. Determining the radix, or radices, of the function;

B. Determining or selecting the logic level voltages and the logic step voltage, (LSV); and C. Determining or selecting the overlap percentage, (OP).

Step 2

Develop a Karnaugh graph of the function to be developed. This is a known procedure to those having ordinary skill in the development of binary logical functions. The only difference is that the graph will generally contain values greater than 1, when the radix of the function is greater than 2, dependent upon the specific logic function being graphed.

Step 3

From the Karnaugh graph developed in STEP 2, list the logical relationships of the input term's/terms' logic level(s) to output logic level. This step is known to those having ordinary skill in binary logic development. However, when the radix is greater than two, a single input acquires the relational characteristics of a multiple place binary function, such relational characteristics including: equal to, greater than, equal to or greater than, the reciprocals of these functions, and permutations thereof.

Because relational operations more complex than simple equality are possible at the most primitive level of SUS-LOC logic synthesis, such known relational operators should be used whenever possible during the performance of STEP 3 to ensure maximum circuit efficiency.

Step 4

Design the circuit from the information obtained from steps 1, 2, and 3. An example of the implementation of these steps is set forth below. The following parameters, (selected to keep the threshold and logic level voltage math simple), are used to develop the ternary circuits shown and set forth herein:

$V_2$=5.0 volts $V_1$=2.5 volts $V_0$=0.0 volts

OP=71%

A ternary base-1 complementer, or inverter, may be developed as follows. Because the parameters (step 1) have been defined in the parameter definition, above, development proceeds with step 2, which obtains the Karnaugh graph shown in table A.

TABLE A

|  | INPUT | | |
| --- | --- | --- | --- |
|  | 0 | 1 | 2 |
| OUTPUT | 2 | 1 | 0 |

Step 3 proceeds to develop and list the logical relationships of the input term/input to the output logic level/output. Performance of step 3 obtains the following relationships set forth in table B:

TABLE B

| I | O |
| --- | --- |
| =0 | =2 |
| =1 | =1 |
| =2 | =0 |

An examination of the relationships indicates that the output changes for each input logic level. This means that there will be three branches, two terminus branches and one intermediate branch.

Step 4 proceeds with the develop the logic function. Beginning with the branch that delivers output logic level 0, and building up to the branch that delivers output logic level r−1 (in this case r−1=2), step 4 proceeds as follows.

To output (O) a logic 0 with an input (I) of logic 2, the output logic level is less than the lowest input logic level to which the terminus branch is to respond. This indicates that an N-channel enhancement mode FET should be used. Using the equation for N-channel devices from the threshold voltage determination section (above), and using a logic step voltage of 2.5 volts and an overlap percentage of 70%, yields a $V_{GS(TH)}$ of:

$$\overset{Vi}{5\text{ volts}} - (\overset{Vo}{0\text{ volts}} + (\overset{OP}{0.7} \times \overset{LSV}{2.5\text{ volts}})) = \overset{V_{GS(TH)}}{+3.75\text{ volts}}$$

Figure 95:
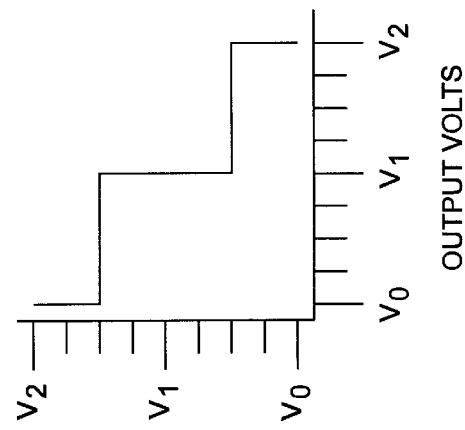
FIG. 95 is a schematic representation of a one-place ternary function having the positional descriptor of $F210_3$, otherwise known as a ternary (base-1) complimenter.
Figure 97:
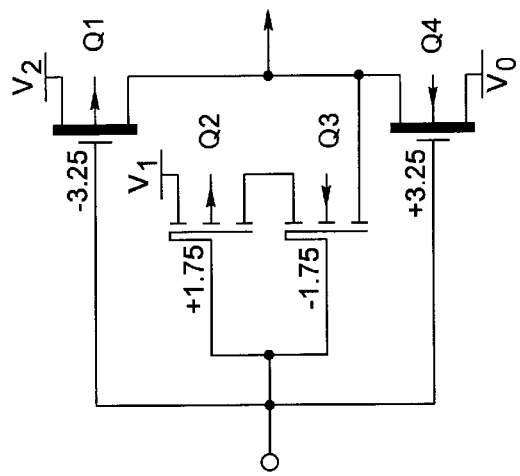
FIG. 97 is a plot of the input to output waveforms of the $F210_3$ OPF shown in FIG. 95.
Figure 96:
FIG. 96 is a plot of the transfer characteristics of the $F210_3$ OPF shown in FIG. 95.
Figure 106:
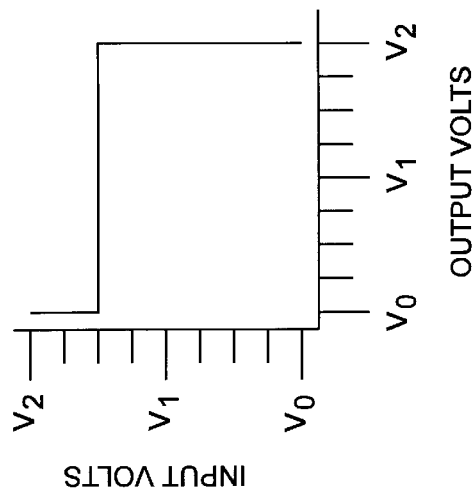
FIG. 106 is a plot of the input to output waveforms of the $F220_3$ OPF shown in FIG. 104.
Figure 104:
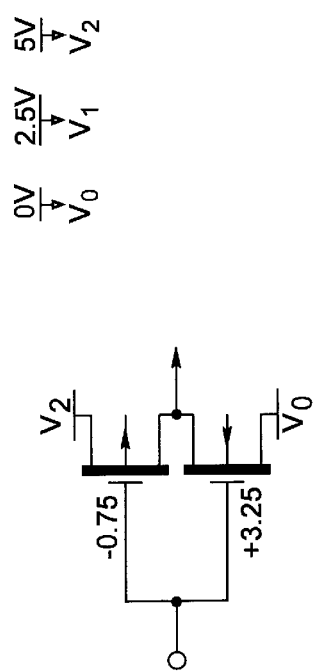
FIG. 104 is a schematic representation of a one-place ternary function having the positional descriptor of $F220_3$.
Figure 105:
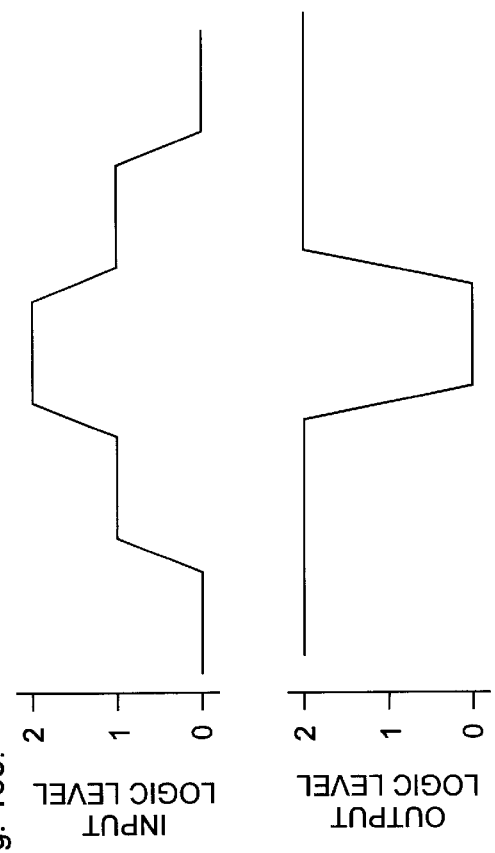
FIG. 105 is a plot of the transfer characteristics of the $F220_3$ OPF shown in FIG. 104.
Figure 107:
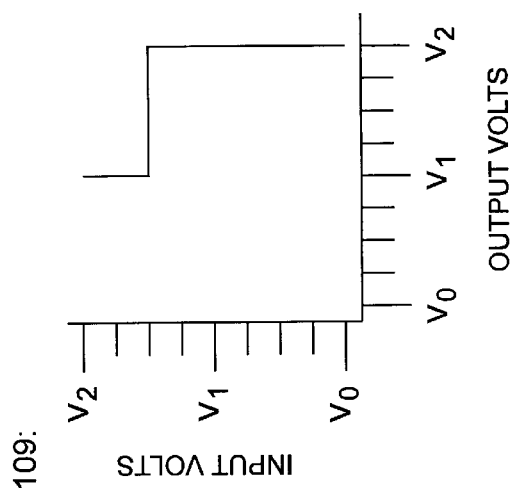
FIG. 107 is a schematic representation of a one-place ternary function having the positional descriptor of $F221_3$.
Figure 108:
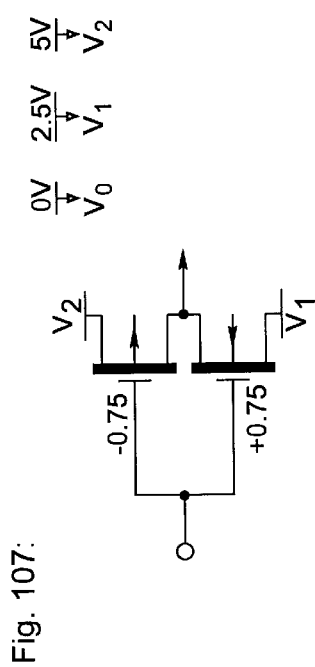
FIG. 108 is a plot of the transfer characteristics of the $F221_3$ OPF shown in FIG. 107.

This FET is shown in FIG. 95 as Q4.

The intermediate branch(es) is/are next to be developed. In this case there is only one, and it must provide a logic 1 output in response to logic 1 input. This indicates that one P-channel depletion mode, and one N-channel depletion mode FETs are required (for O ∈ I, use PD & ND). Using the threshold equations for P-channel and N-channel devices, yields the following $V_{GS(TH)}$ voltages:

P-channel depletion mode:

$$\overset{Vi}{2.5\text{ volts}} - (\overset{Vo}{2.5\text{ volts}} - (\overset{OP}{0.7} \times \overset{LSV}{2.5\text{ volts}})) = \overset{V_{GS(TH)}}{+1.75\text{ volts}}$$

N-channel depletion mode:

$$\overset{Vi}{2.5\text{ volts}} - (\overset{Vo}{2.5\text{ volts}} + (\overset{OP}{0.7} \times \overset{LSV}{2.5\text{ volts}})) = \overset{V_{GS(TH)}}{-1.75\text{ volts}}$$

These two FETs are shown in FIG. 95 as Q2 and Q3, (their positions are interchangeable in one place functions such as this one).

To provide an output of logic 2 for an input of logic level 0, the output logic level is greater than the highest input logic level to which the terminus branch is to respond, indicating the use of a P-channel enhancement mode FET. Using the equation for P-channel devices, yields a $V_{GS(TH)}$ of:

$$\overset{Vi}{0\text{ volts}} - (\overset{Vo}{5\text{ volts}} - (\overset{OP}{0.7} \times \overset{LSV}{2.5\text{ volts}})) = \overset{V_{GS(TH)}}{-3.75\text{ volts}}$$

This FET is shown in FIG. 95 as Q1.

The method used to develop the branches of the ternary base-1 complementer is valid for the development of all branches of any r-valued logic function of any number of places. The method is extendable to accommodate the additional intermediate branches.

SUS-LOC provides for the development of multiple place functions that allow comparison and other logical operations for several inputs using the same radix r-based logic level signals. Actual branch design (step 4) is similar to that described in ternary base-1 complementer development, above. To provide examples of the present invention, steps 2, 3 and the results of step 4 are described for three ternary multiple place functions: the complementing generalized OR ($CGOR_3$), the complementing generalized AND ($CGAND_3$), and the complementing equality generator, ($CEQ_3$). These three ternary functions are considered analogous to binary "NOR", "NAND", and "Exclusive OR", ("XOR") gates, respectively.

A ternary complementing generalized OR, or $CGOR_3$, gate is analogous to a binary "NOR" gate. The output logic level of a $CGOR_3$ gate is the base-1 complement of the highest logic level presented to its inputs. This is indicated by the $CGOR_3$'s Karnaugh graph, shown in table C ("A" and "B" are the inputs).

TABLE C

|   |   | A |   |   |
|---|---|---|---|---|
|   |   | 0 | 1 | 2 |
|   | 0 | 2 | 1 | 0 |
| B | 1 | 1 | 1 | 0 |
|   | 2 | 0 | 0 | 0 |

Next is the listing of the logical relationships of the input term's/terms' logic level(s) to output logic level. Table D shows the relationships for a $CGOR_3$ using the relational operator of equality only. As indicated by table D, there would 9 composite branches in the resulting circuit and it would require an excessive number of transistors (more than eight) to implement. "C" is the output for inputs "A" and "B" in table D.

TABLE D

| A | B | C | A | B | C | A | B | C |
|---|---|---|---|---|---|---|---|---|
| 0 | 0 | 2 | 0 | 1 | 1 | 0 | 2 | 0 |
| 1 | 0 | 1 | 1 | 1 | 1 | 1 | 2 | 0 |
| 2 | 0 | 0 | 2 | 1 | 0 | 2 | 2 | 0 |

While a functional nine branch circuit could be designed, the more complex relational operators (such as greater than, or equal to or greater than) should be used. The $CGOR_3$ circuit shown in FIG. 8 was designed using the more complex relational operators shown in table E.

TABLE E

| A  | B  | C  |
|----|----|----|
| =0 | =0 | =2 |
| =1 | <2 | =1 |
| =2 | x  | =0 |
| <2 | =1 | =1 |
| x  | =2 | =0 | x = don't care

As indicated, there are 3 composite branches. This is due to the two "don't care" entries x being part of the same terminus composite branch, and both of the =1, and <2 entries being combined into the intermediate composite branch. As such, only 8 transistors are required. Expansion of a $CGOR_3$ to accommodate more inputs requires only 4 transistors per input as indicated by the phantom lines in FIG. 8.

The ternary complementing generalized AND, or $CGAND_3$, circuit is analogous to a binary "NAND" gate, and its Karnaugh graph is shown in table F.

TABLE F

|   |   | A |   |   |
|---|---|---|---|---|
|   |   | 0 | 1 | 2 |
|   | 0 | 2 | 2 | 2 |
| B | 1 | 2 | 1 | 1 |
|   | 2 | 2 | 1 | 0 |

Figure 9:
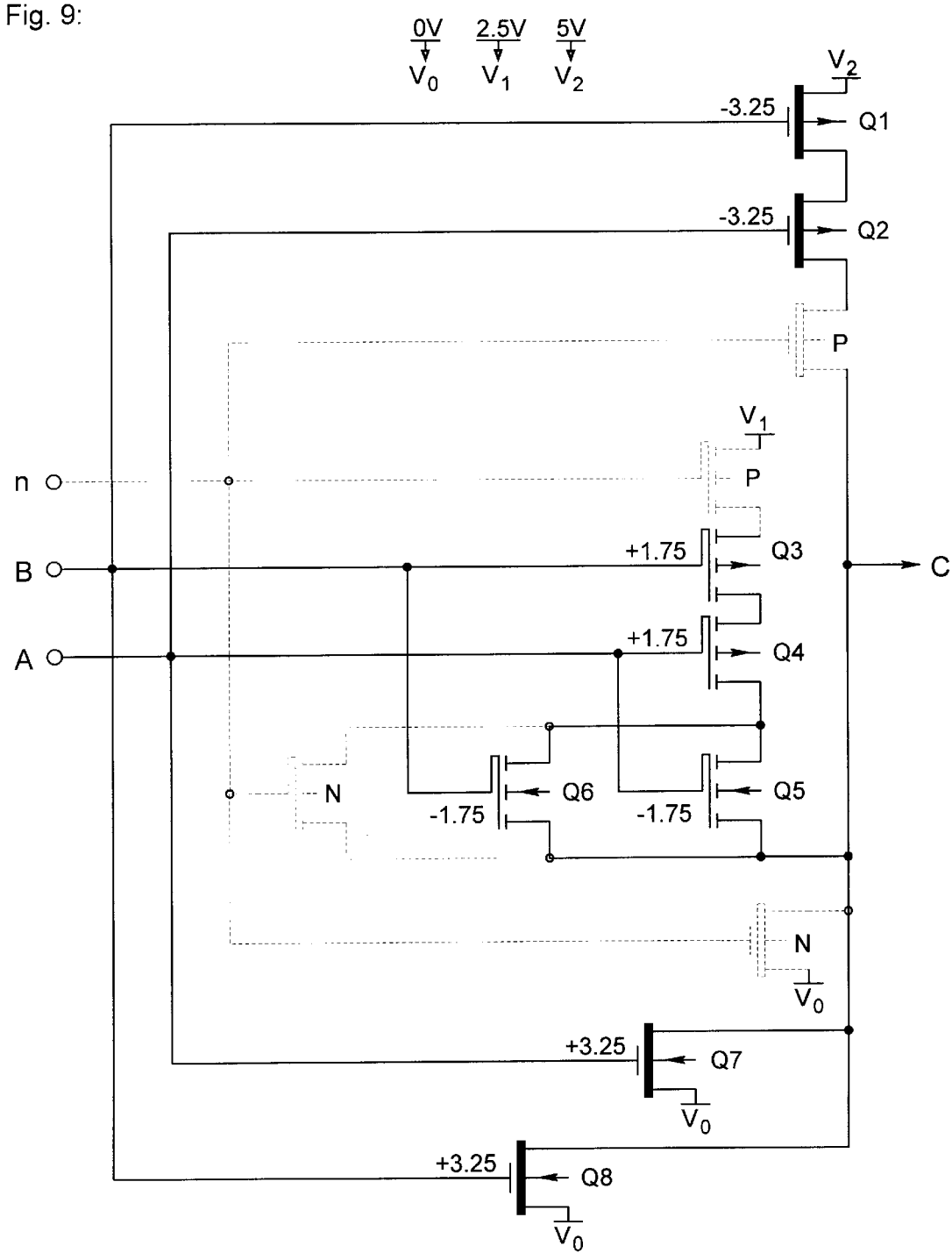
FIG. 9 is a schematic representation of a ternary CGAND circuit.

FIG. 9 shows the $CGAND_3$ circuit that was developed from the relational operators shown in table G and also requires only 8 transistors, and is expanded to accommodate additional inputs with only 4 transistors per additional input. The accommodation of such additional inputs is shown by phantom lines in FIG. 9.

TABLE G

| A  | B  | C  |
|----|----|----|
| =0 | x  | =2 |
| x  | =0 | =2 |
| =1 | ≧1 | =1 |
| ≧1 | =1 | =1 |
| =2 | =2 | =0 | x = don't care

Figure 10:
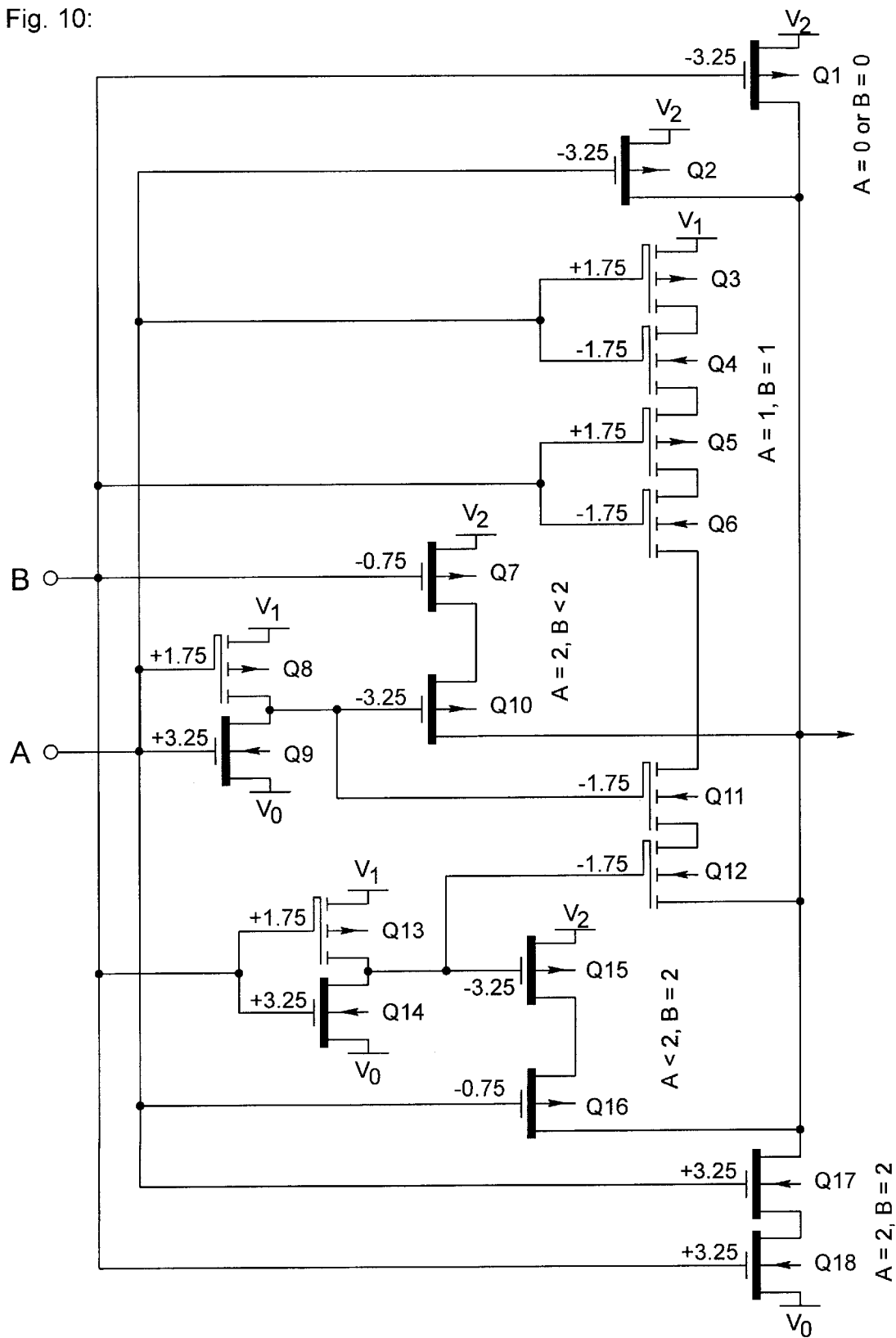
FIG. 10 is a schematic representation of a ternary CEQ circuit.
Figure 11:
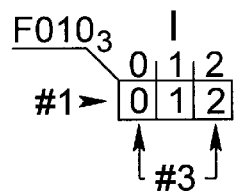
Figure 12:
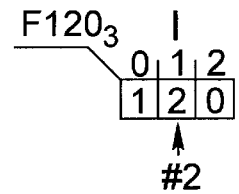
Figure 13:
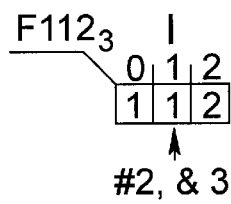
Figure 14:
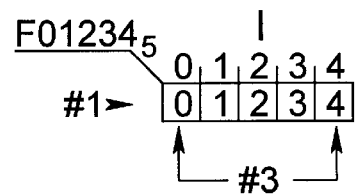
Figure 15:
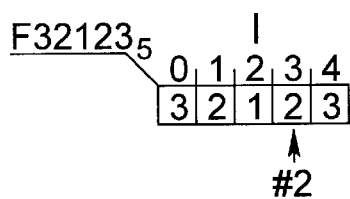
Figure 16:
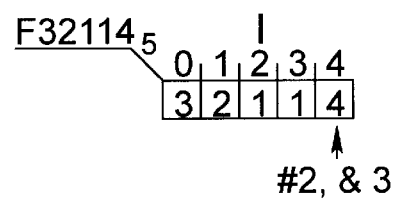

A ternary complementing equality generator, or $CEQ_3$, can be designed and constructed according to SUS-LOC. The $CEQ_3$ determines whether two inputs, A and B, are equal and complements the resulting signal. However, as shown in FIG. 10, the $CEQ_3$ delivers its output according to the circuit's output requirements and not by first generating an equality signal that is subsequently complemented.

Table H shows the $CEQ_3$'s Karnaugh graph. The Karnaugh graph indicates that the output sequence of the $CEQ_3$ is not "reverse sequential" as is true for a complementer. Such non-reverse, sequential output, or random output, indicates that additional OPFs are required by the $CEQ_3$ circuit. The shaded areas of table H indicate the "non-reverse sequential" or "random" output values.

TABLE H

|   |   | A |   |   |
|---|---|---|---|---|
|   |   | 0 | 1 | 2 |
|   | 0 | 2 | 2 | 2 |
| B | 1 | 2 | 1 | 2 |
|   | 2 | 2 | 2 | 0 |

The $CEQ_3$'s requirement for the additional OPFs can also be seen in the listed relational operators, table I (also as shaded areas).

TABLE I

| A  | B  | C  |
|----|----|----|
| =0 | x  | =2 |
| x  | =0 | =2 |
| =1 | =1 | =1 |
| =2 | <2 | =2 |
| <2 | =2 | =2 |
| =2 | =2 | =0 | x = don't care

In addition to the additional OPFs, the branch that responds to an input of A=1, B=1 requires two additional switches that are driven by the outputs of the additional OPFs to prevent an aberrant path (back biasing), when either input is a logic 2 and the other input is a logic 1. For A=2, B=1, Q5 and Q6 are held open (or conduct) by B=1. Q4 is open by A=2. Q3 is a P-type FET and is sourced from the most positive electrode. As the $CEQ_3$ circuit transmits a $V_2$ output for A=2, B=1, that $V_2$ signal is transmitted to Q3. As A=2 is not 1.75 volts higher than the greater of $V_1$ or $V_2$ (which is $V_2$), Q3 is on and conducts $V_2$ to $V_1$. More on such aberrant paths is set forth below.

The additional OPFs for the A and B inputs are shown in FIG. 10 as Q8 and Q9, and Q13 and Q14, respectively. These OPFs are $F110_3$. Use of such OPFs are described below in further detail. Q11 and Q12 form a "gatekeeper" to prevent back transmission of $V_2$ output upon FETs Q3–Q6.

The complementing equality generator's, or $CEQ_3$'s, closest binary equivalent consists of two "XOR" gates and one "NOR" gate. Two binary XOR gates are required because two places of binary are required to represent a value of 2 (necessary to achieve the 9 possible input states of the $CEQ_3$). The two "XOR" gates detect equality of the individual binary places, and the inputs of the "NOR" gate are driven by the outputs of the "XOR" gates. The CMOS binary equivalent requires 24 transistors, while the $CEQ_3$, shown in FIG. 10 requires only 18 transistors.

Expansion to form a $CEQ_3$ with 3 input terms requires 12 additional transistors, to make 30 transistors total. This means the equality of 3 terms, and the level of equality greater than zero, can be determined in one operation. A three term $CEQ_3$ has no single analogous binary logic function that is capable of determining the equality of three terms in one operation. In this and other ways, SUS-LOC provides a significant expansion upon and greater efficiencies for electronic information processing.

The number of transistors required to fabricate the $CGOR_3$, $CGAND_3$, and $CEQ_3$ circuits may exceed that of the corresponding binary circuits and, consequently, might seem excessive. However, each of these ternary gates has nine possible combinations of the A and B inputs. Analogous binary circuits capable of nine input states require that the A and B input terms be multiple-place values, and such circuits would require more transistors, more conductors, more I/O pins, and would have more parasitic values than the corresponding ternary circuits.

The different requirements, implementations, and resultant computational power between binary and ternary logic (at their most primitive levels) generally indicates that the more complex logics of a ternary (or higher radix) system will require fewer transistors than an equivalent binary system. Yet, such higher radix systems generally yield a higher computational ability.

Some caution is warranted in the direct replacement of binary circuits with SUS-LOC. The direct replacement of binary gates with revalued gates is enticing and in some cases will result in a functional circuit (if some attention is given to the appropriate enable levels). However, with the number of logic functions available from the higher-radix SUS-LOC circuitry, the design and fabrication of more specific logic functions is generally preferred. The design and fabrication of circuits with the more specific functions will reduce component count, over-all power requirements, parasitic parameters, et cetera, to make implementation of SUS-LOC even more advantageous.

As mentioned above, aberrant paths can arise due to the use of certain circuit elements, generally leading to a short circuit. In general, these problems arise from the fact that FETs take as their source voltage the most positive (for P-channel) or negative (for N-channel) voltage on either the source or drain. The gate voltage needed to control the FET then becomes dependent on which voltage is acting as the source and the gate threshold voltage. A gate voltage that initially controls a FET with respect to an intended source may be inadequate to maintain that control if a circuit output voltage usurps the original source voltage.

In order to avoid such problems, additional circuit stages are used in SUS-LOC that prevent transmission of output signals to FETs susceptible to changing their source voltages.

The requirement for an additional stage of logic is indicated in/by the Karnaugh graph for that circuit as an output sequence that is non-reverse. That is to say, the output does not sequence in the opposite direction of a sequenced input logic level, or combination of sequenced input logic levels, or both the input and output are equal to either $V_0$ or $V_{r-1}$.

When this last situation is present, an input logic level does not have sufficient magnitude to traverse the threshold voltage of the FET that is to conduct the appropriate output logic level voltage to the output terminal. I.e., an input of 0 does not exceed the threshold voltage of the N-channel FET that is to conduct a 0 to the output terminal. The solution is to use an OPF to increase, or translate, the 0 input to a higher value such that a threshold voltage can be traversed by the output voltage of the OPF. Likewise, similar accommodation can be made by using an OPF when both input and output are $V_{r-1}$. In that case, the OPF may translationally decrease the $V_{r-1}$ input so that the threshold voltage can be traversed by the OPF output voltage.

For OPFs, a conventional, standard, or reverse output sequence is one that becomes an ever smaller value or logic level as the input becomes an ever larger value or logic level, and vice verse. The output sequence may change only one logic level in response to an input sequence change of several logic levels, however, the output sequence is an ever smaller value or logic level when it does change. This is also referred to herein as a reverse sequence. Output responses not following this sequence are referred to as non-reverse sequences. For example, the pentanary OPF F33220 is a reverse sequence while pentanary F33224 is not.

Due to the basic operating characteristics of OPFs, the minimum number of output logic levels for an OPF of any radix is two because one output logic level constitutes a continuous function (i.e., $F111_3$). The maximum number of output logic levels for an OPF to maintain a conventional output sequence is equal to the radix of the function.

For one place functions, an unconventional, non-standard, or non-reverse output sequence is one that:

1. Does not change in the opposite direction of the input sequence;
2. Reverses its direction of change without the input sequence reversing direction; and/or
3. The output logic level=the input logic level=$V_0$ or $V_{r-1}$.

Figure 17:
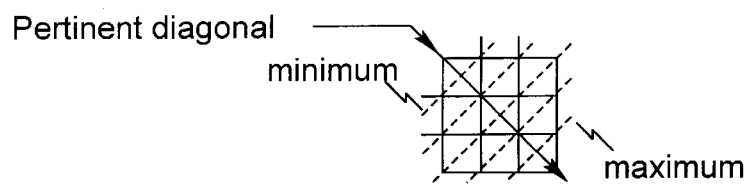

A non-reverse output sequence is indicated in the Karnaugh graph of an OPF when one or more of the above listed situations are present. FIGS. 11–16 show examples of a few ternary and pentanary one-place functions with non-reverse output sequences. Reasons why these output sequences are non-reverse are indicated by pointers, or darts, making reference to the situation number(s) listed above:

For MPFs, a conventional output sequence is seen in the function's Karnaugh graph as a sequence of diagonal groups of output locations that decrease in value, or logic level, as the collective or overall magnitude of the inputs increases in value, or logic level, from all inputs equaling 0 to all inputs equaling r−1, and vice versa. For example, the two-place functions have Karnaugh graphs that are generally square. The pertinent diagonal travels from the upper left (minimum) to the lower right (maximum) as shown in FIG. 17. For a ternary two-place MPF and as shown in FIG. 17 with dotted lines, there are generally five magnitudes, those being:

A=0, B=0;
   A=0, B=1 to A=1, B=0;
   A=0, B=2 to A=2, B=0;
   A=1, B=2 to A=2, B=1; and
   A=2, B=2.

Due to the nature of MPFs, the minimum number of groups for an MPF of any radix and any number of input terms is two because one group would mean that all output locations are equal and this constitutes a continuous function. The Karnaugh graph for such a continuous function has the same output value for any combination of input values. The maximum number of groups for an MPF that maintains a conventional, or reverse, output sequence is equal to the radix of the function. Functions of mixed radices are approached differently.

For MPFs, an unconventional, non-standard, or non-reverse output sequence is one that:

1. Does not change in the opposite direction of the input sequence;
2. Reverses in the direction of change without the overall magnitude of the inputs reversing direction;
3. The number of groups is less than two or is greater than the radix of the MPF; and/or
4. The output logic level=the input logic level=$V_0$ or $V_{r-1}$.

Three MPF examples for conventional, or reverse, output sequence MPFs are shown in FIGS. 18–25 to show a few of such possible groups. These three groups are: the $CGOR_3$ circuit, the $CGAND_3$ circuit, and the LAMBDA $01_3$ circuit. The groups in those figures are outlined with heavy lines for emphasis. The patterns of these groupings are not the only possible patterns.

FIGS. 26–30 show an MPF with an unconventional, or non-reverse, output sequence. In those Figures, the third grouping shows an output sequence direction reversal causing fourth and fifth groups to be required by a radix 3 function, these are situations 2 and 3, respectively.

Brief Analysis of SUS-LOC

Figure 31:
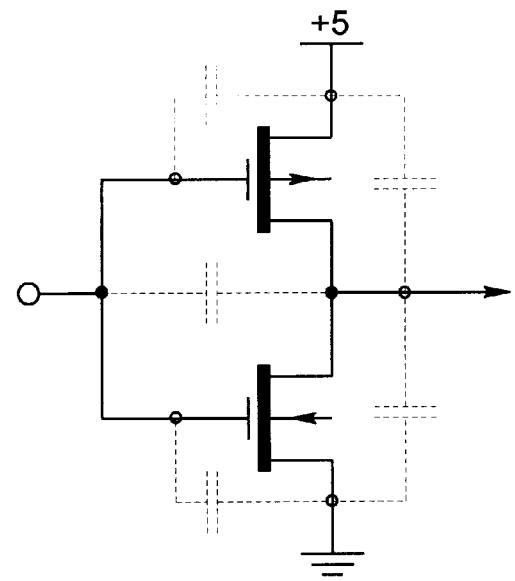
FIG. 31 is a schematic representation of a binary CMOS inverter with the associated parasitic capacitances shown in phantom.
Figure 32:
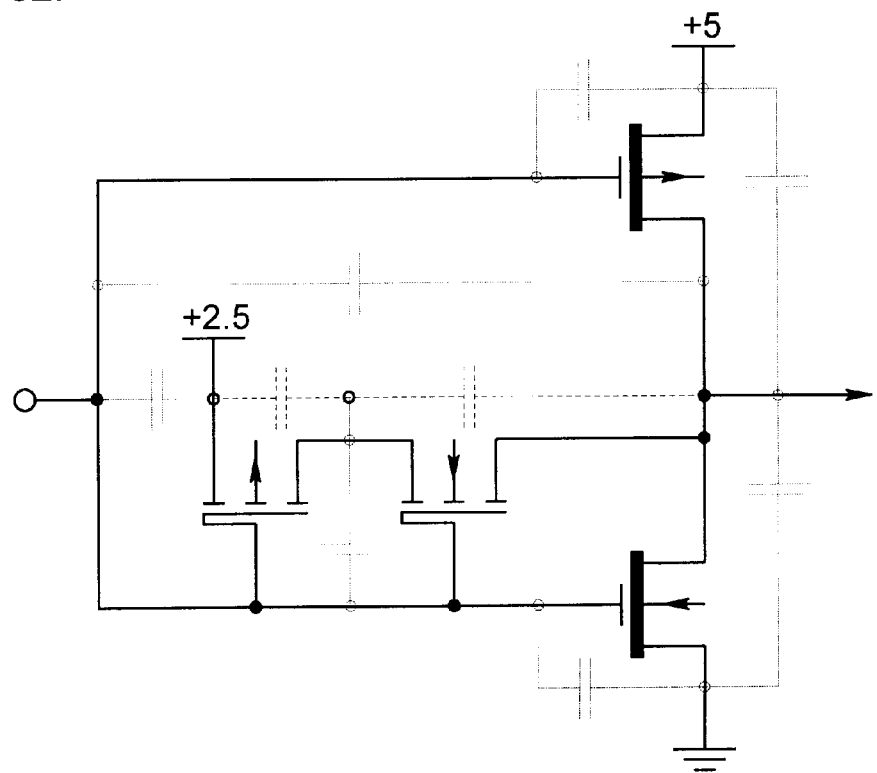
FIG. 32 is a schematic representation of a ternary SUSLOC base-1 complementer with the associated parasitic capacitances shown in phantom.

To understand the SUS-LOC structure in terms of speed, power consumption, and data density, a SUS-LOC circuit will be compared with its binary counterpart. The circuits selected for the speed and power comparison are the base-1 complementers of the binary (CMOS) and ternary (SUS-LOC) logic systems. FIGS. 31 and 32 show the binary CMOS inverter and the ternary SUS-LOC base-1 complementer respectively, as well as the associated parasitic capacitances shown in phantom.

When the schematic of a ternary base-1 complementer is first viewed, two incorrect assumptions may be made: due to the increased capacitance of the circuit, a ternary system is slower and requires more energy to operate; and a ternary system will require more transistors, thereby increasing the parasitic capacitance values while decreasing data density. However, the following shows these assumptions to be incorrect. In fact, the opposite is true.

While a ternary base-1 complementer requires twice the number of transistors and has approximately twice the capacitance of a binary "inverter", a complete system is comprised of more than a single one place function.

The input capacitance of the SUS-LOC circuit is larger than its binary counterpart, but less then twice as much.

The following parameters are assumed: the basic gate capacitance of a FET is 1.0 unit, a parasitic capacitance is 0.1 unit, $V_{r-1}$ of both circuits is 5 volts, and switching requires one half cycle.

Calculation of the total capacitance of each circuit is simply the summation of the capacitance of the FETs plus the parasitic capacitances. For the CMOS binary inverter, the total is 2.5 units, and for the SUS-LOC ternary base-1 complementer the total is 4.9 units.

The energy required to switch the output of each circuit r−1 logic levels is considered to be the $E_{sw}$ of the circuit. The energy required to drive one half cycle with a capacitive load is equal to 0.5 times the capacitance, times the square of the voltage change across the capacitance. The energy is expressed in joules, or $E_{sw}=0.5\ CV^2$ joules. The results of inserting values from each circuit into the equation are shown in table J.

TABLE J

| CMOS | TERNARY SUS-LOC |
|---|---|
| Switch from logic 0 to logic 1 | |
| Esw = .5 × 2.5 ($5^2$) | Esw = .5 × 4.9 ($2.5^2$) |
| = 1.25 (25) | = 2.45 (6.25) |
| = 31.25 j | = 15.3125 j |
| Switch from logic 1 to logic 2 | |
| Not capable of | Esw = .5 × 4.9 ($2.5^2$) |
| a logic 1 to logic 2 | = 2.45 (6.25) |
| transition | = 15.3125 j |

The ternary SUS-LOC circuit switches two logic levels with less energy, (30.625j) than the CMOS circuit switching only one logic level (31.25j). Therefore, the ternary SUS-LOC circuit requires less energy to operate although it has approximately twice the capacitance.

The fastest possible operation of a FET circuit is the time required to transfer a signal from the gate of a primary FET to the gate of a similar secondary FET. The minimum amount of time in which this can be accomplished is the transit time of the primary FET. Transferring a signal to more than one secondary FET requires one transit time per secondary FET. The actual time is an RC time constant, $RC_g=L^2/\mu(V_{GS}-V_{(TH)})$, and requires that all parameters be known, such as feature size, material of the conductors, et cetera. However, to maintain clarity, the transit time, $L^2/\mu V_{DS}$, being similar in form to the RC time constant, could be used to approximate the delay of both circuits.

For purposes of comparison, the transit time of a FET in the CMOS circuit will be 0.3 nS, and 0.6 nS for the FETs in the SUS-LOC circuit due to $V_{DS}$ being 2.5 volts per logic level.

Figure 33:
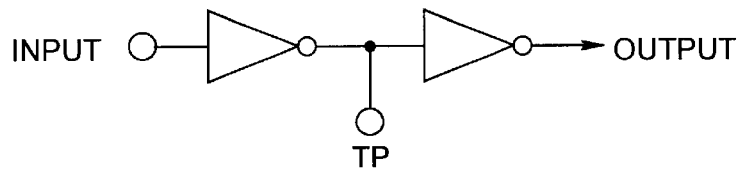
FIG. 33 is a schematic representation of a binary circuit test pair with test point TP.
Figure 34:
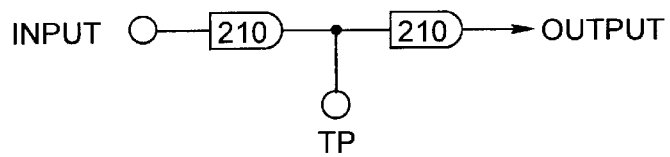
FIG. 34 is a schematic representation of a ternary circuit test pair with test point TP.

To compare the two circuits, two of each will be used. The output of a first base-1 complementer will drive the input of a second base-1 complementer and the junction of the two complementers is the test point for this comparison, as shown in FIGS. 33 and 34, CMOS and SUS-LOC respectively.

The input stimulus for both circuits is a 10 nS transition from +5.0 volts to 0.0 volts. The time required for the first base-1 complementer to raise the input voltage of the second base-1 complementer to a switch point will be considered as the speed of the circuit. The starting point ($t_0$) is when the input stimulus begins changing from 5 volts toward 0 volts.

The switch point for the CMOS circuit is 2.5 volts. The switch points for the SUS-LOC circuit are: 1.25 volts as the switch point between logic 0 and logic 1, and 3.75 volts as the switch point between logic 1 and logic 2.

Before the output of the first base-1 complementer can change, the input voltage must traverse a switch point. The time required will be the transit time of the FETs plus the time required for the input stimulus to achieve a switch point. For the binary circuit, this requires half of the 10 nS transition time, or 5 nS, plus two transit times of 0.3 nS for a total of 5.6 nS.

The ternary circuit requires one fourth of the 10 nS transition time, or 2.5 nS, plus 4 transit times of 0.6 nS for a total of 4.9 nS for the logic 0 to logic 1 step, and 7.5 nS plus 2.4 nS or 9.9 nS to achieve the second switch point. The ternary circuit has stepped from 0 to 1 to 2 in 9.9 nS, while the binary circuit has stepped from 0 to 1 with the same 10 nS stimulus.

Figure 35:
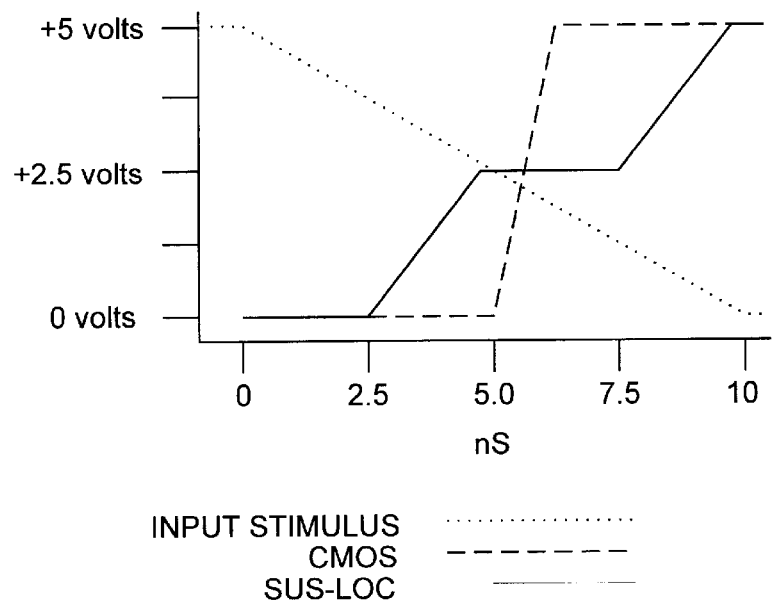
FIG. 35 shows plots of the timing comparisons between the binary inverter and the ternary base-1 complementer of FIGS. 13 and 14, respectively.

Plots of the timing comparisons between the binary inverter and the ternary base-1 complementer are shown in FIG. 35.

While an individual SUS-LOC logic function might be slower than its analogous CMOS function, a SUS-LOC based system with a radix greater than two would be faster overall. For example, assuming a binary system is operating at 10 MHz clock rate with an average period of 0.1 $\mu$s, and assuming a ternary system operating at a percentage of the binary clock rate, the test is to perform several summations to determine circuit speed. Both systems require 3 clock cycles (one machine cycle) to perform one summation. An examination of the time required by both systems to sum x-numbers obtains the results shown in table K.

TABLE K

| NUMBERS TO SUM | CMOS BINARY $\mu$S | SUS-LOC TERNARY $\mu$S at a % of the Binary clock rate | | | | | |
|---|---|---|---|---|---|---|---|
| | | 50% | 60% | 70% | 80% | 90% | 100% |
| 2 | 0.3 | 0.6 | 0.5 | 0.43 | 0.38 | 0.33 | 0.3 |
| 3 | 0.6 | 0.6 | 0.5 | 0.43 | 0.38 | 0.33 | 0.3 |
| 4 | 0.9 | 1.2 | 1 | 0.86 | 0.75 | 0.67 | 0.6 |

TABLE K

| NUMBERS TO SUM | CMOS BINARY $\mu$S | SUS-LOC TERNARY $\mu$S at a % of the Binary clock rate | | | | | |
|---|---|---|---|---|---|---|---|
| | | 50% | 60% | 70% | 80% | 90% | 100% |
| 5 | 1.2 | 1.2 | 1 | 0.86 | 0.75 | 0.67 | 0.6 |
| 10 | 2.7 | 3 | 2.5 | 2.14 | 1.88 | 1.67 | 1.5 |
| 11 | 3 | 3 | 2.5 | 2.14 | 1.88 | 1.67 | 1.5 |
| 50 | 14.7 | 15 | 12.5 | 10.7 | 9.38 | 8.33 | 7.5 |

The ternary SUS-LOC system requires less time to perform summations of 3 or more "Numbers To Sum" (shaded area) with only 60% of the binary clock rate. Also, the ternary SUS-LOC system closely approximates the required time and throughput of the binary system at only 50% of the clock rate when there are 3 or more numbers to sum.

The reason for this is that the number of variables a digital computer is capable of summing in one operation, complete with a CARRY, is equal to the radix of the computer. An examination of how 5 numbers, A, B, C, D, and E, are summed using the binary and ternary systems described above obtains:

| BINARY | TERNARY |
|---|---|
| SUM A + B = W | SUM A + B + C = Y |
| SUM C + W = X | SUM D + E + Y = Z |
| SUM D + X = Y | 2 Operations |
| SUM E + Y = Z | 2 × 3 = 6 clock cycles |
| 4 Operations | 6 × 0.1667 $\mu$s = 1 $\mu$s |
| 4 × 3 = 12 clock cycles | |
| 12 × 0.1 $\mu$s = 1.2 $\mu$s | |

When the logic functions of a system use a radix greater than two, the system becomes capable of more complex logical functions in a single operation. The performance of logical functions of intermediate complexity (such as "A plus B GAND C") in one operation become more easily accomplished. Because of the ability to perform complex and/or multiple logical functions in one operation, or more precisely one machine cycle, computers of a radix greater than two would be faster.

While the preceding has been primarily concerned with the ternary logic system, it should be understood that the techniques and methods employed are applicable to the logical functions of any radix, or combination of radices. Logical functions of radices other than three and logical functions using mixed radices are possible in accordance with SUS-LOC. Also, a one place function can perform both analog to digital conversion and linearization in one operation, or more precisely one radix r gate time and is set forth in more detail below.

The enhancements for binary computers provided by SUS-LOC is limited only by the development of r-valued circuitry for use in conjunction with a binary computer. Three important enhancements are presented pertaining to adders, multipliers, and data storage.

A very useful enhancement for binary computers is a two term "ternary adder". A ternary adder increases the speed of binary addition because there would be no "CARRY" required and therefore no carry propagation delay time. The conversion from ternary to binary can be performed with a "radix converter" that translates a radix$_A$ value to a radix$_B$ value in approximately 4 radix$_A$ gate times. Radix converters are set forth in more detail below.

As the radix of the adder is increased, the number of terms of a lower radix that can be summed in one operation increases as there is no carry propagation delay time. As an example, the use of a "tetranary adder" (radix 4) would allow three binary or two ternary terms to be summed in one operation, again without the carry propagation delay time.

For SUS-LOC multipliers, the number of terms that can be multiplied by a "matrix multiplier" is one greater than the radix of the multiplier, or r+1. Therefore, as the radix of a system is increased, the number of matrices that can be multiplied in one operation increases. The efficiency of the multiplier would be increased when the terms to be multiplied are of the same radix as the multiplier.

As with adders, the conversion from radix$_A$ to radix$_B$ can be performed with a "radix converter" that translates a radix$_A$ value to a radix$_B$ value in approximately 4 radix$_A$ gate times.

Data storage is advantageously provided by increasing the radix of the logic on the device electronics board used with disk drives. The storage capacity, data density, and data transfer rate of the disk drive can be increased without changing any of the hardware. The percentage of increase is dependant upon the radix increase. As an example, a ternary device electronics board would yield a 25% increase of the storage capacity, data density, and data transfer rate.

The simplest method of achieving a disk drive with an increased radix is to use the phase difference between a flux change, if any, and an edge, leading or trailing, of the data clock that determines the data cell boundaries, (currently known as the bit cell boundaries).

One-Place Functions

One place functions, (OPF, OPFs) are a required set of radix r connectives if all of the logical functions of radix r are to be realized. An OPF is a SUS-LOC circuit that only takes one input. (Hence the name and the name for "multiple place functions.") The OPF then converts the input signal to a pre-determined output signal according to the characteristics of the OPF. OPFs are used primarily for intermediate logic level conversion. There are also additional uses of OPFs.

The ternary logic system (r=3) contains 27 possible OPFs, including continuous functions that give the same output for any input. The number of continuous functions, for any radix and number of places, is always equal to the radix of the function, in this case 3. Therefore, 24 ternary OPFs are useable. All of the useable ternary OPFs are presented herein and serve as examples of SUS-LOC as a whole.

Figure 38:
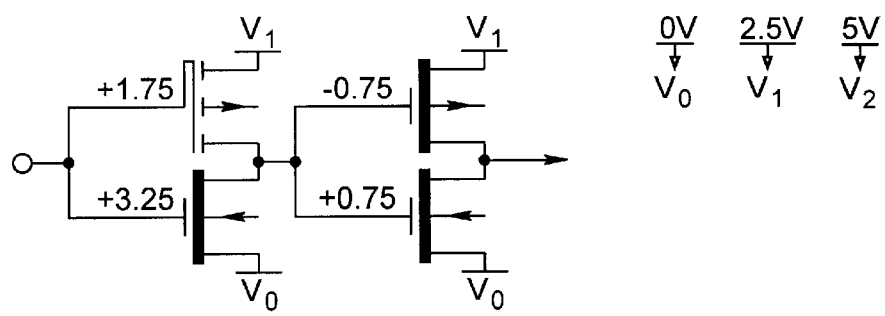
FIG. 38 is a schematic representation of a one-place ternary function having the positional descriptor of $F001_3$.
Figure 39:
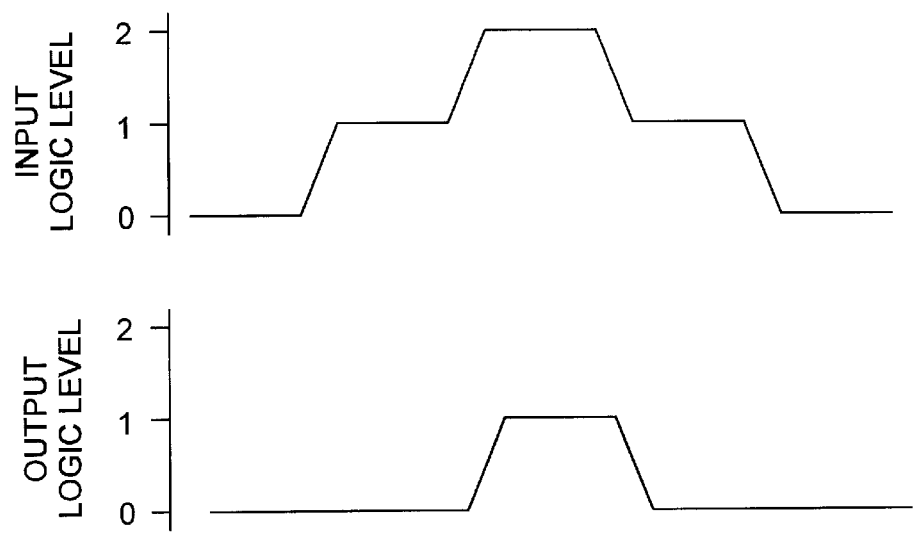
FIG. 39 is a plot of the transfer characteristics of the $F001_3$ OPF shown in FIG. 38.
Figure 40:
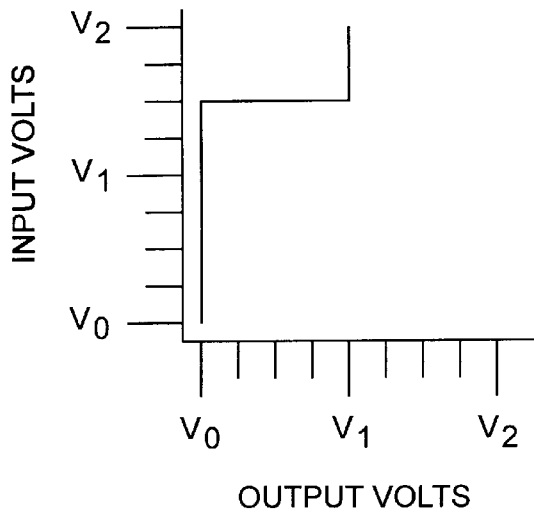
FIG. 40 is a plot of the input to output waveforms of the $F001_3$ OPF shown in FIG. 38.
Figure 41:
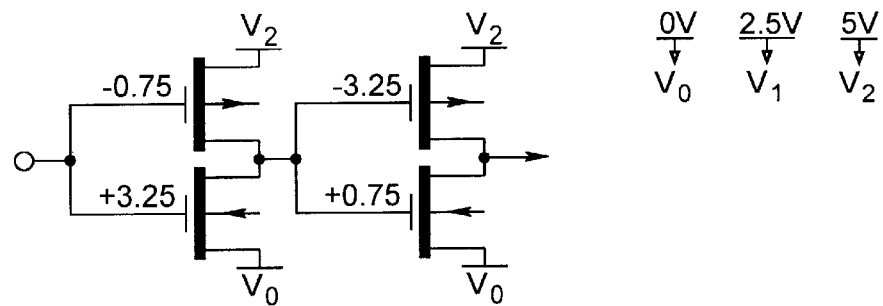
FIG. 41 is a schematic representation of a one-place ternary function having the positional descriptor of $F002_3$.
Figure 42:
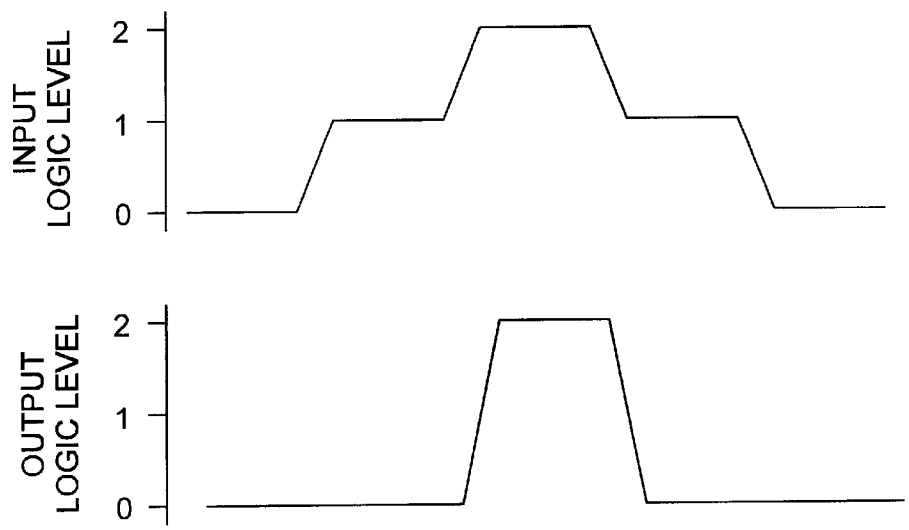
FIG. 42 is a plot of the transfer characteristics of the $F002_3$ OPF shown in FIG. 41.
Figure 43:
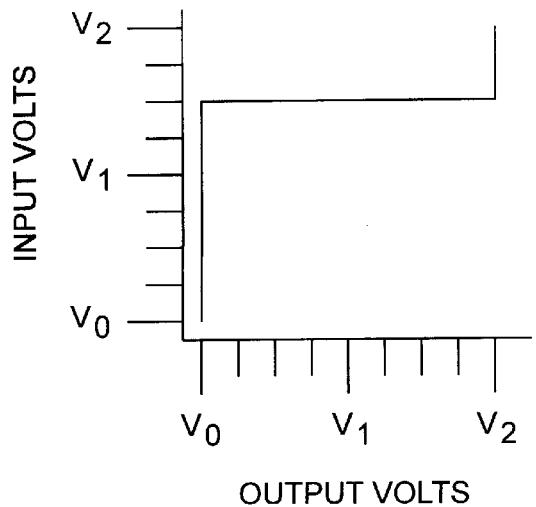
FIG. 43 is a plot of the input to output waveforms of the $F002_3$ OPF shown in FIG. 41.
Figure 47:
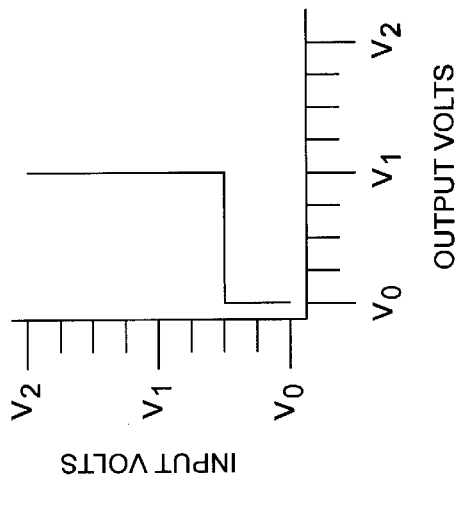
FIG. 47 is a schematic representation of a one-place ternary function having the positional descriptor of $F011_3$.
Figure 48:
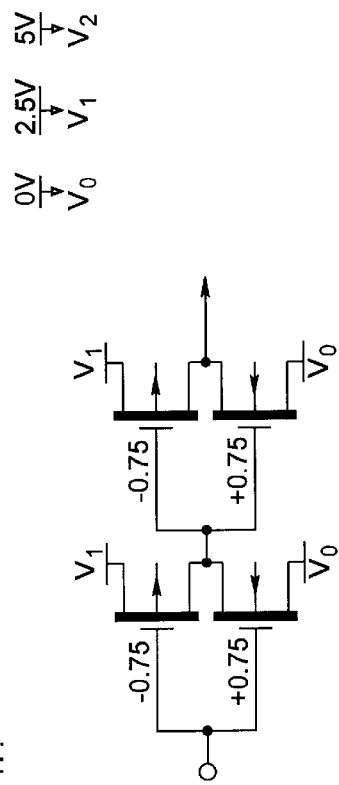
FIG. 48 is a plot of the transfer characteristics of the $F011_3$ OPF shown in FIG. 47.
Figure 49:
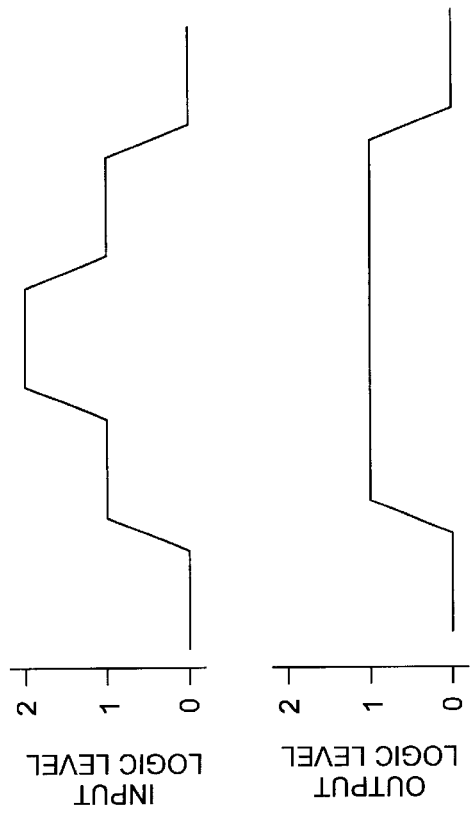
FIG. 49 is a plot of the input to output waveforms of the $F011_3$ OPF shown in FIG. 47.
Figure 64:
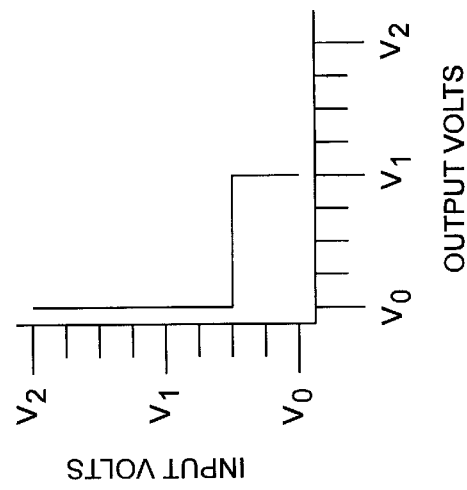
FIG. 64 is a plot of the input to output waveforms of the $F100_3$ OPF shown in FIG. 62.
Figure 62:
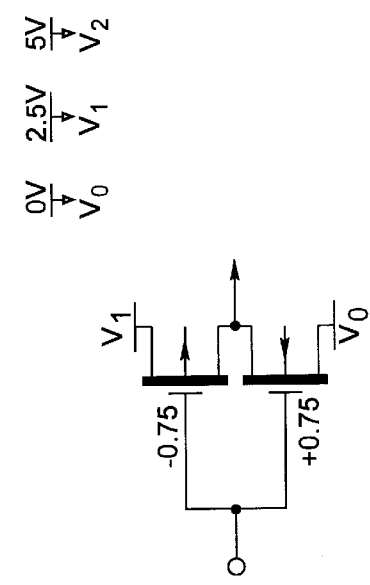
FIG. 62 is a schematic representation of a one-place ternary function having the positional descriptor of $F100_3$.
Figure 63:
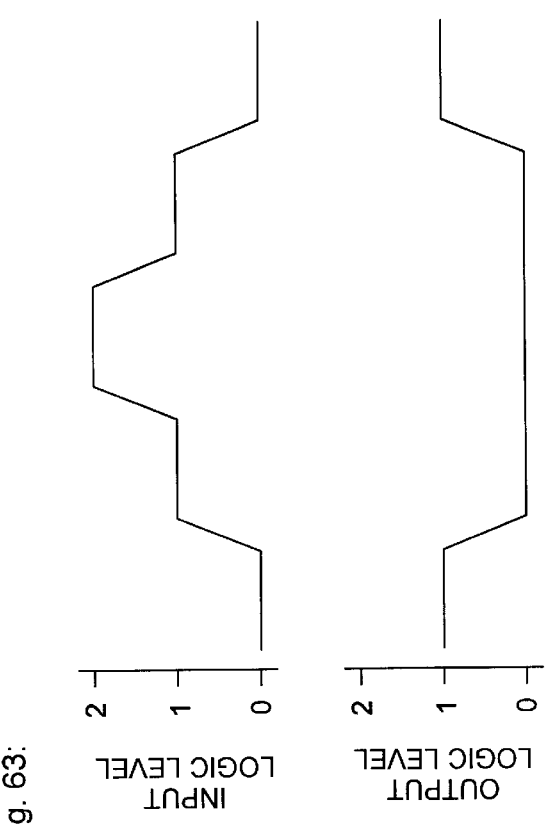
FIG. 63 is a plot of the transfer characteristics of the $F100_3$ OPF shown in FIG. 62.
Figure 68:
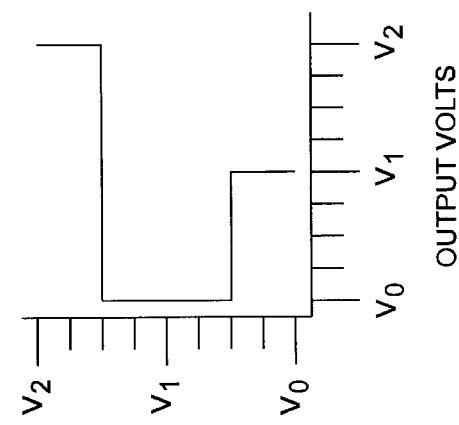
FIG. 68 is a schematic representation of a one-place ternary function having the positional descriptor of $F102_3$.
Figure 70:
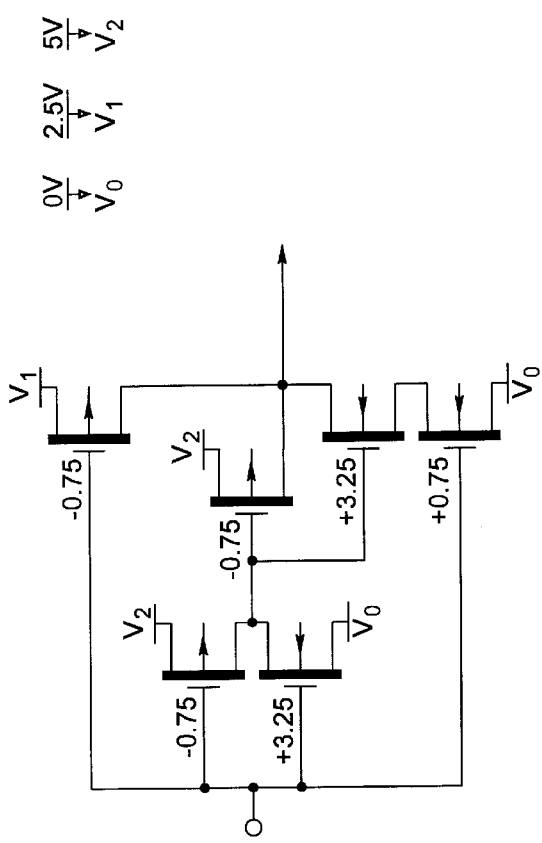
FIG. 70 is a plot of the input to output waveforms of the $F102_3$ OPF shown in FIG. 68.
Figure 69:
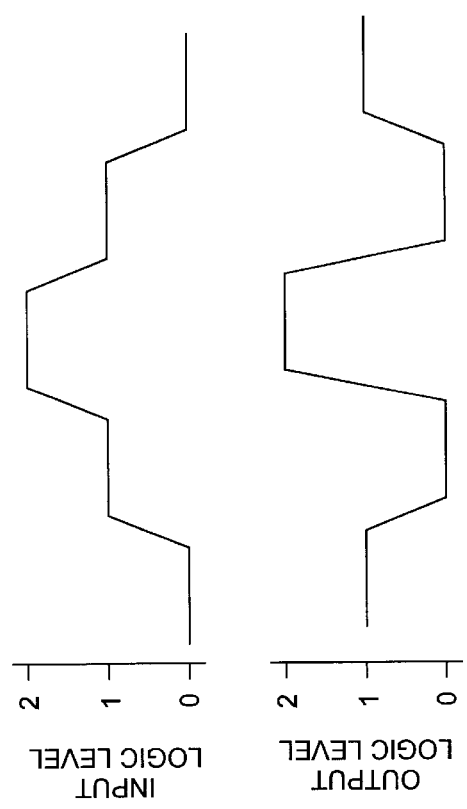
FIG. 69 is a plot of the transfer characteristics of the $F102_3$ OPF shown in FIG. 68.
Figure 109:
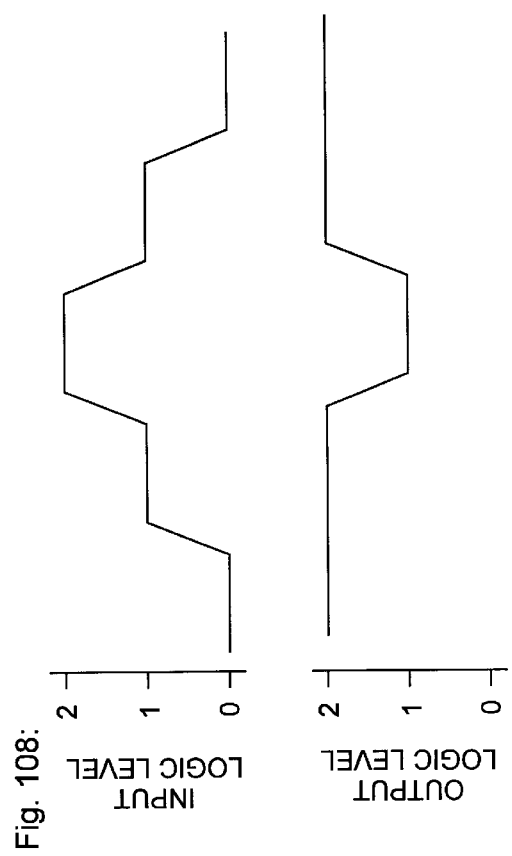
FIG. 109 is a plot of the input to output waveforms of the $F221_3$ OPF shown in FIG. 107.
Figure 110:
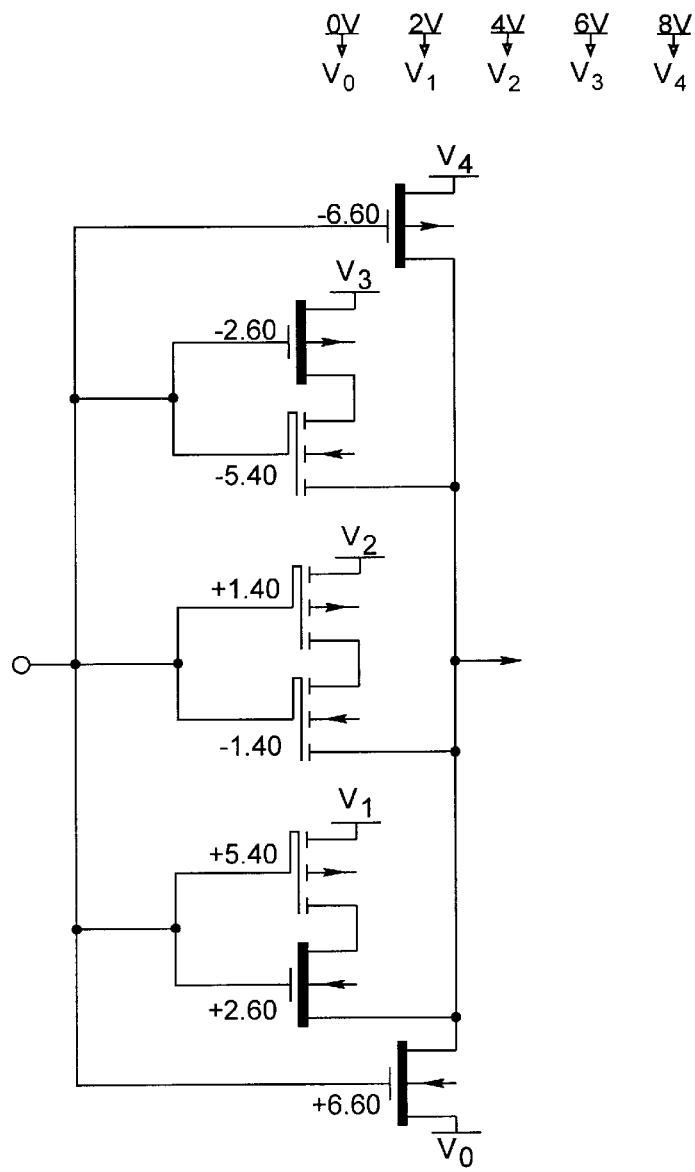
FIG. 110 is a schematic representation of a pentanary (radix 5) base-1 complementer, $F43210_5$.
Figure 111:
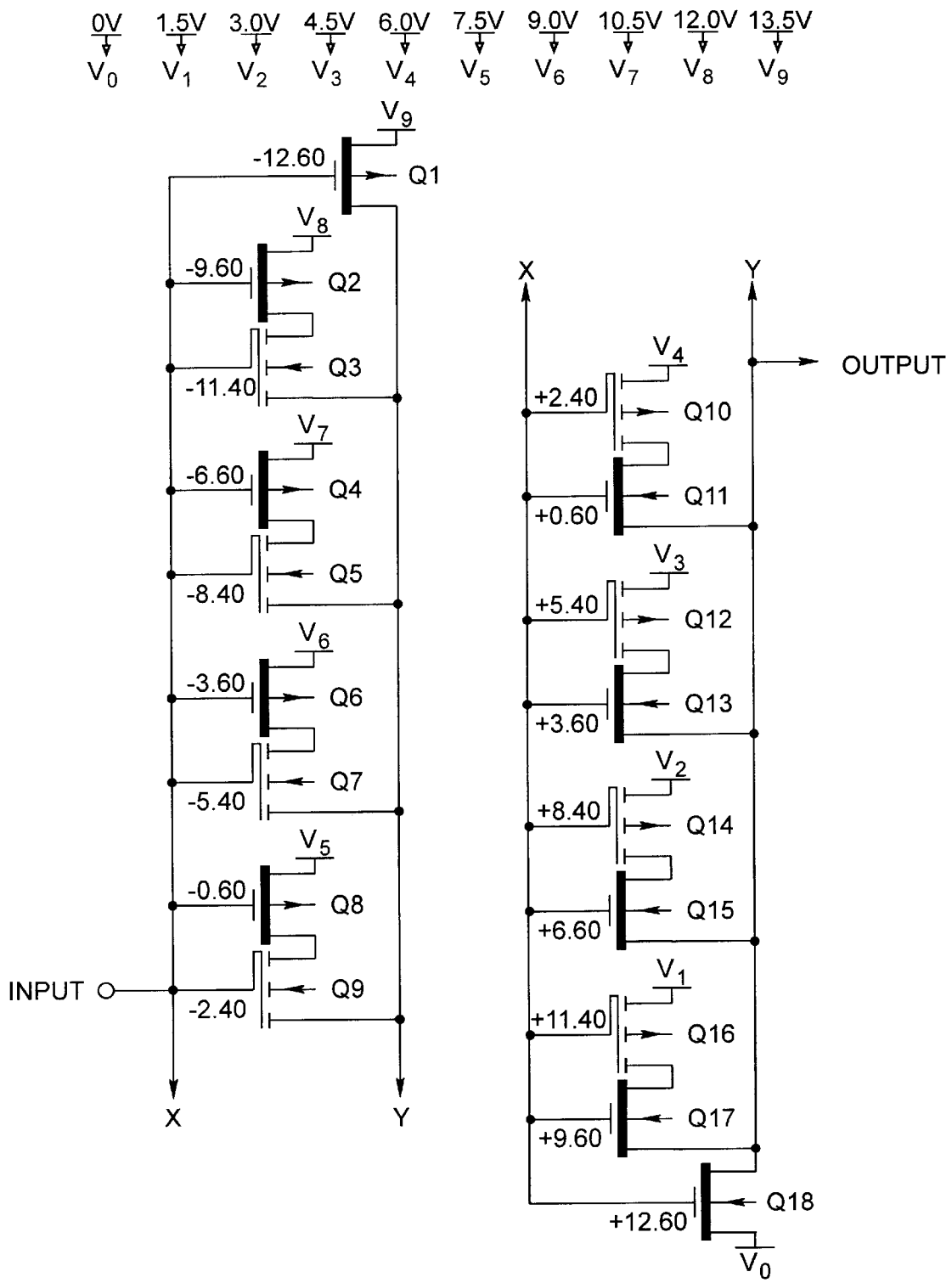
FIG. 111 is a schematic representation of a decimal base-1 complementer, $F9876543210_{10}$.

The schematics, input to output waveforms, and transfer characteristics of the useable ternary OPFs are shown in FIGS. 38 through 109. To show that OPFs of any radix can be implemented, a pentanary (radix 5) base-1 complementer is shown in FIG. 110 and a decimal (radix 10) base-1 complementer is shown in FIG. 111. The pentanary base-1 complementer includes all three intermediate branch configurations (set forth above).

When a one place function of any radix is presented with the input logic level sequence of 0 . . . r−1, each one place function produces a unique output sequence. The output sequences for all 27 ternary OPFs are shown in table L, with the functions that are either continuous or have a reverse or random output sequence indicated.

TABLE L

| INPUT SEQUENCE▶ | 0 1 2 | 0 1 2 | 0 1 2 |
|---|---|---|---|
| TERNARY OUTPUT SEQUENCES | 0 0 0* | 1 0 0 | 2 0 0 |
| | 0 0 1† | 1 0 1† | 2 0 1† |
| | 0 0 2† | 1 0 2† | 2 0 2† |
| | 0 1 0† | 1 1 0 | 2 1 0 |
| | 0 1 1† | 1 1 1* | 2 1 1 |
| | 0 1 2† | 1 1 2† | 2 1 2† |
| | 0 2 0† | 1 2 0† | 2 2 0 |
| | 0 2 1† | 1 2 1† | 2 2 1 |
| | 0 2 2† | 1 2 2† | 2 2 2* |

*Continuous Functions
†Reverse or Random output sequence

Each output sequence being unique to only one OPF of radix r, is used as a "positional descriptor" to identify each one place function both textually and graphically.

When referring to a one place function textually, its positional descriptor is prefaced herein with an "F" as in "Function". For example, the ternary function with the positional descriptor of 210, is written as "F210" and the pentanary function with the positional descriptor of 01234, is written as "F01234". This is the method used throughout this patent.

Alternative methods of identification are possible and might be adopted at some future date. One such alternative method is to delete all leading zeros from the positional descriptor, and sub-script the descriptor with the radix of the function. As an example, a pentanary F00125 becomes $F125_5$, and a decimal F0000000125 becomes $F125_{10}$.

Another alternative is to select the most useful or versatile OPFs of each radix. These selected functions can then be cataloged by an assigned number or name. The catalog number or name would then be used to identify a particular one place function.

Figure 36:
FIG. 36 shows the basic graphic symbol for a one place function of a radix greater than two.
Figure 37:
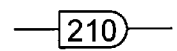
FIG. 37 shows the graphic symbol for the function $F210_3$.

The basic graphic symbol for a one place function of a radix greater than two, is shown in FIG. 36. The positional descriptor of the function is placed inside the symbol to distinguish one function from another. For example: $F210_3$ is shown in FIG. 37.

Fabricating most operational OPFs requires the use of two single stage OPFs in series. This arises from the way currently-available switches operate and the fact that a set of OPFs of a radix greater than two contain more functions with reverse or random output sequences. More information regarding this is set forth below in conjunction with multiple place functions and combinational logic, below. The ternary single stage OPFs are F100, F110, F200, F210, F211, F220, and F221.

Shown in table M are the useable ternary OPFs. Those that are single stage are indicated as "single." Those with a reverse output are indicated as paired functions in the "$F_A$-$F_B$" columns (except the buffer, there are several combinations that achieve these OPFs), and those with random output sequences are indicated as "random."

TABLE M

| | $F_A$-$F_B$ | $F_A$-$F_B$ | $F_A$-$F_B$ | $F_A$-$F_B$ | $F_A$-$F_B$ | $F_A$-$F_B$ |
|---|---|---|---|---|---|---|
| 001 | F110–F100 | F210–F100 | F220–F100 | F220–F110 | F221–F110 | F221–F210 |
| 002 | F110–F200 | F210–F200 | F220–F200 | F220–F210 | F220–F220 | F221–F220 |
| 010 | Random | | | | | |
| 011 | F100–F100 | F200–F100 | F200–F110 | F210–F110 | F211–F110 | F211–F210 |
| 012 | F210–F210 | | | | | |
| 020 | Random | | | | | |
| 021 | Random | | | | | |
| 022 | F100–F200 | F200–F200 | F200–F210 | F200–F220 | F210–F220 | F211–F220 |

TABLE M

| | $F_A$–$F_B$ | $F_A$–$F_B$ | $F_A$–$F_B$ | $F_A$–$F_B$ | $F_A$–$F_B$ | $F_A$–$F_B$ |
|---|---|---|---|---|---|---|
| 100 | Single | | | | | |
| 101 | Random | | | | | |
| 102 | Random | | | | | |
| 110 | Single | | | | | |
| 112 | F110–F210 | F110–F211 | F210–F211 | F220–F211 | F220–F221 | F221–F221 |
| 120 | Random | | | | | |
| 121 | Random | | | | | |
| 122 | F100–F210 | F100–F211 | F200–F211 | F200–F221 | F210–F221 | F211–F221 |
| 200 | Single | | | | | |
| 201 | Random | | | | | |
| 202 | Random | | | | | |
| 210 | Single | | | | | |
| 211 | Single | | | | | |
| 212 | Random | | | | | |
| 220 | Single | | | | | |
| 221 | Single | | | | | |

A one place function is primarily used for intermediate logic level conversion. However, OPFs can be used to form several types of circuits, including: interface circuits used to drive relays, LEDs, and other devices that require a control signal that is binary in nature; input conditioners for switches, buttons, and other binary input devices; and circuitry used in cross-coupled pairs, to form latches and registers (discussed in the description of latches and registers, below). Also, OPFs may be combined with one or more multiple place functions to form any logical function of n-places, including the r+1 state drivers discussed in the description of combinational logic. The single stage OPFs with the CGOR and CGAND functions constitute a functionally complete set of logical connectives from which nan and all other logic functions may be achieved.

Also, the use of one place functions as analog to digital converting linearizers that perform both functions in one operation (or more precisely one radix r gate time) is possible and set forth below.

In order to more fully describe SUS-LOC, an extensive description of the F210$_3$ ternary one place function (OPF) is set forth below. The F210 is a single stage OPF.

Logical 0 input upon the F210, or base-1 complementer circuit, can be analyzed as follows. Referring now to FIG. 95 and the F210, or base-1 complementer circuit, for a circuit input of logical 0, $V_0$ (0V), an input of 0 volts is transmitted to the gates of all the IGFETs: the top IGFET Q1, the intermediate IGFET branch with its first and second intermediate bran ch IGFETs Q2, Q3, and the bottom IGFET Q4.

The bottom IGFET Q4 is an N-channel enhancement mode IGFET with an absolute threshold of 3.25 volts (0 volts source voltage ($V_0$) plus 3.25 volts gate voltage ($V_{GS(TH)}$)). As the bottom IGFET Q4 is an N-channel enhancement mode IGFET, the source voltage is transmitted to the drain only for gate voltages above its absolute threshold. The circuit input of logical 0, $V_0$ (0V), to the gate of the bottom IGFET Q4 is below its absolute threshold of 3.25 volts and the bottom IGFET Q4 does not transmit the voltage at its source to its drain and onto the circuit output. For a circuit input of logical 0, $V_0$ (0V), the bottom IGFET delivers no circuit output.

The intermediate IGFET branch has two IGFETs Q2, Q3 connected in series between a logical 1, $V_1$ (2.5V), source voltage and the circuit output. Both of the intermediate branch IGFETs Q2, Q3 are gate-connected to the circuit input. The source of the first intermediate branch IGFET Q2 is connected to the logical 1, $V_1$ (2.5V), source voltage. The drain of the first intermediate branch IGFET Q2 is connected to the source of the second intermediate branch IGFET Q3. The drain of the second intermediate branch IGFET Q3 is connected to the circuit output.

The first intermediate branch IGFET Q2 is a P-channel depletion mode IGFET with an absolute threshold of 4.25 volts (2.50 volts source voltage ($V_1$) plus 1.75 volts gate voltage ($V_{GS(TH)}$)). As the first intermediate branch IGFET Q2 is a P-channel enhancement mode IGFET, the source voltage is transmitted to the drain only for gate voltages below its absolute threshold. The circuit input of logical 0, $V_0$ (0V), to the gate of the first intermediate branch IGFET Q2 is below its absolute threshold of 4.25 volts and the first intermediate branch IGFET Q2 does transmit the voltage at its source to its drain. For a circuit input of logical 0, $V_0$ (0V), the first intermediate branch IGFET Q2 transmits a logical 1, $V_1$ (2.5V), to its drain and to the source of the second intermediate branch IGFET Q3.

The second intermediate branch IGFET Q3 is an N-channel depletion mode IGFET with an absolute threshold of 0.75 volts (2.50 volts source voltage ($V_1$) plus (−1.75) volts gate voltage ($V_{GS(TH)}$)). A logical 1, $V_1$ (2.5V), source voltage is applied to the second intermediate branch IGFET Q3 by the drain of the first intermediate branch IGFET Q2. As the second intermediate branch IGFET Q3 is an N-channel depletion mode IGFET, the source voltage is transmitted to the drain only for gate voltages above its absolute threshold. The circuit input of logical 0, $V_0$ (0V), to the gate of the second intermediate branch IGFET is below its absolute threshold of 0.75 volts and the second intermediate branch IGFET Q3 does not transmit the voltage at its source to its drain and onto the circuit output. For a circuit input of logical 0, $V_0$ (0V), the second intermediate branch IGFET Q3 transmits no circuit output. For a circuit input of logical 0, $V_0$ (0V), the intermediate IGFET branch delivers no circuit output.

The top IGFET Q1 is a P-channel enhancement mode IGFET with an absolute threshold of 1.75 volts (5 volts source voltage ($V_2$) plus (−3.25) volts gate voltage ($V_{GS(TH)}$)). As the top IGFET Q1 is a P-channel enhancement mode IGFET, the source voltage is transmitted to the drain only for gate voltages below its absolute threshold. The circuit input of logical 0, $V_0$ (0V), to the gate of the top IGFET Q1 is below its absolute threshold of 1.75 volts. The top IGFET Q1 does transmit the voltage at its source (logical 2, $V_2$, 5) to its drain and onto the circuit output. For a circuit input of logical 0, $V_0$ (0V), the top IGFET Q1 delivers the circuit output of logical 2, $V_2$ (5V).

From the above, it can be seen that for a circuit input of logical 0, $V_0$ (0V), the F210 circuit responds by delivering a logical 2, $V_2$ (5V), output. Only the top IGFET Q1 transmits its source voltage to the output of the circuit to provide the circuit with its logical 2 output for logical 0 input. The gate input voltage to the top IGFET Q1 is below its absolute threshold and so the top IGFET Q1 transmits its logical 2, $V_2$ (5V), source voltage to the circuit output.

The intermediate IGFET branch does not deliver a signal voltage to the circuit output. The first intermediate branch IGFET Q2 does transmit its source voltage logical 1, $V_1$ (2.5V), to its drain, as the gate input voltage is below its absolute threshold. The second intermediate branch IGFET Q3 does not transmit its source voltage logical 1, $V_1$ (2.5V), from the drain of the first intermediate branch IGFET Q2 as the gate input voltage to the second intermediate branch IGFET Q3 is below its absolute threshold. The second intermediate branch IGFET Q3 prevents further transmission of the logical 1, $V_1$ (2.5V), signal voltage from the first intermediate branch IGFET.

The bottom IGFET Q4 does not deliver a signal voltage to the circuit output. The bottom IGFET Q4 does not transmit its source voltage of logical 0, $V_0$ (0V), to its drain and to the circuit output as the circuit input of logical 0, $V_0$ (0 v), is below its absolute threshold of 3.25 volts.

For a logical 0 input, the F210 circuit delivers a logical 2 output.

The effect of a logical one input on the F210, or base-1 complementer, circuit is as follows. For a circuit input of logical 1, $V_1$ (2.5V), an input of 2.50 volts is transmitted to the gates of all the IGFETs: the top IGFET Q1, the intermediate IGFET branch with its first and second intermediate branch IGFETs Q2, Q3, and the bottom IGFET Q4.

The bottom IGFET Q4 is an N-channel enhancement mode IGFET with an absolute threshold of 3.25 volts (0 volts source voltage ($V_0$) plus 3.25 volts gate voltage ($V_{GS(TH)}$)). As the bottom IGFET Q4 is an N-channel enhancement mode IGFET, the source voltage is transmitted to the drain only for gate voltages above its absolute threshold. The circuit input of logical 1, $V_1$ (2.5V), to the gate of the bottom IGFET Q4 is below its absolute threshold of 3.25 volts and the bottom IGFET Q4 does not transmit the voltage at its source to its drain and onto the circuit output. For a circuit input of logical 1, $V_1$ (2.5V), the bottom IGFET Q4 delivers no circuit output.

The intermediate IGFET branch has two IGFETs Q2, Q3 connected in series between a logical 1, $V_1$ (2.5V), source voltage and the circuit output. Both of the intermediate branch IGFETs Q2, Q3 are gate-connected to the circuit input. The source of the first intermediate branch IGFET Q2 is connected to the logical 1, $V_1$ (2.5V), source voltage. The drain of the first intermediate branch IGFET Q2 is connected to the source of the second intermediate branch IGFET Q3. The drain of the second intermediate branch IGFET Q3 is connected to the circuit output.

The first intermediate branch IGFET Q2 is a P-channel depletion mode IGFET with an absolute threshold of 4.25 volts (2.50 volts source voltage ($V_1$) plus 1.75 volts gate voltage ($V_{GS(TH)}$)). As the first intermediate branch IGFET Q2 is a P-channel enhancement mode IGFET, the source voltage is transmitted to the drain only for gate voltages below its absolute threshold. The circuit input of logical 1, $V_1$ (2.5V), to the gate of the first intermediate branch IGFET Q2 is below its absolute threshold of 4.25 volts and the first intermediate branch IGFET does transmit the voltage at its source to its drain. For a circuit input of logical 1, $V_1$ (2.5V), the first intermediate branch IGFET Q2 transmits a logical 1, $V_1$ (2.5V), to its drain and to the source of the second intermediate branch IGFET Q3.

The second intermediate branch IGFET Q3 is an N-channel depletion mode IGFET with an absolute threshold of 0.75 volts (2.50 volts source voltage ($V_1$) plus (−1.75) volts gate voltage ($V_{GS(TH)}$)). A logical 1, $V_1$ (2.5V), source voltage is applied to the second intermediate branch IGFET Q3 by the drain of the first intermediate branch IGFET Q2. As the second intermediate branch IGFET Q3 is an N-channel depletion mode IGFET, the source voltage is transmitted to the drain only for gate voltages above its absolute threshold. The circuit input of logical 1, $V_1$ (2.5V), to the gate of the second intermediate branch IGFET Q3 is above its absolute threshold of 0.75 volts and the second intermediate branch IGFET Q3 does transmit the voltage at its source to its drain and onto the circuit output. For a circuit input of logical 1, $V_1$ (2.5V), the second intermediate branch IGFET Q3 transmits a logical 1, $V_1$ (2.5V), to its drain and to the circuit output. For a circuit input of logical 1, $V_1$ (2.5V), the intermediate IGFET branch delivers a circuit output of logical 1, $V_1$ (2.5V).

The top IGFET Q1 is a P-channel enhancement mode IGFET with an absolute threshold of 1.75 volts (5 volts source voltage ($V_2$) plus (−3.25) volts gate voltage ($V_{GS(TH)}$)) As the top IGFET Q1 is a P-channel enhancement mode IGFET, the source voltage is transmitted to the drain only for gate voltages below its absolute threshold. The circuit input Is of logical 1, $V_1$ (2.5V), to the gate of the top IGFET Q1 is above its absolute threshold of 1.75 volts. The top IGFET Q1 does not transmit the voltage at its source (logical 2, $V_2$, 5) to its drain and onto the circuit output. For a circuit input of logical 1, $V_1$ (2.5V), the top IGFET Q1 delivers no circuit output.

From the above, it can be seen that for a circuit input of logical 1, $V_1$ (2.5V), the F210 circuit responds by delivering a logical 1, $V_1$ (2.5V), output. Only the intermediate IGFET branch transmits its source voltage to the output of the circuit to provide the circuit with its logical 1 output for logical 1 input. The gate input voltage to the intermediate IGFET branch is below the absolute threshold of the first intermediate branch IGFET Q2 and above the absolute threshold of the second intermediate branch IGFET Q3. As both intermediate branch IGFETs Q2, Q3 transmit their source voltages to their drains, the intermediate branch transmits its source voltage of logical 1, $V_1$ (2.5V), to the circuit output. The bottom IGFET Q4 does not deliver a signal voltage to the circuit output. The bottom IGFET Q4 does not transmit its source voltage of logical 0, $V_0$ (0V), to its drain and to the circuit output as the circuit input of logical 1, $V_1$ (2.5V), is below its absolute threshold of 3.25 volts.

The top IGFET Q1 does not deliver a signal voltage to the circuit output. The top IGFET Q1 does not transmit its source voltage of logical 2, $V_2$ (5V), to its drain and to the circuit output as the circuit input of logical 1, $V_1$ (2.5V), is above its absolute threshold of 1.75 volts.

For logical 1 input, the F210 circuit delivers a logical 1 output.

Logical 2 input upon the F210 base-1 complementer circuit is as follows. For a is circuit input of logical 2, $V_2$ (5V), an input of 5 volts is transmitted to the gates of all the IGFETs: the top IGFET Q1, the intermediate IGFET branch with its first and second intermediate branch IGFETs Q2, Q3, and the bottom IGFET Q4.

The bottom IGFET Q4 is an N-channel enhancement mode IGFET with an absolute threshold of 3.25 volts (0 volts source voltage ($V_0$) plus 3.25 volts gate voltage ($V_{GS(TH)}$)). As the bottom IGFET Q4 is an N-channel enhancement mode IGFET, the source voltage is transmitted to the drain only for gate voltages above its absolute threshold. The circuit input of logical 2, $V_2$ (5V), to the gate of the bottom IGFET Q4 is above its absolute threshold of 3.25 volts and the bottom IGFET Q4 does transmit the voltage at its source to its drain and onto the circuit output. For a circuit input of logical 2, $V_2$ (5V), the bottom IGFET Q4 delivers a circuit output of logical 0, $V_0$ (0V).

The intermediate IGFET branch has two IGFETs Q2, Q3 connected in series between a logical 1, $V_1$ (2.5V), source voltage and the circuit output. Both of the intermediate branch IGFETs Q2, Q3 are gate-connected to the circuit input. The source of the first intermediate branch IGFET Q2 is connected to the logical 1, $V_1$ (2.5V), source voltage. The drain of the first intermediate branch IGFET Q2 is connected to the source of the second intermediate branch IGFET Q3. The drain of the second intermediate branch IGFET Q3 is connected to the circuit output.

The first intermediate branch IGFET Q2 is a P-channel depletion mode IGFET with an absolute threshold of 4.25 volts (2.50 volts source voltage ($V_1$) plus 1.75 volts gate voltage ($V_{GS(TH)}$)). As the first intermediate branch IGFET Q2 is a P-channel enhancement mode IGFET, the source voltage is transmitted to the drain only for gate voltages below its absolute threshold. The circuit input of logical 2, $V_2$ (5V), to the gate of the first intermediate branch IGFET Q2 is above its absolute threshold of 4.25 volts and the first intermediate branch IGFET Q2 does not transmit the voltage at its source to its drain. For a circuit input of logical 2, $V_2$ (5V), the first intermediate branch IGFET Q2 does not transmit a logical 1, $V_1$ (2.5V), to its drain and to the source of the second intermediate branch IGFET Q3.

The second intermediate branch IGFET Q3 is an N-channel depletion mode IGFET with an absolute threshold of 0.75 volts (2.50 volts source voltage ($V_1$) plus (−1.75) volts gate voltage ($V_{GS(TH)}$)). A logical 1, $V_1$ (2.5V), source voltage is not applied to the second intermediate branch IGFET Q3 by the drain of the first intermediate branch IGFET Q2 as the gate input voltage to the first intermediate branch IGFET Q2 is above its absolute threshold. As the second intermediate branch IGFET Q3 is an N-channel depletion mode IGFET, the source voltage is transmitted to the drain only for gate voltages above its absolute threshold. The circuit input of logical 2, $V_2$ (5V), to the gate of the second intermediate branch IGFET Q3 is above its absolute threshold of 0.75 volts and the second intermediate branch IGFET Q3 would transmit the voltage at its source to its drain and onto the circuit output. However, as there is no source voltage for the second intermediate branch IGFET Q3, there is no transmission of voltage to the drain of the second intermediate branch IGFET Q3 and onto the circuit output. For a circuit input of logical 2, $V_2$ (5V), the second intermediate branch IGFET Q3 transmits no circuit output. For a circuit input of logical 2, $V_2$ (5V), the intermediate IGFET branch delivers no circuit output.

The top IGFET Q1 is a P-channel enhancement mode IGFET with an absolute threshold of 1.75 volts (5 volts source voltage ($V_2$) plus (−3.25) volts gate voltage ($V_{GS(TH)}$)).

As the top IGFET Q1 is a P-channel enhancement mode IGFET, the source voltage is transmitted to the drain only for gate voltages below its absolute threshold. The circuit input of logical 2, $V_2$ (5V), to the gate of the top IGFET Q1 is above its absolute threshold of 1.75 volts. The top IGFET Q1 does not transmit the voltage at its source (logical 2, $V_2$, 5V) to its drain and onto the circuit output. For a circuit input of logical 2, $V_2$ (5V), the top IGFET Q1 delivers no circuit output.

From the above, it can be seen that for a circuit input of logical 2, $V_2$ (5V), the F210 circuit responds by delivering a logical 0, $V_0$ (0V), output. Only the bottom IGFET Q4 transmits its source voltage to the output of the circuit to provide the circuit with its logical 0 output for logical 2 input. The gate input voltage to the bottom IGFET Q4 is above its absolute threshold and so the bottom IGFET Q4 transmits its logical 0, $V_0$ (0V), source voltage to the circuit output.

The intermediate IGFET branch does not deliver a signal voltage to the circuit output. The first intermediate branch IGFET Q2 does not transmit its source voltage logical 1, $V_1$ (2.5V), to its drain, as the gate input voltage is above its absolute threshold. The second intermediate branch IGFET Q3 would transmit its source voltage to its drain as the gate input voltage to the second intermediate branch IGFET Q3 is below its absolute threshold. However, as there is no voltage at the source of the second intermediate IGFET Q3, there is no effect upon the circuit output. The first intermediate branch IGFET Q2 prevents transmission of the logical 1, $V_1$ (2.5V), signal voltage to the second intermediate branch IGFET Q3 and the circuit output.

The top IGFET Q1 does not deliver a signal voltage to the circuit output. The top IGFET Q1 does not transmit its source voltage of logical 2, $V_2$ (5V), to its drain and to the circuit output as the circuit input of logical 2, $V_2$ (5V), is above its absolute threshold of 1.75 volts.

For a logical 2 input, the F210 circuit delivers a logical 0 output.

In the F210 circuit: the top IGFET Q1 delivers the logical 2, $V_2$ (5V), circuit output for logical 0, $V_0$ (0V), circuit input; the intermediate IGFET branch with its first and second IGFETs Q2, Q3 delivers the logical 1, $V_1$ (2.5V), circuit output for logical 1, $V_1$ (2.5V), circuit input; and the bottom IGFET Q4 delivers the logical 0, $V_0$ (0V), circuit output for the logical 2, $V_2$ (5V), circuit input. Each of the three IGFET branches respond to deliver the circuit output for only one value of logical input.

The analysis set forth above for the F210 ternary OPF can be conducted for any SUS-LOC circuit. By analyzing the input voltage, the source voltage, and the gate threshold voltage ($V_{GS(TH)}$), the response characteristics of any SUS-LOC OPF circuit can be determined. This process can also be extended to multiple place functions.

Multiple-Place Functions

Ternary multiple place functions (MPF, MPFs), with some references made to binary and pentanary (radix 5) are set forth herein. MPFs of any radix can be implemented with the SUS-LOC structure. As an example, the "two place functions" of radix two are shown in table N. There are very many possible two place functions. For radix 2, the number of possible two place functions is sixteen (16 or $2^4$). For radices 2 through 9, the number is greater than $10^{77}$. For radix 10 by itself, the number of two place functions is $10^{100}$.

An MPF is essentially the combination of two or more one place functions of the same radix. The combination of radices within a single multiple place function, while possible, is more advanced and complicated. Each input of an MPF is the input to one, or more, of the one place functions used to form the MPF. The branches of each one place function are arranged to conduct in series, parallel, or series-parallel with the like branches of the other OPF(s), to form composite branches. Like branches are those branches that connect the output terminal to the same source of logic level power for a given input logic level combination.

Every MPF, whatever its number of places and radix, produces a unique output sequence in response to its inputs being cycled through all possible combinations of input logic levels. The ternary logic system contains 19,683 ($3^9$) possible two place functions with 9 input combinations each. This is 2.25 times the number of input states of a binary two place function. However, not all of the possible MPFs of a given radix and number of places are useful. A set of MPFs contains r continuous functions, and functions that are reducible to a function of fewer places or reducible to a function of a lower radix, or both. When the radix is greater than 2, a reduction in the number of places and/or one of the radices of the function may be possible.

The sixteen two place functions of the binary system are shown in table N, below.

As shown in table N, some functions have familiar names such as the "Exclusive OR" and "NAND" gates. As previously stated, there are r number of continuous functions. For the binary case, there are 2: numbers 0 and 15. There are functions reducible to fewer places: numbers 3, 5, 10, and 12. The mirrored functions, if the labels are reversed, are shown as number 2 (which mirrors 4) and 11 (which mirrors 13). This is also the case for MPFs of any radix and any number of places. The use of binary in this circumstance provides a useful way in which to show characteristics shared by all MPFs of any radix.

The following presents tentative methods of identifying MPFs both textually and graphically. The methods are tentative because improvements and/or changes are expected to occur as r-valued logics and the SUS-LOC structure are further developed.

When referring to an MPF textually, the abbreviated name (assuming the function has been named) of the function is subscripted with the radix of the intended function. As examples, the ternary CGOR is referred to as "CGOR$_3$" and the pentanary GOR is referred to as "GOR$_5$". If the subscripted radix is omitted then radix 3 is assumed herein. Binary functions use their current names in conformance with established practice.

An alternate method of identification is to number the functions and to use the function's number for identification and cataloging. Numbering can be performed by assigning a power of the radix to each output location in the Karnaugh graph of the function. Functions with mixed radices are possible. The assignment of powers of three, for ternary logic, are shown in table O.

TABLE N

| # | B = 1, A = 1 | B = 1, A = 0 | B = 0, A = 1 | B = 0, A = 0 | NAME or DESCRIPTION |
|---|---|---|---|---|---|
| 0 | 0 | 0 | 0 | 0 | CONTINUOUS |
| 1 | 0 | 0 | 0 | 1 | "NOR" gate |
| 2 | 0 | 0 | 1 | 0 | "AND" gate with inverted "B" input |
| 3 | 0 | 0 | 1 | 1 | Reduce to inverter of input "B" |
| 4 | 0 | 1 | 0 | 0 | "AND" gate with inverted "A" input |
| 5 | 0 | 1 | 0 | 1 | Reduce to inverter of input "A" |
| 6 | 0 | 1 | 1 | 0 | Exclusive "OR" gate (XOR) |
| 7 | 0 | 1 | 1 | 1 | "NAND" gate |
| 8 | 1 | 0 | 0 | 0 | "AND" gate |
| 9 | 1 | 0 | 0 | 1 | "XOR" with inverted output |
| 10 | 1 | 0 | 1 | 0 | Reduce to buffer of input "A" |
| 11 | 1 | 0 | 1 | 1 | "OR" gate with inverted "B" input |
| 12 | 1 | 1 | 0 | 0 | Reduce to buffer of input "B" |

TABLE N

| # | B = 1, A = 1 | B = 1, A = 0 | B = 0, A = 1 | B = 0, A = 0 | NAME or DESCRIPTION |
|---|---|---|---|---|---|
| 13 | 1 | 1 | 0 | 1 | "OR" gate with inverted "A" input |
| 14 | 1 | 1 | 1 | 0 | "OR" gate |
| 15 | 1 | 1 | 1 | 1 | CONTINUOUS |

TABLE O

|   | | A | | |
|---|---|---|---|---|
|   |   | 0 | 1 | 2 |
|   | 0 | $3^8$ | $3^7$ | $3^6$ |
| B | 1 | $3^5$ | $3^4$ | $3^3$ |
|   | 2 | $3^2$ | $3^1$ | $3^0$ |

The Karnaugh graph of a GAND$_3$ (FIG. 134) is shown in table P with the powers of three used by the numbering method. Totaling the values for each power of three obtains the number of the GAND$_3$, which is the ternary two place function number 113.

TABLE P

|   | | A | | |
|---|---|---|---|---|
|   |   | 0 | 1 | 2 |
|   | 0 | $0 \times 3^8$ | $0 \times 3^7$ | $0 \times 3^6$ |
| B | 1 | $0 \times 3^5$ | $1 \times 3^4$ | $1 \times 3^3$ |
|   | 2 | $0 \times 3^2$ | $1 \times 3^1$ | $2 \times 3^0$ |

Figure 112:
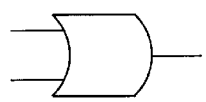
FIG. 112 shows the basic symbol for used for multiple place functions (MPFs).
Figure 113:
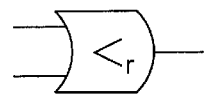
FIG. 113 shows the symbol for a GAND gate with an "r" placed at the location reserved for the radix of the function.
Figure 114:
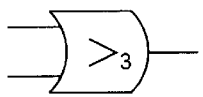
FIG. 114 shows the symbol for a $GOR_3$ gate.

The basic symbol for MPFs is shown in FIG. 112. The symbol for a GAND gate with an "r" placed at the location reserved for the radix of the function is shown in FIG. 113. The symbol for a GOR$_3$ gate is shown in FIG. 114. When the subscripted radix is omitted then radix 3 is assumed. Binary functions use their current symbols with gloss or legend notations indicating SUS-LOC implementation, required for proper interfacing of functions. Other r-valued logic symbols will be developed simultaneously with the development of r-valued logics based upon the SUS-LOC structure.

As previously stated, there are 19,683 possible ternary two place functions and 19,632 are usable. However, some are repeated and/or mirrored when the input labels are exchanged.

Of the 19,632 ternary two place functions, only a few are presented herein to provide pertinent examples of the operation and utility of SUS-LOC. Some of the gates have binary analogs and some have no single gate binary solution or analog. The gates that are the analogous to the well known binary NAND, NOR, and XOR are described herein. Pentanary logical functions are also described primarily to show that logical functions of any radix can be synthesized. There may be certain advantages in using radix 5. Also, the design parameters for the ternary and pentanary circuits are shown are shown in table Q, with those for the binary functions shown according to standard CMOS parameters.

TABLE Q

| LOGIC SYSTEM | LSV | OP | $V_0$ | $V_1$ | $V_2$ | $V_3$ | $V_4$ |
|---|---|---|---|---|---|---|---|
| Ternary | 2.5V | 70% | 0.0V | 2.5V | 5.0V | | |
| Pentanary | 2.0V | 70% | 0.0V | 2.0V | 4.0V | 6.0V | 8.0V |

Because an MPF is essentially the combination of two or more one place functions of the same radix, the CGOR and CGAND gates provide exemplary circuits by which the combining of OPFs to form an MPF may be shown. The CGOR$_3$, CGAND$_3$, CGOR$_5$ and CGAND$_5$, schematics, symbols, and Karnaugh graphs are shown in FIGS. 115 through 117, 118 through 120, 121 through 123, and 124 through 126, respectively. Also, shown in phantom are the components required for expansion of the ternary gates. The expansion of the corresponding pentanary gates is achieved in a similar manner.

The CGOR$_3$, and CGAND$_3$ gates are comprised of one radix 3 base-1 complementer per input term with like branches of each complementer placed in series, parallel, or series parallel as necessary to achieve the logic function of CGOR or CGAND. FIGS. 115 and 118 show that one complementer is comprised of Q2, Q4, Q6 and Q7, while the other complementer is comprised of Q1, Q3, Q5 and Q8.

The differences between a CGOR$_r$ and a CGAND$_r$ are: which composite branch (comprised of terminus branches) is connected in series, and which is connected in parallel; and which channel type forms the series portion and which channel type forms the parallel portion of the composite branch formed by the intermediate branches.

The like branches placed in series are seen in FIG. 115 as the composite branch formed by terminus branches consisting of Q1 and Q2. The like branches placed in parallel are shown as the composite branch formed by terminus branches comprised of Q7 and Q8. The like branches placed in series/parallel are seen as the composite branch formed by the intermediate branches consisting of Q3 in series with Q4, and placed in series with Q5 paralleled with Q6.

A comparison of FIGS. 115 and 118 reveals the differences between the CGOR$_3$ and the CGAND$_3$. The schematic of the CGAND$_3$ shows that the parallel, and series terminus branches are reversed, and the position of the channel types within the series/parallel composite branch are reversed.

With respect to the CGOR$_3$ circuit of FIG. 115, note should be taken that when input A is 0, output C follows the complement of input B. Note should also be taken that when input A is 2, output C is 0 for any input B. As inputs A and B are interchangeable, the reverse is also true (substituting input B for input A and vice-versa).

The circuit elements of the CGOR circuit are a mixture of depletion mode and enhancement mode FETs. A group of N-channel enhancement mode FETs intermediate the transmission of $V_0$ to output C to control $V_0$ output. A group of combined P-channel depletion mode and N-channel depletion mode FETs intermediate the transmission of $V_1$ to output C to control $V_1$ output. A group of P-channel enhancement mode FETs intermediate the transmission of $V_2$ to output C to control $V_2$ output. These groups of FETs serve to discriminate the input so as to control and generate the appropriate output for a CGOR circuit.

As shown in FIG. 115, $V_0$ is connected to output C via N-channel enhancement mode FETs connected in parallel. There is one corresponding N-channel enhancement mode FET for each input and the signal of each input is connected to the gate of the corresponding FET. The FETs are connected in parallel so that only one of the FETs must conduct in order for the signal at $V_0$ to be transmitted to output C. $V_{GS\ on}$ for all the $V_0$ FETs is 3.25 volts (yielding an absolute gate threshold voltage of 3.25 volts) so that in order for the signal at $V_0$ to be transmitted to output C, either input A or B must be at $V_2$. This corresponds to the truth table value for output C when inputs A or B is 2. When both input A and input B are logic level 1 or below, the signal at $V_0$ is not transmitted to output C by either Q7 or Q8.

$V_1$ is intermediated to output C by two sets of intersecting circuit structures. The first circuit structure is a group of P-channel depletion mode FETs connected in series with gate thresholds $V_{GS\ off}$ of 1.75 volts (yielding an absolute gate threshold voltage of 4.25 volts). The second circuit structure is a group of N-channel depletion mode FETs connected in parallel with gate thresholds $V_{GS\ off}$ of -1.75 volts (yielding an absolute gate threshold voltage of 0.75 volts). The two circuit structures are serially connected to one another as the output from the first circuit structure must pass through the second circuit structure before reaching output C. FETs Q4 and Q5 of the two circuit structures are both gate-connected to input A. FETs Q3 and Q6 are gate-connected to input B. For CGOR circuits with additional inputs, corresponding FETs of the two circuit structures are gate-connected to their corresponding inputs.

The first circuit structure with its P-channel depletion mode FETs Q3, Q4 serves to prevent transmission of $V_1$ to output C when either input A or input B is logic level 2 (or above logic level 1). As the FETs Q3, Q4 are connected in series, any input of logic level 2 on any of the FETs of the first circuit structure serves to prevent transmission of $V_1$ to output C. Only when inputs A and B are both logic level 1 or below will the FETs of the first circuit structure conduct $V_1$ to the second circuit structure.

The second circuit structure with its N-channel depletion mode FETs Q5, Q6 serves to allow transmission of $V_1$ to output C when either input A or input B is logic level 1 or above. As the FETs are connected in parallel, any input of logic level 1 or above from any input (A, B, n . . . ) allows transmission of the $V_1$ from the first P-channel depletion mode circuit structure to the output C.

The second circuit structure has a group of N-channel depletion mode FETs Q5, Q6 connected in parallel with threshold voltages $V_{GS\ off}$ of −1.75 volts (yielding an absolute gate threshold voltage of 0.75 volts). If either input A or input B is logic level 1 or above, at least one FET for the second circuit structure will be placed in its conducting mode so that the output from the first circuit structure is transmitted to output C. If both input A and input B are logic level 0, no FET of the second circuit structure is placed in its conducting mode and no output from the first circuit structure is transmitted to output C. In this way, transmission of $V_1$ to output C for inputs A and B both at logic level 0 is prevented by the second circuit structure. Circuit response for the CGOR circuit for inputs A and B both at logic level 0 is then mediated only by the series circuitry associated with $V_2$.

Only when inputs A and B are both logic level 1 or below will the FETs Q3, Q4 of the first circuit structure conduct $V_1$ to the second circuit structure. When inputs A and B are both logic level 0, the first circuit structure connected to $V_1$ will conduct $V_1$ to the end of the serially connected P-channel depletion mode FETs Q3, Q4. If left unchecked, the anomalous circumstance would arise where both $V_1$ and $V_2$ would be transmitted to output C although the circuit should respond only with $V_2$ at output C for inputs A and B both at 0. In order to check the transmission of $V_1$ to output C for inputs A and B both at 0, the second Is circuit structure of parallel N-channel depletion mode FETs Q5, Q6 is serially connected to the first circuit structure.

Output of the CGOR circuit when both input A and input B are $V_0$ is $V_2$. A $V_2$ source signal is connected to output C via P-channel enhancement mode FETs Q1, Q2, which together mediate $V_2$ circuit response. There is one corresponding P-channel enhancement mode FET for each input and the signal of each input is connected to the gate of the corresponding FET. The FETs are connected to one another in series so that all the FETs must conduct in order to transmit the $V_2$ source voltage to output C. $V_{GS\ on}$ for all the FETs is −3.25 volts (yielding an absolute gate threshold voltage of 1.75 volts) so that in order for a $V_2$ signal to be transmitted to output C, both inputs A and B, must be at $V_0$. This corresponds to the truth table value for output C when both input A and input B are logic level 0. When either input A or B are above logic level 0, no $V_2$ signal is transmitted to output C.

The CGOR circuit can be expanded to handle any number of inputs. One such possible third input is shown as input "n" with the additional circuitry required shown in phantom in FIG. 115. The additional required circuitry conforms to the overall circuitry of the CGOR circuit, expanding upon the circuit pattern set forth for two-input CGOR circuits, such as that for inputs A and B, above.

For each additional input required for the CGOR circuit, an additional FET is required for each of the CGOR circuit sub-structures. To mediate the $V_0$ output, an additional N-channel enhancement mode FET is connected in parallel to the FETs corresponding to inputs A and B for mediating $V_0$ output. To mediate $V_1$ output, one additional like FET is required for both the first serial circuit structure and the second parallel circuit structure. An additional P-channel depletion mode FET is connected in series with the other FETs of the first circuit structure and an additional N-channel depletion mode FET is connected in parallel with the other FETs of the second circuit structure. To mediate $V_2$ output, an additional P-channel enhancement mode FET is connected in series to the FETs corresponding to inputs A and B for mediating $V_2$ output. The gate inputs of the additional FETs are connected to the corresponding additional input. Even with the addition of more inputs, the response characteristics of the CGOR circuit remain the same as generally indicated by the truth table of table C.

Note should be taken how the CGOR circuit resembles the F210 base-1 complementer circuit (FIG. 95) of the one-place function circuits. By removing the circuitry associated with input B, the CGOR circuit becomes an F210 base-1 complementer circuit. Also, the series-parallel nature of the circuit should be noted. That portion of the CGOR circuit transmitting $V_0$ to output C is in parallel, the portion transmitting $V_2$ is in series, and that portion transmitting $V_1$ has a serial portion in series with a parallel portion.

The table below shows the response of the individual transistors Qn for the different inputs of A and B. Those table entries left blank indicate that the input does not control that transistor Qn.

|   |   | Q1  | Q2  | Q3  | Q4  | Q5  | Q6  | Q7 | Q8  |
|---|---|-----|-----|-----|-----|-----|-----|----|-----|
| A | 0 |     | on  |     | on  |     | off | off |    |
|   | 1 |     | off |     | on  |     | on  | off |    |
|   | 2 |     | off |     | off |     | on  | on  |    |
| B | 0 | on  |     | on  |     | off |     |     | off |
|   | 1 | off |     | on  |     | on  |     |     | off |
|   | 2 | off |     | off |     | on  |     |     | on  |

For the $CGAND_3$ circuit of FIG. 118, note should be taken that when input A is 0, input C is always 2. Note should also be taken that when input A is 2, output C follows the complement of input B. As inputs A and B are interchangeable, the reverse is also true (substituting input B for input A and vice-versa).

In general, the CGAND circuit is supplementary to the CGOR circuit in both response and structure. Where the CGOR circuit uses parallel FETs to mediate $V_0$ to output C, the CGAND circuit uses serial FETs. Where the CGOR circuit uses P-channel depletion mode FETs in series and N-channel depletion mode FETs in parallel to mediate $V_1$ to output C, the CGAND circuit uses N-channel depletion mode FETs in series and P-channel depletion mode FETs in parallel. Where the CGOR circuit uses serial FETs to mediate $V_2$ to output C, the CGAND circuit uses parallel FETs. Other features of the CGAND circuit supplementing the CGOR circuit can be seen by inspection of the circuit schematics of FIGS. 115 and 118, and the truth tables of FIGS. 117 and 120.

Like the CGOR circuit, the circuit elements of the CGAND circuit are a mixture of depletion mode and enhancement mode FETs. A group of N-channel enhancement mode FETs intermediate the transmission of $V_0$ to output C to control $V_0$ output. A group of combined N-channel depletion mode and P-channel depletion mode FETs intermediate the transmission of $V_1$ to output C to control $V_1$ output. A group of P-channel enhancement mode FETs intermediate the transmission of $V_2$ to output C to control $V_2$ output. These groups of FETs serve to discriminate the input so as to control and generate the appropriate output for a CGAND circuit.

As shown in FIG. 118, $V_0$ is connected to output C via N-channel enhancement mode FETs Q7, Q8 connected in series. Output of the CGAND circuit when all inputs are $V_2$ is $V_0$. There is one corresponding N-channel enhancement mode FET for each input and the signal of each input is connected to the gate of the corresponding FET. Each FET mediates the $V_0$ circuit response in conjunction with the other, serially-connected FETs of the $V_0$ output circuit group. The FETs are connected in series so that all FETs must conduct in order for the signal at $V_0$ to be transmitted to output C. $V_{GS\ on}$ for all the FETs is 3.25 volts (yielding an absolute gate threshold voltage of 3.25 volts) so that in order for the signal at $V_0$ to be transmitted to output C, all inputs, both A and B, must be at $V_2$. This corresponds to the truth table value for output C when both inputs A and input B are 2. When either input A or input B is below logic level 2, no $V_0$ signal is transmitted to output C.

$V_1$ is intermediated to output C by two sets of intersecting circuit structures. The first circuit structure is a group of N-channel depletion mode FETs Q3, Q4 connected in series with gate thresholds $V_{GS\ off}$ of $-1.75$ volts (yielding an absolute gate threshold voltage of 0.75 volts). The second circuit structure is a group of P-channel depletion mode FETs Q5, Q6 connected in parallel with gate thresholds $V_{GS\ off}$ of $+1.75$ volts (yielding an absolute gate threshold voltage of 4.25 volts). The two circuit structures are serially connected to one another so that the output from the first serial circuit structure must pass through the second parallel circuit structure before reaching output C. One FET of both of the two circuit structures is gate-connected to input A. One FET of both of the two circuit structures are gate-connected to input B.

The first circuit structure with its N-channel depletion mode FETs Q3, Q4 serves to prevent transmission of $V_1$ to output C when either input A or input B is logic level 0 (or below logic level 1). As the FETs Q3, Q4 are connected in series, any input of logic level 0 on any of the FETs of the first circuit structure serves to prevent transmission of $V_1$ to output C. Only when inputs A and B are both logic level 1 or above will the FETs Q3, Q4 of the first circuit structure conduct $V_1$ to the second circuit structure.

The second circuit structure with its P-channel depletion mode FETs Q5, Q6 serves to allow transmission of $V_1$ to output C when either input A or input B is logic level 1 or below. As the FETs are connected in parallel, any input of logic level 1 or below from any input (A, B, n . . . ) allows transmission of the $V_1$ from the first N-channel depletion mode circuit structure to the output C.

The second $V_1$ circuit structure has a group of P-channel depletion mode FETs Q5, Q6 connected in parallel with threshold voltages $V_{GS\ off}$ of 1.75 volts (yielding an absolute gate threshold voltage of 4.25 volts). If either input A or input B is logic level 1 or below, at least one FET for the second circuit structure will be placed in its conducting mode so that the output from the first circuit structure is transmitted to output C. If both input A and input B are logic level 2, no FET of the second circuit structure is placed in its conducting mode and no output from the first circuit structure is transmitted to output C. In this way, transmission of $V_1$ to output C for inputs A and B both at logic level 2 is prevented by the second circuit structure. Circuit response for the CGAND circuit for inputs A and B both at logic level 2 is then mediated only by the serial circuitry associated with $V_0$.

When inputs A and B are both logic level 2, the first circuit structure connected to $V_1$ will conduct $V_1$ to the end of the serially connected N-channel depletion mode FETs Q3, Q4. If left unchecked, the anomalous circumstance would arise where both $V_1$ and $V_0$ would be transmitted to output C although the circuit should respond only with $V_0$ at output C for inputs A and B both at 2. In order to check the transmission of $V_1$ to output C for inputs A and B both at 2, the second circuit structure of parallel P-channel depletion mode FETs Q5, Q6 is serially connected to the first circuit structure.

Output of the CGAND circuit is $V_2$ when either input A or input B is $V_0$. $V_2$ is connected to output C via P-channel enhancement mode FETs Q1, Q2 connected in parallel and only one must be placed in a conducting mode by its gate input in order to transmit $V_2$ to output C. There is one corresponding P-channel enhancement mode FET for each input and the signal of each input is connected to the gate of the corresponding FET. $V_{GS\ on}$ for all the FETs is $-3.25$ volts (yielding an absolute gate threshold voltage of 1.75 volts) so that in order for a $V_2$ signal to be transmitted to output C, any input, either A or B, must be at $V_0$. This corresponds to the truth table value for output C when either input A or B is logic level 0. When both input A and input B are above logic level 0, no $V_2$ signal is transmitted to output C.

The CGAND circuit can be expanded to handle any number of inputs. One such to possible third input is shown as input "n" with the additional required circuitry shown in phantom in FIG. 118. The additional required circuitry conforms to the overall circuitry of the CGAND circuit, expanding upon the circuit pattern set forth for two-input CGAND circuits, such as that for inputs A and B, above.

For each additional input required for the CGAND circuit, an additional FET is required for each of the CGAND circuit sub-structures. To mediate the $V_0$ output, an additional N-channel enhancement mode FET is connected in series to the FETs corresponding to inputs A and B for mediating $V_0$ output. To mediate $V_1$ output, one additional like FET is required for both the first serial circuit structure and the second parallel circuit structure. An additional N-channel depletion mode FET is connected in series with the other FETs of the first circuit structure and an additional P-channel depletion mode FET is connected in parallel with the other FETs of the second circuit structure. To mediate $V_2$ output, an additional P-channel enhancement mode FET having its source at $V_2$ is connected in parallel with the original parallel-connected FETs and to output C with its gate connected to its corresponding input. Even with the addition of more inputs, the response characteristics of the CGAND circuit remain the same as generally indicated by the truth table of FIG. 120.

Note should be taken how the CGAND circuit resembles the F210 base-1 complementer circuit (FIG. 95) of the one-place function circuits. By removing the circuitry associated with input B, the CGAND circuit becomes an F210 base-1 complementer circuit. Also, the series-parallel nature of the circuit should be noted. That portion of the CGAND circuit transmitting $V_0$ to output C is in series, the portion transmitting $V_2$ is in parallel, and that portion transmitting $V_1$ has a serial portion in series with a parallel portion. There are similarities present in the CGAND circuit to the CGOR circuit. Inspection of the two circuit schematics (FIGS. 118 and 115) show the differences in structure leading to the different operating characteristics of the two circuits.

The table below shows the response of the individual transistors Qn for the different inputs of A and B. Those table entries left blank indicate that the input does not control that transistor Qn.

|   |   | Q1 | Q2 | Q3 | Q4 | Q5 | Q6 | Q7 | Q8 |
|---|---|----|----|----|----|----|----|----|----|
| A | 0 |    | on |    | off |    | on | off |   |
|   | 1 |    | off |    | on |    | on | off |   |
|   | 2 |    | off |    | on |    | off | on |   |
| B | 0 | on |    | off |    | on |    |    | off |
|   | 1 | off |    | on |    | on |    |    | off |
|   | 2 | off |    | on |    | off |    |    | on |

Non-complementing logic circuits are also achievable through SUS-LOC. Due to the way currently-available switches operate, the output voltage of a single stage circuit must move in the opposite direction of the circuit's input voltage as indicated above with regards to non-reverse sequences. Therefor e the basi c s ingle stage function of an MPF produces either a complementary or converted output in order to avoid aberrant paths. To obtain a logic function with an output that is not the complement or in reverse sequence of its inputs, the addition of a base-1 complementer or another one place function is necessary. This is the case with most MPFs in order to produce logic levels that are no t a complement or reverse of a function's input.

This quality of SUS-LOC is independent of the radix and arises due to switch operation. If such switches are not susceptible to back biasing, the additional OPFs preventing such back biasing can be eliminated. Additionally, this inherent trait of SUS-LOC logic circuit structures indicates that proper planning and design of combinational circuits is necessary to ensure an optimum design having a minimum of components, lower power requirements, and shorter propagation delay time.

Figure 127:
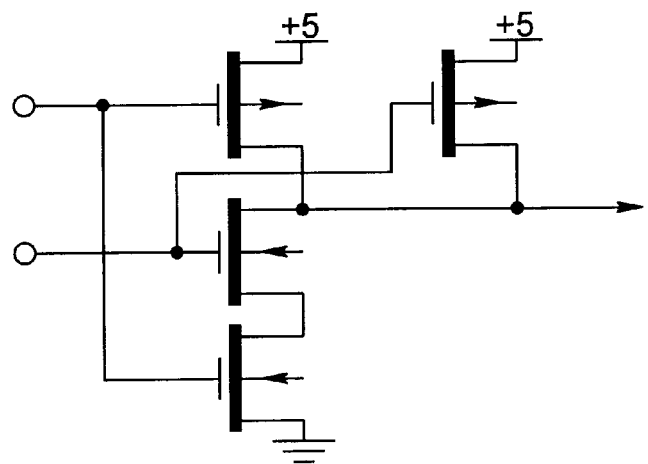
FIG. 127 is a schematic representation of a binary NAND gate.
Figure 128:
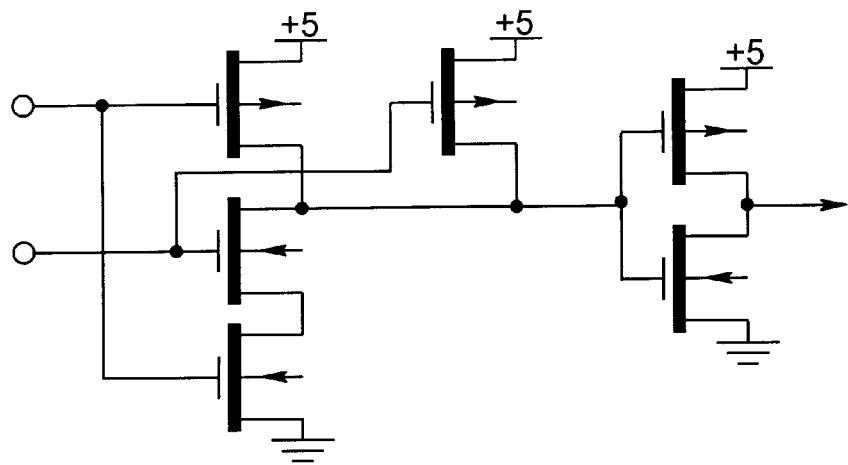
FIG. 128 is a schematic representation of a binary AND gate.
Figures 138A, 138B:
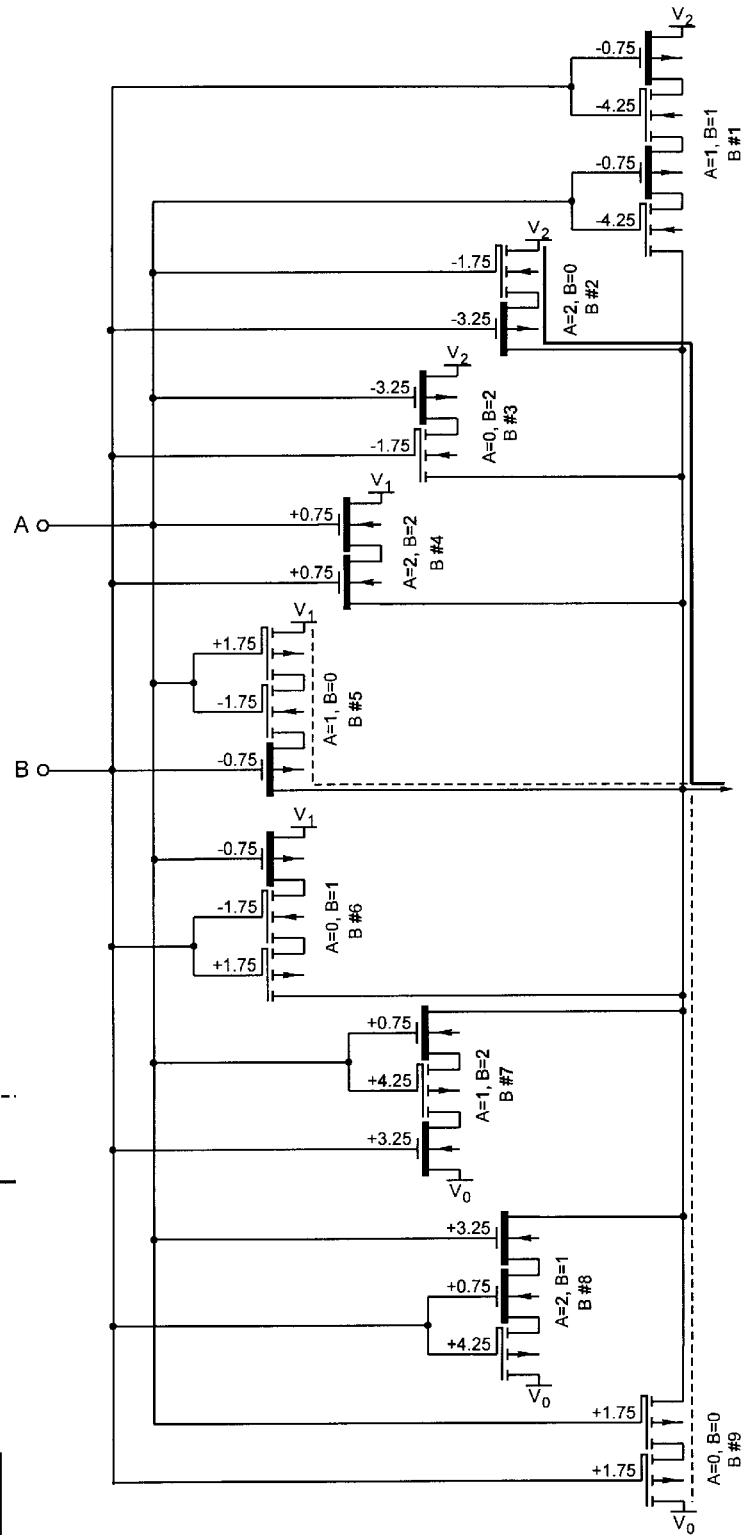
Figure 145:
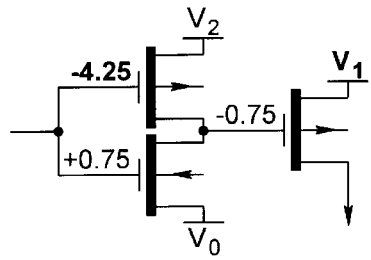

An example of non-complementing logic is the difference between the CMOS implementations of the binary NAND and AND gates, shown in FIGS. 127 and 128, respectively. Notice that the AND gate is actually a NAND gate with an inverter added.

To form a non-complementing or a non-converting logic function simply add a base-1 complementer, or another OPF of the proper radix, to the basic logic function as a pre- or post-conditioner. This will produce the desired output sequence. The $GOR_3$ and $GAND_3$, shown in FIGS. 129 through 131 and 132 through 134, respectively, were realized through this post-conditioning method. In these circuits, a base-1 complementer was added to the output of the basic $CGOR_3$ and $CGAND_3$ gates.

Additional Stages

The process of adding additional stages to SUS-LOC circuits, and the resulting circuitry, provide insight into the construction and design of SUS-LOC.

FIG. 135a shows the SUS-MOS implementation of a two-term ternary Sigma gate. The term SUS-MOS refers to an embodiment of SUS-LOC using one-way FETs having a dedicated source voltage. FETs such as those used in SUS-LOC take their source from the more positive or negative voltage for P-channel and N-channel FETs, respectively.

FIGS. 136–144 show the Sigma gate with the intended output path shown in bold and the aberrant paths shown by dotted lines for each of the nine combinations of input logic levels, respectively. Also, FIGS. 136–144 show the Karnaugh graphs with the unselected input and output locations in phantom. Additionally, all of the aberrant paths are shown in table R.

TABLE R

SUS-MOS SIGMA ABERRANT PATHS

| | INPUTS | | | Selected or | Aberrant Paths by |
|---|---|---|---|---|---|
| FIG. # | A | B | OUTPUT | Desired Path | Branch Number, (B#) |
| 1 | 0 | 0 | 0 | 9 | 1, 2, 3, 5, 6 |
| 2 | 1 | 0 | 1 | 5 | 1, 2, 9 |
| 3 | 2 | 0 | 2 | 2 | 5, 9 |
| 4 | 0 | 1 | 1 | 6 | 1, 3, 9 |
| 5 | 1 | 1 | 2 | 1 | 5, 6, 9 |
| 6 | 2 | 1 | 0 | 8 | 4 |
| 7 | 0 | 2 | 2 | 3 | 6, 9 |
| 8 | 1 | 2 | 0 | 7 | 3, 4 |
| 9 | 2 | 2 | 1 | 4 | 7, 8 |

Because SUS-MOS circuits do not take into consideration that the source and drain electrodess of a FET are determined by the magnitude or polarity of the voltages placed upon them, desired branch conduction (or aberrant paths) occur if actually implemented using currently available FETs. For P-channel FETs, the source electrode is the more positive of the two electrodes; for N-channel FETs, the source is the more negative. Therefore, the output voltage or logic level can exchange the source and drain electrodes of the FETs used to form a branch. While SUS-MOS forms an excellent means by which multiple-valued logic may be achieved, the apparent absence of dedicated-source FETs must be resolved in another way. SUS-LOC provides such a way, as indicated below by the use of additional stages.

If currently available FETs are used in a SUS-MOS design, when a source/drain electrode exchange occurs, the input logic level(s) might not have sufficient magnitude to prevent an unselected branch from conducting and giving rise to an aberrant path. FIG. 136a shows branch 2 as an aberrant path and is used in the following example explaining sourcedrain exchange.

With input logic levels of A=0, B=0, the selected branch is branch 9 which conducts logic 0, $V_0$, zero volts to the output terminal as shown in bold in FIG. 136. Because branch 2 is also connected to the output terminal, the voltage conducted by branch 9 is placed on the drain of QB, a P-channel enhancement mode transistor. With a gate voltage of zero, QB is biased to conduct because QA acts as an extremely large resistor connecting the source of QB to $V_2$, 5 volts. QB then conducts V. from the output terminal to QA.

Because QA is an N-channel device and the voltage conducted by QB ($V_0$) is more negative than the $V_2$ supply voltage, the source electrode of QA is now the electrode connected to QB. With a "new" source voltage of 0 volts, the input or gate voltage of QA (A=O) is not sufficiently low enough to turn off QA as $V_0$ (A=O) is not −1.75 V below the $V_0$ "source" from QB. With the source/drain exchange of QA, branch 2 conducts $V_2$ to the output terminal. With both branch 9 and branch 2 conducting, there is an extremely high current flow from $V_2$ to $V_0$ through the FETs of branches 2 and 9. This aberrant path also causes an erroneous output voltage of $V_2-V_0/2$. The required circuit response is not available.

Likewise, branches 3, 5, and 6 give rise to aberrant paths as follows. With the A=0, B=0 input, branch 9 transmits $V_0$ to the output and to the connections all branches (including branches 3, 5, and 6) have with the output.

For branch 3, the $V_O$ output is transmitted to the drain of QD, an N-channel depletion mode FET with a gate threshold of −1.75 volts. As it is an N-channel FET, its source is taken from the more negative of voltages placed upon its electrodes (those electrodes acting as the source and drain under the conditions present). As $V_O$ is less than $V_2$, it becomes the source for QD and as B=0 ($V_O$) is not 1.75 volts below $V_O$, QD is open and conducts.

For QC, the input of A=0 upon the P-channel enhancement mode FET of QC (having a gate threshold voltage of −3.25 volts) opens QC so that it conducts $V_2$ to QD. As both QC and QD are open when A=0 and B=0, there is an aberrant path from the $V_2$ source of branch 3 to the $V_O$ source of branch 9.

For branch 5, the $V_O$ output is transmitted to QG which is a P-channel enhancement mode FET having a gate threshold voltage of −0.75 volts. As QG is a P-channel FET, it takes its source from the more positive of the voltages impressed upon its non-input/non-gate electrodes. As the voltage on the other side of QG is $V_1$ (either by direct conductance or the high resistance of a closed FET condition by QE and/or QF), QG takes its source voltage from $V_1$. As B=0 ($V_O$) is −0.75 volts below VI, QG is open when A=0, B=0 and conducts $V_O$ onto QF.

QF is an N-channel depletion mode FET with a gate threshold voltage of −1.75 volts. It takes for its source as an N-channel FET from the lesser of either $V_1$ or $V_O$, in this case $V_O$. As QF takes for its source $V_O$, the input of A=0 ($V_O$) is not 1.75 volts below $V_O$. Consequently, QF is open and conducts from its source to drain.

QE is a P-channel depletion mode FET having a gate threshold voltage of 1.75 volts. As QE is a P-channel FET, it takes as its source the greater of either $V_1$ or $V_O$, this case being $V_1$. As A=0 ($V_O$) is not 1.75 volts more than $V_1$, QE is open and conducts $V_1$ from its source to drain.

As all of the three FETs (QE, QF, and QG) are open, the voltage source $V_1$ for branch 5 is conducted to output at the same time the source voltage for branch 9 ($V_O$) is also transmitted to output. An aberrant path is present with the high current flow and erroneous output voltages as similarly set forth for branch 2.

With respect to branch 6, a similar situation occurs when A=0, B=0. QJ is a P-channel depletion mode FET with a gate threshold voltage of 1.75 volts. As QJ is a P-channel FET, it takes as its source the more positive of either of its non-input/non-gate electrodes. Although QH and QI may act as extremely large resistors, $V_1$ as the source of branch 6 will be impressed upon one of the QJ electrodes, the $V_O$ output from branch 9 is impressed upon the other. QJ then takes the more positive of $V_1$ or $V_O$ as its source, in this case $V_1$. The input of B=0 upon QJ is not 1.75 volts above $V_1$ and QJ is on, thereby conducting $V_O$ back to QI.

QI is an N-channel depletion mode FET having a gate threshold of −1.75 volts. $V_1$ is impressed upon one of its non-input electrodes and $V_O$ (through QJ) is impressed upon the other electrode. As QI is an N-channel FET, it takes as its source the more negative of $V_1$ or $V_O$, in this case $V_O$. As the input of B=0 upon QI is not 1.75 volts below $V_O$, QI is open and transmits $V_O$ onto QH.

QH is a P-channel enhancement mode FET with a gate threshold of 0.75 volts. As a P-channel FET, it takes as its source the more positive of either $V_1$ or $V_O$, in this case $V_1$. As the input of A=0 is 0.75 volts less than $V_1$, QH is on transmitting $V_1$ (through QI and QJ) onto the output simultaneously with the $V_O$ output of branch 9. An aberrant path is present with the corresponding high current flow and erroneous output voltage as for branch 2.

As shown above, aberrant paths can rise in SUS-LOC circuits that do not take into account the characteristic of N- and P-channel FETs to take the more negative or positive, respectively, voltages upon their electrodes as their source. With the development of one-way FETs, the SUS-MOS embodiment of SUS-LOC is believed to be a very useful and advantageous embodiment of SUS-LOC. However, at this point, the apparent unavailability of such dedicated-source (or one-way) FETs requires that accommodation be made for the transistors or switches used in a SUS-LOC circuit. FIGS. 138–144 show the pertinent intended output and aberrant paths as well as the related Karnaugh value. These drawings are believed to be sufficiently self-explanatory such that the above evaluation process can be applied to these circuit structures in evaluating FET conductance.

In a like manner, it can be seen in FIGS. 136–144 and table R that all nine branches become an aberrant path for at least one combination of input logic levels. Because the aberrant paths cause an extremely high current flow and an improper output logic level, measures must be taken to prevent aberrant paths from occurring. The methods and designs by which such aberrant paths can be prevented in the SIGMA circuit are applicable to all SUS-LOC circuitry.

To prevent an aberrant path from occurring, an additional single stage OPF and/or transistor replacement is required to ensure proper turn on and turn OFF of each transistor of each branch. This can be done by substituting a branch transistor with a two transistor OPF with its output driving the gate of an appropriate conducting transistor.

The absolute threshold voltage of the branch transistor to be replaced is relative to the supply voltage it is to conduct. The difference between the absolute threshold voltage and the supply or source voltage is the gate threshold voltage $V_{GS(TH)}$ of the FET in question as the absolute threshold voltage equals the source voltage plus the gate threshold voltage. The threshold voltage of one of the transistors of the OPF being used as part of the replacement is set to the absolute voltage of the threshold of the transistor being replaced. The threshold of the other transistor forming the OPF is the corresponding supplementary threshold voltage for the transistor being replaced. The threshold of the replacement conducting transistor should be low to assist in maintaining the symmetry of the output.

The replacement sets consisting of a single stage OPF and conducting transistor for ternary logic gates having a $V_{r-1}$ of 5 volts, an LSV (Logic Step Voltage) of 2.5 volts, and an OP of 70% are shown in FIGS. 145–152 and the figure numbers are associated with the conducting transistor being replaced as indicated in table S.

TABLE S

| Channel | Mode | Threshold | Conducting | FIGURE # |
|---|---|---|---|---|
| N | Depl. | −1.75 | V1 | 145 |
| N | Depl. | −1.75 | V2 | 146 |
| N | Depl. | −4.25 | V2 | 147 |
| P | Depl. | +1.75 | V1 | 148 |
| P | Depl. | +1.75 | V0 | 149 |
| P | Depl. | +4.25 | V0 | 150 |
| N | Enh. | +0.75 | V1 | 151 |
| N | Enh. | +0.75 | V0 | Not Required |
| N | Enh. | +3.25 | V0 | Not Required |
| P | Enh. | −0.75 | V1 | 152 |
| P | Enh. | −0.75 | V2 | Not Required |

TABLE S

| Channel | Mode | Threshold | Conducting | Figure # |
|---|---|---|---|---|
| P | Enh. | −3.25 | V2 | Not Required |

In the figures showing the replacement sets, the relative threshold voltage of the transistor being replaced is translated to a voltage relative to either $V_0$ or $V_{r-1}$ that is equal to the absolute threshold voltage of the transistor to be replaced. By so selecting such threshold voltages, the response characteristics (namely the point where FETs turn on and off) of the circuit are preserved. As an example: if the transistor to be replaced is a P-channel depletion mode that conducts $V_1$ with a threshold voltage of +1.75 which equates to an absolute voltage of 4.25 volts then one of the replacement set OPF transistors will have a relative threshold voltage equal to the absolute voltage of 4.25 volts. Such a replacement set is lo shown in FIG. 148. The recalculated relative threshold voltage and the voltage to be conducted of the transistor being replaced are shown in bold face in FIGS. 145–152 and are listed in table S. The transistors that do not need to be replaced have the words "Not Required" in the figure number column of table S.

Table T shows Table S sorted according to source voltage ("Conducting") and mode type.

TABLE T

| Channel | Mode | Threshold | Conducting | Figure # |
|---|---|---|---|---|
| P | Depl. | +4.25 | V0 | 150 |
| P | Depl. | +1.75 | V0 | 149 |
| P | Depl. | +1.75 | V1 | 148 |
| N | Depl. | −1.75 | V1 | 145 |

TABLE T

| Channel | Mode | Threshold | Conducting | Figure # |
|---|---|---|---|---|
| N | Depl. | −1.75 | V2 | 146 |
| N | Depl. | −4.25 | V2 | 147 |
| N | Enh. | +0.75 | V1 | 151 |
| P | Enh. | −0.75 | V1 | 152 |
| N | Enh. | +0.75 | V0 | Not Required |
| N | Enh. | +3.25 | V0 | Not Required |
| P | Enh. | −0.75 | V2 | Not Required |
| P | Enh. | −3.25 | V2 | Not Required |

It should be noted that such replacement sets can be designed and fabricated for the transistors in the branches of any logic function of any radix.

Figure 146:
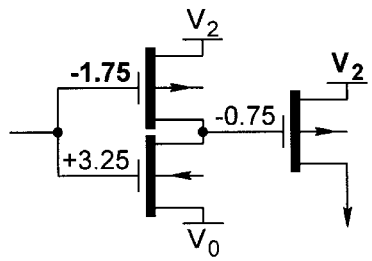
Figure 147:
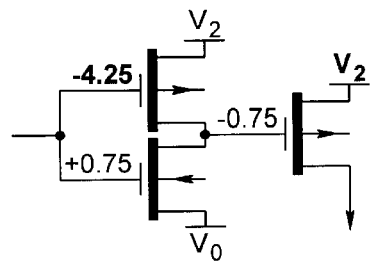
Figure 148:
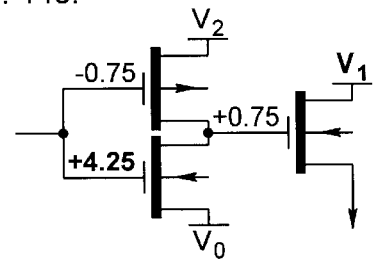
Figure 149:
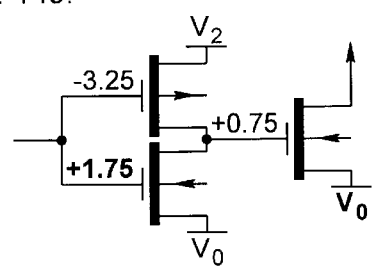
Figure 150:
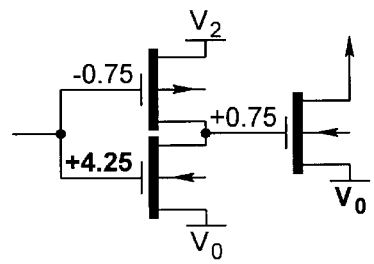
Figure 151:
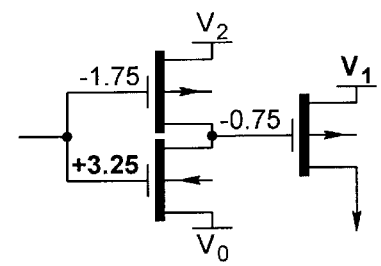
Figure 152:
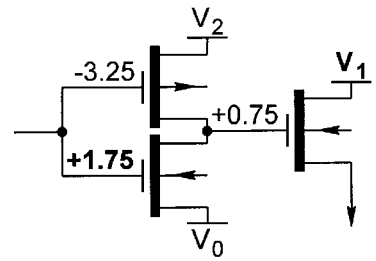
Figures 153A, 153B:
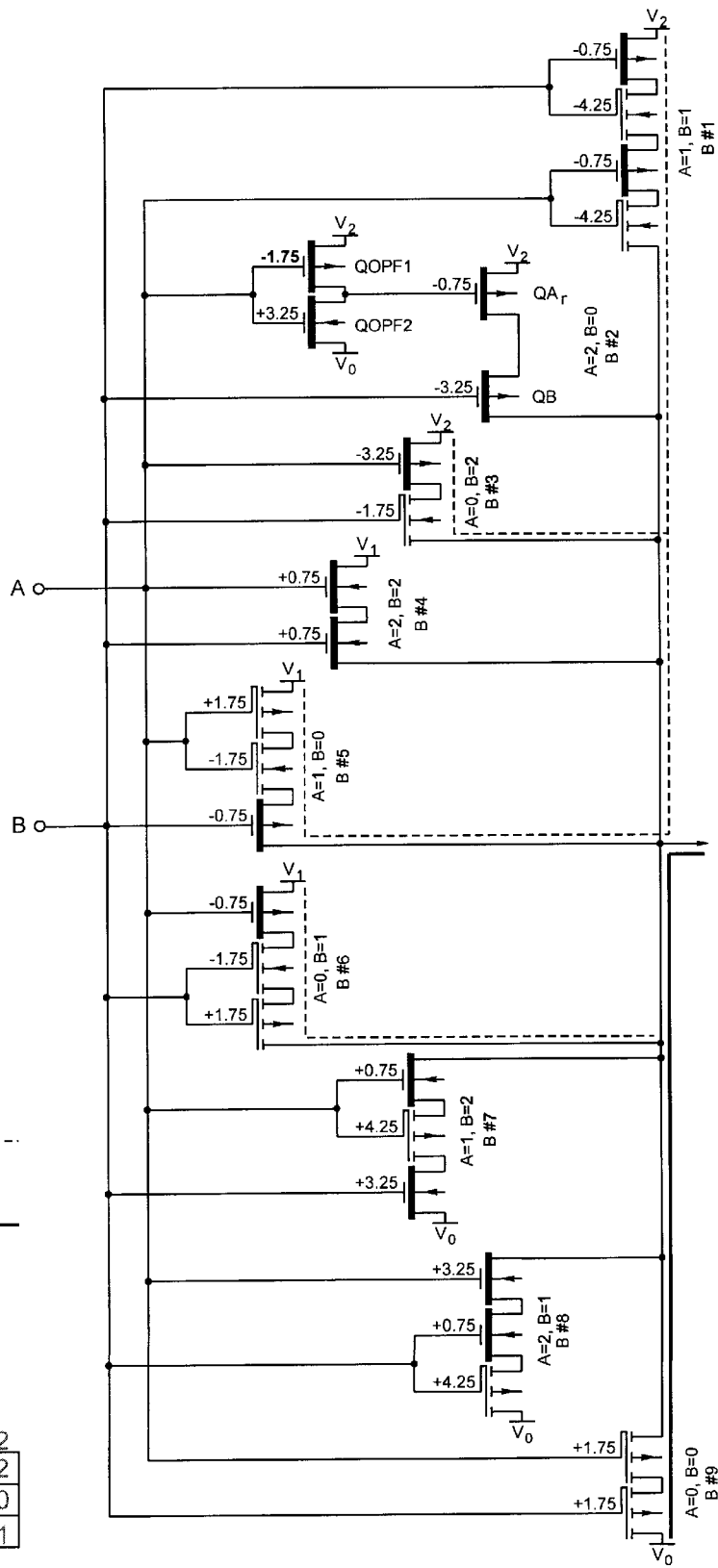

To show that the use of a replacement set is fuinctional, FIG. 153a shows the replacement of branch 2's QA in FIG. 136a with the replacement set for an N-channel depletion mode transistor having a threshold voltage of −1.75 and conducting V2, logic 2, 5 volts as shown in FIG. 146 and listed in table T.

Using the same input conditions as the above example, A=0, B=0, branch 9 is again selected and conducts $V_0$, logic 0, 0 volts to the output terminal. The drain of QB is connected to the output terminal and conducts because the replacement QA ($QA_R$) acts as an extremely large resistor and the gate voltage of QB is below its threshold voltage. With QB on, the output voltage ($V_0$) is placed on the drain of the replacement QA. However, unlike the source/drain exchange example above, there is not an aberrant path through branch 2.

Input A transmits a voltage is $V_0$, logic 0, 0 volts to the gates of QOPF1 and QOPF2. The $V_0$ input exceeds the threshold voltage of QOPF1 and QOPF1 conducts $V_2$ to the gate of the replacement QA. QA is held OFF and does not conduct as the $V_2$ input to $QA_R$ is neither 0.75 volts below $V_2$ (present on one electrode of replacement QA) nor 0.75 volts below $V_0$ (present on the other electrode of $QA_R$). As $QA_R$ is a P-type FET, the $V_2$ source as highest voltage controls as source to FET QA. With QA OFF there is not an aberrant path through branch 2.

Figure 154A:
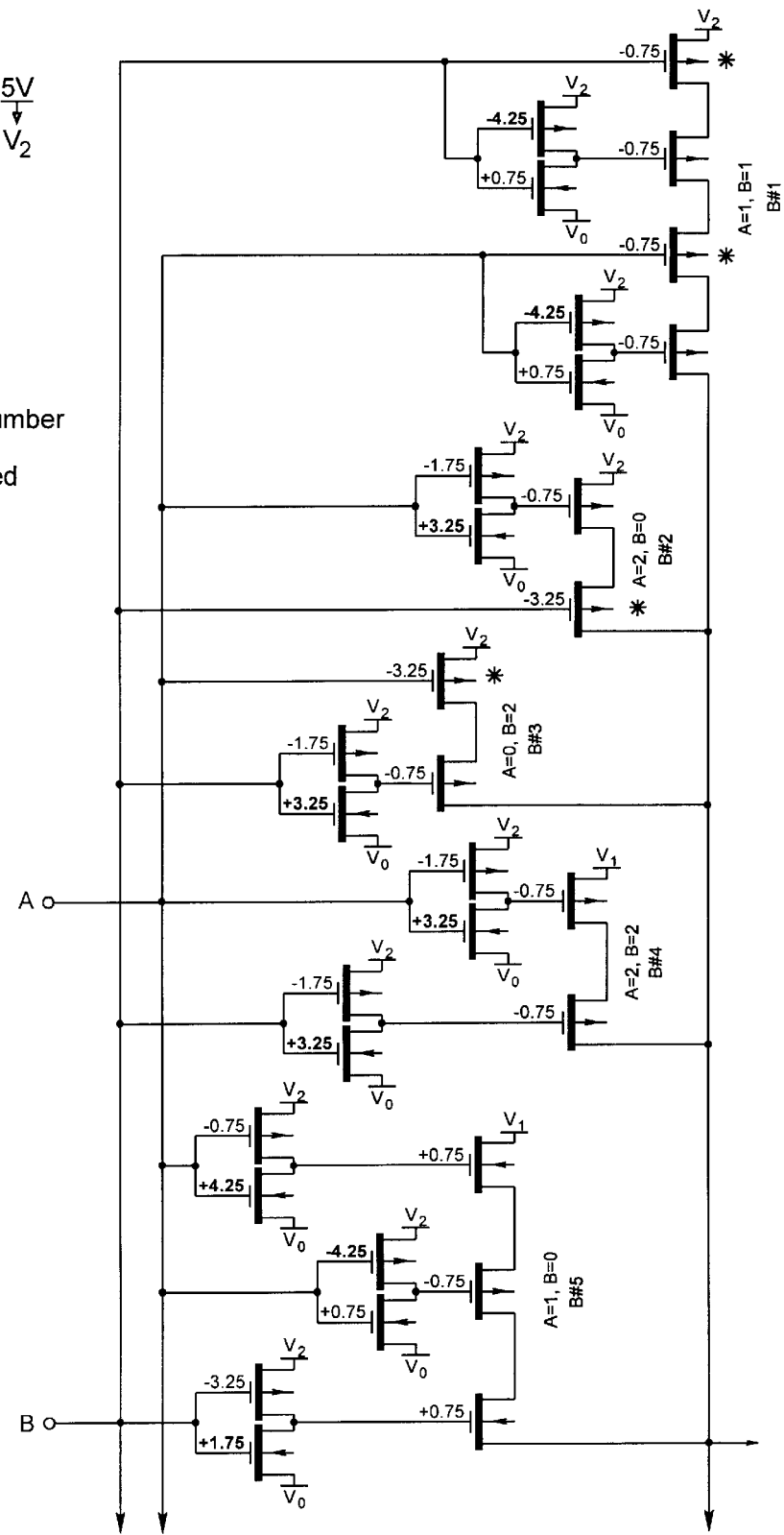
Figure 154B:
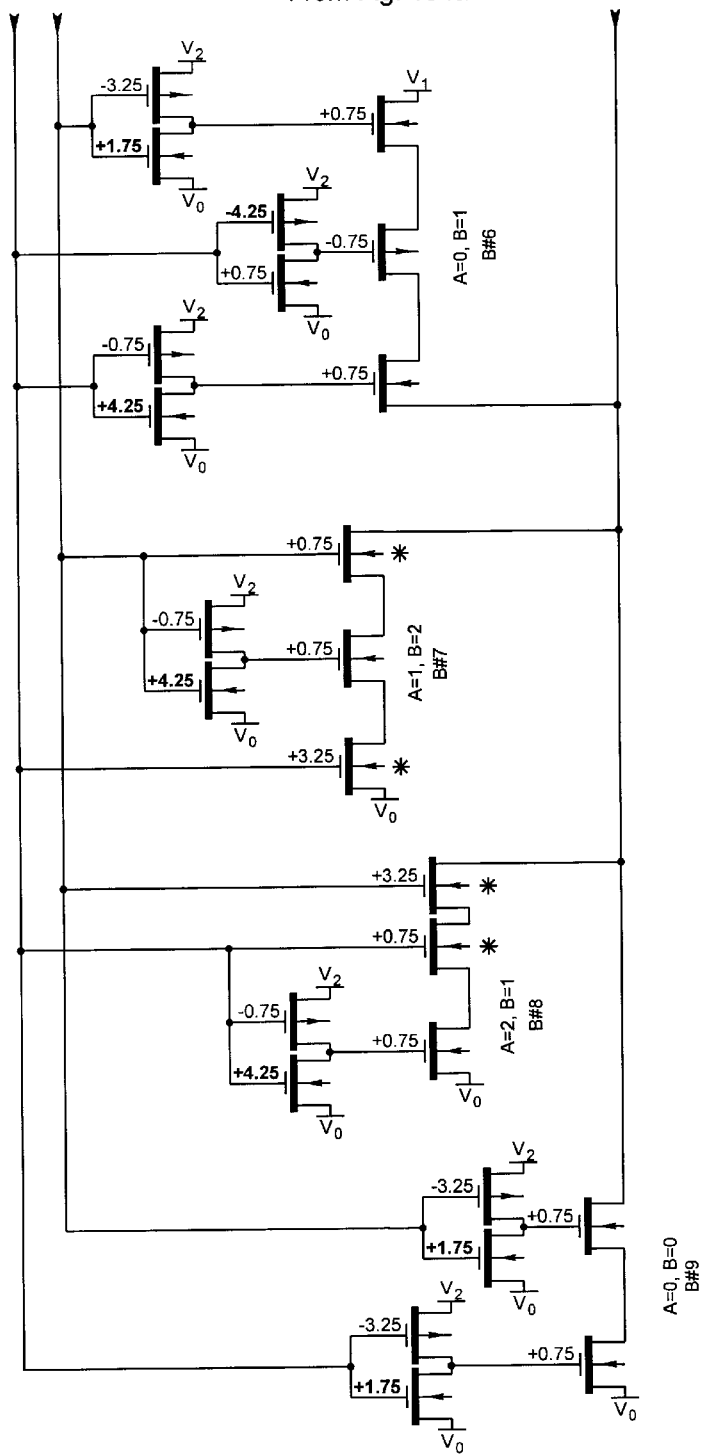
Figure 155A:
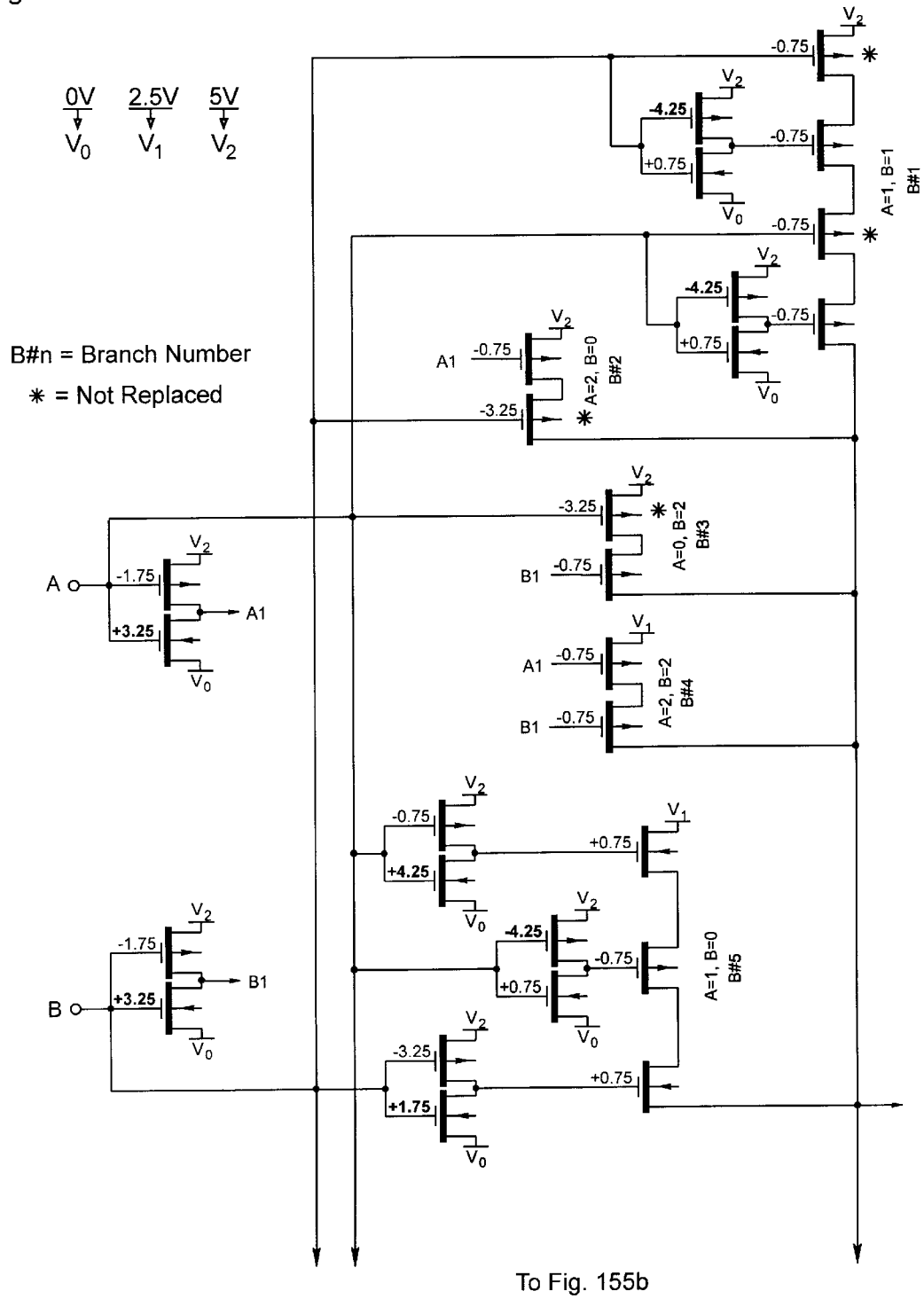
Figure 155B:
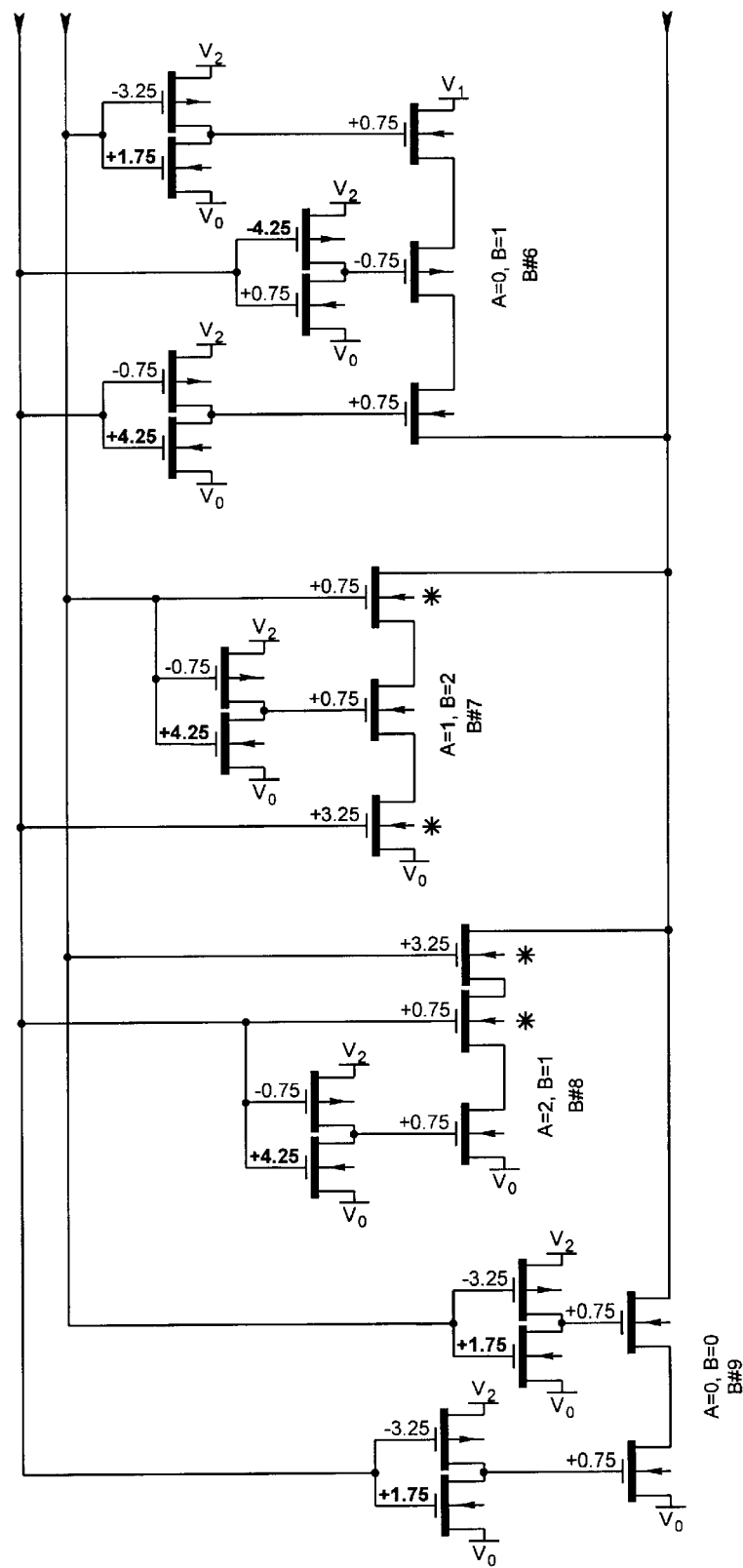

Replacing each transistor that experiences source/drain exchange (causing a branch to become an aberrant path under certain input to output conditions) with its corresponding replacement set (indicated in table T and shown in FIGS. 145 through 152) ensures that aberrant paths do not occur. FIGS. 154a and 154b show the two input ternary Sigma gate with all of the transistors that experience source/drain exchange replaced with the corresponding replacement set. The result is a functional 56 transistor two input ternary Sigma gate without aberrant paths. Consequently, a multiple-valued logic Sigma circuit provides means by which ternary addition may be achieved.

Because a reduction in the number of components is always desired, the ternary Sigma is examined for common elements that can be combined to reduce component count for increased manufacturing and circuit response efficiencies.

The first noticeable common elements are the OPFs of the replacement sets such as the OPF used in branch 2, that is the same as one used in branch 4, and one used in branch 3 is the same as the other one used in branch 4. The threshold voltages are the same. There are then two identical OPFs for the A input and there are two identical OPFs for the B input. Because the output of the input A OPF in branch 2 is the same as the output of the input A OPF in branch 4 only one OPF is required to drive the conducting transistors of both branches, and the same hold s true for the i nput B OPFs. This commonality of OPFs can be seen in s everal of the branches.

By using only one of the common OPFs per input term and connec ting its output to the appropriate transistors driven by the common OPF, fewer OPFs are required. The common OPFs for the input A and input B OPFs of branches 2, 3 and 4 are show n in FIGS. 155a and 155b.

Figure 156A:
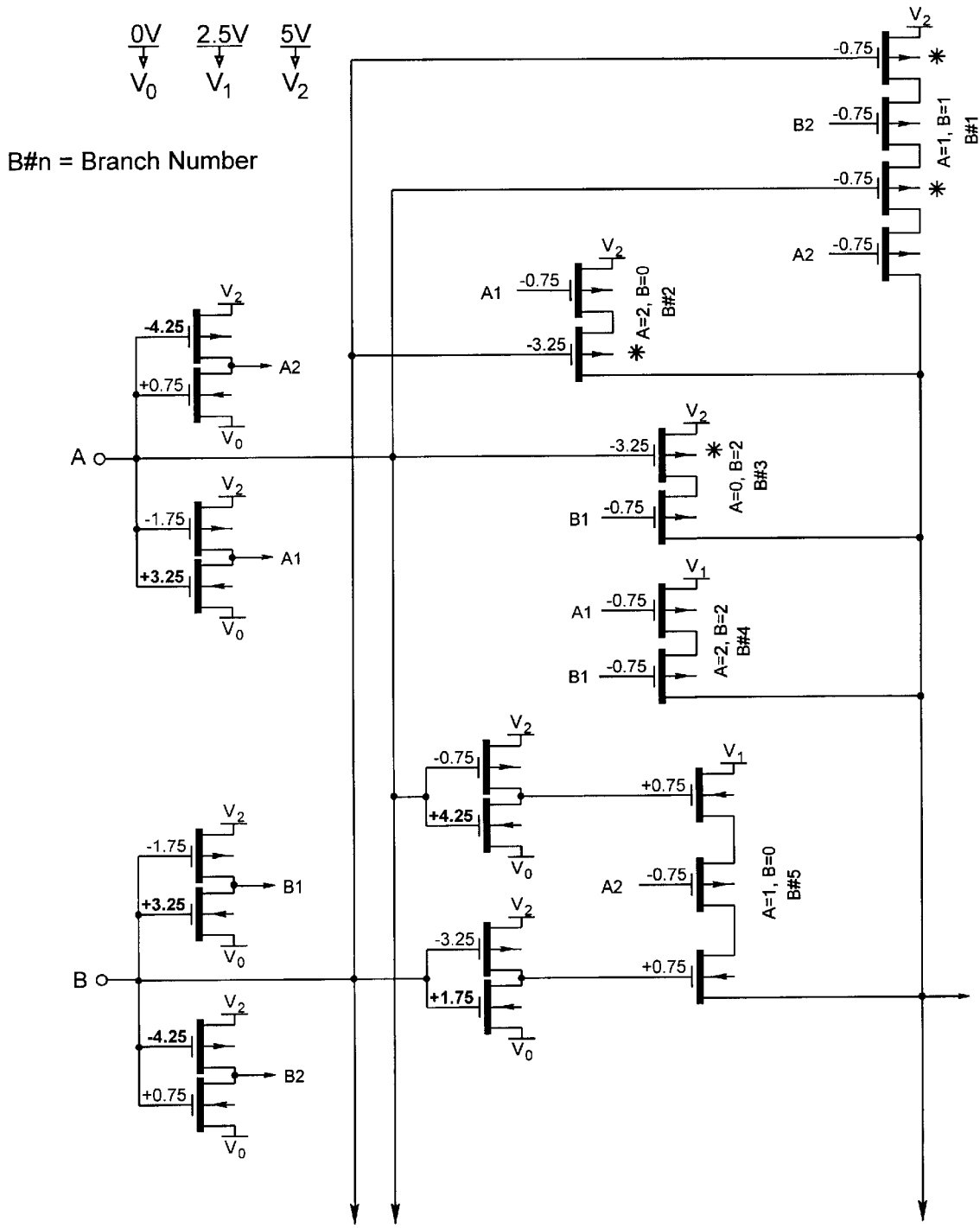
Figure 156B:
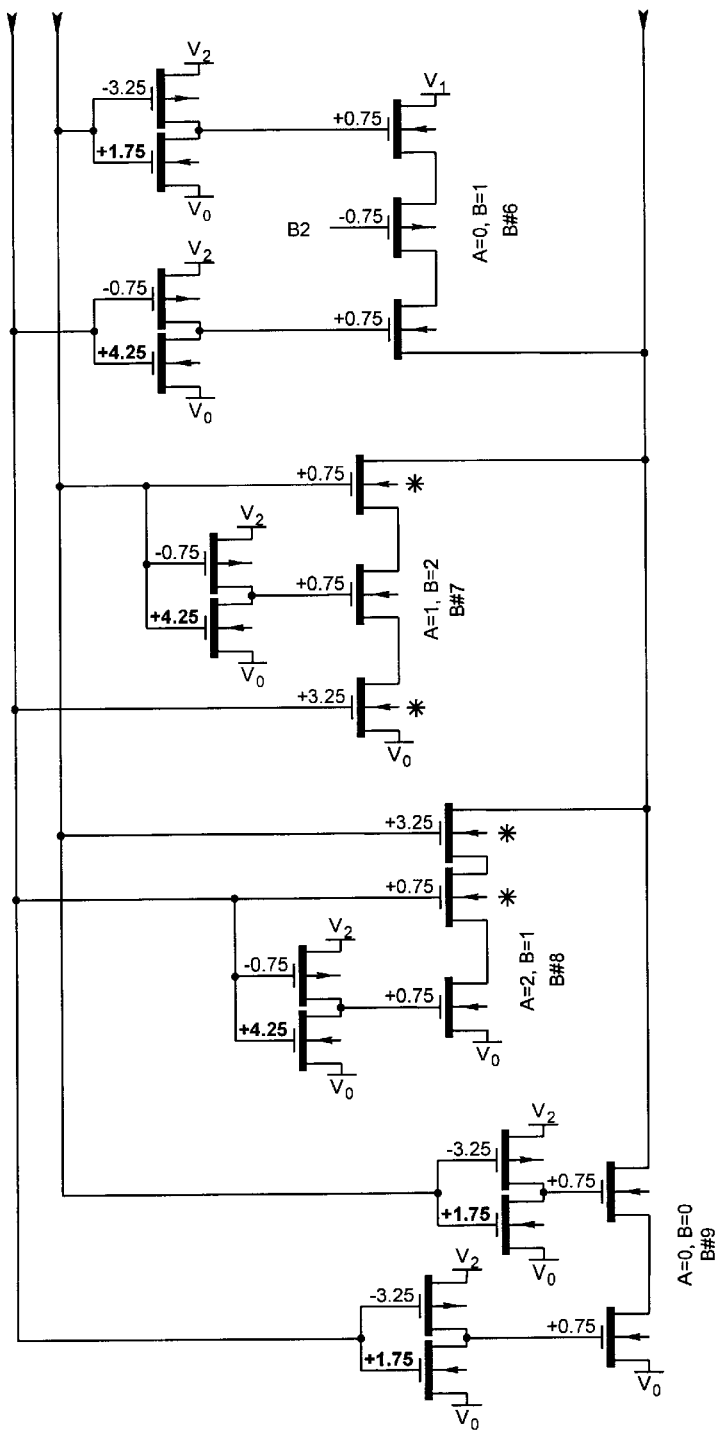

Shown in FIGS. 156a and 156b is the Sigma gate after the common OPFs of branches 1, 5 and 6 are combined.

Figure 157A:
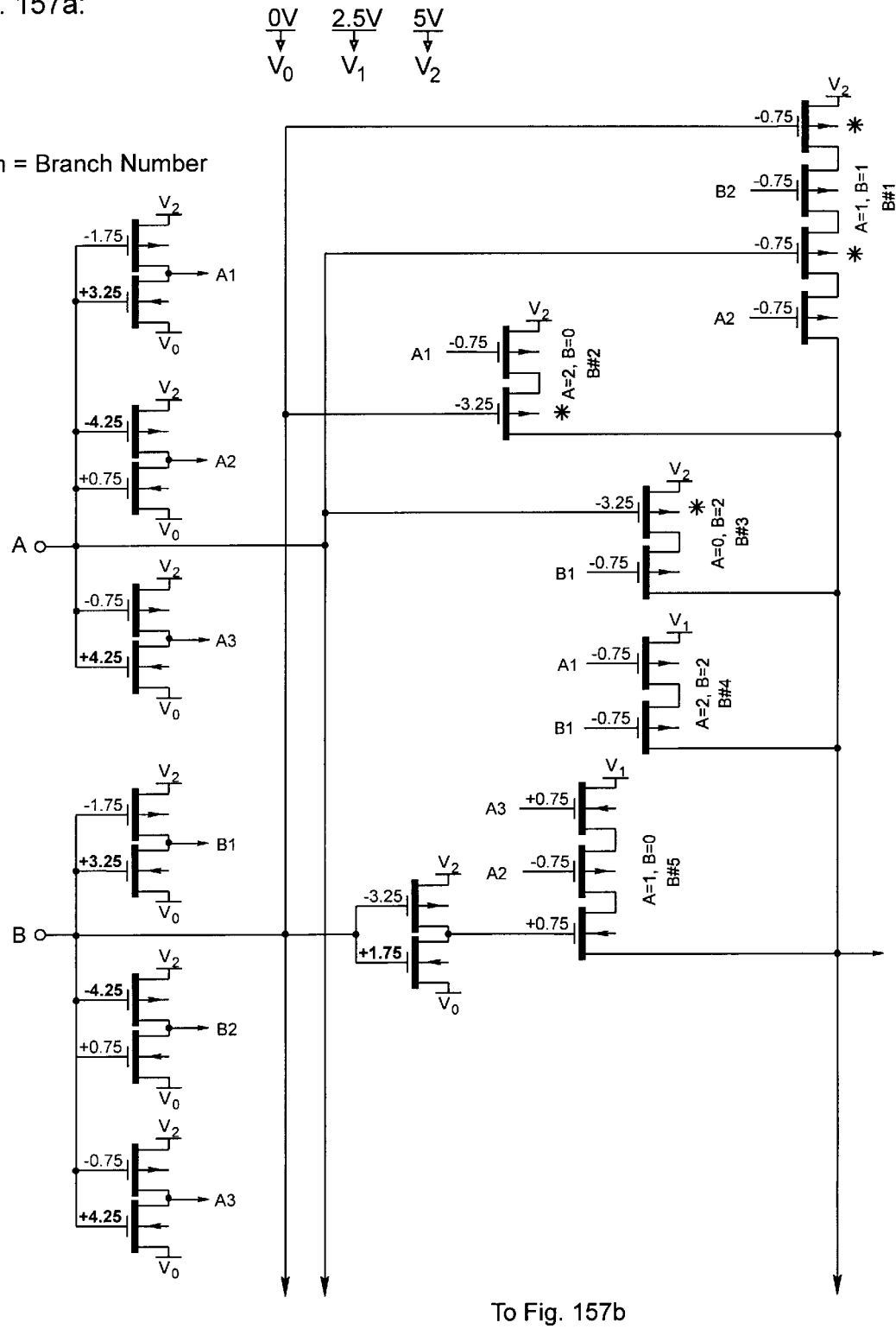
Figure 157B:
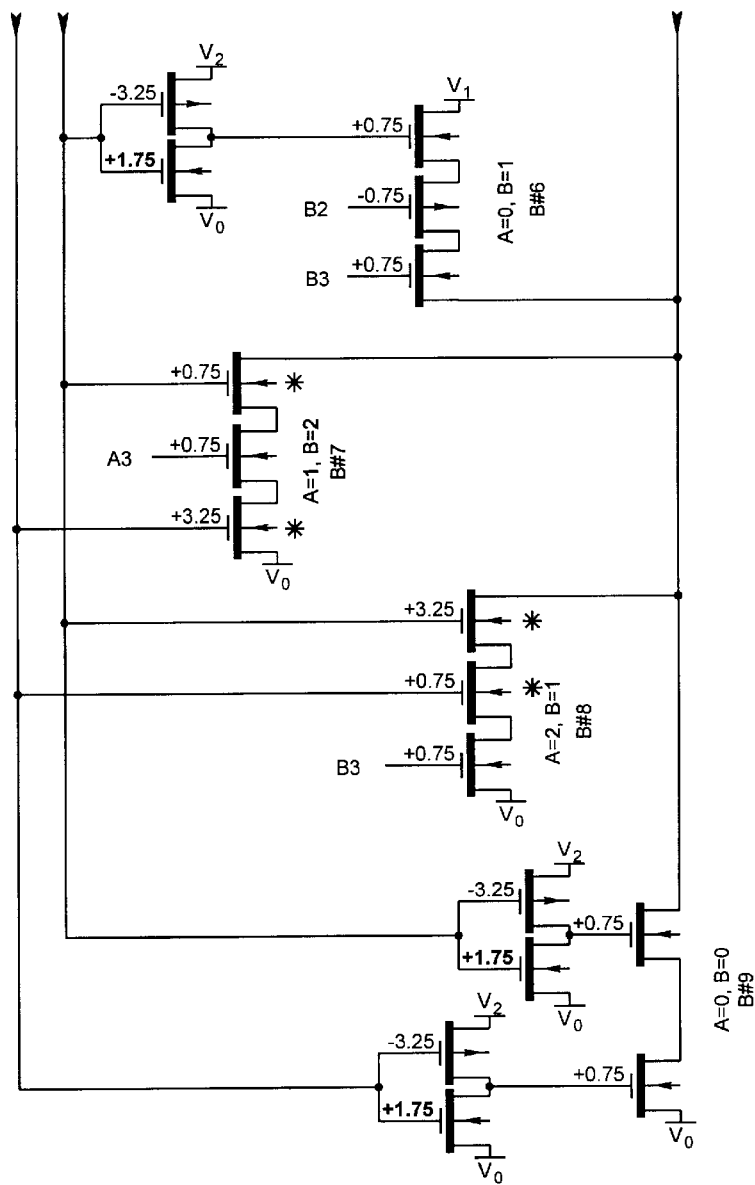

FIGS. 157a and 157b show the Sigma gate after the common OPFs of branches 5, 6, 7 and 8 are combined. And FIG. 158 shows the Sigma gate after the common OPFs of branches 5, 6, and 9 are combined.

Figure 158:
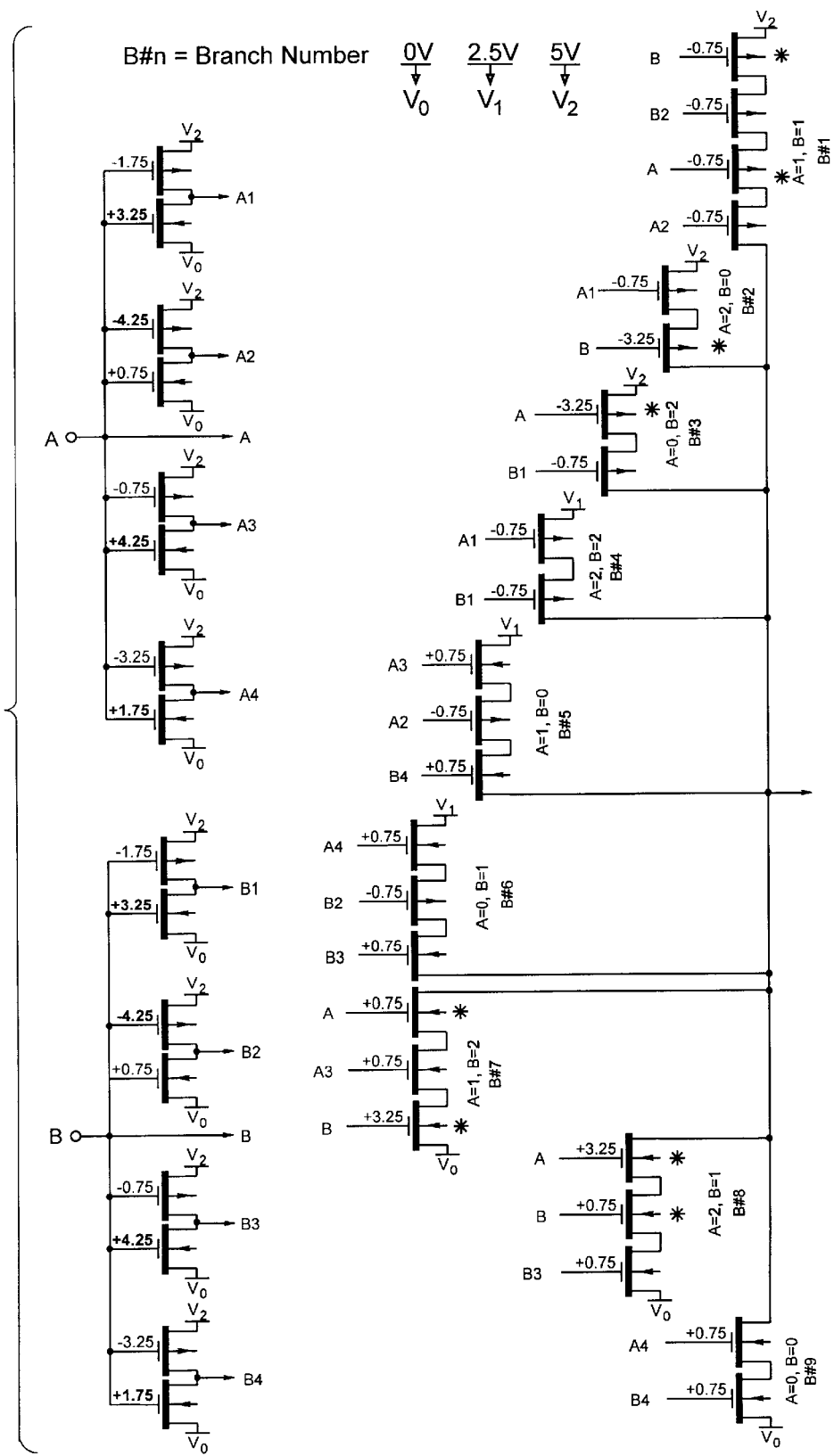

Upon examination of the circuit shown in FIG. 158, one can see that there is a symmetry to the threshold voltages of the common OPFs that are driven by the A or B input. The threshold voltages that produce the A1 and A4 signals are apparently reciprocals of each other as are the threshold voltages that produce the A2 and A3 signals. This same pattern is also seen in the threshold voltages of the common OPFs of the B input. Because of this apparent symmetry, a table showing the A (B) input values of logic 0 . . . r−1 and the output value of each of the four OPFs for each input value is made to assist in finding any pattern that might be present. This table is shown as table U.

TABLE U

| INPUT A (B) | OUTPUT A1 (B1) | OUTPUT A2 (B2) | OUTPUT A3 (B3) | OUTPUT A4 (B4) |
|---|---|---|---|---|
| 0 | 2 | 2 | 2 | 2 |
| 1 | 2 | 0 | 2 | 0 |
| 2 | 0 | 0 | 0 | 0 |

An examination of the four OPF output sequences indicates that the A1 (B1) and the A3 (B3) output sequences are the same, and the A2 (B2) and A4 (B4) output sequences are also the same. The A1 (B1) and A3 (B3) output sequences are 2 2 0 for the input sequence of 0 1 2 and this matches the output sequence of the ternary one place function F220$_3$. The A2 (B2) and A4 (B4) output sequences are 2 0 0 for the input sequence of 0 1 2 and this matches the output sequence of the ternary one place function F200$_3$.

Figure 159:
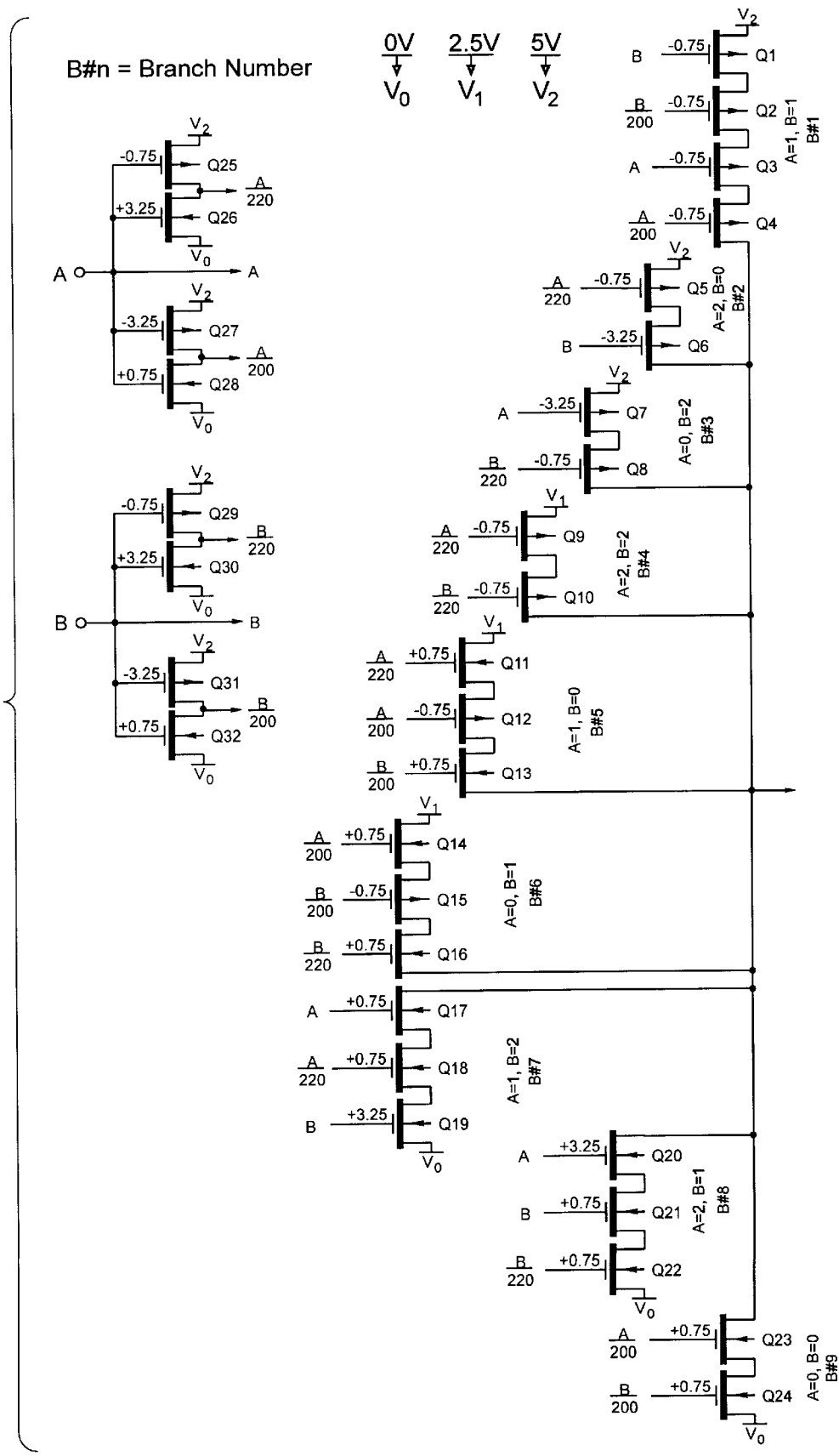

Because the A1 (B1) and A3 (B3) output sequences match the output sequence of F220$_3$ the OPFs that produce the A1 (B1) and A3 (B3) signals can be replaced with a single F220$_3$ to produce A/220 and B/220 signals which are connected to all transistors labeled A1, (B1) and A3 (B3) in FIG. 158. Similarly, the two OPFs that produce the A2 (B2) and A4 (B4) signals can be replaced with a single F200$_3$ to produce A/200 and B/200 signals which are connected to all transistors labeled A2 (B2) and A4 (B4) in FIG. 158. FIG. 159 shows the Sigma circuit with the A1 (B1) and A3 (B3) as well as the A2 (B2) and A4 (B4) OPFs replaced with F220$_3$ and F200$_3$ OPFs, respectively, and the transistors are now numbered. Consequently, each input needs at most only two OPFs: an F200 and an F220. There are 32 FETs in the SIGMA circuit of FIG. 159, all of which are enhancement mode.

In constructing the SIGMA circuit, some additional optimization may be possible, including: rearrangements that will allow the FETs of the output drivers to be used as replacements for the OPFs; a means of reduction such as changing a few threshold voltages to eliminate one or both of the OPFs for the A and B inputs; a way to replace the OPFs with base-1 complementers or another OPF with a lower dynamic power consumption, or simply reduce the dynamic power requirement and component count of the circuit.

Figure 160:
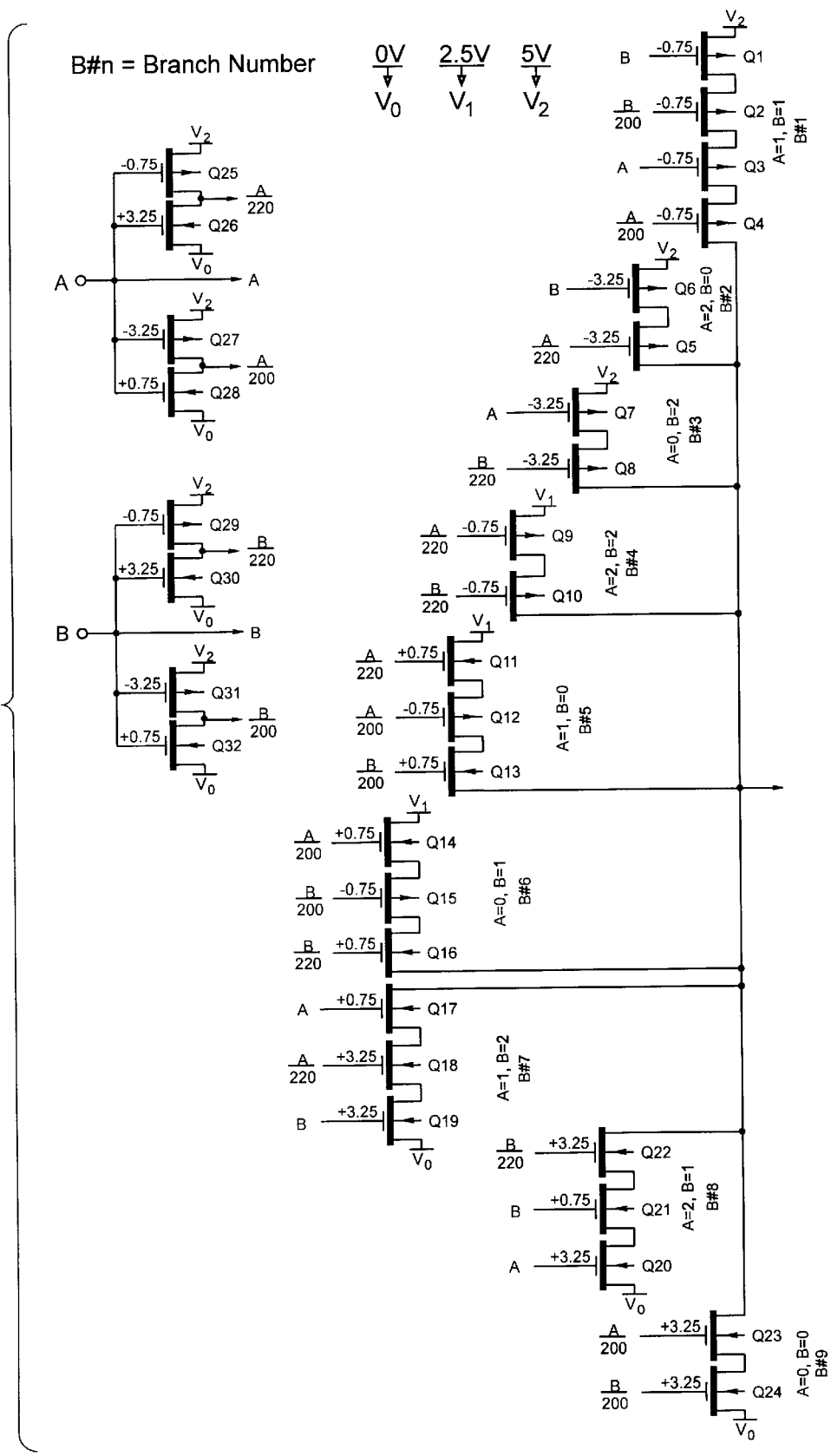

Transistors Q23 and Q24 of branch 9 only turn on when both the A and B input logic levels are 0 and the output logic level of the OPFs driving their gates is a lobic 2. Therefore, the threshold voltages of these two transistors can be increased to +3.25 volts to reduce the dynamic power requirement when branch 9 turns ON or OFF. Similarly, Q5 of to branch 2 (being driven by the A/220 signal) and Q8 of branch 3 (driven by the B/220 signal), only turn on when the A/220 or B/220 signal is logic level 0. Therefore, the magnitude of the threshold voltages of Q5 and Q7 can also be increased to −3.25 volts, also reducing the dynamic power requirement when branch 2 or 3 turns ON or OFF. This same situation is seen with Q18 and Q22 of branches 7 and 8, these threshold voltages can also be increased to +3.25 volts (FIG. 160).

Transistors Q6 and Q7 of branches 2 and 3 are driven directly by the inputs B and A, respectively, and only turn on when the associated input is logic level 0 to conduct V$_2$. The output of the OPFs that produce the A/200 and B/200 signals are logic level 2 or V$_2$ only when the input logic levels are 0 and can be used in the stead of these branch transistors to provide V$_2$ to the other transistor of the branch. To do this, Q5 and Q6 of branch 2 need to be rearranged such that the transistor driven directly by the B input is the first in the series of transistors from V$_2$ just as Q7 of branch 3 is directly driven by the A input and is first in the series of transistors from V$_2$ (FIG. 161).

Similar to the transistors of branches 2 and 3 that are directly driven by the inputs A and B, Q19 and Q20 of branches 7 and 8 are directly driven by the inputs A and B. Q19 and Q20 each have a threshold of +3.25 and turn on only when the inputs are a logic level 2 and conduct V$_0$. Because the output of the OPFs that produce the A/220 and B/220 signals are logic level 0 or V$_0$ only when the input logic levels are 2, these outputs can be used in the stead of Q19 and Q20 to provide V$_0$ to the other transistors in the branches. Branch 8 requires rearrangement such that Q20 is first in the series from V$_0$ as Q19 is in branch 8. These are also shown in FIG. 161.

Figure 161:
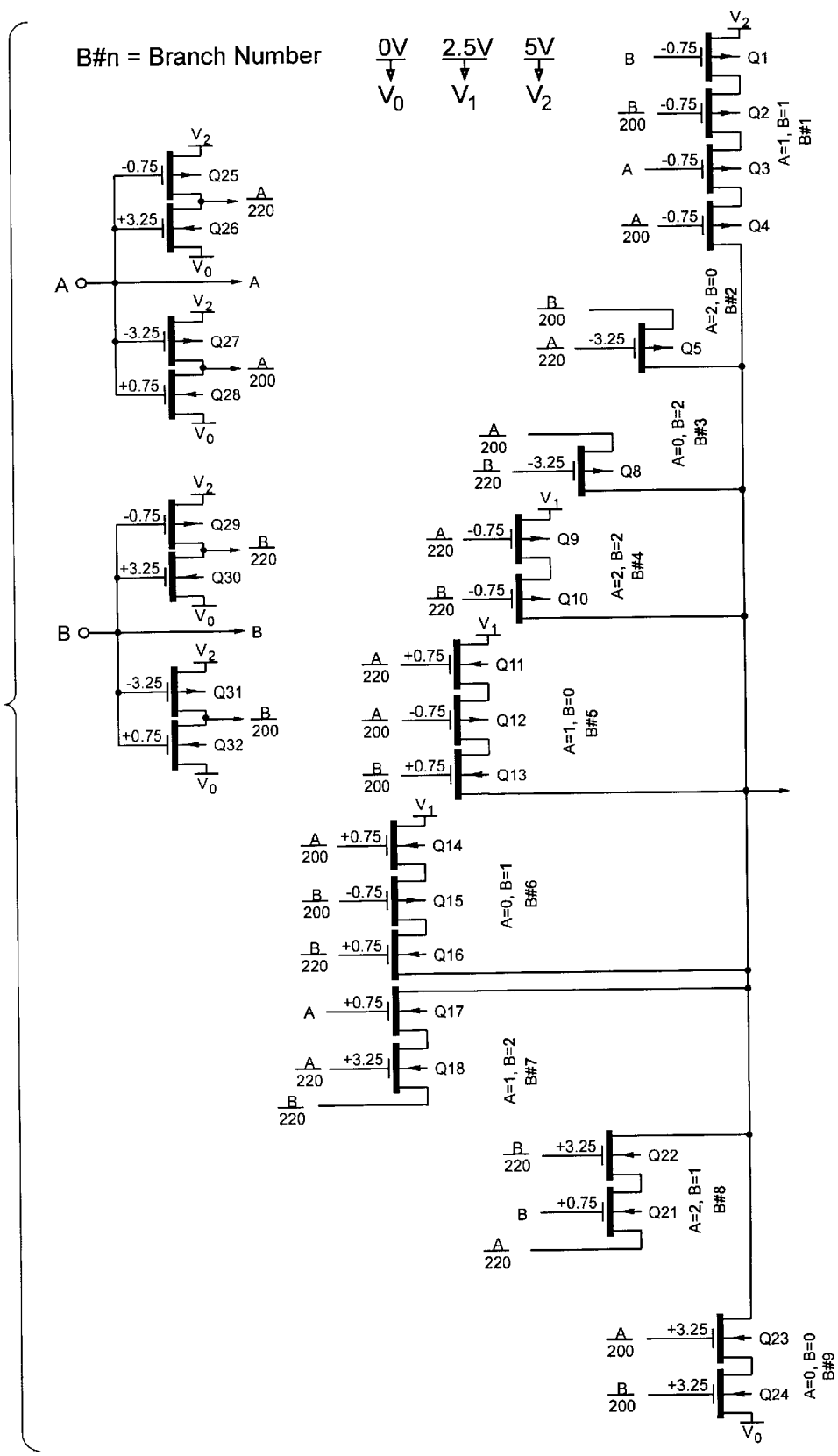

Because the output of the entire circuit is connected to the gates of the transistors that drive the output, the possibility of unwanted oscillation and noise susceptibility is increased in the circuit shown in FIG. 161. Also, when the output of an OPF is used in the stead of the branch transistors, then the size of the OPF transistor is larger to supply greater output.

Other Circuits

Additional logic function circuits may be achieved via SUS-LOC. An equality generator, (EQ$_r$), produces an output other than zero when the logic levels presented to its input terminals are equal and greater than zero. The schematic, symbol, and Karnaugh graph, of a two place ternary EQ, are shown in FIGS. 162 through 164.

A two place EQ$_3$ has two base-1 complementers with the addition of two composite branches and a post-conditioning base-1 complementer, or simply a CEQ$_3$ shown as FIG. 10 with its output base-1 complemented. One of the composite branches is comprised of Q9 and Q11, with Q14 and Q16 forming the other composite branch. These two additional branches generate the appropriate output logic levels of zero when one input is presented with a logic level r−1 and the other input is presented with a logic level that is less than r−1. In the case of a ternary two place EQ, this amounts to inputs of A=2 and B=1, and vice versa. If an input is logic level 0, then Q1 and/or Q2 will conduct in parallel with one of the two additional composite branches.

Expansion of the EQ$_3$ is accomplished by one of two methods with mutually exclusive advantages. The first method is shown in FIG. 162 with phantom components. The second method is discussed and shown in the combinational logic description, below.

The Lambda nn series of MPFs produce a bi-level output. Each Lambda nn gate produces a bi-level output that is one of several possible combinations of two logic levels when the radix is greater than two. The basic symbol and explanation of the numbering method for a Lambda nn is shown in FIG. 165.

Of primary concern is the Lambda 01, the schematic, symbol, and Karnaugh graph of which are shown in FIGS. 166 through 168 As indicated by the Karnaugh graph, FIG. 168, the Lambda 01 produces an output logic level of one when all inputs are presented with logic level zero, else the output logic level is zero.

The following functions are ones that are not specially named, but serve useful purposes in manipulating multiple-valued function logic.

Function #15,309$_3$. This MPF is nameless in that it does not correspond to a know binary function. It is shown in FIGS. 169 through 171 This gate is useful as a data control gate and its use is shown and discussed in the combinational logic description, below. The output of a #15,309$_3$ gate is the base-1 complement of the A input while the B input is a logic zero. When the B input is a logic one or two, the output is a logic zero. This is shown in the Karnaugh graph of FIG. 171.

Function #19,542$_3$. This MPF is currently nameless and is shown in FIGS. 172 through 174. This gate is useful as a data control gate. The output of a #19,542$_3$ gate is the base-1 complement of the A input while the B input is greater than zero. When the B input is zero, the output is a logic two. This is shown in the Karnaugh graph of FIG. 174.

Function #140$_3$. The addition of a base-1 complementer to the output of a #19,542 forms a #140$_3$ gate. The #140$_3$ gate is shown in FIGS. 175 through 177. It is described in more detail in the description of latches and registers, below. The output of a #140$_3$ gate is the identity of the A input while the B input is greater than zero. When the B input is zero, the output is a logic zero. This is shown in the Karnaugh graph of FIG. 177.

Function #19,677$_3$. This MPF is shown in FIGS. 178 through 180. This gate is also useful as a data control gate. See the combinational logic description, below. The output of a #19,677$_3$ gate is the base-1 complement of the A input while the B input is a logic two. When the B input is a logic zero or one, the output is a logic two. This is shown in the Karnaugh graph of FIG. 180.

Combinational Logic

The following description focuses primarily on functions of the ternary logical system, with a few pentanary (radix 5) and binary references. In addition, most of the circuits and discussions presented are in a form understood by those ordinarily skilled with CMOS or other circuit structures used to synthesize binary logic. Consequently, future enhancements are possible and foreseeable.

The term "combinational logic" indicates the use of selected OFF and/or MPF logic functions as required to achieve a desired output that is based upon the logical state of the input(s) (excluding the use of a memory element). Generally, the logic functions are of the same radix. As before, mixed radix circuitry is possible, but more elaborate. More than one logic function, output, and/or input logic state may be desired and achieved through combinational logic.

Most of the common blocks of logic used in digital systems use combinational logic circuits that form a "1 of n selector". Among these common logic circuits are multiplexers, demultiplexers, and address decoders. Other combinational logic circuits include input or output conditioners such as those used to decode a quadrature input. Additionally, r+1 state output drivers (due to the dominance of binary logic, these are currently referred to as tri-state drivers) are considered to be combinational logic circuits. Also, combinational logic circuits are required for more complex logic functions which include sequential and clocked sequential logic (including memory elements). Use of a memory element is defined as either "sequential" or "clocked sequential" logic.

Several combinational circuits use logic functions shown in the one place and multiple place function descriptions, above. The combinational circuits described herein should not be construed as the only possible combinations. With the ability to design and fabricate any logic function of any radix, billions of combinational logic circuits are possible.

SUS-LOC allows the creation of circuits that act as selectors of 1 of n outputs. The 1 of n selector is probably the most used combinational logic circuit because it is an integral part of multiplexers, demultiplexers, static and dynamic memories, and it is found in the "instruction decoder/sequencer" section of a CPU. The 1 of n selector, being a virtual ubiquity, is set forth herein.

A 1 of n selector that selects 1 of more than r possibilities has one MPF per output and enough OPFs to produce the r possible logic levels per place of the address input. Binary implementations use two inverters per input place. The first serves as both an input buffer and a "next state generator" for an input. The second inverter, driven by the first, serves as a "next state generator" for the input buffer. This scheme buffers the input to reduce the circuit's loading effects and produces both logical states of the binary input.

The analogous circuit for a radix greater than two can follow the same scheme. An r-valued one-place function serves as an input buffer and r-valued "next state generators" or "previous state generators" produce the r possible logic levels per place of the address input. In the binary logic system, the base-1 complement, the next state, and the previous state are the same, (i.e., the 1's complement of a logic 1 is logic 0, the next state of a logic 1 is logic 0; and the previous state of a logic 1 is logic 0).

A three place binary 1 of 8 selector is shown in FIG. 181, and a two place ternary address decoder, or 1 of 9 selector using the same scheme, is shown in FIG. 182. The truth tables for the circuits of FIGS. 181 and 182 are shown in tables V and W, respectively.

TABLE V

| INPUTS | | | OUTPUT (selected when logic 1) | | | | | | | |
|---|---|---|---|---|---|---|---|---|---|---|
| $B^0$ | $B^1$ | $B^2$ | Y0 | Y1 | Y2 | Y3 | Y4 | Y5 | Y6 | Y7 |
| 0 | 0 | 0 | 1 | 0 | 0 | 0 | 0 | 0 | 0 | 0 |
| 1 | 0 | 0 | 0 | 1 | 0 | 0 | 0 | 0 | 0 | 0 |
| 0 | 1 | 0 | 0 | 0 | 1 | 0 | 0 | 0 | 0 | 0 |
| 1 | 1 | 0 | 0 | 0 | 0 | 1 | 0 | 0 | 0 | 0 |
| 0 | 0 | 1 | 0 | 0 | 0 | 0 | 1 | 0 | 0 | 0 |
| 1 | 0 | 1 | 0 | 0 | 0 | 0 | 0 | 1 | 0 | 0 |
| 0 | 1 | 1 | 0 | 0 | 0 | 0 | 0 | 0 | 1 | 0 |
| 1 | 1 | 1 | 0 | 0 | 0 | 0 | 0 | 0 | 0 | 1 |

TABLE W

| INPUTS | | | OUTPUT (selected when logic 0) | | | | | | | |
|---|---|---|---|---|---|---|---|---|---|---|
| $T^0$ | $T^1$ | Y0 | Y1 | Y2 | Y3 | Y4 | Y5 | Y6 | Y7 | Y8 |
| 0 | 0 | 0 | 2 | 1 | 2 | 2 | 2 | 1 | 2 | 1 |
| 1 | 0 | 1 | 0 | 2 | 2 | 2 | 2 | 1 | 1 | 2 |
| 2 | 0 | 2 | 1 | 0 | 2 | 2 | 2 | 2 | 1 | 1 |
| 0 | 1 | 1 | 2 | 1 | 0 | 2 | 1 | 2 | 2 | 2 |
| 1 | 1 | 1 | 1 | 2 | 1 | 0 | 2 | 2 | 2 | 2 |
| 2 | 1 | 2 | 1 | 1 | 2 | 1 | 0 | 2 | 2 | 2 |
| 0 | 2 | 2 | 2 | 2 | 1 | 1 | 1 | 0 | 2 | 1 |
| 1 | 2 | 2 | 2 | 2 | 1 | 1 | 2 | 1 | 0 | 2 |
| 2 | 2 | 2 | 2 | 2 | 2 | 1 | 1 | 2 | 1 | 0 |

To reduce the number of components required for the ternary 1 of 9 selector, the GOR$_3$ gates can be replaced with Lambda 01 gates. However, logic levels 0 and 1 must be the only required output logic levels. The output of a Lambda 01 is logic 1 to indicate selected and logic 0 to indicate non-selected. If Lambda 01 gates are used, the reduction in transistor count for the MPFs is 50%.

SUS-LOC also provides circuits having exclusive of equality functions. A logical function that produces an output logic level of zero when all of its inputs are presented with the same logic level and a logic level other than zero when its inputs are unequal, is an "Exclusive of Equality" function. Every logical system of radix r contains analogous functions to the binary "Exclusive OR" gate (XOR).

Additionally, exclusive of equality "generalized OR" circuits are available through SUS-LOC. When the radix is greater than two, the analogous function of a binary XOR is the "Exclusive of Equality Generalized OR" (XGORr). Also, an XGOR$_r$'s reciprocal function "Exclusive of Equality Generalized AND" (XGAND$_r$) and several other functions that are exclusive of equality, are possible when the radix is greater than two. The XGOR$_3$ Karnaugh graph is shown in table X. FIGS. 183 and 184 show the binary Exclusive OR gate schematic and Karnaugh graph, respectively.

TABLE X

|   |   | A |   |   |
|---|---|---|---|---|
|   |   | 0 | 1 | 2 |
|   | 0 | 0 | 1 | 2 |
| B | 1 | 1 | 0 | 2 |
|   | 2 | 2 | 2 | 0 |

An XGOR$_3$, assembled with a combinational architecture similar to the binary Exclusive OR, is shown in FIG. 185. Other than the radix, the primary difference between the two circuits is the use of EQ$_3$ and F200$_3$ circuits in the stead of a GAND$_3$ and a base-1 complementer (F210$_3$). This is because the function is to be "Exclusive of Equality" and so has different response characteristics. FIGS. 186 and 187 show the symbol and Karnaugh graph of the XGOR$_3$, respectively.

High impedance output state (r+1 state) circuits are also available via SUS-LOC. A circuit that presents an output terminal with one of r different logic levels when enabled and a high impedance state when disabled is an r+1 state driver. The current name for such binary devices is "tri-state". Two other methods of achieving a high impedance state are known as "open collector" and "open drain," each of which require an external load resistor. However, when the radix is greater than two, it is suggested that the driver be fully active as the use of external resistive elements for one of r different logic levels adds to the output load.

Following the same scheme as a tri-state driver, implementation of an r+1 state driver requires two OPFs of radix r, a GOR$_r$, and a GAND$_r$ for the "data and enabled/disabled" logic and any single stage (or final stage of a two stage) OPF of radix r as the output driver. The gates of the transistors that form the OPF selected for the output driver are connected to the outputs of the GOR$_r$ and GAND$_r$. The connections are such that the output logic levels from the GOR$_r$ and GAND$_r$ turn OFF all of the FETs of the output driver when disabled. If a two stage OPF is used as the output driver, only the second stage is driven by the MPFs. The first stage is placed in the data path to the inputs of the MPFs.

In this patent, the method of labeling a signal is as follows. The method is to sub-script the signal name, such as "Enable", with the numeral of the active logic level. If the "Enable" is active when the signal is logic level 1, then the signal is labeled "Enable$_1$". This method is adopted as those used with binary logic (such as Enable, $\overline{\text{Enable}}$, or Enable*) are not sufficient when more than two logic levels are available. Also, when the radix is greater than two, a single input can be used to control, or select from, multiple functions such as a ternary signal labeled "Read$_2$-Stand By$_1$-Write$_0$".

Examples of ternary r+1 state driver circuits realized by SUS-LOC include the quad-state buffer and the quad-state base-1 complementer. The ternary r+1 state buffer and base-1 complementer versions are shown in FIGS. 188 and 189, respectively. The truth table of a quad-state buffer with an output enable level of zero is shown in table Y.

TABLE Y

| EN | DATA | OUTPUT |
|---|---|---|
| >0 | X | High Impedance |
| 0 | 0 | Logic 0 |
| 0 | 1 | Logic 1 |
| 0 | 2 | Logic 2 |

X can be any logic level

The symbol for an r+1 state driver is the symbol of the OPF selected as the output driver with an input near its output. It is labeled with the logic level that enables the output. The symbol for the ternary r+1 state buffer with an output enable level of zero consistent with Table Y is shown in FIG. 190.

The Enable level can be changed to any one of the r different logic levels, any group of contiguous logic levels, or a specific set of logic levels. The enable level change is achieved by changing the one place function labeled OEL in FIGS. 188 and 189 and is indicated symbolically by changing the logic level label that enables the output shown in FIG. 190 to the appropriate value or values.

The logic level(s) that can be used to enable the output of a quad-state driver implemented with the GOR$_r$, GAND$_r$ scheme shown in FIGS. 188 and 189, and the replacement OPF for those labeled OEL in FIGS. 188 and 189 are shown in table Z.

TABLE Z

| Enable Level(s) | OEL replacement |
|---|---|
| 0 | F022 |
| 1 | F202 |
| 2 | F220 |
| 0 & 1 | F002 |
| 0 & 2 | F020 |
| 1 & 2 | F200 |

As the radix increases, the number of possible discrete logic levels, group of contiguous logic levels, or specific set of logic levels that can be used to enable an r+1 state driver also increases. This becomes straightforward upon inspection of the pentanary hex-state base-1 complementer shown in FIG. 193.

Because of the increased possibilities of signal conflicts (including power surges), care should be taken to avoid two or more r+1 state drivers from driving the same load during logic level transitions. During logic level transitions, disparate source voltages (i.e., V$_2$ and V$_0$) may be available to one another causing a power surge in the circuit. Such transitions are considered to include a transition from logic level 0 to logic level r−1 as such a transition includes all of the intermediate logic levels.

While the preceding r+1 state drivers are functional, reducing the number of transistors required enhances their utility. One way to reduce the number of components used in the quad-state buffer is to replace the GOR$_3$ and GAND$_3$ gates with CGOR$_3$ and CGAND$_3$ gates to eliminate the base-1 complementers in the basic MPFs and the one in the data path. This reduces the transistor count 25%, from 36 to 24.

Better replacements for the GOR$_3$ and GAND$_3$ gates are the ternary MPFs #15,309 (FIGS. 169–171) and #19,677 (FIGS. 178–180) as shown in FIG. 191. The use of the #15,309 and #19,677 gates reduces the transistor count of the quad-state buffer 55%, from 36 to 16.

A preferred method of producing a fully active r+1 state output is to use one additional transistor per branch. Using this method results in the quad state base-1 complementer shown in FIG. 192 and reduces the transistor count of the quad state base-1 complementer 66% (from 24 to 8). (FIG. 189.)

The $EQ_3$ circuit of FIG. 162 may be expanded to provide more inputs. A combinational method of expanding the number of inputs to an $EQ_3$ uses the output of a three or more input $CGOR_3$ to drive one input of a $CEQ_3$. The output of a $CGAND_3$ having an equal number of inputs as the $CGOR_3$ drives the other input of the $CEQ_3$. This is shown in FIG. 194 with Karnaugh graphs to show the output logic level of each gate. This method can be used to expand the number of inputs to an EQ gate of any radix. For the ternary case, this requires 8 transistors per additional input term plus the basic two input gates.

Radix Conversion

Two methods of converting a digital value from one radix to another are set forth herein. These two methods are denominated "Radix Converting Read Only Memory" (RCROM) and "Duad" gate. Neither method has disallowed input states nor missing output code(s), problems associated with previous radix converters. Also, both methods can incorporate logic level voltage changing and are based upon the SUS-LOC structure, making them fully active, (i.e., neither method uses resistors nor resistive elements).

The RCROM performs radix conversion from any pre-determined source radix ($S_r$) to any destination radix ($D_r$). The time required for conversion is approximately four $S_r$ gate times. The Duad gate performs radix conversion from a $S_r$ to a $D_r$ that is either an even power or root of the $S_r$. Conversion via duad gate is accomplished in one $S_r$ gate time.

Other radix conversion techniques may be implemented with SUS-LOC. One alternative technique includes a folded multiplexer using bi-lateral switch outputs. A folded multiplexer is a known technique which has solved many mathematic, timing, and unusual counting sequence problems.

When two logic synthesizing circuits, or systems, of different radices are required to interchange data, conversion from a source radix ($S_r$) to a destination radix ($D_r$) becomes necessary. There are two approaches to converting a value from one radix to another: hardware and software (with firmware considered to be software).

The programmatic, or software, approach to conversion of two radices requires the computer with the greater radix to perform the conversion. This is due to the fact that, for example, a ternary (radix 3) computer can not produce or manipulate pentanary (radix 5) signals. However, a pentanary computer is capable of producing and manipulating ternary signals. The programmatic method of radix conversion, while useful and perhaps in some cases desired, requires several machine cycles to execute and does not ensure proper $D_r$ logic level voltages.

Previous hardware-implemented radix converters employed analog techniques dependent upon resistive elements such as voltage dividers and resister ladders. While these converters are functional within the specifications of their design, they have a comparatively high power requirement and do not address the problems of disallowed states, missing codes, and logic level voltage differences. Due to the high power requirement and the areas that are not addressed, these radix converters are not suitable for the multiple place conversions that are required by two different r-valued systems.

A block diagram of a radix converting read only memory (RCROM) is shown in FIG. 195 and is similar to known binary memories with the exception of the row drivers being differential driver/level changers. Level changing is only required when the $V_{r-1}$ voltages of the two radices involved are extremely different. For purposes of disclosure herein, binary and ternary $V_{r-1}$ voltages are both 5 volts.

The input section consists of two $S_r$ 1 of n selectors. The value to be converted from the $S_r$ to a $D_r$ is presented to, or impressed upon, the inputs of the RCROM, $S_r^0$ through $S_r^n$, as an address. This address is decoded, by the two 1 of n selectors to produce row (R#) and column (C#) select signals.

Each row select signal, R0 through Rn, is connected to the input of a differential driver/level changer. There are two reasons for the use of differential driver/level changers: to ensure proper voltage levels that drive the transistors of the memory array, and to maintain a fully active device, (i.e., pre-charge and/or pull-up/pull-down circuitry is not needed or used).

Each column select signal, C0 through Cn, is connected to a buffer driver/level changer which controls the column select pass transistors (near-zero threshold FETs).

The memory array consists of one FET per row-column intersection. When a row is selected, all of the transistors connected to that row turn on, connecting column lines associated with the FETs to the power supply voltage representing the $D_r$ logic level for that particular row and column combination. When a column is selected, all of the pass transistors connected to that column turn on, connecting the $D_r$ logic level of that column line to an output terminal.

FIG. 196 shows a four bit binary address decoder. As shown, the row select signals are generated by a 1 of 4 selector. Each row select signal, R0 through R3, is connected to the input of a differential driver/level changer as shown in FIG. 195. The outputs of each differential driver, Rxa and Rxb, are connected to the appropriate gates of the FETs that form the memory array (FIG. 204) that should turn on when that row is selected.

Also shown in FIG. 195, the column select signals are produced by another 1 of 4 selector. Each column select signal, C0 through C3, is connected to the input of a buffer/level changer. The output of each buffer is connected to 3 pass transistors, one for each required place of the radix 3 output (FIG. 204).

Memory arrays may also be realized. FIGS. 199–202 show the FETs that are required to form the binary to ternary memory array. Next to the gate of each FET is its required threshold voltage. FIG. 203 shows the symbol used to represent the FETs in the memory array. The label inside the symbol is the figure number of the FET it is representing. As shown, the symbol is representing the P-channel enhancement mode FET with a –0.75 volt threshold voltage of FIG. 201.

The memory array is comprised of 48 FETs with a 4×4×3 organization as shown in FIG. 204. This organization is based on the magnitude of the $S_r$ value which, in this case, is 16 and equates to 4 rows by 4 columns. The number of 4×4 arrays required is based on the number of required places of the $D_r$ necessary to equal or exceed the magnitude of the $S_r$ value. In this case three terts are required as three terts are capable of 27 logical states, a sufficient number to address the $S_r$ magnitude of 16. Two terts would be insufficient as two terts are capable of only 9 logical states.

When a row becomes active, all of the FETs that are connected to the active row driver (Rxa and Rxb), turn on with each FET connecting a different column line to the power supply voltage that represents the required logic level for that particular row and column combination. Upon selection of the appropriate column, three selected column lines (one for each place) will be allowed to conduct to an output terminal.

The gates of three pass transistors, one for each tert of the output word, are controlled by one output of the column select 1 of 4 decoder and driver. These transistors each connect a different column line to one of the respective output terminals, $T^0$, $T^1$, or $T^2$.

When a binary value is presented to the input terminals, the output value is the ternary equivalent of the input value, as shown in table AA.

TABLE AA

| DECIMAL | BINARY INPUT | | | | TERNARY OUTPUT | | |
|---|---|---|---|---|---|---|---|
| | $B^3$ | $B^2$ | $B^1$ | $B^0$ | $T^2$ | $T^1$ | $T^0$ |
| 0 | 0 | 0 | 0 | 0 | 0 | 0 | 0 |
| 1 | 0 | 0 | 0 | 1 | 0 | 0 | 1 |
| 2 | 0 | 0 | 1 | 0 | 0 | 0 | 2 |
| 3 | 0 | 0 | 1 | 1 | 0 | 1 | 0 |
| 4 | 0 | 1 | 0 | 0 | 0 | 1 | 1 |
| 5 | 0 | 1 | 0 | 1 | 0 | 1 | 2 |
| 6 | 0 | 1 | 1 | 0 | 0 | 2 | 0 |
| 7 | 0 | 1 | 1 | 1 | 0 | 2 | 1 |
| 8 | 1 | 0 | 0 | 0 | 0 | 2 | 2 |
| 9 | 1 | 0 | 0 | 1 | 1 | 0 | 0 |
| 10 | 1 | 0 | 1 | 0 | 1 | 0 | 1 |
| 11 | 1 | 0 | 1 | 1 | 1 | 0 | 2 |
| 12 | 1 | 1 | 0 | 0 | 1 | 1 | 0 |
| 13 | 1 | 1 | 0 | 1 | 1 | 1 | 1 |
| 14 | 1 | 1 | 1 | 0 | 1 | 1 | 2 |
| 15 | 1 | 1 | 1 | 1 | 1 | 2 | 0 |

A ternary to binary radix converter can be achieved as follows. Shown in FIG. 205 is a three-tert ternary address decoder. As shown, the row select signals are generated by a 1 of 9 selector. Each row select signal, R0 through R8, is connected to the input of a differential drier/level changer as shown in FIG. 206. The outputs of each differential driver, Rxa and Rxb, are connected to the gates of the FETs forming the memory array (FIGS. 211a,b) that turn on when that row is selected.

Figure 211B:
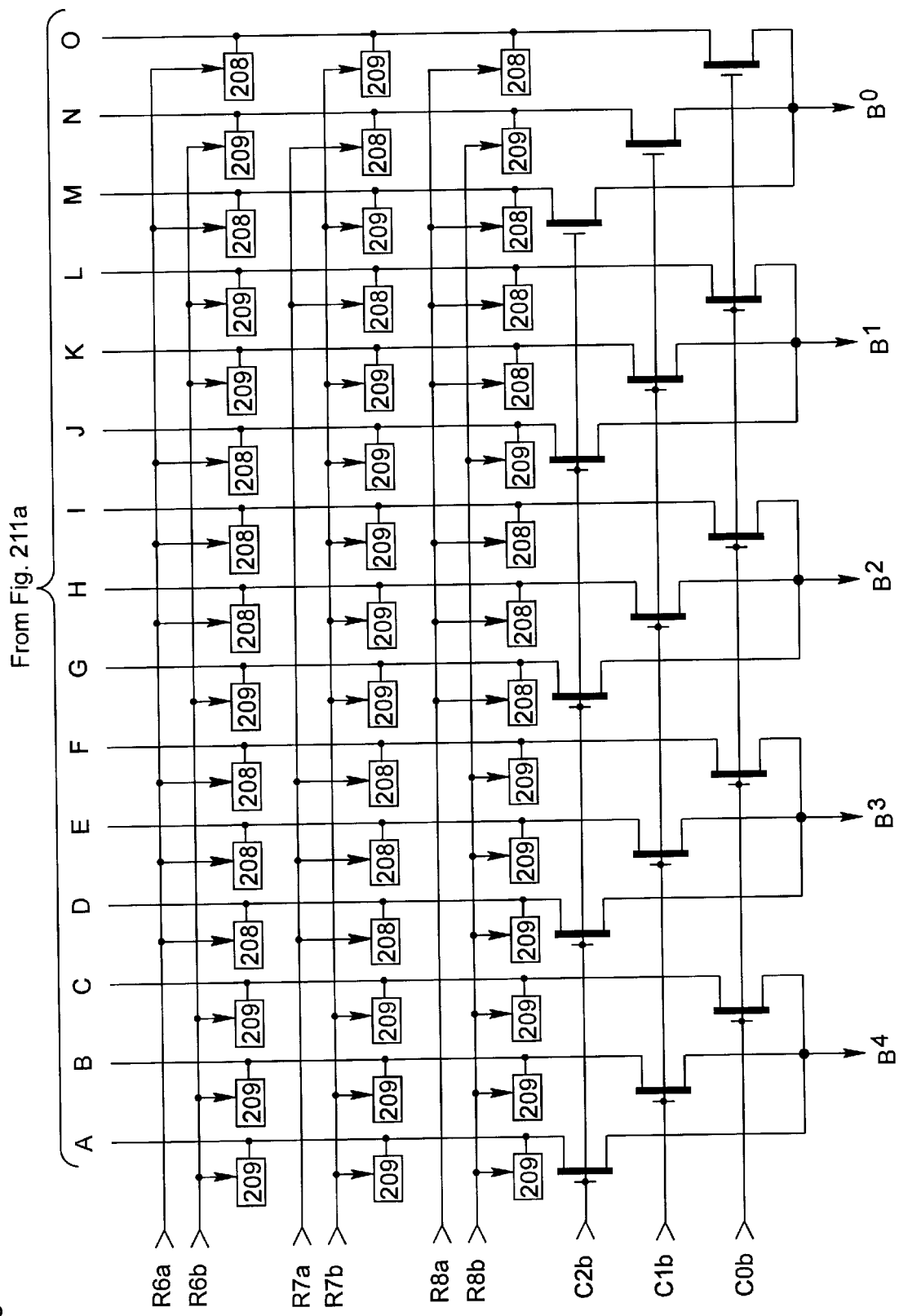

Also shown in FIG. 205, the column select signals are produced by a 1 of 3 selector. Each column select signal, C0 through C2, is connected to the input of a buffer/level changer as shown in FIG. 207. The output of each buffer is connected to 5 pass transistors, one for each required place of the radix 2 output (FIG. 211b)

Ternary to binary memory arrays may be created as follows. FIGS. 208 and 209 show the FETs that are required to form the ternary to binary memory array. Next to the gate of each FET is its required threshold voltage, $V_{GS(TH)}$.

FIG. 210 shows the symbol used to represent the FETs in the memory array. The label inside the symbol is the figure number of the FET it is representing. As shown, the to symbol is representing the P-channel enhancement mode FET with a −2.00 volt threshold voltage of FIG. 209. The memory array is comprised of 135 FETs with a 9×3×5 organization as shown in FIG. 211a,b. This organization is based on the magnitude of the $S_r$ value which in this case is 27 and equates to 9 rows by 3 columns. The number of 9×3 arrays required is based on the number of required places of the $D_r$ necessary to equal or exceed the magnitude of the $S_r$ value, in this case 5 bits are required as $2^5$ is 32, a number sufficient to provide 27 distinct responses.

When a row becomes active, all of the FETs that are connected to the active row driver (Rxa and Rxb), turn on.

Each activated FET connects a column line to the power supply voltage that represents the $D_r$ logic level for that particular row and column combination.

The gates of five pass transistors, one for each bit of the output word, are controlled by one output of the column select 1 of 3 decoder and driver. These transistors connect a column line to one of the five output terminals, $B^0$, $B^1$, $B^2$, $B^3$, or $B^4$.

When a ternary value is presented to, or imnpressed upon, the input terminals, the output value is the binary equivalent of the input value, as shown in table AB.

TABLE AB

| DECIMAL | TERNARY INPUT | | | BINARY OUTPUT | | | | |
|---|---|---|---|---|---|---|---|---|
| | $T^2$ | $T^1$ | $T^0$ | $B^4$ | $B^3$ | $B^2$ | $B^1$ | $B^0$ |
| 0 | 0 | 0 | 0 | 0 | 0 | 0 | 0 | 0 |
| 1 | 0 | 0 | 1 | 0 | 0 | 0 | 0 | 1 |
| 2 | 0 | 0 | 2 | 0 | 0 | 0 | 1 | 0 |
| 3 | 0 | 1 | 0 | 0 | 0 | 0 | 1 | 1 |
| 4 | 0 | 1 | 1 | 0 | 0 | 1 | 0 | 0 |
| 5 | 0 | 1 | 2 | 0 | 0 | 1 | 0 | 1 |
| 6 | 0 | 2 | 0 | 0 | 0 | 1 | 1 | 0 |
| 7 | 0 | 2 | 1 | 0 | 0 | 1 | 1 | 1 |
| 8 | 0 | 2 | 2 | 0 | 1 | 0 | 0 | 0 |
| 9 | 1 | 0 | 0 | 0 | 1 | 0 | 0 | 1 |
| 10 | 1 | 0 | 1 | 0 | 1 | 0 | 1 | 0 |
| 11 | 1 | 0 | 2 | 0 | 1 | 0 | 1 | 1 |
| 12 | 1 | 1 | 0 | 0 | 1 | 1 | 0 | 0 |
| 13 | 1 | 1 | 1 | 0 | 1 | 1 | 0 | 1 |
| 14 | 1 | 1 | 2 | 0 | 1 | 1 | 1 | 0 |
| 15 | 1 | 2 | 0 | 0 | 1 | 1 | 1 | 1 |
| 16 | 1 | 2 | 1 | 1 | 0 | 0 | 0 | 0 |
| 17 | 1 | 2 | 2 | 1 | 0 | 0 | 0 | 1 |
| 18 | 2 | 0 | 0 | 1 | 0 | 0 | 1 | 0 |
| 19 | 2 | 0 | 1 | 1 | 0 | 0 | 1 | 1 |
| 20 | 2 | 0 | 2 | 1 | 0 | 1 | 0 | 0 |
| 21 | 2 | 1 | 0 | 1 | 0 | 1 | 0 | 1 |
| 22 | 2 | 1 | 1 | 1 | 0 | 1 | 1 | 0 |
| 23 | 2 | 1 | 2 | 1 | 0 | 1 | 1 | 1 |
| 24 | 2 | 2 | 0 | 1 | 1 | 0 | 0 | 0 |
| 25 | 2 | 2 | 1 | 1 | 1 | 0 | 0 | 1 |
| 26 | 2 | 2 | 2 | 1 | 1 | 0 | 1 | 0 |

One advantageous modification is the addition of an "ENABLE" input to the row and column decoders. In addition to making the RCROM "selectable," it causes the shown $D_r$ outputs to take the r+1 state (tri-state for the ternary to binary case) when the RCROM is not enabled.

Other modifications include the addition of input latches which allows the source radix data bus to be used for other computing. Also output buffers or drivers may be added. While this increases the output drive capability, it defeats the r+1 state ability of the "ENABLE" modification unless the drivers are of the r+1 state type. If r+1 state drivers are used, then the "ENABLE" is used to select the r+1 drivers and not the row and column decoders. Pre-charge or biasing circuitry may be added. While this might increase the speed of conversion and eliminate transistors from the memory array, it increases the dynamic power consumption.

Because the concepts herein are extendable to any number of places of any two radices, the design and fabrication of an RCROM for radices other than those shown can now be achieved using the SUS-LOC circuit structure of the present invention.

Radix conversion can also be accomplished via duad gates. Duad gates convert a value from a $S_r$ that is an even power or root of the $D_r$. Either one place of the higher radix is produced from multiple places of the lower radix, or multiple places of the lower radix are produced from one place of the higher radix. For example, a 2 duad 8 gate produces a one place octal value from a three place binary value.

In addition to converting a value from one radix to another, a basic duad gate has an inherent level changing capability. Although somewhat limited, in many cases the level changing ability of a basic duad gate is sufficient enough to preclude additional level changing circuitry. However, should level changing beyond the capability of a basic duad gate be necessary, it must occur on the side of the gate with the lower radix. E.g., the level changer must be placed on the input side of a 3 duad 9 gate, and on the output side of a 9 duad 3 gate.

For purposes of disclosure, two duad gates are set forth herein: a binary to tetranary us duad gate (2 duad 4) and a tetranary to binary duad gate (4 duad 2). The binary system has a $V_{3-1}$ of 3 volts, and the tetranary system uses a $V_{-1}$ of 6 volts. The parameters necessary for designing the required duad gates, using the SUS-LOC structure, are shown in table AC.

TABLE AC

| Logic System | Vr-1 | LSV | OP | $V_0$ | $V_1$ | $V_2$ | $V_3$ |
|---|---|---|---|---|---|---|---|
| Binary | 3 | 3 | N/A | 0 | 3 | | |
| Tetranary | 6 | 2 | 60% | 0 | 2 | 4 | 6 |

The schematic of a 2 duad 4 gate is shown in FIG. 212. FIGS. 213 and 214 show the symbol and Karnaugh graph, respectively. The tetranary output value of the basic 2 duad 4 gate is the base-1 complement of the input binary value. The Karnaugh graph may be unfamiliar to those who are not familiar with the SUS-LOC structure as it contains values other than zero and one, including values that are larger than one. An alternative Karnaugh graph is shown in table AD.

TABLE AD

|   |   | A |   |   |   |
|---|---|---|---|---|---|
|   |   | 0 |   | 1 |   |
|   |   | 3 | 3 | 2 | 2 |
| B | 0 | 3 | 3 | 2 | 2 |
|   | 1 | 1 | 1 | 0 | 0 |
|   |   | 1 | 1 | 0 | 0 |

Both Karnaugh graphs are correct. However, the graph shown in FIG. 214 may be preferred due to its greater simplicity.

Due to the difference between the $V_{r-1}$ voltages (shown in table AC), level changing is necessary. Because the basic 2 duad 4 gate has a limited level changing capability and because the required voltage change is within the range of the basic 2 duad 4 gate, additional level changing circuitry is not required in this case. As shown, without the components shown in phantom, the 2 duad 4 gate performs as a radix converter and a level changer.

Should level changing beyond the capability of the basic gate be necessary or should a positive logic output be desired, then the base-1 complementers (shown as phantom components in FIG. 212) should be used. It should be noted that if the base-1 complementers change the level of the binary input, then the transistors of Q1 through Q8 must be re-calculated.

The tetranary output value of the basic 2 duad 4 gate is the base-1 complement of the input binary value. The base-1 complementers, shown as phantom components in FIG. 212, are used when either additional level changing is required or only a positive logic output is desired. If the base-1 complementers are used, it is suggested that they also be level changers, if required, as this will increase the speed of the gate.

When both positive and complementary logic outputs are required, a $D_r$ base-1 complementer (not shown) is added to the output. Also, when level changing beyond the ability of the basic gate and both logical outputs are required, then the phantom components of FIG. 212 and the $D_r$ base-1 complementer are required.

For logical outputs other than positive and complementary, the appropriate $D_r$ OPF is added to the output of the basic gate. Of the 256 possible tetranary OPFs, 252 are useful (i.e., 252 are non-continuous).

The schematic of a 4 duad 2 gate is shown in FIG. 215 with FIGS. 216 and 217 showing the symbol and Karnaugh graph, respectively. Again, the Karnaugh graph may appear unusual because it has one input with values other than zero and one, and two outputs of only zeros and ones. An alternative is two Karnaugh graphs, one for each output.

Due to the difference between the $V_{r-1}$ voltages (shown in table AC), level changing is necessary. The basic 4 duad 2 gate has a limited level changing capability and the required voltage change is within its range, therefore, in this case, additional level changing circuitry is not required. Without the components shown in phantom, the 4 duad 2 gate performs both radix conversion and level changing.

Should level changing beyond that of the basic gate be necessary or positive logic outputs be desired, then the base-1 complementers (inverters) shown as phantom components in FIG. 215 are added and the transistors Q1 through Q8 are re-calculated.

The binary output values of the basic 4 duad 2 gate are the base-1 complement of the input tetranary value. The base-1 complementers, shown as phantom components in FIG. 215, are used when either additional level changing is required or only a positive logic output is desired. If the base-1 complementers are used, it is suggested that they also be level changers, if required, as this will increase the speed of the gate.

When both positive and complementary logic outputs are required and/or level changing beyond the ability of the basic gate is required, then the components of FIG. 215 shown in phantom are used.

Latches and Registers

Latches are the memory elements used to form registers as well as sequential and clocked sequential logic circuits. Currently, a definition of a latch is a bistable circuit that can be set and reset by appropriate input signals. However, when the radix of the latch is greater than two, a latch is no longer bistable and therefore requires a new working definition. One definition useful in conjunction with SUS-LOC-based latches is "a multi-stable circuit that is placed in one of multiple states by appropriate input signals."

When the radix of a latch is greater than two, three groups of latches are possible. The three groups are: the complementing, converting (not possible with binary), and identity latches. Each group contains bi-level through r-level types of latches.

The first group of latches is the complementing latches. The output logic level of these latches is equal to the base-1 complement of the datum input logic level. E.g., the primary output of a pentanary complementing latch is equal to the 4's complement of the datum input.

The latches of the second group are converting latches. This group of latches produce output logic levels that are neither the r–1 complement nor the identity of the datum input logic level. Of the three groups, this group contains the most bi-level through r-level latch types. When radix 2, or straight binary (i.e., not two of r states), is implemented with any logic structure, this group is not possible.

The third group consists of identity latches. All of the latches in this group are basically latches from the complementing and converting groups with the output taken from a different point in the circuit. The output logic level of an identity latch is equal to the datum input logic level.

Simple Latches

A simple r-valued latch is formed by cross-coupling two r-valued OPFs, as shown in FIG. 218. Two differences between an r-valued latch and a binary latch are the number of logic levels the latch is capable of storing and the latch might be a converting latch. I.e., the output might not be the identity nor base-1 complement of the input data.

The elements in FIG. 218 labeled TG are transmission gates or near zero threshold FETs (FIG. 5) and are used to control the input and feedback paths of the latch. These switches or transmission gates are OFF (not conducting) when a logic level 0 is placed on their control inputs $\phi A$ and $\phi B$ and on (conducting) when a logic level greater than 0 is placed on their control inputs.

The two OPFs in FIG. 218 labeled FA and FB are the active elements of the latch. The specific pair of OPFs used determines the group and type of latch formed. With the exception of less than r-level latches (which require special consideration), the two OPFs used will form an r-valued buffer. An identity group latch is formed by simply taking the output of the latch from the output side of the OPF labeled "FB" (as shown in FIG. 219) with a bidirectional data input/output terminal. The output logic level of the identity latch shown in FIG. 219 is equal to the input datum.

The output logic level of complementing and converting latches is function FA of the input datum.

The pairs of OPFs for each group and type of ternary latch are listed and can be selected from table AE. Latches with multiple outputs are achievable by simply adding the OPF(s) that produce the desired output logic level(s) as shown in FIG. 220.

TABLE AE

| | | TYPE | | | | | | | |
|---|---|---|---|---|---|---|---|---|---|
| | | Tri-level | | Bi-level | | | | | |
| GROUP | | FA | FB | ILL* | FA | FB | FA | FB | FA | FB |
| Identity | | Complementing or Converting, output taken from FB | | 0,1<br>0,2<br>1,2 | F011<br>F022<br>F112 | F011<br>F022<br>F112 | | | | |
| Complementing | | F210 | F210 | 0,1<br>0,2<br>1,2 | F100<br>F200<br>F221 | F100<br>F200<br>F221 | | | | |
| Converting | | F021<br>F102<br>F120<br>F201 | F021<br>F102<br>F201<br>F120 | 0,1<br>0,2<br>1,2 | F022<br>F122<br>F002 | F011<br>F002<br>F122 | F200<br>F011<br>F001 | F100<br>F022<br>F122 | F122<br>F100<br>F110 | F001<br>F200<br>F211 |

*Input Logic Level for the Bilevel Types

The basic symbol used to represent an r-valued complementing or converting latch is shown in FIG. 221 and labeled $DL_r$ to indicate a data latch of radix r. The output terminal(s) is/are labeled with Fnnn to indicate the OPF used to generate the output. With a single output, this label indicates the OPF used for FA. If the latch is from the ternary complementing group, then $F210_3$ would be used as the label for the output terminal.

The symbol representing a simple latch with multiple outputs is shown in FIG. 222. The symbol shown in FIG. 223 represents an identity group latch with a bi-directional data terminal.

If a simple latch has a strobe circuit dedicated to it, then the two phase inputs ($\phi A$ and $\phi B$) are replaced with a single input labeled "STB" (Strobe), as shown in FIG. 224. The shaded area next to the STB label is the location used to indicate the active logic level of the strobe input.

Clock Phase Generation

There are several methods of generating the $\phi A$ and $\phi B$ clock signals required to operate a latch. The simplest is that shown in FIG. 225. With the OPFs shown, a complementing or converting simple latch becomes transparent during the logic 1 to logic 0 transition of the $Strobe_0$ input.

During this transparency, the datum presented to the data input is available at the output terminal(s) as Fnnn of the input datum. The datum present at the data input is latched during the logic 0 to logic 1 transition of the $Strobe_0$ input. The output of an identity latch with a bi-directional data terminal is only available during the latched state (i.e., when the $Strobe_0$ input is inactive).

Any logic level, or pair of logic levels for the ternary case, may be selected to operate a simple latch. The number of logic levels that can be used to activate a simple latch is radix dependent and equates to r–2. To change the active logic level(s) of the strobe circuitry shown in FIG. 225, the OPFs of the strobe circuit shown in FIG. 225 are replaced with OPFs that provide the desired operating level(s). The replacement OPFs and the logic level(s) responded to for the ternary case are listed in table AF.

TABLE AF

| FOR LEVEL(S) | REPLACE F022 WITH |
|---|---|
| 0 | F022 |
| 0 & 1 | F002 |
| 1 | F202 |
| 1 & 2 | F200 |
| 2 | F220 |
| 0 & 2 | F020 |

While any of the r logic levels may be selected to operate an r-valued simple latch, caution should be exercised when a logic level other than 0 or r−1 is selected to operate an r-valued latch. This is due to the fact that a transition of an r-valued control signal from logic level 0 to a logic level greater than 1, and vice versa, passes through all of the intermediate logic levels which may affect latch operation. The operation of a simple latch with an intermediate logic level may be desired in some cases and is dependant upon the particular application.

Master-Slave Latches

To form a master-slave latch, two simple latches are cascaded by connecting the output of a first latch (master) to the data input of a second latch (slave) and reversing the control signals φA and φB in the slave as shown in FIG. 226.

This method of cascading causes the master-slave latch to be responsive to an/the edge(s) of the strobe input rather than its level. With the OPFs shown in the strobe circuit of FIG. 225 (F022$_3$ and F200$_3$) the datum present at the data input is latched by the master during the logic 1 to logic 0 transition of the Strobe$_0$ input, and the slave becomes transparent making the datum latched by the master available at the output. During the logic 0 to logic 1 transition of the Strobe$_0$ input, the slave latches the output of the master and the master becomes transparent without affecting the output of the slave.

The symbol used to represent a master-slave latch is shown in FIG. 227. The shaded area next to the clock input (CLK) is the location reserved for the edge(s) descriptor required to operate the latch. The symbol is almost identical to that of the data latch except for the identifying MS$_r$ (as opposed to DL$_r$) and the clock input label CLK with 2 or more logic levels separated with one or more arrows indicating the leading, trailing, or special pair of edges utilized for operation.

Any edge, or special pair of leading and/or trailing edges, may be selected to operate an r-valued master-slave latch. The number of edges and combinations of edges available increases as the radix increases. Changing the edge(s) operating a master-slave latch is accomplished by changing an/the OPF(s) of the strobe circuitry. For the ternary case, the edge(s) operating a master-slave latch and the associated descriptor to be used in its symbol are listed in table AG.

TABLE AG

| Edge(s) | USE | Descriptor |
|---|---|---|
| 1 to 0 | F022 | 1 ↓ 0 |
| 2 to 1 | F002 | 2 ↓ 1 |
| 0 to 1, & 2 to 1* | F202 | 0 ↑ 1–2 ↓ 1 |
| 0 to 1 | F200 | 0 ↑ 1 |

TABLE AG-continued

| Edge(s) | USE | Descriptor |
|---|---|---|
| 1 to 2 | F220 | 1 ↑ 2 |
| 1 to 0, & 1 to 2* | F020 | 1 ↓ 0–1 ↑ 2 |

*special pair of edges

When selecting the edge(s) used to operate a master-slave latch, caution is warranted because a transition from a logic 0 to a level greater than 1, and vice versa, includes all of the intermediate logic level transitions and will have several leading and trailing edges. The edges of the intermediate logic level transitions may cause activation of the master-slave latch.

The operation of a master-slave latch with an intermediate logic level transition may be desired in some cases and is dependant upon the particular application. The schematic of a master-slave latch with multiple outputs that operates on the logic 1 to logic 0 edge of the Strobe$_0$ input is shown in FIG. 228 and its symbol is shown in FIG. 229.

Resettable Latches

The schematic of a simple latch that can be reset, or more precisely set to zero or cleared, is shown in FIG. 230 and its symbol is shown in FIG. 233. However, if the Strobe$_0$ input is active when the CLR$_0$ input is de-activated, then the logic 0 injected by the 140$_3$ gate might not be latched dependent upon the state of the Strobe$_0$ and data inputs. If it is desired that the logic 0 be latched without regard to the state of the Strobe$_0$ input, then a resettable master-slave latch should be used.

A master-slave latch with asynchronous clear and its symbol are shown in FIGS. 231 and 232, respectively, with optional CLK and CLR0 input buffers. The multiple output functions are shown in phantom. As shown, the clear input, CLR$_0$, is active when presented with a logic level 0. While the CLR$_0$ is active, the output logic level is 0 and remains so regardless of the state of the Strobe$_0$ input.

The logic level at which the CLR$_N$ input is active can be altered by replacing the 140$_3$ gates with 3650$_3$ gates for logic level 1, or 3780$_3$ gates for logic level 2. To achieve a latch that is clearable with multiple logic levels, replace the 140$_3$ with the appropriate MPF or an OPF may be added to drive the B input of a 140$_3$, 3650$_3$, or 3780$_3$ gate.

As mentioned above, it is suggested that only logic level zero or r−1 be used to activate the clear function because transitions of any r-valued signal of two or more logic levels includes all of the intermediate logic levels. Also, utilizing zero and r−1 as the active logic levels requires fewer components as the discrete decoding of an intermediate logic level requires more components than the discrete decoding of logic level 0 or r−1.

Latches that are settable to any of the r logic levels other than zero are possible by using the appropriate MPF to replace the 140$_3$ gates. Alternatively, a combinational logic circuit that incorporates all of the desired "set to" states can be designed and used in the stead of the 140$_3$ gates.

There are many variations of the basic schemes set forth above which will be envisioned and developed by those who utilize and practice the SUS-LOC structure now that the foregoing is understood. Also, the above section concerning latches should not be considered as the full extent of the possible variations and/or combinations of circuitry that perform the logical function of memory.

Sequential and Clocked Sequential Logic

The term "sequential logic" implies that two or more logical functions are performed one after another or in sequence and the result(s) of a previous step must be stored for use by a subsequent step in the sequence. The term "clocked sequential logic" usually implies the use of sequential logic, as described above, and performs one or more of the logical functions in synchronization with a signal generated by a circuit elsewhere in the system.

In either case the foregoing section concerned with latches discloses a few of the many possible circuits that provide the memory element(s) required by sequential and clocked sequential logic.

Digitizing Linearizer

Analog to digital converting linearizers can be realized by the use of SUS-LOC in analog applications by alteration of threshold voltages. The specific application is a circuit that digitizes and linearizes in one operation, or stage, and is denominated digitizing linearizer.

The output voltage, or current, of most transducers used to sense various phenomena is non-linear. Because of the non-linear outputs, the method of digitizing and linearizing currently in use is a two step process. The first step converts the analog signal into a digital value. This process is called analog to digital conversion (A to D, or A/D). While there are several methods of doing this (such as successive approximation and dual slope), they all have a sampling rate and require many clock cycles to complete one conversion. And, greater accuracy requires more clock cycles. The second step linearizes the digital value using a processor and an appropriate algorithm. This process also requires many clock cycles to complete with greater accuracy requiring more clock cycles.

A SUS-LOC digitizing linearizer performs both of the above steps in one operation, samples continuously, and requires almost no clock cycles to complete. The time required might be equal to one or two clock cycles for settling, depending on the clock rate, but this is minimal compared to the hundreds of clock cycles required by the current A/D method.

In order to achieve a digitizing linearizer, the threshold voltages of an OPF are calculated such that they match selected points on the amplified output curve of the transducer. The number of points which can be selected is equal to the number of switch points of the selected OPF. FIG. 234 shows a simple over-all schematic of a digitizing linearizer using a ternary OPF for simplicity, and FIG. 235 shows the amplified output curve of the transducer or sensing element.

FIG. 236 shows the schematic of the ternary OPF with altered threshold voltages that match the sensors amplified output curve. Amplifiers are currently used in A/D converters and the digitizing linearizer conforms to this present standard. Linearization occurs because the threshold voltages match the selected points on the curve, and digitization occurs because the output of the OPF is digital. In one simultaneous step, and upon reception of the signal, incoming data is both digitized and linearized.

FIG. 237 shows the simple over-all schematic of a digitizing linearizer of FIG. 234 extended to several places of ternary, plus an additional OPF to serve as a buffer to ensure that metastability does not occur and to produce a non-complemented value. The amplifiers shown in FIG. 237 have different amplification factors such that the output of amplifier A is whole volts, amplifier B is 3 times the amplification of A and subtracts the whole volts, amplifier C is 9 times the amplification of A and the output of amplifier B is subtracted, et cetera for the number of stages added.

For greater accuracy and to produce a digital output that is in distinct decades, the ternary OPFs are replaced with decimal OPFs with altered threshold voltages that match ten selected points on the transducer's amplified output curve. Of course, if decimal OPFs are used, the amplification factors would be powers of 10 as opposed to powers of three.

Examples of Other SUS-LOC Circuits

From the foregoing, it can be seen that a logic function circuit of any radix, r, having any number of inputs, n, can be realized through SUS-LOC. Once the Karnaugh graph for the function, any function, is chosen, SUS-LOC provides actual and realizable means by which that multiple-valued logic circuit can be constructed. A brief description of the remaining drawings is given as the drawings themselves provide a complete disclosure in light of the foregoing description, above.

FIG. 238 shows a pentanary $GOR_5$ circuit as realized through the SUS-MOS embodiment of SUS-LOC along with its Karnaugh graph. Due to the non-reverse nature of the Karnaugh graph, back biasing is present in the SUS-MOS embodiment shown in FIG. 238. FIGS. 239a,b show the $GOR_5$ circuit of FIG. 238 with additional stages to prevent such back biasing. Of course, the $CGOR_5$ circuit of FIG. 121 could be complemented to obtain a circuit providing the same circuit response and Karnaugh graph as shown in FIG. 240b.

While any single radix multiple-valued logic circuit can be realized via SUS-LOC (and, it is believed, any multiple radix multiple-valued logic circuit as well), certain efficiencies and optimizations may take place by accommodating certain groupings that are indicated by the circuit's associated Karnaugh graph and otherwise. By establishing the equivalent SUS-MOS circuit for the desired Karnaugh graph and adding necessary additional stages to prevent back biasing, any single radix multiple-valued logic circuit can be realized via SUS-LOC. It is believed that the same it true for multiple radix multiple-valued logic circuits.

FIG. 241 shows a pentanary $GAND_5$ circuit as realized through the SUS-MOS embodiment of SUS-LOC along with its Karnaugh graph. Due to the non-reverse nature of the Karnaugh graph, back biasing is present in the SUS-MOS embodiment shown in FIG. 241. FIGS. 242a,b show the $GAND_5$ circuit of FIG. 241 with additional stages to prevent such back biasing. Of course, the $CGAND_5$ circuit of FIG. 124 could be complemented to obtain a circuit providing the same circuit response and Karnaugh graph as shown in FIG. 243b. The $CGOR_5$ symbol and Karnaugh graph are also shown in FIG. 244c.

FIG. 244a shows the $CGOR_5$ circuit of FIG. 121 with brackets about absolute threshold voltages calculated from the source voltage plus the relative gate threshold voltage.

Figure 246A:
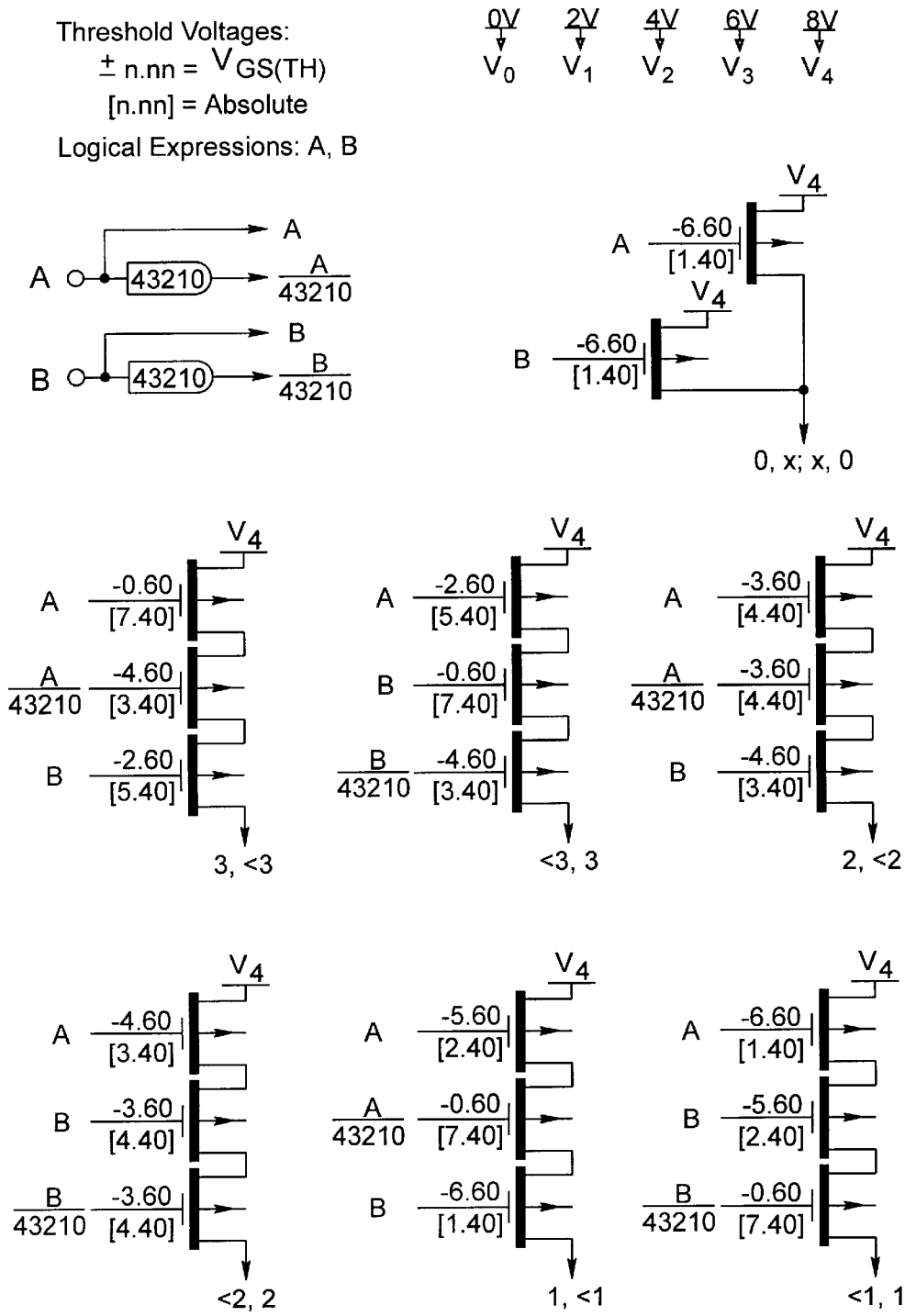

Figures 245a–245l show a complete set of Karnaugh graph groupings (set forth in heavy circumscribing) for the pentanary $CEQ_5$ circuit. Such groupings are dictated by choice and, to that extent, are arbitrary in nature. FIGS. 246a,b show the composite circuit branches corresponding to the Karnaugh graph groupings of FIG. 245.

FIGS. 247a–247i show an alternative Karnaugh graph grouping scheme for the $CEQ_5$ circuit. FIGS. 248a,b show the composite circuit branches corresponding to the Karnaugh graph groupings shown in FIG. 247.

FIGS. 249a–249l show a second alternative Karnaugh graph grouping for the $CEQ_5$ circuit.

FIGS. 250a–250c show the schematic (250a), Karnaugh graph (250b), and symbol (250c) for the complemented ternary Sigma or $CSIGMA_3$ circuit.

FIGS. 251a–251c show the schematic (251a), Karnaugh graph (251b), and symbol (251c) for an alternative embodiment of the ternary Sigma or $SIGMA_3$ circuit.

Figures 252A, 252B:
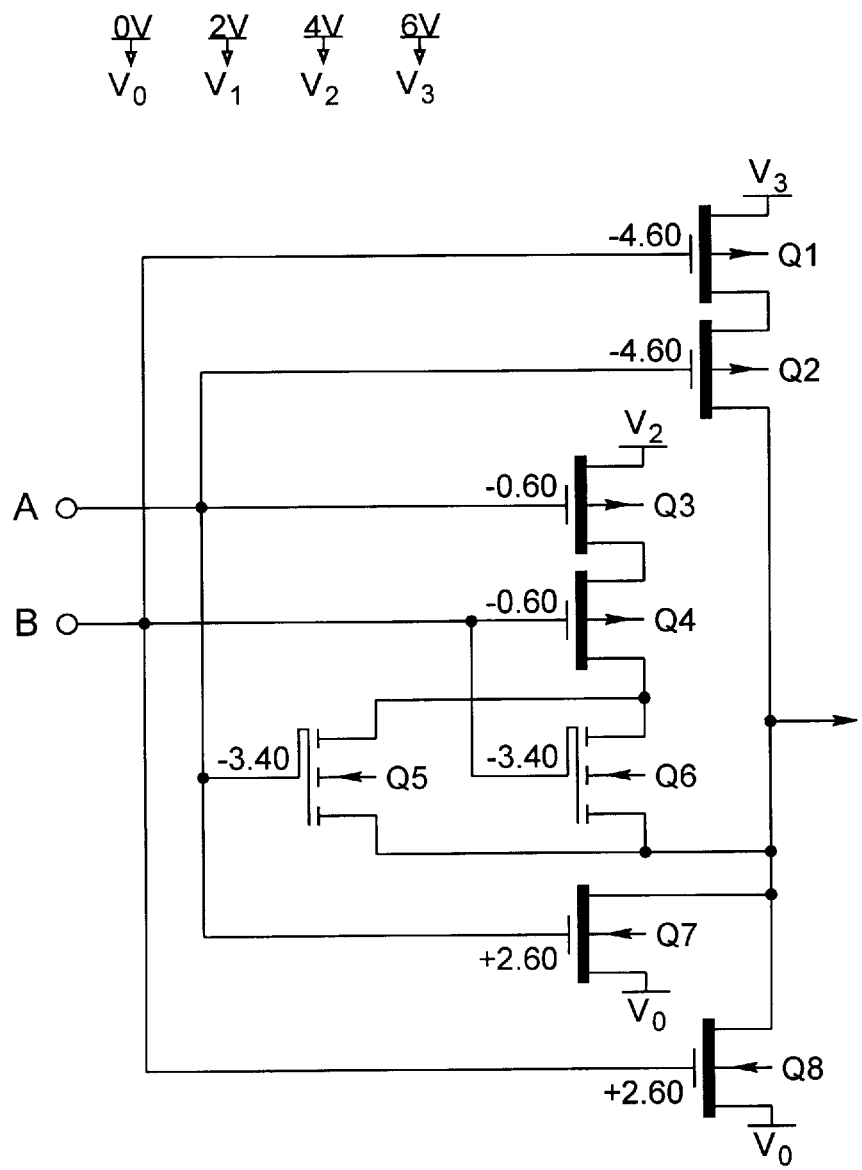

FIGS. 252a and 252b show the schematic (252a) and Karnaugli graph (252b) for a tetranary embodiment of a circuit named after Dr. Claudio Moraga of the University of Dortmund, Germany. The CMORAGA circuit is a reverse circuit and needs no anti-back biasing additional stages. The "corner" structure present in the Karnaugh graph (B1/A0, B1/A1, and B0/A1) gives rise to the series-parallel structure responsible for the transmission of logic level 2 to output. It is believed that the series-parallel nature of intermediate branches is reflected by such corners in the circuit's corresponding Karnaugh graph. Such corners may provide a group for circuit branch development/determination in SUS-LOC as reflected by similar features in CGOR and CGAND circuits.

With respect to such corners in Karnaugh graphs, it is believed that when the output voltage for the group is greater than or equal to $V_{r-1}/2$ ($\geq V_{r-1}/2$), the P-channel FETs are in series and the N-channel FETs are in parallel. When the output voltage for the group is less than $V_{r-1}/2$ ($<V_{r-1}/2$), then it is believed that the N-channel FETs form the series portion and the P-channel FETs are in parallel. If the output voltage is equal to $V_{r-1}/2$ ($=V_{r-1}/2$), then it appears that all the FETs are depletion mode FETs. If the output voltage is greater than $V_{r-1}/2$ (>hd r-1/2), it appears that the series FETs are P-channel enhancement mode FETs and that the parallel FETs are N-channel depletion mode FETs. When the output voltage is less than $V_{r-1}/2$ ($<V_{r-1}/2$), it appears that the series N-channel FETs are enhancement mode FETs and that the parallel P-channel FETs are depletion mode FETs.

While the present invention contemplates the use of FETs that maintain constant threshold characteristics ($V_{GS(TH)}$), use of circuit elements that have dynamic threshold characteristics may also be put to good and advantageous use in SUS-LOC. For example, the bulk, or body, effect known in transistors including FETs can alter the threshold voltage $V_{GS(TH)}$. By raising or lowering the threshold voltage $V_{GS(TH)}$ via bulk effect, additional advantage and utility can be provided to enhance the present invention. For example, it may be possible to effect one-way FETs necessary for SUS-MOS via bulk effect by enabling and disabling FETs susceptible to back biasing.

While the present invention has been described with regards to particular embodiments, it is recognized that additional variations of the present invention may be devised without departing from the inventive concept. As mentioned above, optical or other high-speed analogous circuit elements may be used to good advantage in SUS-LOC circuits. Additionally, the bulk effect or other means may allow discrete circuit elements dynamic switching ability which may be used in SUS-LOC.

What is claimed is:

1. A one-place signal processing circuit for multiple-valued logic, comprising:
   an input and an output,
   a first terminus branch coupling said input to said output, said first terminus branch conducting a first output signal for a first set of unique input signals;
   a second terminus branch coupling said input to said output, said second terminus branch conducting a second output signal for a second set of unique input signals; and
   an intermediate branch coupling said input to said output, said intermediate branch having only two switches and conducting a third output signal for a third set of unique input signals; whereby
   a one-place logic function is provided for multiple-valued logic signal processing.

2. The one-place signal processing circuit for multiple-valued logic of claim 1, further comprising:
   an additional stage, said additional stage preventing back biasing of at least one branch of the one-place signal processing circuit for multiple-valued logic.

3. A multiple-place signal processing circuit for multiple-valued logic, comprising:
   first and second inputs;
   an output;
   a first composite branch coupling said first and second inputs to said output, said first composite branch having an intermediate branch, said intermediate branch having only two switches, said first composite branch conducting a first output signal for a first set of unique input signals; and
   a second composite branch coupling said first and second inputs to said output, said second composite branch conducting a second output signal for a second set of unique input signals; whereby
   a multiple-place logic function is provided for multiple-valued logic signal processing.

4. The multiple-place signal processing circuit for multiple-valued logic of claim 3, wherein said first composite branch further comprises:
   an additional stage, said additional stage preventing back biasing of at least one switch of said first composite branch.

5. An information signal processing circuit for multiple-valued logic, comprising:
   a first switch, said first switch coupled to a first source voltage and having a first switch input and a first switch output, said first switch transmitting said first source voltage to said first switch output when an input signal voltage impressed upon said first switch input is sufficiently different than said first source voltage by a first threshold voltage; and
   a second switch, said second switch coupled to said first switch, said second switch coupled to a second source voltage and having a second switch input coupled to said first switch input and a second switch output coupled to said first switch output, said second switch transmitting said second source voltage to said second switch output when said input signal voltage impressed upon said second switch input is sufficiently different than said second source voltage by a second threshold voltage; whereby
   the information signal processing circuit controls transmission of either said first source voltage or said second source voltage in response to said input signal voltage by appropriate selection of said first switch, said first threshold voltage required by said first switch, said second switch, and said second threshold voltage required by said second switch thereby attaining a multiple-valued logic circuit.

6. The information signal processing circuit for multiple-valued logic of claim 5, further comprising:
   said first source voltage plus said first threshold voltage overlapping said second source voltage plus said second threshold voltage to provide continuous output.

7. The information signal processing circuit for multiple-valued logic of claim 5 wherein said first switch comprises an N-channel FET.

8. The information signal processing circuit for multiple-valued logic of claim 5 wherein said second switch comprises a P-channel FET.

9. An information signal processing circuit for multiple-valued logic, comprising:
   a first N-channel FET switch, said first switch coupled to a first source voltage and having a first switch input and a first switch output, said first switch transmitting said first source voltage to said first switch output when an input signal voltage impressed upon said first switch input is sufficiently different than said first source voltage by a first threshold voltage;

a second P-channel FET switch, said second switch coupled to a second source voltage and having a second switch input coupled to said first switch input and a second switch output coupled to said first switch output, said second switch transmitting said second source voltage to said second switch output when said input signal voltage impressed upon said second switch input is sufficiently different than said second source voltage by a second threshold voltage; and said first source voltage plus said first threshold voltage overlapping said second source voltage plus said second threshold voltage to provide continuous output; whereby the information signal processing circuit controls transmission of either said first source voltage or said second source voltage in response to said input signal voltage by appropriate selection of said first switch, said first threshold voltage required by said first switch, said second switch, and said second threshold voltage required by said second switch thereby attaining a multiple-valued logic circuit.

10. A multiple-valued logic signal processing circuit for processing signals having three or more levels, comprising:

a first input;

an output;

a first terminus branch coupled to said first input and to said output, said first terminus branch responding to input signals of a first logic level carried by said first input by transmitting a first output signal;

a second terminus branch coupled to said first input and to said output, said second terminus branch responding to input signals of a second logic level carried by said first input by transmitting a second output signal;

a first intermediate branch coupled to said first input and said outputs said first intermediate branch having only two switches and responding to input signals of a third logic level carried by said first input by transmitting a third output signal;

said first terminus branch not transmitting said first output signal when said first input carries said second logic level signal; and said second terminus branch not transmitting said second output signal when said first input carries said first logic level signal; whereby logic operations are performed on input signals by the signal processing circuit, said input signals controlling said output signals.

11. The multiple-valued logic signal processing circuit of claim 10, wherein said first terminus branch comprises a P-channel depletion mode FET, whereby said first terminus branch responds to said first logic level signal by transmitting said first output signal, said first logic level being below said first output signal plus a gate threshold value.

12. The multiple-valued logic signal processing circuit of claim 10, wherein said first terminus branch comprises a P-channel enhancement mode FET, whereby said first terminus branch responds to said first logic level signal by transmitting said first output signal, said first logic level being below said first output signal minus a gate threshold value.

13. The multiple-valued logic signal processing circuit of claim 10, wherein said second terminus branch comprises an N-channel depletion mode FET, whereby said second terminus branch responds to said second logic level signal by transmitting said second output signal, said second logic level being above said second output signal minus a gate threshold value.

14. The multiple-valued logic signal processing circuit of claim 10, wherein said second terminus branch comprises an N-channel enhancement mode FET, whereby said second terminus branch responds to said second logic level signal by transmitting said second output signal, said second logic level being above said second output signal plus a gate threshold value.

15. The multiple-valued logic signal processing circuit of claim 10, further comprising:

said first intermediate FET having a gate, source, and drain, and defining an upper value above which said first intermediate branch does not transmit said third output signal;

said second intermediate FET having a gate, source, and drain, and defining a lower value below which said first intermediate branch does not transmit said third output signal;

said first intermediate FET gate coupled to said first input and said gate of said second intermediate FET;

said first intermediate FET drain coupled to said source of said second intermediate FET; and said second intermediate FET drain coupled to said output.

16. The multiple-valued logic signal processing circuit of claim 15, wherein:

said first intermediate FET is a P-channel depletion mode IGFET; and said second intermediate FET is an N-channel enhancement mode IGFET.

17. The multiple-valued logic signal processing circuit of claim 15, wherein:

said first intermediate FET is a P-channel enhancement mode IGFET; and said second intermediate FET is an N-channel depletion mode IGFET.

18. The multiple-valued logic signal processing circuit of claim 15, wherein:

said first intermediate FET is a P-channel depletion mode IGFET; and said second intermediate FET is an N-channel depletion mode IGFET.

19. The multiple-valued logic signal processing circuit of claim 10, wherein said first terminus branch comprises a single FET.

20. The multiple-valued logic signal processing circuit of claim 10, wherein said second terminus branch comprises a single FET.

21. The multiple-valued logic signal processing circuit of claim 10, further comprising:

a second input;

a third terminus branch coupled to said second input and said output, said third terminus branch responding to logic level signals carried by said second input by transmitting a fourth output signal;

a fourth terminus branch coupled to said second input and said output, said fourth terminus branch responding to logic level signals carried by said second input by transmitting a fifth output signal; whereby a multiple-valued logic logical operation may be performed on input signals carried by said first and second inputs.

22. The multiple-valued logic signal processing circuit of claim 21, further comprising:
  a second intermediate branch coupled to said second input and said output, said second intermediate branch responding to logic level signals carried by said second input by transmitting a sixth output signal.

23. The multiple-valued logic signal processing circuit of claim 22, wherein said second intermediate branch comprises a plurality IGFET pairs, each IGFET pair defining a unique band of input signals for which each of said IGFET pairs transmits a signal.

24. The multiple-valued logic signal processing circuit of claim 23, further comprising:
  an additional stage, said additional stage preventing back biasing of at least one branch of the multiple-valued logic signal processing circuit.

25. A multiple-valued logic signal processing circuit for processing signals having three or more levels, comprising:
  a first input;
  a second input;
  an output;
  a first terminus branch coupled to said first input and to said output, said first terminus branch responding to input signals of a first logic level carried by said first input by transmitting a first output signal;
  a second terminus branch coupled to said first input and to said output, said second terminus branch responding to input signals of a second logic level carried by said first input by transmitting a second output signal;
  a third terminus branch coupled to said second input and said output, said third terminus branch responding to input signals of a third logic level carried by said second input by transmitting a third output signal;
  a fourth terminus branch coupled to said second input and said output, said fourth terminus branch responding to input signals of a fourth logic level carried by said second input by transmitting a fourth output signal;
  said first and third terminus branches forming a first composite branch capable of transmitting a first composite output signal;
  said second and fourth terminus branches forming a second composite branch capable of transmitting a second composite output signal;
  said first composite branch only transmitting said first composite output signal when said first and third logic level signals are carried by said first and second inputs, respectively;
  said second composite branch only transmitting said second composite output signal when said second and fourth logic level signals are carried by said first and second inputs, respectively; whereby
  a multiple-place multiple-valued logic circuit is provided that provides unique output logic signals in response to unique first and second input logic signals.

26. The multiple-valued logic signal processing circuit for processing signals having three or more levels of claim 25 wherein the multiple-valued logic signal processing circuit is selected from the group consisting of:
  CGOR, CGAND, CEQ, CSIGMA, GOR, GAND, EQ, SIGMA, and XGOR.

* * * * *